US012696680B2

(12) United States Patent
Ahn et al.

(10) Patent No.: US 12,696,680 B2
(45) Date of Patent: Jul. 28, 2026

(54) LIGHT-EMITTING DEVICE INCLUDING ORGANOMETALLIC COMPOUND, ELECTRONIC APPARATUS INCLUDING THE LIGHT-EMITTING DEVICE, AND THE ORGANOMETALLIC COMPOUND

(71) Applicant: SAMSUNG DISPLAY CO., LTD., Yongin-si (KR)

(72) Inventors: Eunsoo Ahn, Yongin-si (KR); Soobyung Ko, Yongin-si (KR); Sungbum Kim, Yongin-si (KR); Eunyoung Lee, Yongin-si (KR); Jaesung Lee, Yongin-si (KR); Jinhee Ju, Yongin-si (KR); Seokhwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 875 days.

(21) Appl. No.: 18/151,326

(22) Filed: Jan. 6, 2023

(65) Prior Publication Data

US 2023/0225190 A1 Jul. 13, 2023

(30) Foreign Application Priority Data

Jan. 10, 2022 (KR) ........................ 10-2022-0003628

(51) Int. Cl.
*H10K 85/30* (2023.01)
*C07F 15/00* (2006.01)
(Continued)

(52) U.S. Cl.
CPC ....... *H10K 85/346* (2023.02); *C07F 15/0086* (2013.01); *H10K 10/46* (2023.02); *C07B 2200/05* (2013.01); *H10K 2101/20* (2023.02)

(58) Field of Classification Search
CPC .............. H10K 85/346; C07F 15/0086; C09K 2211/185
See application file for complete search history.

(56) References Cited

U.S. PATENT DOCUMENTS 7,381,479 B2 6/2008 Lamansky et al.
7,393,599 B2 7/2008 Thompson et al.
(Continued)

FOREIGN PATENT DOCUMENTS

CN 104370974 A 2/2015
CN 111574501 A 8/2020
(Continued)

OTHER PUBLICATIONS

Kai Li et al., "Highly phosphorescent platinum(II) emitters: photophysics, materials and biological applications", Chemical Science, Jan. 7, 2016, pp. 1653-1673, vol. 7, the Royal Society of Chemistry (21 pages).

*Primary Examiner* — Jenna N Chandhok
(74) *Attorney, Agent, or Firm* — Womble Bond Dickinson (US) LLP

(57) ABSTRACT

A light-emitting device including an organometallic compound represented by Formula 1, an electronic apparatus including the light-emitting device, and the organometallic compound represented by Formula 1 are provided.
(Continued)

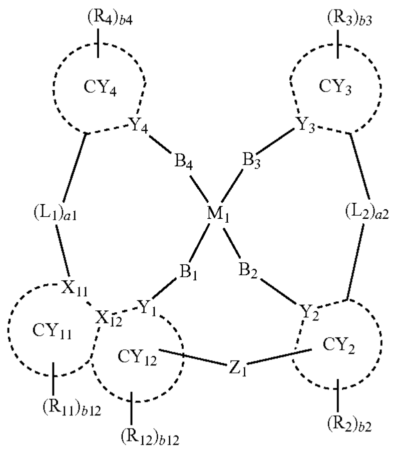

20 Claims, 3 Drawing Sheets

(51) Int. Cl.
*H10K 10/46* (2023.01)
*H10K 101/20* (2023.01)

(56) References Cited

U.S. PATENT DOCUMENTS

| | | | |
|---|---|---|---|
| 7,585,573 | B2 | 9/2009 | Lee et al. |
| 7,776,458 | B2 | 8/2010 | Ragini et al. |
| 7,932,207 | B2 | 4/2011 | Lee et al. |
| 8,106,199 | B2 | 1/2012 | Jabbour et al. |
| 8,389,725 | B2 | 3/2013 | Li et al. |
| 8,669,364 | B2 | 3/2014 | Li et al. |
| 8,680,760 | B2 | 3/2014 | Cheng et al. |
| 8,816,080 | B2 | 8/2014 | Li et al. |
| 8,846,940 | B2 | 9/2014 | Li et al. |
| 8,883,322 | B2 | 11/2014 | Wu et al. |
| 8,946,417 | B2 | 2/2015 | Jian et al. |
| 9,051,344 | B2 | 6/2015 | Lin et al. |
| 9,076,974 | B2 | 7/2015 | Li et al. |
| 9,203,039 | B2 | 12/2015 | Li et al. |
| 9,221,857 | B2 | 12/2015 | Li et al. |
| 9,224,963 | B2 | 12/2015 | Li et al. |
| 9,238,668 | B2 | 1/2016 | Li et al. |
| 9,312,502 | B2 | 4/2016 | Li et al. |
| 9,312,505 | B2 | 4/2016 | Brooks et al. |
| 9,324,957 | B2 | 4/2016 | Li et al. |
| 9,382,273 | B2 | 7/2016 | Li et al. |
| 9,425,415 | B2 | 8/2016 | Li et al. |
| 9,698,359 | B2 | 7/2017 | Li et al. |
| 9,899,614 | B2 | 2/2018 | Li et al. |
| 10,566,552 | B2 | 2/2020 | Zeng et al. |
| 11,793,065 | B2 | 10/2023 | Kim et al. |
| 2005/0287394 | A1 | 12/2005 | Yang et al. |
| 2008/0018221 | A1 | 1/2008 | Egen et al. |
| 2012/0121936 | A1 | 5/2012 | Baek et al. |
| 2014/0309428 | A1 | 10/2014 | Egen et al. |
| 2023/0189631 | A1* | 6/2023 | Ahn .................... C07F 15/0086 257/40 |
| 2024/0188417 | A1 | 6/2024 | She et al. |

FOREIGN PATENT DOCUMENTS

| | | | |
|---|---|---|---|
| JP | 2007-045742 | A | 2/2007 |
| KR | 10-0730115 | B1 | 6/2007 |
| KR | 10-2008-0065868 | A | 7/2008 |
| KR | 10-2014-0040044 | A | 4/2014 |
| KR | 10-2017-0117343 | A | 10/2017 |
| KR | 10-2021-0041162 | A | 4/2021 |
| WO | WO 2012-121936 | A2 | 9/2012 |

* cited by examiner

LIGHT-EMITTING DEVICE INCLUDING ORGANOMETALLIC COMPOUND, ELECTRONIC APPARATUS INCLUDING THE LIGHT-EMITTING DEVICE, AND THE ORGANOMETALLIC COMPOUND

CROSS-REFERENCE TO RELATED APPLICATION

This application claims priority to and the benefit of Korean Patent Application No. 10-2022-0003628, filed on Jan. 10, 2022, in the Korean Intellectual Property Office, the entire content of which is hereby incorporated by reference.

BACKGROUND

1. Field

Aspects of one or more embodiments of the present disclosure relate to a light-emitting device including an organometallic compound, an electronic apparatus including the light-emitting device, and the organometallic compound.

2. Description of the Related Art

Self-emissive devices among light-emitting devices have relatively wide viewing angles, high contrast ratios, short response times, and excellent or suitable characteristics in terms of luminance, driving voltage, and response speed.

In a light-emitting device, a first electrode is on a substrate, and a hole transport region, an emission layer, an electron transport region, and a second electrode are sequentially arranged on the first electrode. Holes provided from the first electrode may move toward the emission layer through the hole transport region, and electrons provided from the second electrode may move toward the emission layer through the electron transport region. Carriers, such as holes and electrons, recombine in such an emission layer region to produce excitons. These excitons transition from an excited state to a ground state to thereby generate light.

SUMMARY

Aspects of one or more embodiments of the present disclosure are directed toward a light-emitting device including an organometallic compound, an electronic apparatus including the light-emitting device, and the organometallic compound.

Additional aspects of embodiments of the present disclosure will be set forth in part in the description which follows and, in part, will be apparent from the description, or may be learned by practice of the presented embodiments of the disclosure.

According to one or more embodiments, provided is a light-emitting device including a first electrode, a second electrode facing the first electrode, an interlayer between the first electrode and the second electrode and including an emission layer, and an organometallic compound represented by Formula 1.

Formula 1

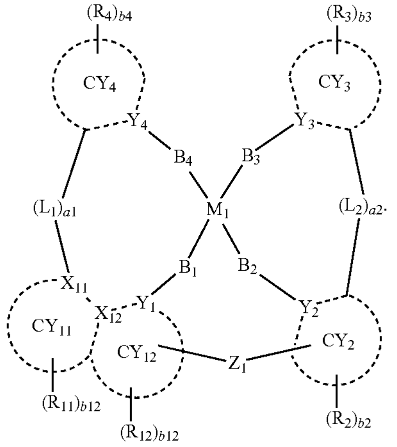

In Formula 1, $M_1$ may be platinum (Pt), palladium (Pd), copper (Cu), silver (Ag), gold (Au), rhodium (Rh), iridium (Ir), ruthenium (Ru), or osmium (Os), rings $CY_{11}$, $CY_{12}$, $CY_2$, $CY_3$, and $CY_4$ may each independently be a $C_5$-$C_{60}$ carbocyclic group or a $C_1$-$C_{60}$ heterocyclic group, ring $CY_{11}$ might be non-aromatic, ring $CY_{12}$ might be aromatic, $Y_1$, $Y_2$, $Y_3$, $Y_4$, $X_{11}$, and $X_{12}$ may each independently be selected from a carbon atom (C) and a nitrogen atom (N), $Y_1$ and $X_{12}$ may directly be linked to each other via a chemical bond, $X_{11}$ and $X_{12}$ may directly be linked to each other via a chemical bond, $X_{12}$ may be a bridgehead atom, $B_1$ to $B_4$ may each independently be a single bond, an oxygen atom (O), a sulfur atom (S), $N(R_{11a})$, or $C(R_{11a})(R_{12a})$, $Z_1$ may be a single bond, an oxygen atom (O), a sulfur atom (S), $B(R_{13})$, $N(R_{13})$, $P(R_{13})$, $C(R_{13})(R_{14})$, $Si(R_{13})(R_{14})$, or $P(R_{13})(R_{14})$, $R_{13}$ and $R_{14}$ may be optionally linked to each other to form a $C_5$-$C_{60}$ carbocyclic group that is unsubstituted or substituted with $R_{10a}$ or a $C_1$-$C_{60}$ heterocyclic group that is unsubstituted or substituted with $R_{10a}$, $L_1$ and $L_2$ may each independently be $*—O—*'$, $*—S—*'$, $*—C(R_{15})(R_{16})—*'$, $*—C(R_{15})═*'$, $*═C(R_{15})—*'$, $*—C(R_{15})═C(R_{16})—*'$, $*—C(═O)—*'$, $*—C(═S)—*'$, $*—C≡C—*'$, $*—B(R_{15})—*'$, $N(R_{15})—*'$, $*—P(R_{15})—*'$, $*—Si(R_{15})(R_{16})—*'$, $*—P(R_{15})(R_{16})—*'$, or $*—Ge(R_{15})(R_{16})—*'$, a1 and a2 may each independently be an integer from 0 to 3, when a1 is 0, a group represented by $*\text{-}(L_1)_{a1}\text{-}*'$ may be a single bond, when a2 is 0, a group represented by $*\text{-}(L_2)_{a2}\text{-}*'$ may be a single bond, $R_{11}$, $R_{12}$, $R_2$, $R_3$, $R_4$, $R_{11a}$, $R_{12a}$, $R_{13}$, $R_{14}$, $R_{15}$, $R_{16}$, and $R_{10a}$ may each independently be deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or one or more combinations thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or one or more combinations thereof, or —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or one or more combinations thereof, b11, b12, b2, b3, and b4 may each independently be an integer from 0 to 8, and

* and *' may each indicate a binding site to a neighboring atom.

According to one or more embodiments, provided is an electronic apparatus including the light-emitting device.

According to one or more embodiments, provided is the organometallic compound represented by Formula 1.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
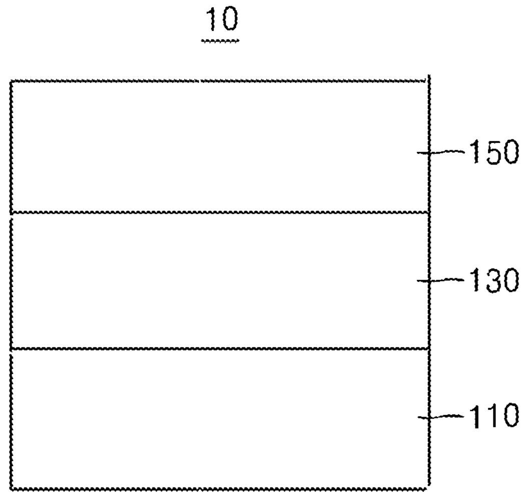
FIG. 1 is a schematic view of a structure of a light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present disclosure. As utilized herein, the term "and/or" includes any and all combinations of one or more of the associated listed items. Throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variations thereof.

In an embodiment, provided is a light-emitting device including: a first electrode;

a second electrode facing the first electrode;

an interlayer between the first electrode and the second electrode and including an emission layer; and an organometallic compound represented by Formula 1.

Formula 1

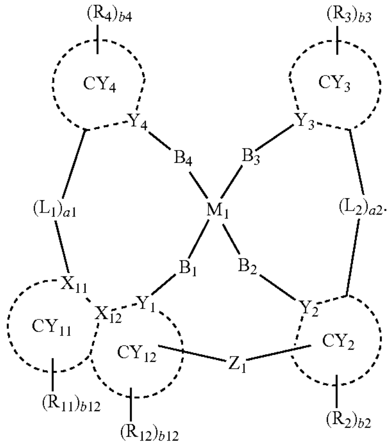

In Formula 1, $M_1$ may be platinum (Pt), palladium (Pd), copper (Cu), silver (Ag), gold (Au), rhodium (Rh), iridium (Ir), ruthenium (Ru), or osmium (Os), rings $CY_{11}$, $CY_{12}$, $CY_2$, $CY_3$, and $CY_4$ may each independently be a $C_5$-$C_{60}$ carbocyclic group or a $C_1$-$C_{60}$ heterocyclic group, ring $CY_{11}$ might be non-aromatic, ring $CY_{12}$ might be aromatic, $Y_1$, $Y_2$, $Y_3$, $Y_4$, $X_{11}$, and $X_{12}$ may each independently be selected from a carbon atom (C) and a nitrogen atom (N), $Y_1$ and $X_{12}$ may directly be linked to each other via a chemical bond, $X_{11}$ and $X_{12}$ may directly be linked to each other via a chemical bond, $X_{12}$ may be a bridgehead atom, $B_1$ to $B_4$ may each independently be a single bond, an oxygen atom (O), a sulfur atom (S), N$(R_{11a})$, or C$(R_{11a})(R_{12a})$, $Z_1$ may be a single bond, an oxygen atom (O), a sulfur atom (S), B$(R_{13})$, N$(R_{13})$, P$(R_{13})$, C$(R_{13})(R_{14})$, Si$(R_{13})(R_{14})$, or P$(R_{13})(R_{14})$, $R_{13}$ and $R_{14}$ may be optionally linked to each other to form a $C_5$-$C_{60}$ carbocyclic group that is unsubstituted or substituted with $R_{10a}$ or a $C_1$-$C_{60}$ heterocyclic group that is unsubstituted or substituted with $R_{10a}$, $L_1$ and $L_2$ may each independently be *—O—*', *—S—*', *—C$(R_{15})(R_{16})$—*', *—C$(R_{15})$=*', *=C$(R_{15})$—*', *—C$(R_{15})$=C$(R_{16})$—*', *—C(=O)—*', *—C(=S)—*', *—C≡C—*', *—B$(R_{15})$—*', *—N$(R_{15})$—*', *—P$(R_{15})$—*', *—Si$(R_{15})(R_{16})$—*', *—P$(R_{15})(R_{16})$—*', or *—Ge$(R_{15})(R_{16})$—*', a1 and a2 may each independently be an integer from 0 to 3, when a1 is 0, a group represented by *-$(L_1)_{a1}$-*' may be a single bond, when a2 is 0, a group represented by *-$(L_2)_{a2}$-*' may be a single bond, $R_{11}$, $R_{12}$, $R_2$, $R_3$, $R_4$, $R_{11a}$, $R_{12a}$, $R_{13}$, $R_{14}$, $R_{15}$, $R_{16}$, and $R_{10a}$ may each independently be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S$(=O)_2(Q_{11})$, —P(=O)$(Q_{11})(Q_{12})$, or one or more combinations thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S$(=O)_2(Q_{21})$, —P(=O)$(Q_{21})(Q_{22})$, or one or more combinations thereof; or —Si$(Q_{31})(Q_{32})(Q_{33})$, —N$(Q_{31})(Q_{32})$, —B$(Q_{31})(Q_{32})$, —C(=O)$(Q_{31})$, —S$(=O)_2(Q_{31})$, or —P(=O)$(Q_{31})(Q_{32})$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or one or more combinations thereof, b11, b12, b2, b3, and b4 may each independently be an integer from 0 to 8, and

* and *' may each indicate a binding site to a neighboring atom.

In the light-emitting device according to an embodiment, the interlayer may include the organometallic compound represented by Formula 1.

In the light-emitting device according to an embodiment, the emission layer may include the organometallic compound represented by Formula 1.

In the light-emitting device according to an embodiment, the percentage of the metal-to-ligand charge-transfer triplet state ($^3$MLCT) of the organometallic compound may be greater than or equal to about 15%.

In the light-emitting device according to an embodiment, the emission layer may further include a second compound and a third compound, the second compound is a hole transporting host, and the third compound is an electron transporting host.

In the light-emitting device according to an embodiment, the second compound may include at least one π electron-rich $C_3$-$C_{60}$ cyclic group, and for example, the π electron-rich $C_3$-$C_{60}$ cyclic group may include at least one selected from a carbazole group, a dibenzofuran group, and a fluorene group.

The third compound may include at least one π electron-deficient nitrogen-containing $C_1$-$C_{60}$ cyclic group, and for example, the π electron-deficient nitrogen-containing $C_1$-$C_{60}$ cyclic group may include at least one selected from a pyridine group, a pyrimidine group, and a triazine group.

In the light-emitting device according to an embodiment, the organometallic compound, the second compound, and the third compound may be different from one another.

Also, in the light-emitting device according to an embodiment, the second compound and the third compound may form an exciplex, and the organometallic compound, the second compound, and/or the third compound may not form an exciplex.

In the light-emitting device according to an embodiment, the second compound may be at least one of compounds represented by Formulae HTH1 to HTH52.

HTH1

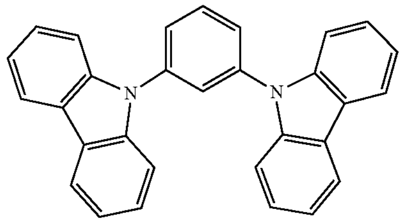

HTH2

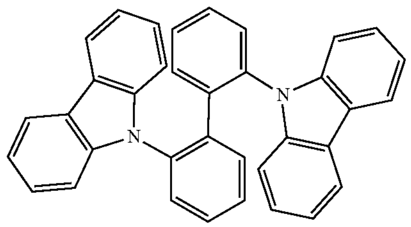

HTH3

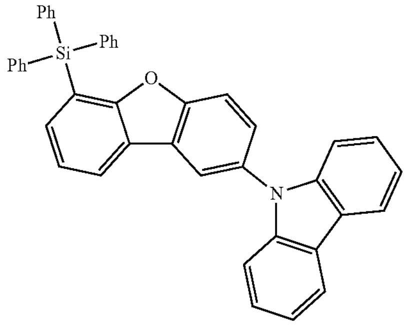

HTH4

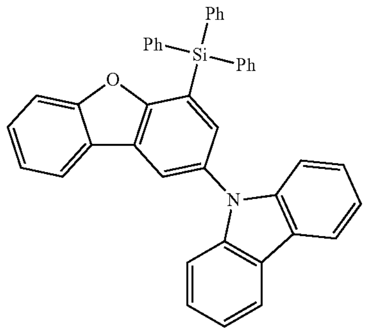

-continued
HTH5
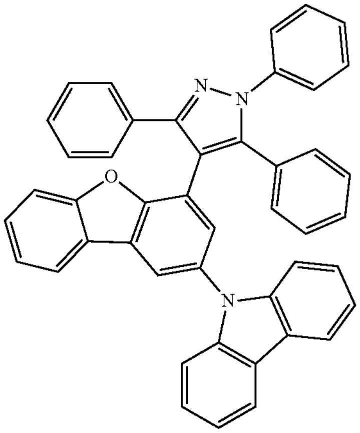
HTH6
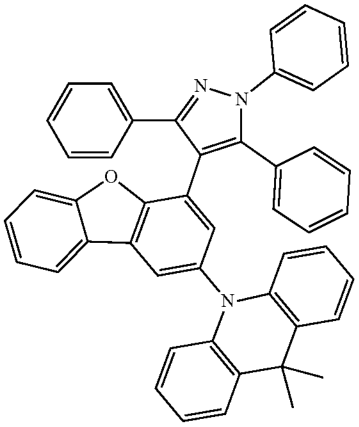
HTH7
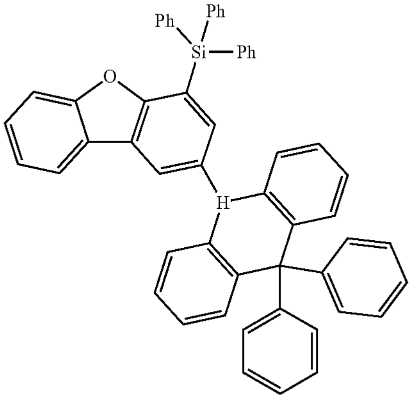
-continued
HTH8
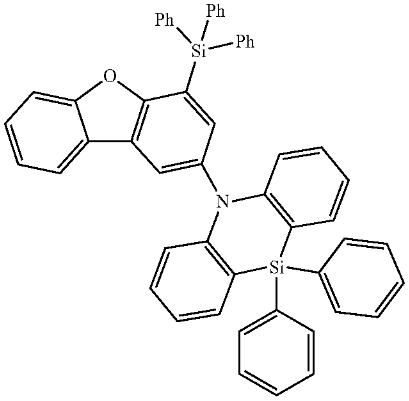
HTH9
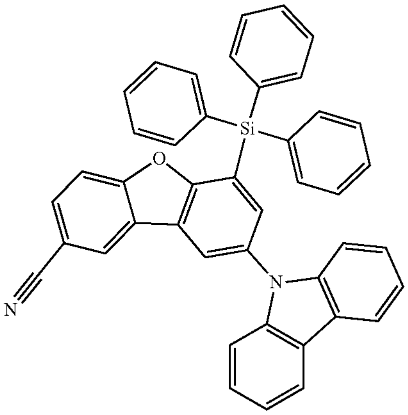
HTH10
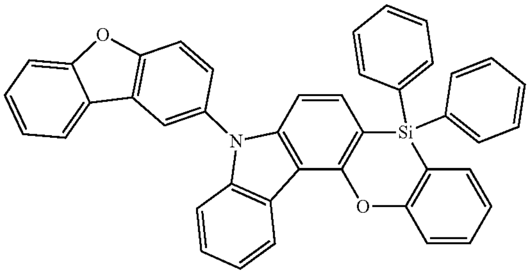
HTH11
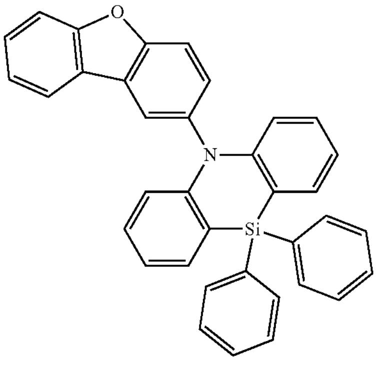

-continued
HTH12
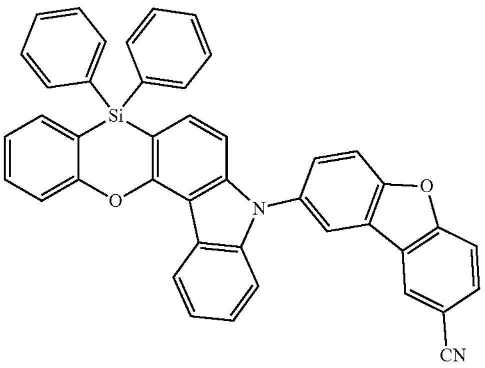
HTH13
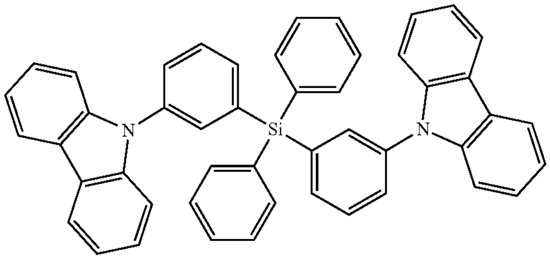
HTH14
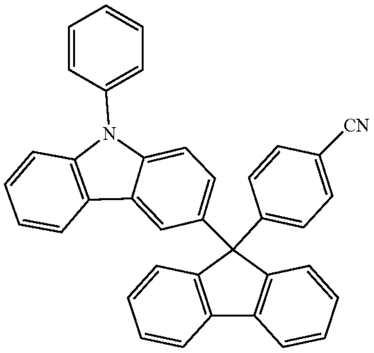
HTH15
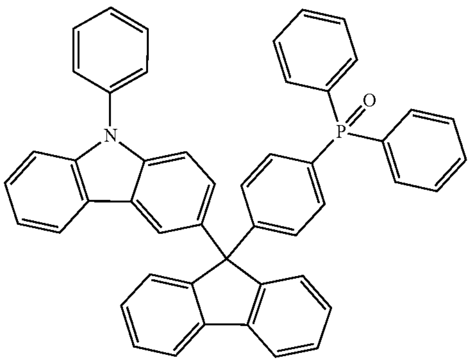
-continued
HTH16
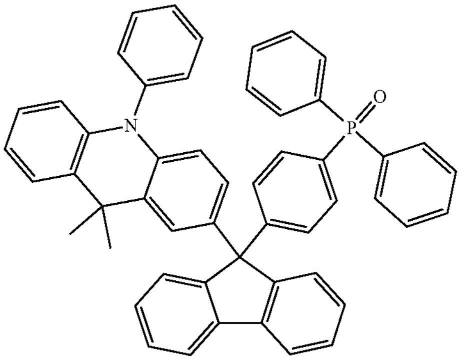
HTH17
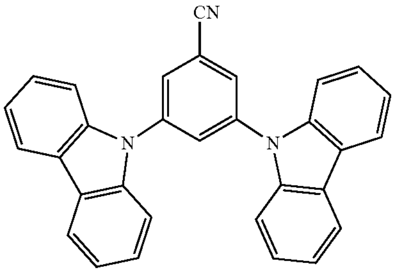
HTH18
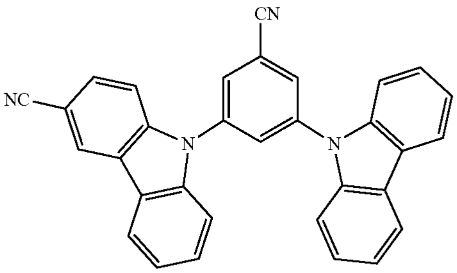
HTH19
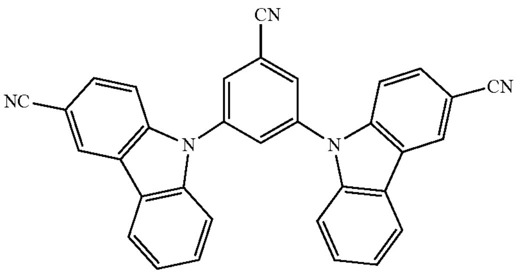
HTH20
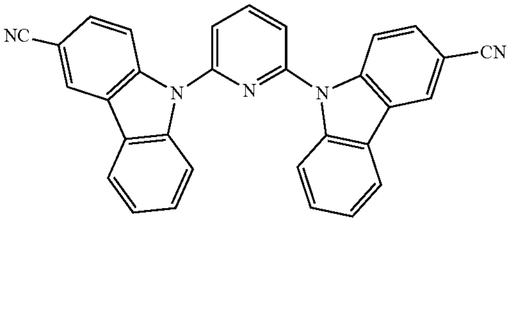

-continued
HTH21
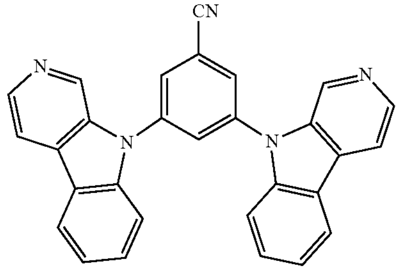
HTH22
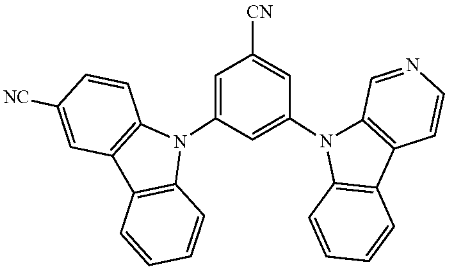
HTH23
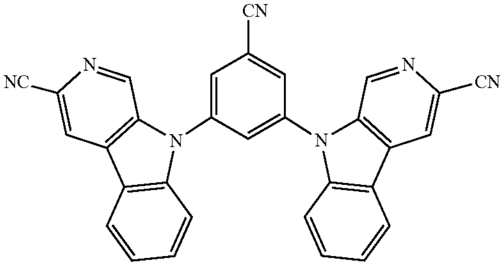
HTH24
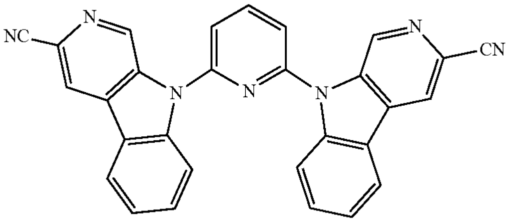
HTH25
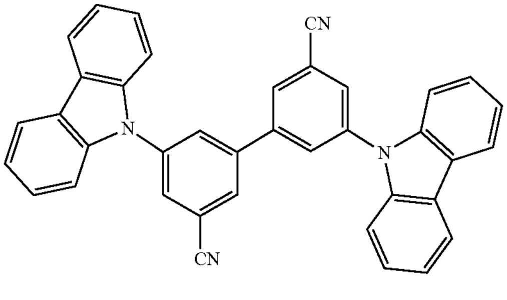
-continued
HTH26
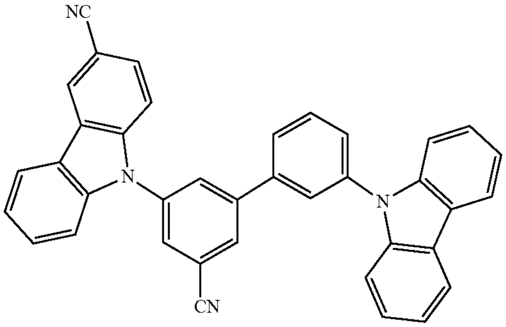
HTH27
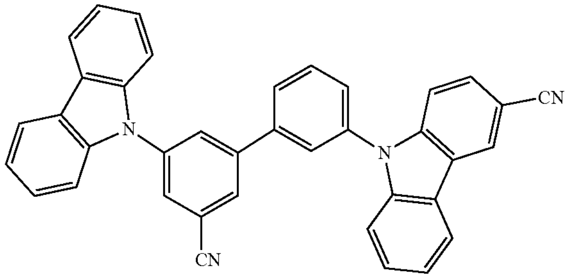
HTH28
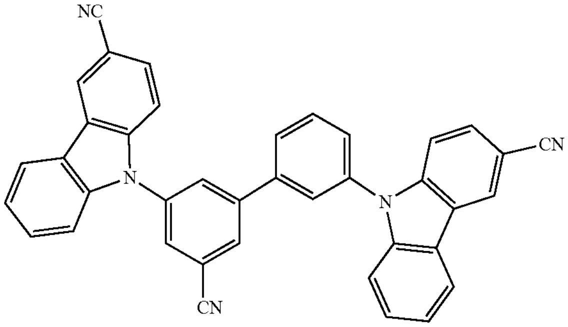
HTH29
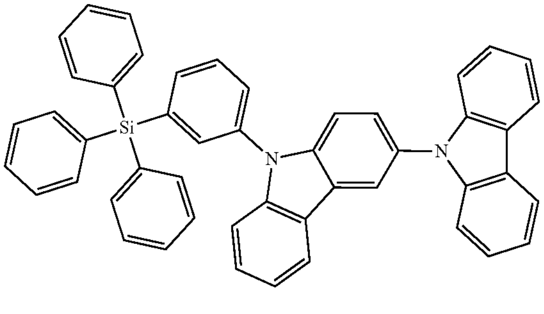

-continued
HTH30
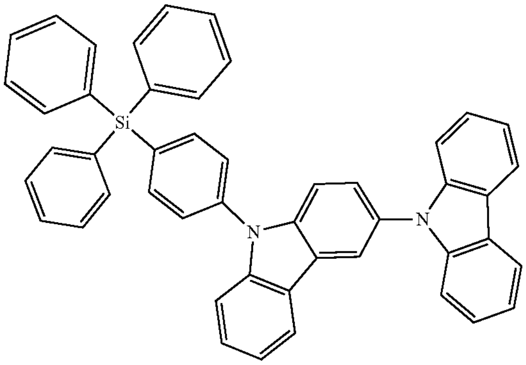
HTH31
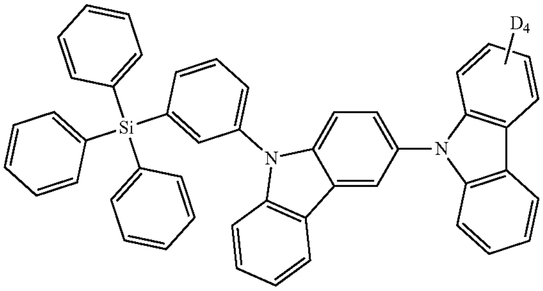
HTH32
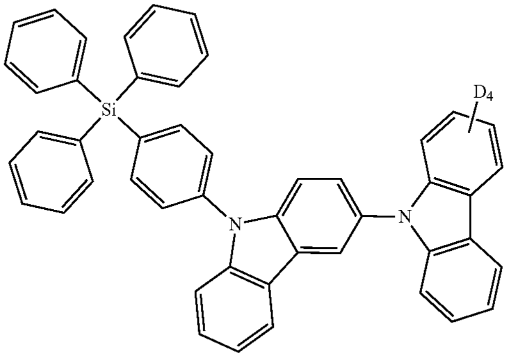
HTH33
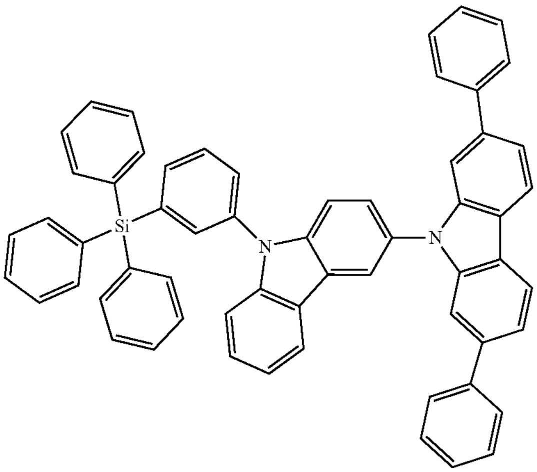
-continued
HTH34
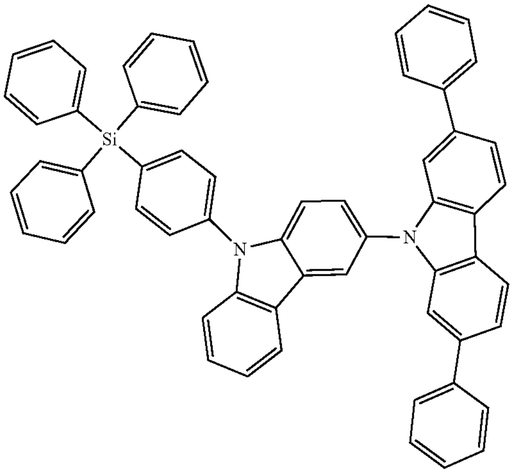
HTH35
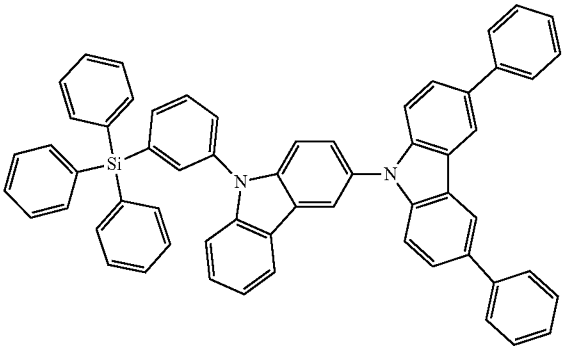
HTH36
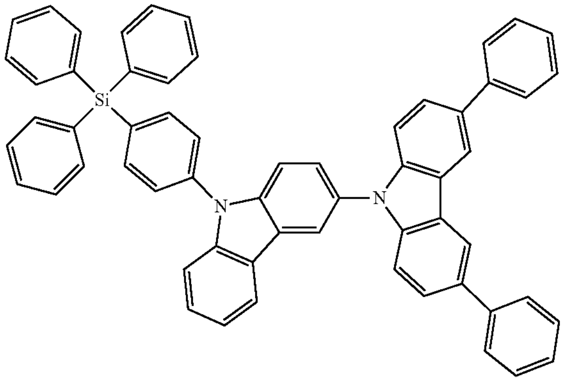
HTH37
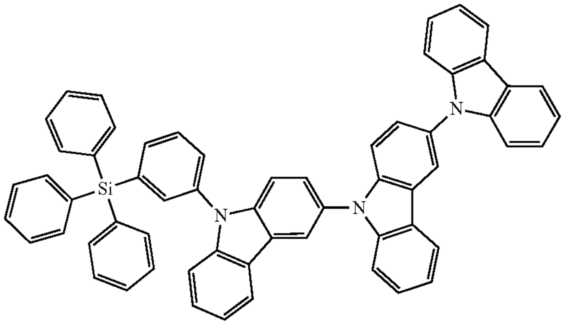

-continued
HTH38
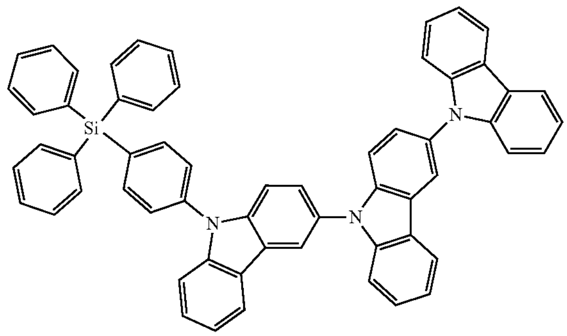
HTH39
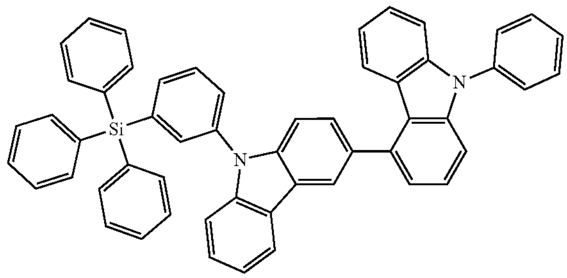
HTH40
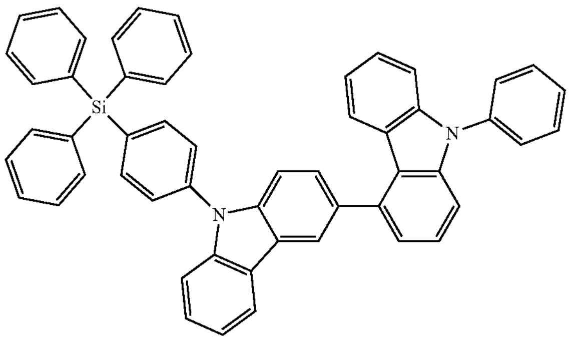
HTH41
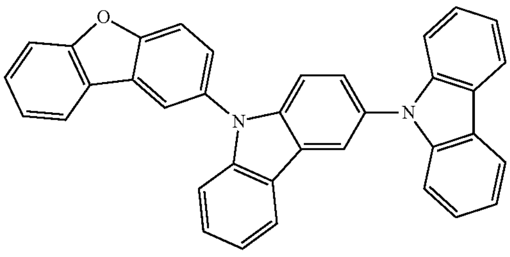
HTH42
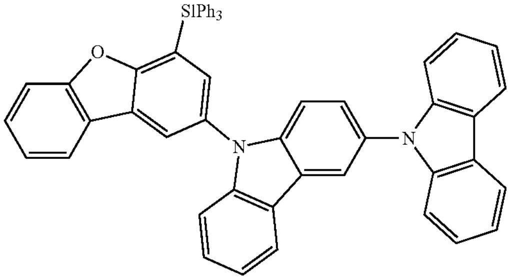
-continued
HTH43
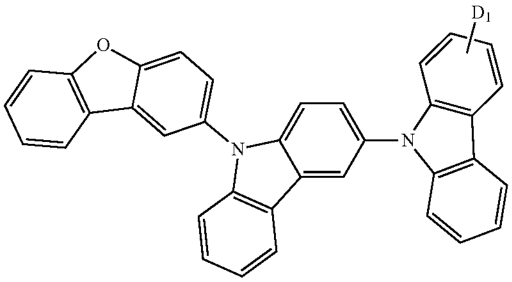
HTH44
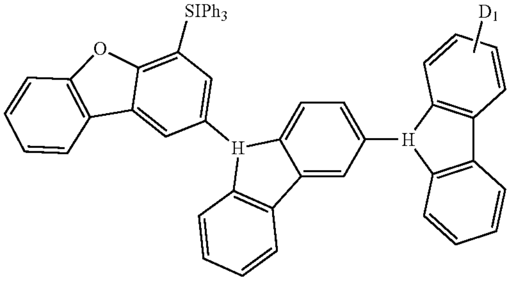
HTH45
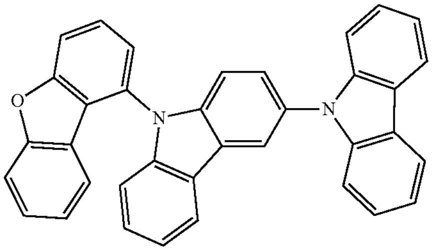
HTH46
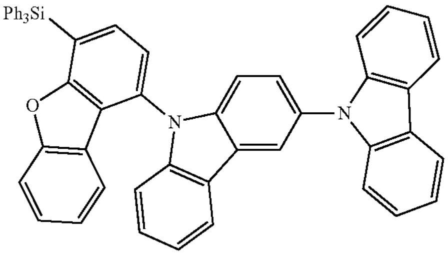
HTH47
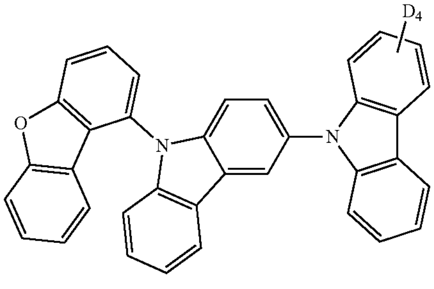

-continued
HTH48
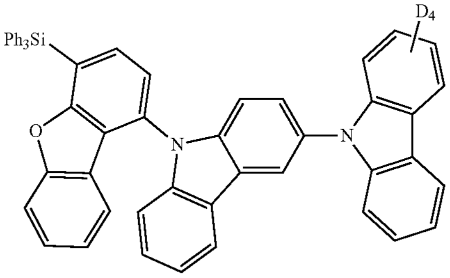
HTH49
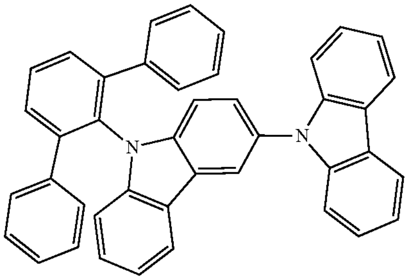
HTH50
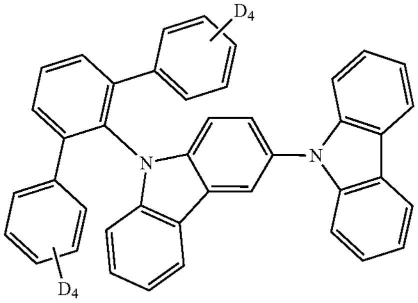
HTH51
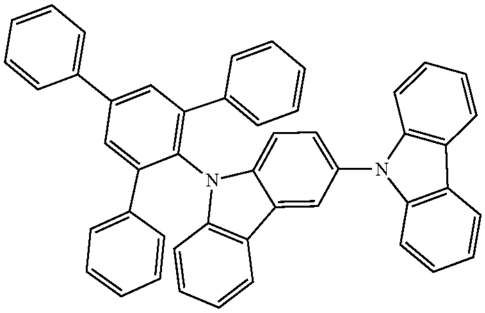
HTH52
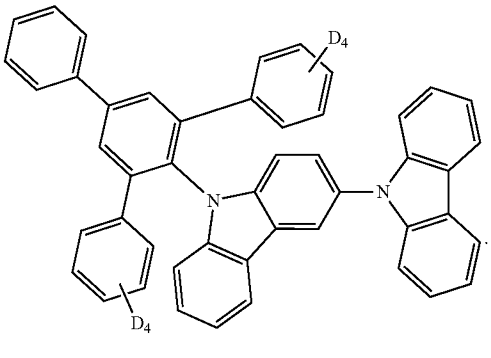
In the light-emitting device according to an embodiment, the third compound may be at least one of compounds represented by Formulae ETH1 to ETH82.
ETH1
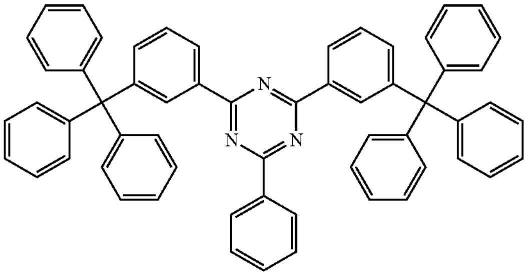
ETH2
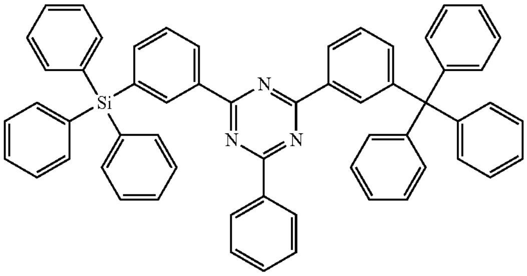
ETH3
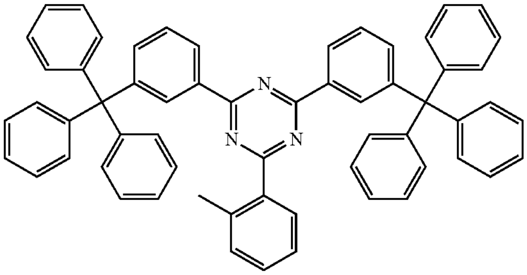
ETH4
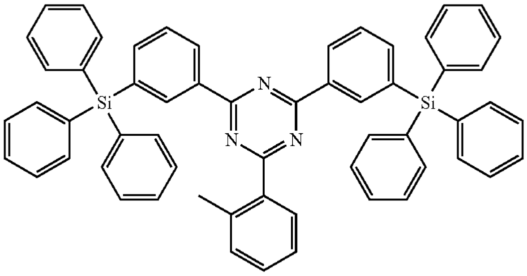
ETH5
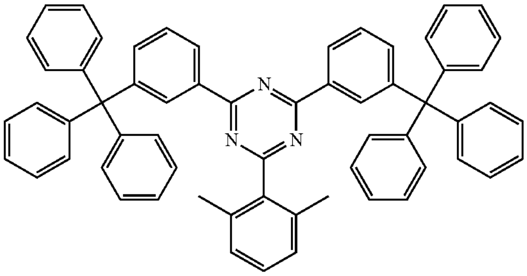

-continued
ETH6
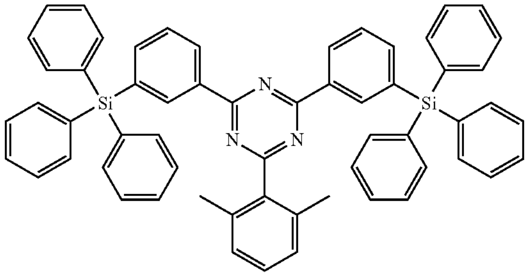
ETH7
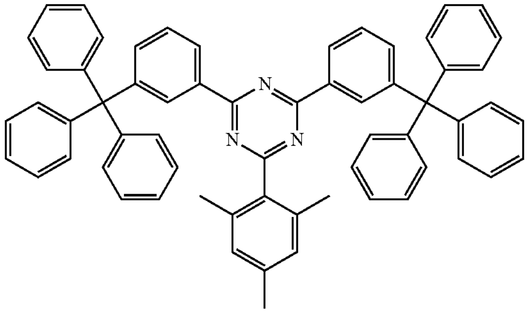
ETH8
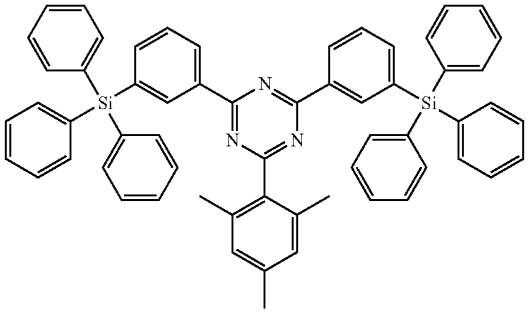
ETH9
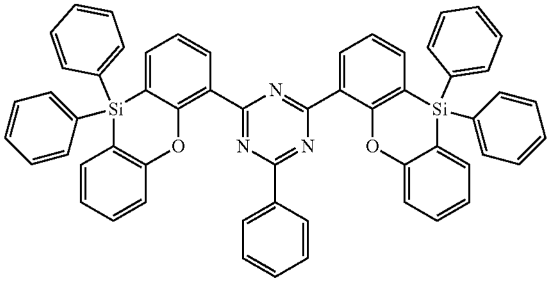
ETH10
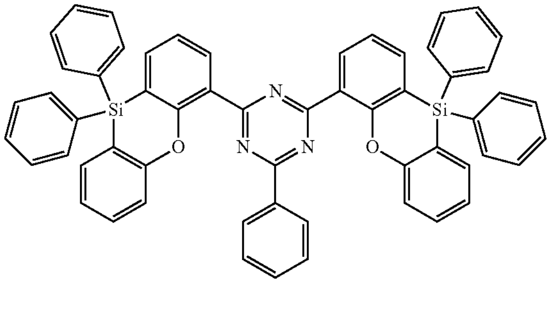
-continued
ETH11
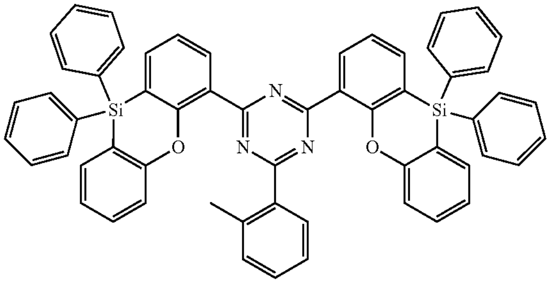
ETH12
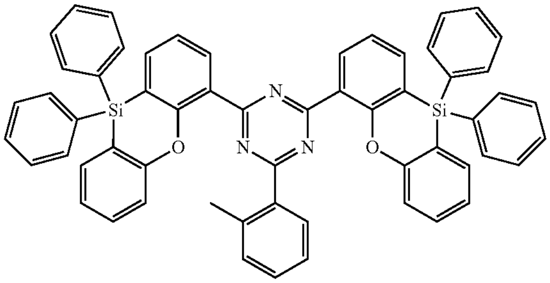
ETH13
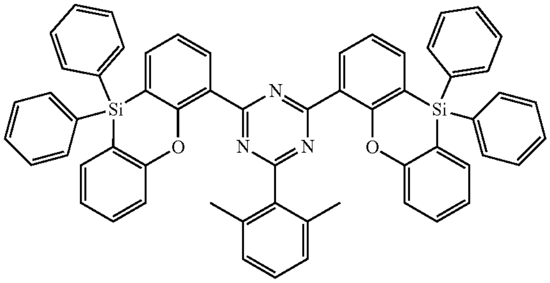
ETH14
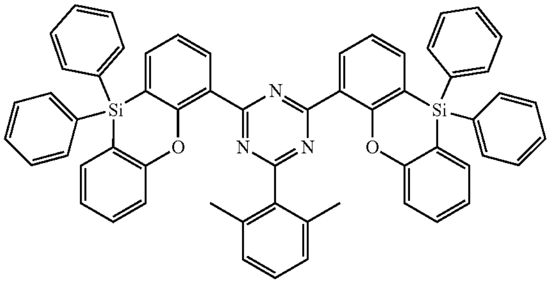
ETH15
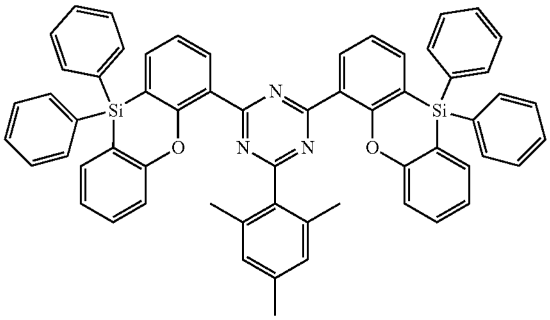

-continued
ETH16
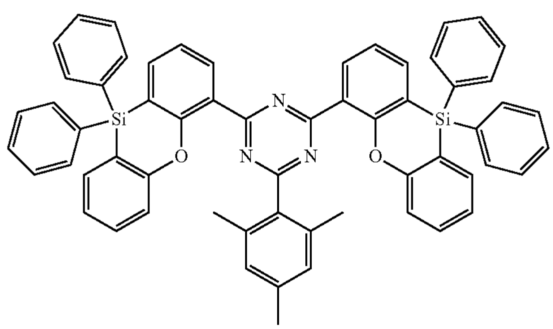
ETH17
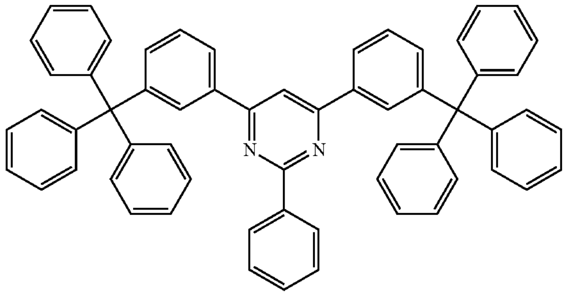
ETH18
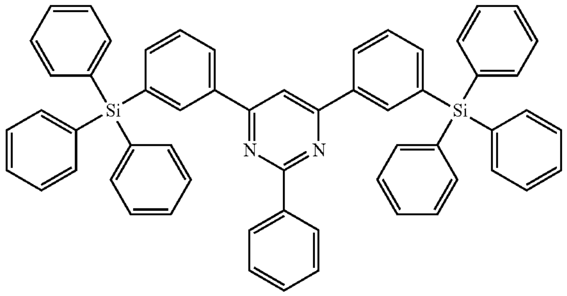
ETH19
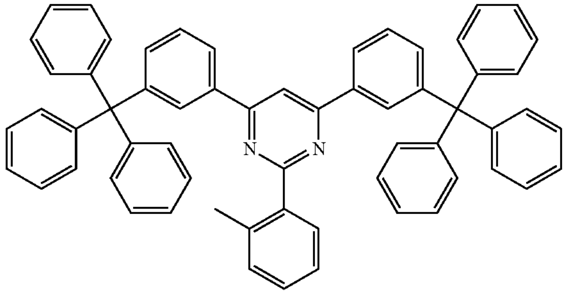
ETH20
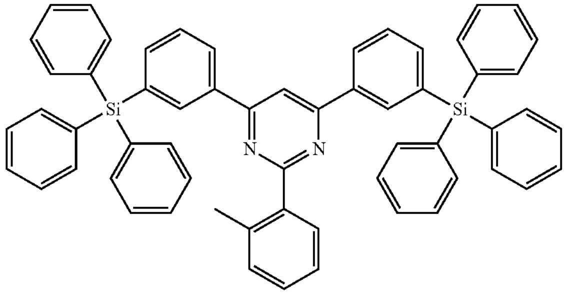
-continued
ETH21
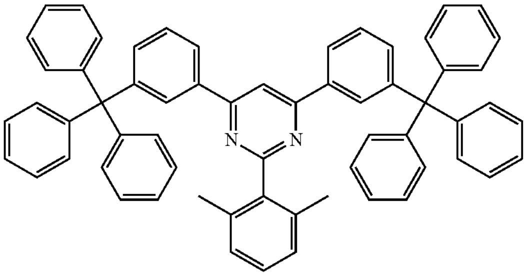
ETH22
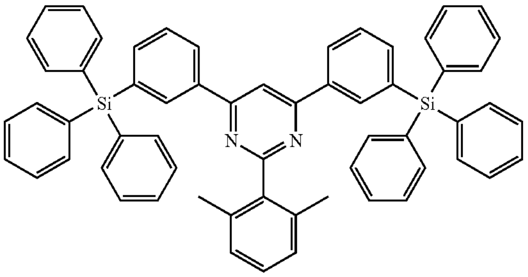
ETH23
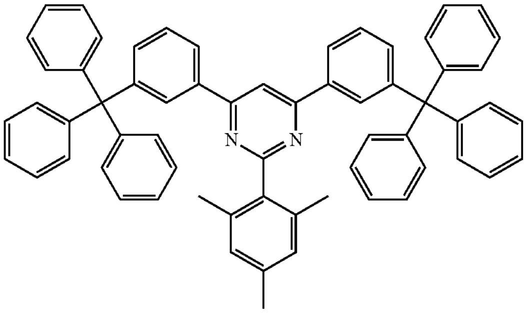
ETH24
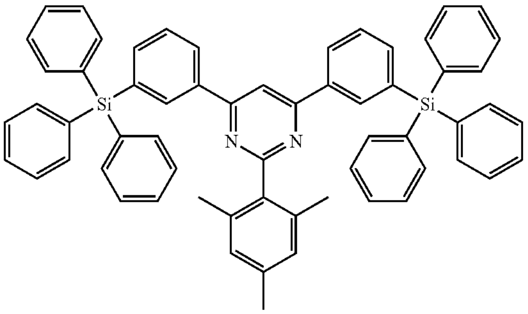
ETH25
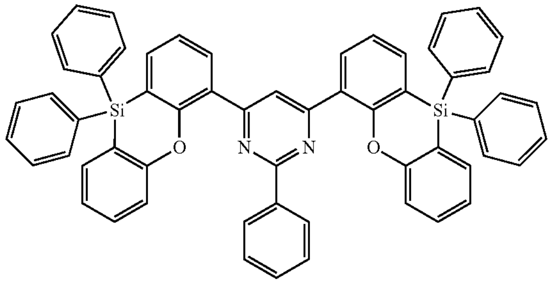

-continued
ETH26
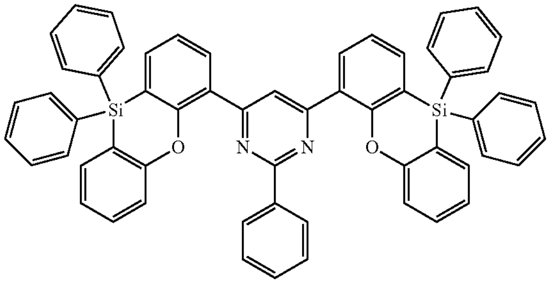
ETH27
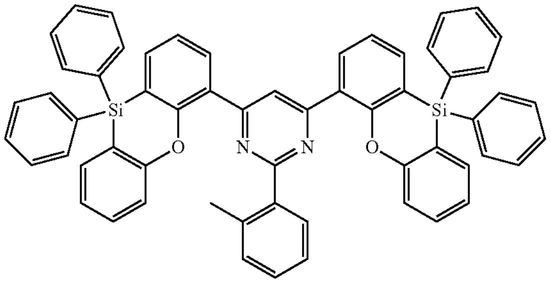
ETH28
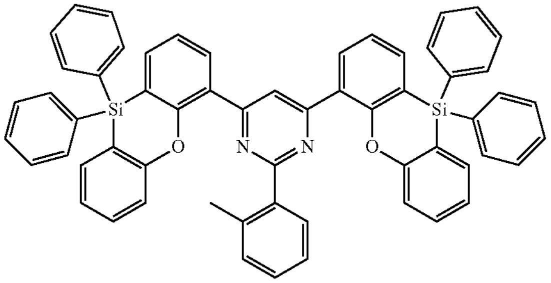
ETH29
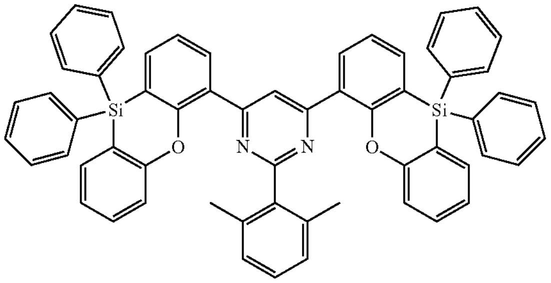
ETH30
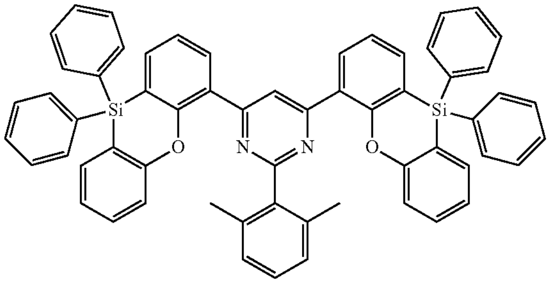
-continued
ETH31
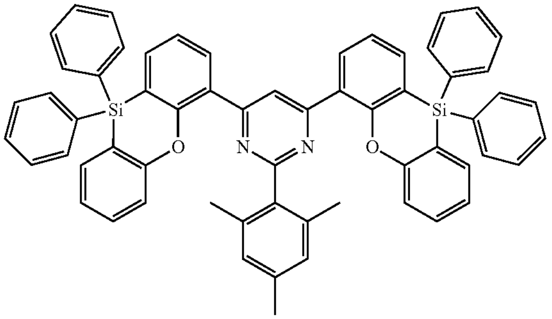
ETH32
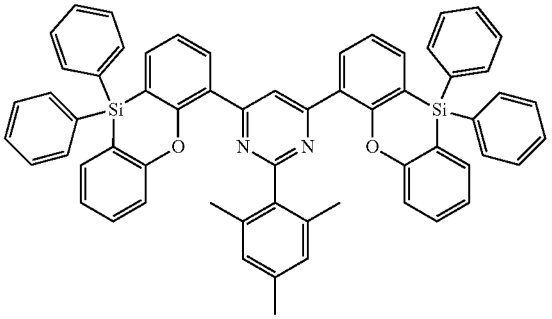
ETH33
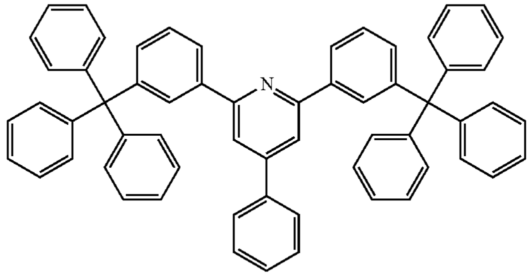
ETH34
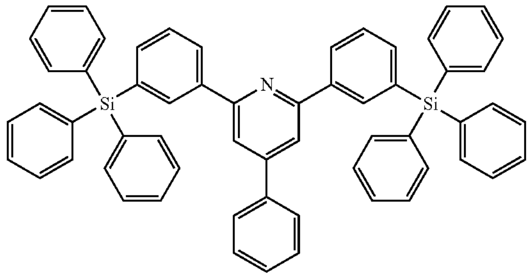
ETH35
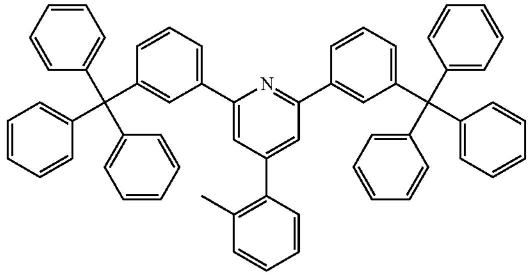

-continued
ETH36
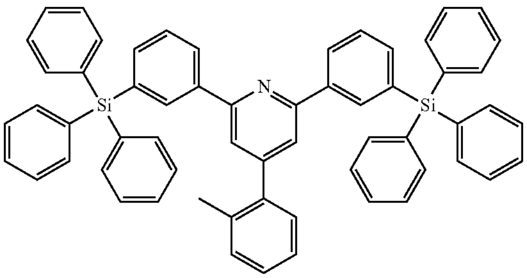
ETH37
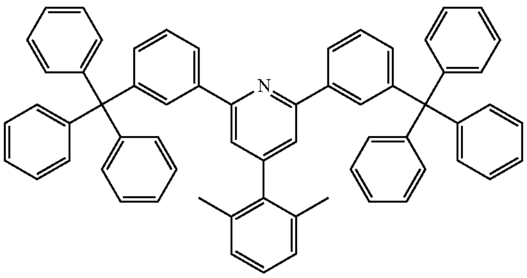
ETH38
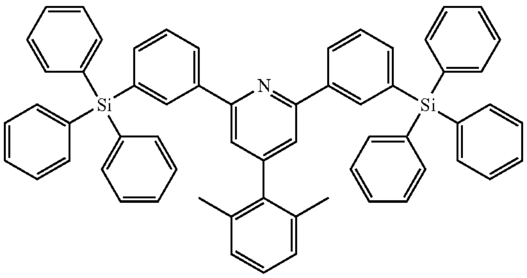
ETH39
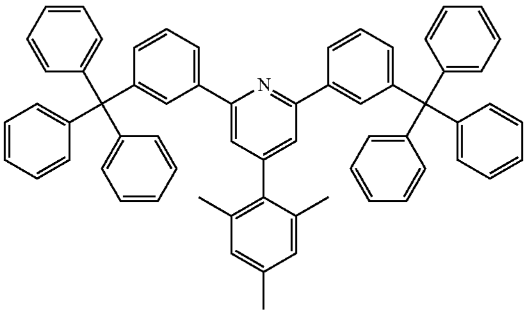
ETH40
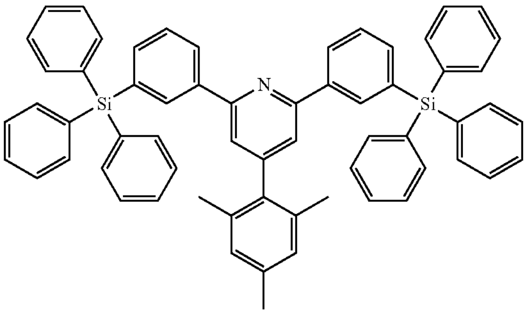
-continued
ETH41
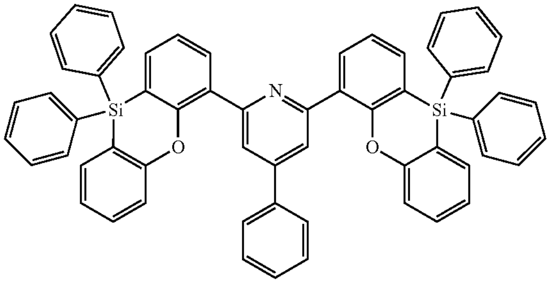
ETH42
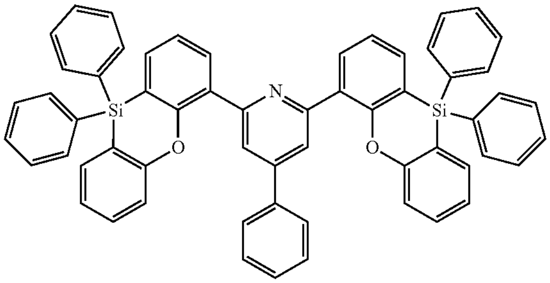
ETH43
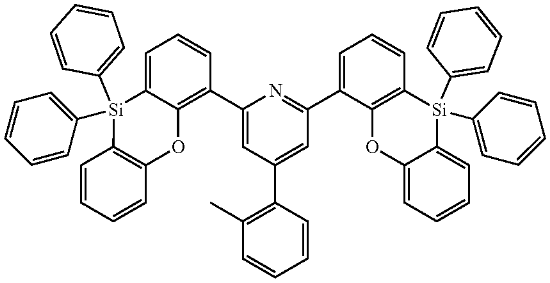
ETH44
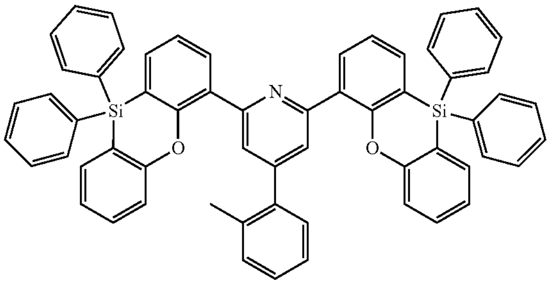
ETH45
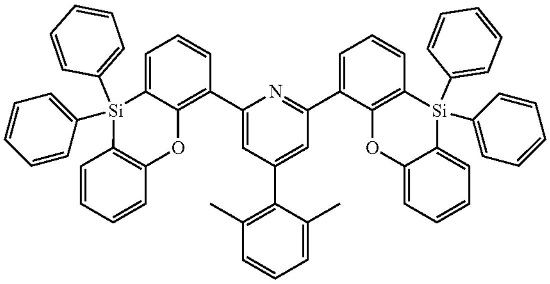

-continued
ETH46
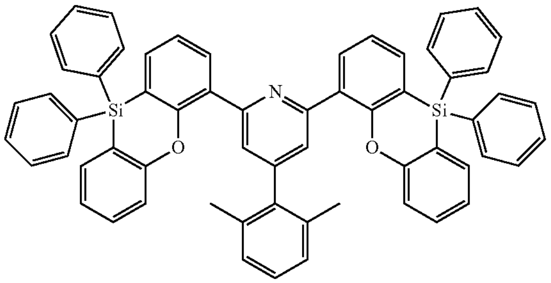
ETH47
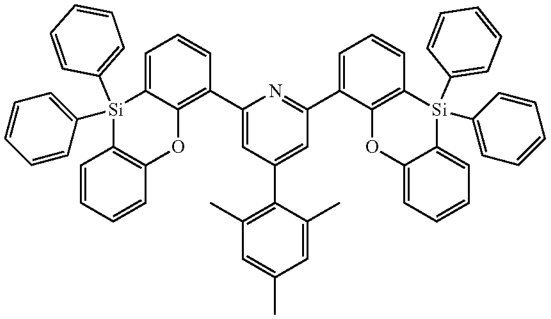
ETH48
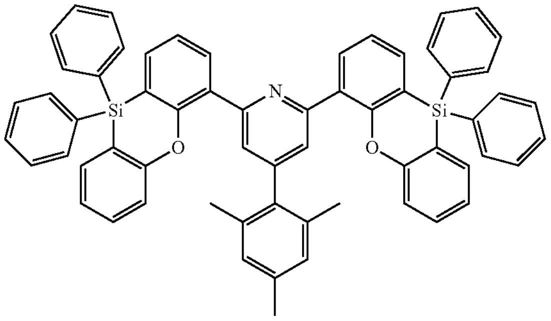
ETH49
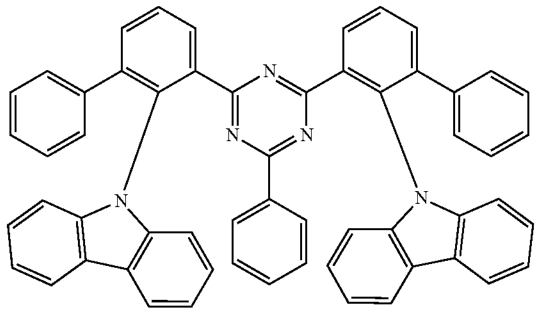
-continued
ETH50
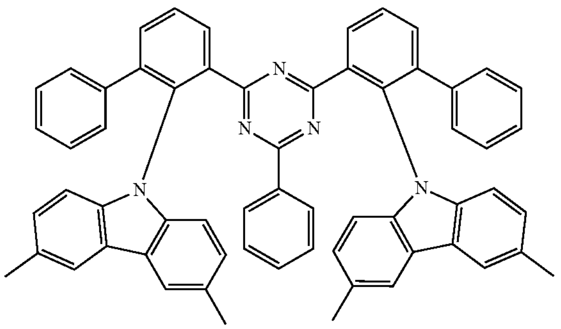
ETH51
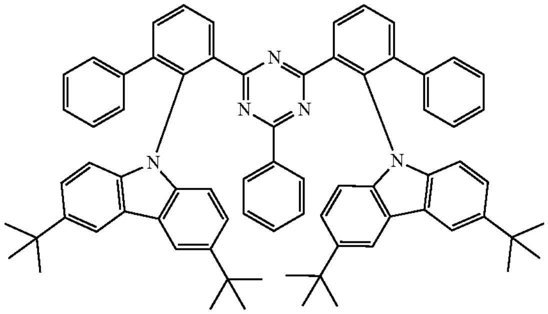
ETH52
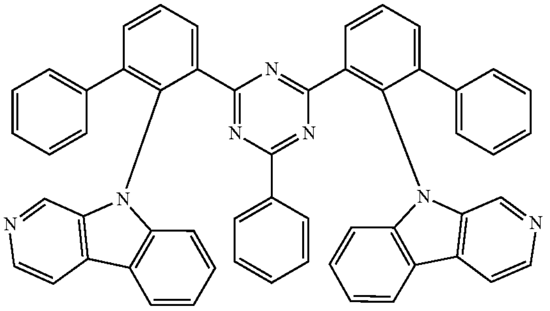
ETH53
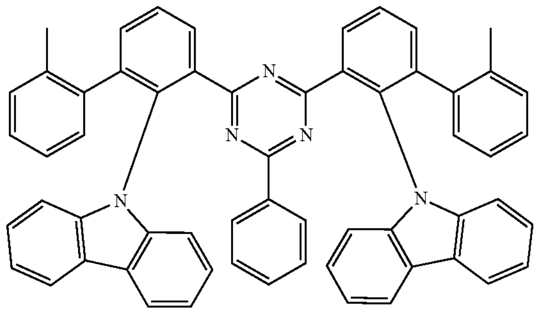

-continued
ETH54
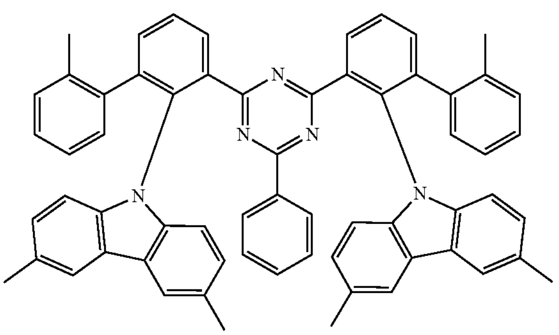
ETH55
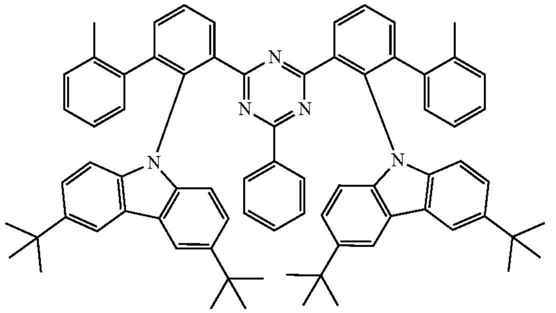
ETH56
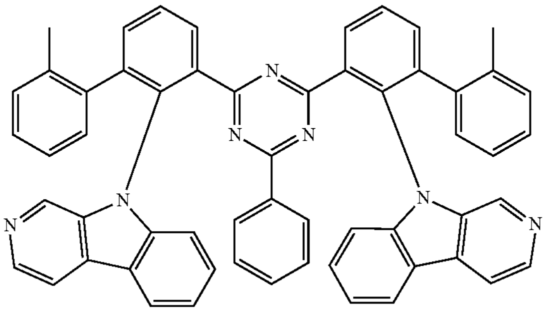
ETH57
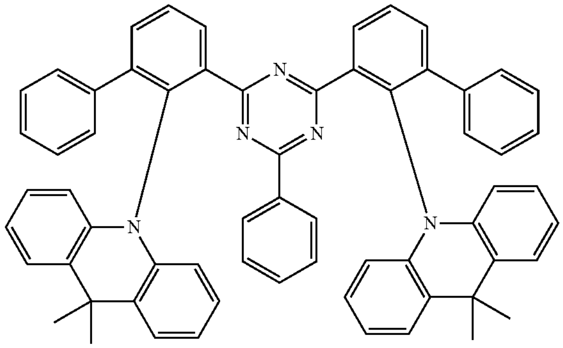
-continued
ETH58
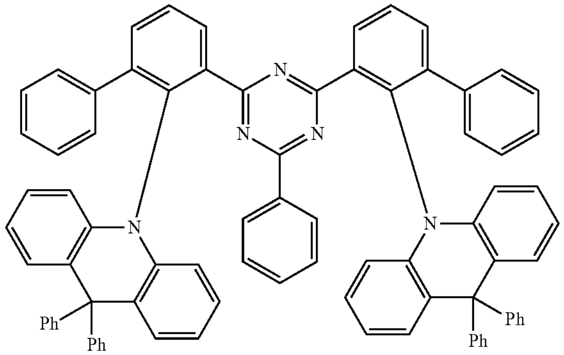
ETH59
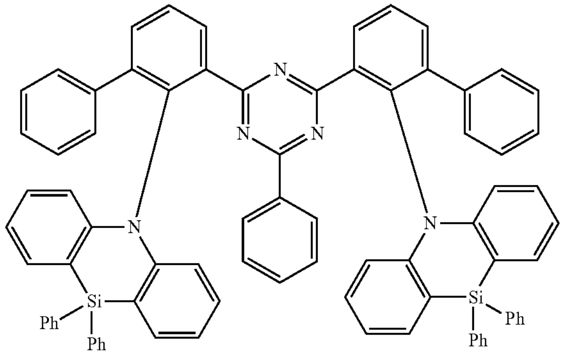
ETH60
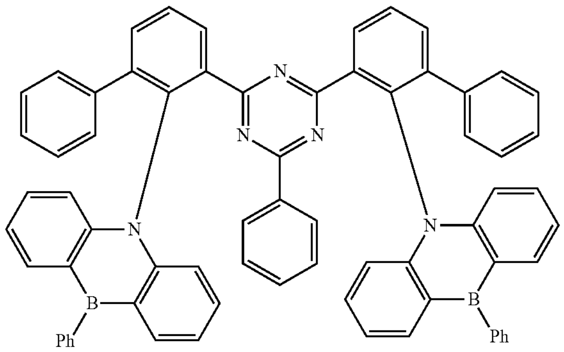
ETH61
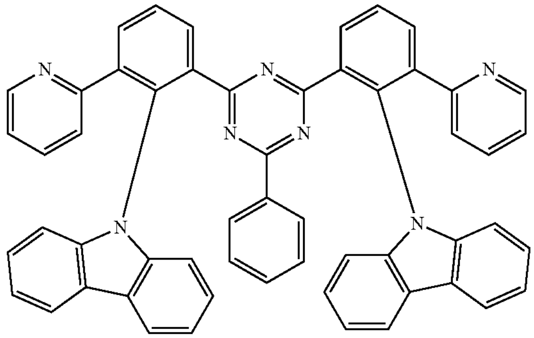

-continued
ETH62
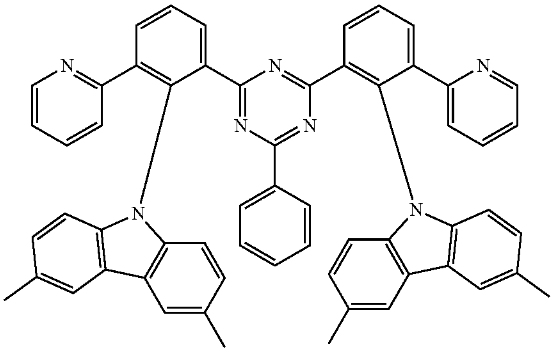
ETH63
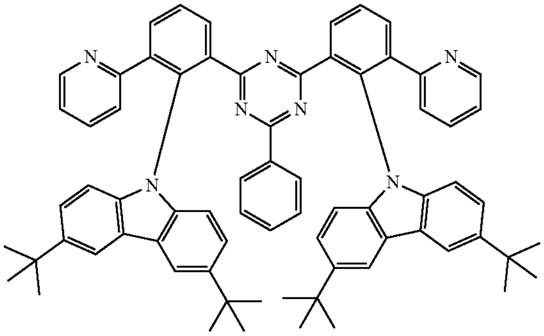
ETH64
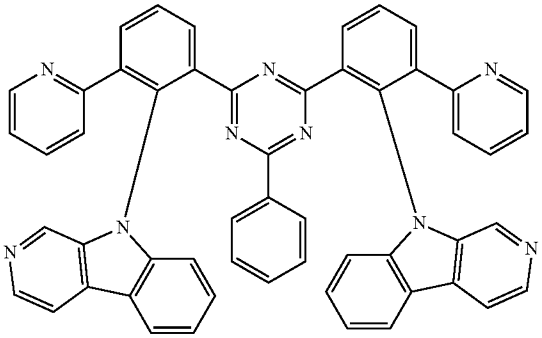
ETH65
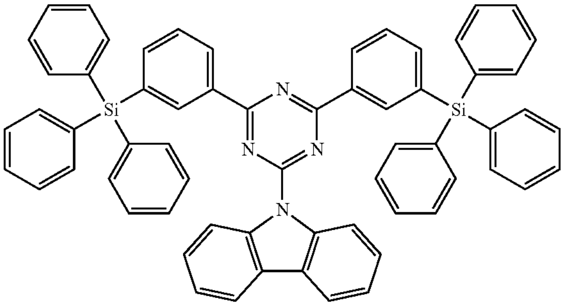
-continued
ETH66
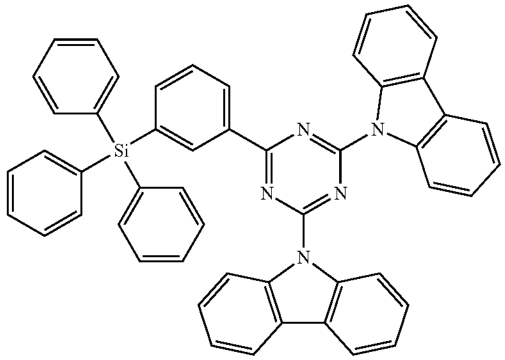
ETH67
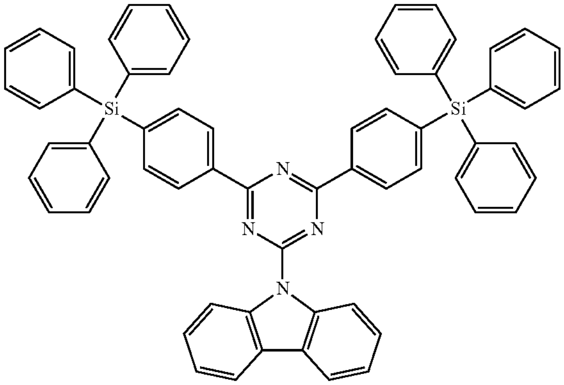
ETH68
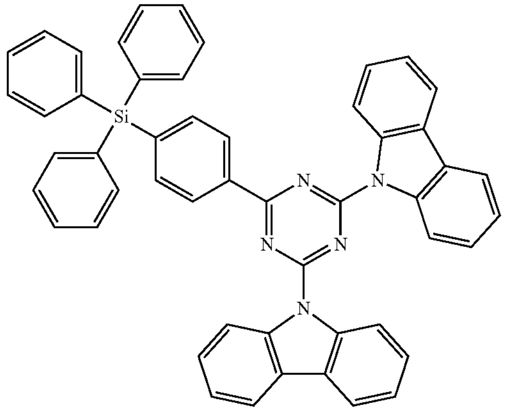
ETH69
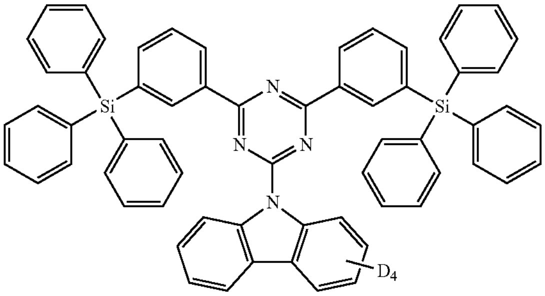

ETH70
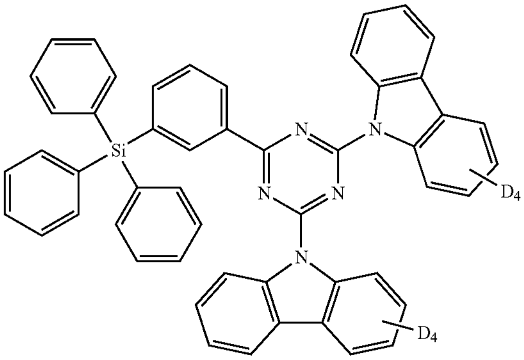
ETH71
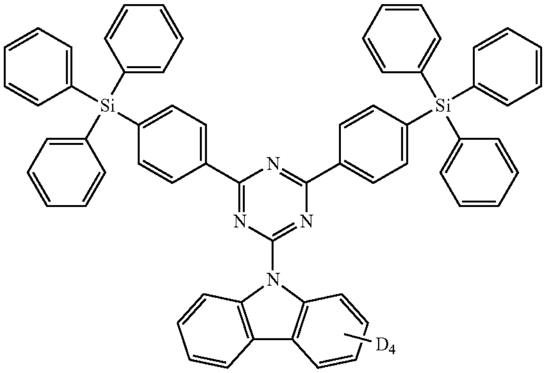
ETH72
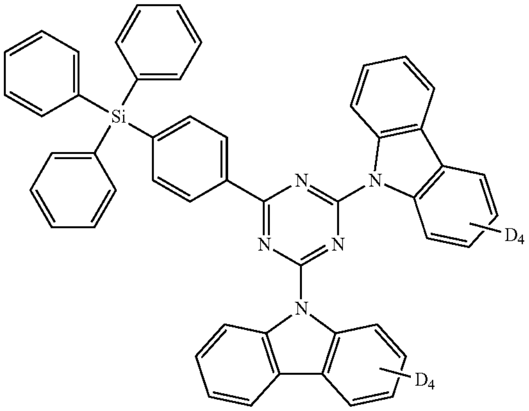
ETH73
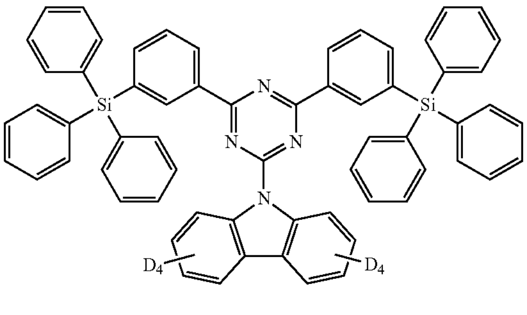
ETH74
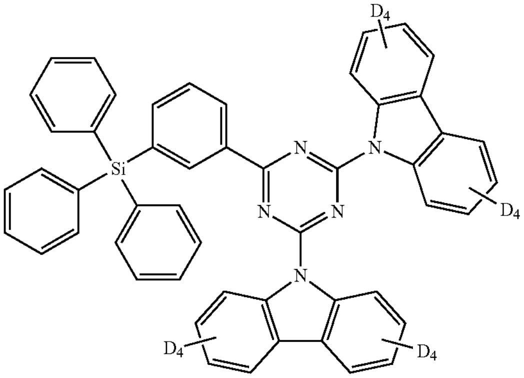
ETH75
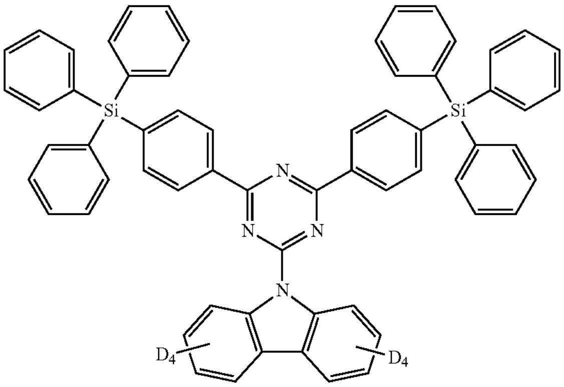
ETH76
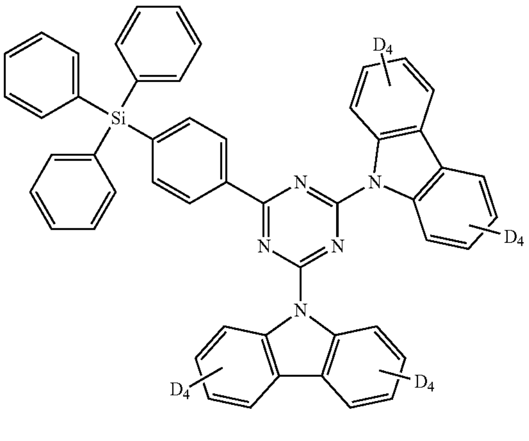

-continued
ETH77
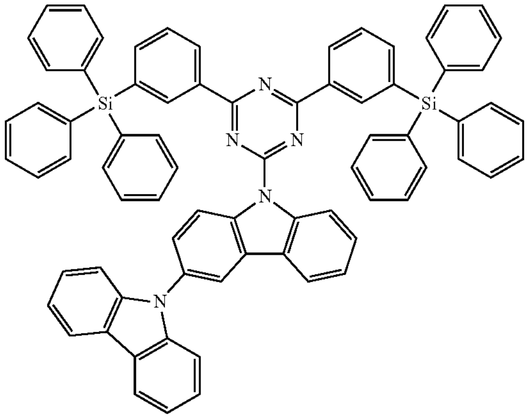
ETH78
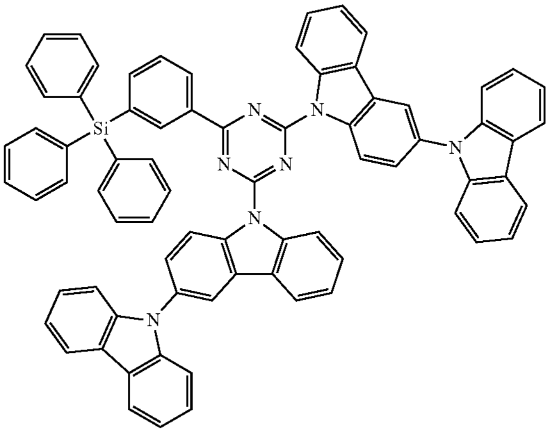
ETH79
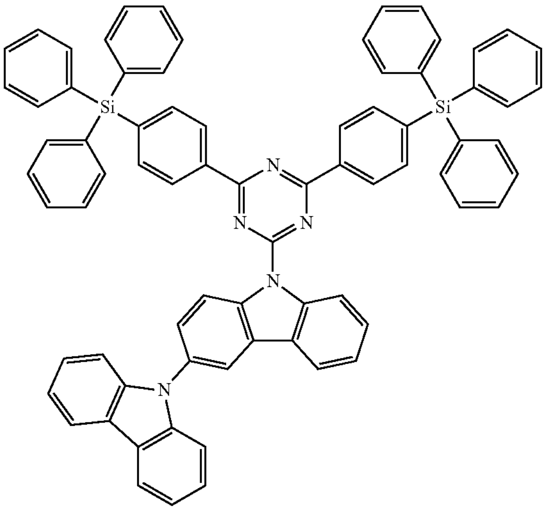
-continued
ETH80
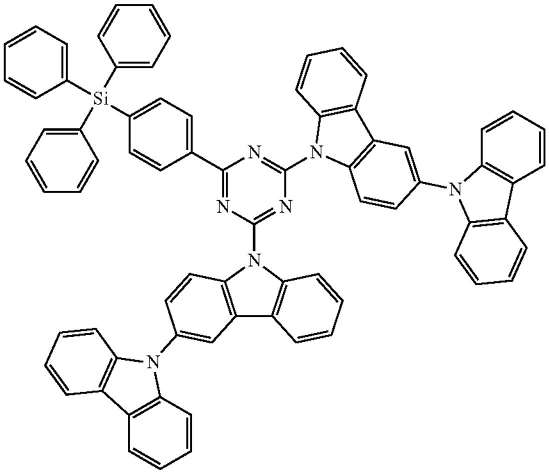
ETH81
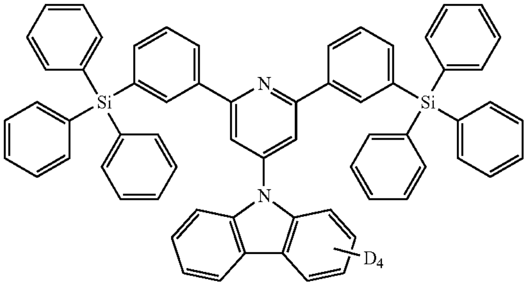
ETH82
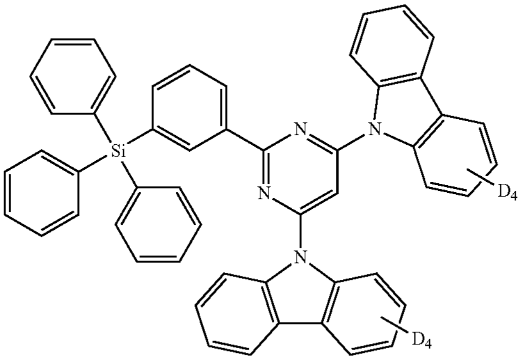
ETH83
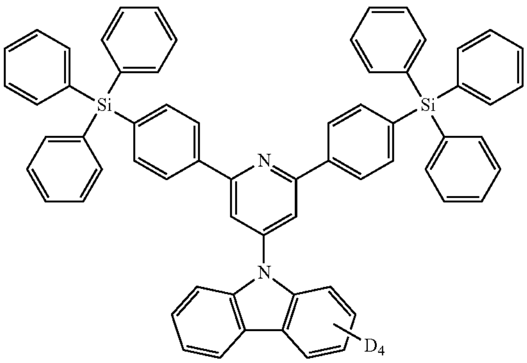

-continued

ETH84

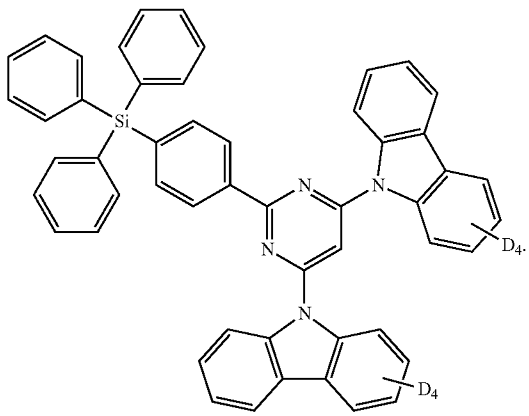

In the light-emitting device according to an embodiment, a ratio of an amount of the second compound may be greater than or equal to a ratio of an amount of the third compound, with respect to a total weight of the emission layer.

A ratio of an amount of the second compound to an amount of the third compound may be in a range of about 7:3 to about 6:4.

In the light-emitting device according to an embodiment, the emission layer may further include a fourth compound, and the fourth compound may emit delayed fluorescence.

In the light-emitting device according to an embodiment, the second compound, the third compound, and the fourth compound may be different from one another.

In the light-emitting device according to an embodiment, the emission layer may emit blue light, and the blue light may emit light having a maximum emission wavelength of about 400 nm to about 500 nm.

In the light-emitting device according to an embodiment, the first electrode may be an anode, the second electrode may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or one or more combinations thereof, and the electron transport region may include a hole blocking layer, an electron transport layer, an electron injection layer, or one or more combinations thereof.

The light-emitting device according to an embodiment may further include a first capping layer or a second capping layer, the first capping layer may be on one surface of the first electrode, and the second capping layer may be on one surface of the second electrode.

In the light-emitting device according to an embodiment, at least one of the first capping layer or the second capping layer may include the organometallic compound represented by Formula 1.

According to one or more embodiments of the disclosure, provided is an electronic apparatus including the light-emitting device according to one of embodiments.

The electronic apparatus according to an embodiment may further include a thin-film transistor, wherein the thin-film transistor may include a source electrode and a drain electrode, and the first electrode of the light-emitting device may be electrically connected to the source electrode or the drain electrode of the thin-film transistor.

The electronic apparatus according to an embodiment may further include a color filter, a quantum dot color conversion layer, a touch screen layer, a polarizing layer, or one or more combinations thereof.

According to one or more embodiments of the disclosure, provided is an organometallic compound represented by Formula 1.

Formula 1

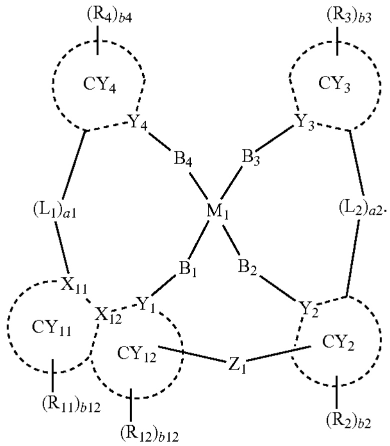

In Formula 1, $M_1$ may be platinum (Pt), palladium (Pd), copper (Cu), silver (Ag), gold (Au), rhodium (Rh), iridium (Ir), ruthenium (Ru), or osmium (Os), rings $CY_{11}$, $CY_{12}$, $CY_2$, $CY_3$, and $CY_4$ may each independently be a $C_5$-$C_{60}$ carbocyclic group or a $C_1$-$C_{60}$ heterocyclic group, ring $CY_{11}$ might be non-aromatic, ring $CY_{12}$ might be aromatic, $Y_1$, $Y_2$, $Y_3$, $Y_4$, $X_{11}$, and $X_{12}$ may each independently be selected from a carbon atom (C) and a nitrogen atom (N), $Y_1$ and $X_{12}$ may directly be linked to each other via a chemical bond, $X_{11}$ and $X_{12}$ may directly be linked to each other via a chemical bond, $X_{12}$ may be a bridgehead atom, $B_1$ to $B_4$ may each independently be a single bond, an oxygen atom (O), a sulfur atom (S), $N(R_{11a})$, or $C(R_{11a})(R_{12a})$, $Z_1$ may be a single bond, an oxygen atom (O), a sulfur atom (S), $B(R_{13})$, $N(R_{13})$, $P(R_{13})$, $C(R_{13})(R_{14})$, $Si(R_{13})(R_{14})$, or $P(R_{13})(R_{14})$, $R_{13}$ and $R_{14}$ may be optionally linked to each other to form a $C_5$-$C_{60}$ carbocyclic group that is unsubstituted or substituted with $R_{10a}$ or a $C_1$-$C_{60}$ heterocyclic group that is unsubstituted or substituted with $R_{10a}$, $L_1$ and $L_2$ may each independently be *—O—*', *—S—*', *—C($R_{15}$)($R_{16}$)—*', *—C($R_{15}$)=*', *=C($R_{15}$)—*', *—C($R_{15}$)=C($R_{16}$)—*', *—C(=O)—*',

*—C(═S)—*', *—C≡C—*', *—B($R_{15}$)—*', *—N($R_{15}$)—*', *—P($R_{15}$)—*', *—Si($R_{15}$)($R_{16}$)—*', *—P($R_{15}$)($R_{16}$)—*', or *—Ge($R_{15}$)($R_{16}$)—*', a1 and a2 may each independently be an integer from 0 to 3, when a1 is 0, a group represented by *-$(L_1)_{a1}$-*' may be a single bond, when a2 is 0, a group represented by *-$(L_2)_{a2}$-*' may be a single bond, $R_{11}$, $R_{12}$, $R_2$, $R_3$, $R_4$, $R_{11a}$, $R_{12a}$, $R_{13}$, $R_{14}$, $R_{15}$, $R_{16}$, and $R_{10a}$ may each independently be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or one or more combinations thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or one or more combinations thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or one or more combinations thereof, b11, b12, b2, b3, and b4 may each independently be an integer from 0 to 8, and

* and *' may each indicate a binding site to a neighboring atom.

In the organometallic compound according to an embodiment, ring $CY_3$ and ring $CY_4$ may be the same group.

In the organometallic compound according to an embodiment, ring $CY_3$ and ring $CY_4$ may be different groups.

In the organometallic compound according to an embodiment, ring $CY_3$ and $CY_4$ may each independently be a benzene group, a pyridine group, a pyridazine group, a pyrimidine group, a pyrazine group, a triazine group, a cyclopentadiene group, a pyrrole group, a pyrazole group, an imidazole group, or a triazole group.

In formula 1, a moiety represented by

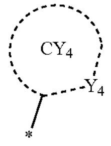

may be a moiety represented by

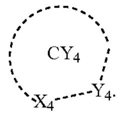

In formula 1, a moiety represented by

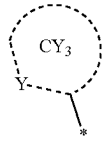

may be a moiety represented by

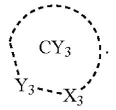

In the organometallic compound according to an embodiment, in Formula 1, a moiety represented by

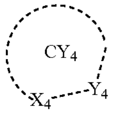

or a moiety represented by

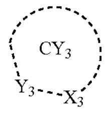

may each independently be one of groups represented by Formulae 1-2-1 to 1-2-35.

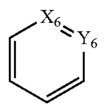

1-2-1

-continued
1-2-2
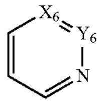
1-2-3
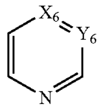
1-2-4
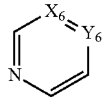
1-2-5
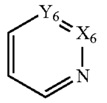
1-2-6
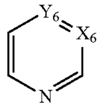
1-2-7
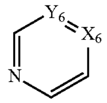
1-2-8
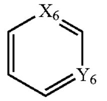
1-2-9
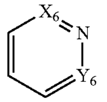
1-2-10
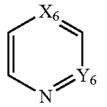
1-2-11
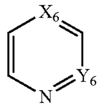
1-2-12
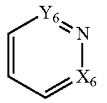
1-2-13
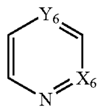
1-2-14
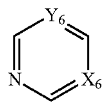
1-2-15
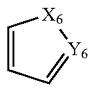
-continued
1-2-16
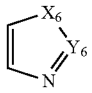
1-2-17
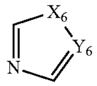
1-2-18
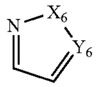
1-2-19
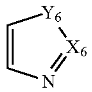
1-2-20
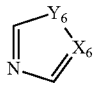
1-2-21
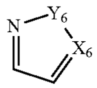
1-2-22
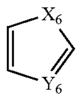
1-2-23
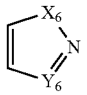
1-2-24
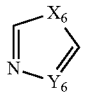
1-2-25
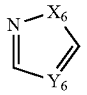
1-2-26
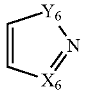
1-2-27
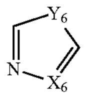
1-2-28
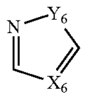
1-2-29
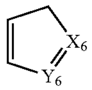
1-2-30
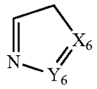

-continued 1-2-31

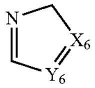

1-2-32

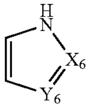

1-2-33

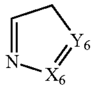

1-2-34

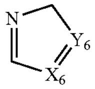

1-2-35

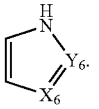

In Formulae 1-2-1 to 1-2-35, $X_6$ may be $X_3$ or $X_4$, when $X_6$ is $X_3$, $Y_6$ may be $Y_3$, and when $X_6$ is $X_4$, $Y_6$ may be $Y_4$.

In the organometallic compound according to an embodiment, ring $CY_{11}$ may be a cyclopentane group, a cyclopentene group, a cyclopentadiene group, a cyclohexane group, a cyclohexene group, a cyclohexadiene group, a cycloheptane group, a cycloheptene group, a cycloheptadiene group, a cycloheptatriene group, an azepane group, a pyrrolidine group, an imidazolidine group, a dihydropyrrole group, a dihydroimidazole group, a piperidine group, a tetrahydropyridine group, a dihydropyridine group, a hexahydropyrimidine group, a dihydropyrimidine group, a piperazine group, a tetrahydropyrazine group, a dihydropyrazine group, a tetrahydroazepine group, or a dihydroazepine group, and ring $CY_{12}$ may be a benzene group, a pyrrole group, a pyridine group, a pyridazine group, a pyrimidine group, a pyrazine group, an azepine group, a diazepine group, an oxepine group, a dioxazepine group, a thiepine group, or a thiazepine group.

In the organometallic compound according to an embodiment, in Formula 1, a moiety represented by

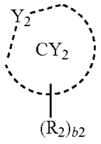

may be a group represented by Formula 1-1.

Formula 1-1

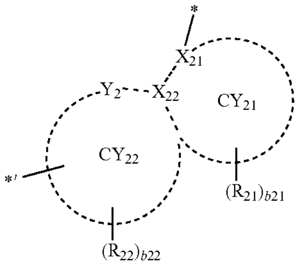

In Formula 1-1, rings $CY_{21}$ and $CY_{22}$ may each independently be a $C_5$-$C_{60}$ carbocyclic group or a $C_1$-$C_{60}$ heterocyclic group, ring $CY_{21}$ might be non-aromatic, ring $CY_{22}$ might be aromatic, $X_{21}$ and $X_{22}$ may each independently be selected from a carbon atom (C) and a nitrogen atom (N), $Y_2$ and $X_{22}$ may directly be linked to each other via a chemical bond, $X_{21}$ and $X_{22}$ may directly be linked to each other via a chemical bond, $X_{22}$ may be a bridgehead atom,

* indicates a binding site to $L_2$,

*' indicates a binding site to $Z_1$, $R_{21}$ and $R_{22}$ are respectively the same as described in connection with $R_2$ in Formula 1, and b21 and b22 are respectively the same as described in connection with b2 in Formula 1.

In the organometallic compound according to an embodiment, ring $CY_{11}$ and ring $CY_{21}$ may be the same group.

In the organometallic compound according to an embodiment, ring $CY_{11}$ and ring $CY_{21}$ may be different groups.

In the organometallic compound according to an embodiment, ring $CY_{12}$ and ring $CY_{22}$ may be the same group.

In the organometallic compound according to an embodiment, ring $CY_{12}$ and ring $CY_{22}$ may be different groups.

In the organometallic compound according to an embodiment, ring $CY_{21}$ may be a cyclopentane group, a cyclopentene group, a cyclopentadiene group, a cyclohexane group, a cyclohexene group, a cyclohexadiene group, a cycloheptane group, a cycloheptene group, a cycloheptadiene group, a cycloheptatriene group, an azepane group, a pyrrolidine group, an imidazolidine group, a dihydropyrrole group, a dihydroimidazole group, a piperidine group, a tetrahydropyridine group, a dihydropyridine group, a hexahydropyrimidine group, a dihydropyrimidine group, a piperazine group, a tetrahydropyrazine group, a dihydropyrazine group, a tetrahydroazepine group, or a dihydroazepine group, and ring $CY_{22}$ may be a benzene group, a pyrrole group, a pyridine group, a pyridazine group, a pyrimidine group, a pyrazine group, an azepine group, a diazepine group, an oxepine group, a dioxazepine group, a thiepine group, or a thiazepine group.

In the organometallic compound according to an embodiment, a moiety represented by

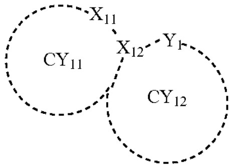

in Formula 1 or a moiety represented by

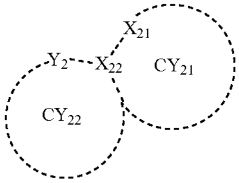

in Formula 1-1 may each independently be one of groups represented by Formulae 1-1-1 to 1-1-12.

1-1-1

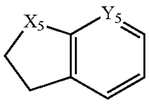

1-1-2

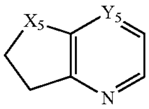

1-1-3

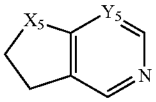

1-1-4

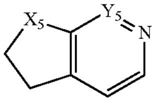

1-1-5

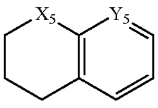

1-1-6

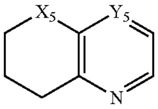

1-1-7

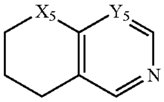

1-1-8

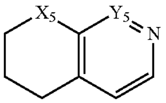

-continued 1-1-9

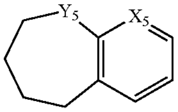

1-1-10

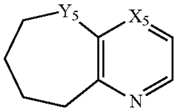

1-1-11

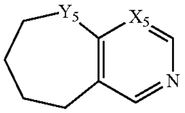

1-1-12

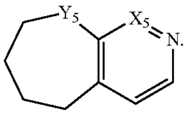

In Formulae 1-1-1 to 1-1-12, $X_5$ may be $X_{11}$ or $X_{21}$, when $X_5$ is $X_{11}$, $Y_5$ may be $Y_1$, and when $X_5$ is $X_{21}$, $Y_5$ may be $Y_2$.

In the organometallic compound according to an embodiment, two of $Y_1$ to $Y_4$ may each be a nitrogen atom (N) and may satisfy one of conditions of 1) to 4).

1) $Y_1$ and $Y_2$ are each a nitrogen atom (N).

2) $Y_3$ and $Y_4$ are each a nitrogen atom (N).

3) $Y_1$ and $Y_3$ are each a nitrogen atom (N).

4) $Y_2$ and $Y_4$ are each a nitrogen atom (N).

In the organometallic compound according to an embodiment, a1 and a2 may each be 0, and $B_1$ to $B_4$ may each be a single bond.

In the organometallic compound according to an embodiment, $Z_1$ may be $C(R_{11})(R_{12})$, and $C(R_{11})(R_{12})$ may be $C(CH_3)_2$ or a group represented by 1-3-1.

1-3-1

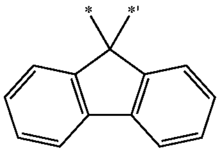

In Formula 1-3-1,

* and *' each indicate a binding site to a neighboring atom.

In the organometallic compound according to an embodiment, $R_1$ to $R_4$ may each independently be:

—F, —Cl, —Br, —I, a hydroxyl group, a cyano group, a nitro group; or one of a methyl group, an ethyl group, a propyl group, an iso-propyl group, a butyl group, an isobutyl group, a sec-butyl group, a tert-butyl group, a pentyl group, an isopentyl group, a sec-pentyl group, a tert-pentyl group, a neopentyl group, a 1-phenylpropyl group, a 2-phenylpropyl group, a 1-phenylbutyl group, a 2-phenylbutyl group, a 1-phenylpentyl group, a 2-phenylpentyl, a 3-phenylpentyl group, a 1-cyclohexylpropyl group, a 2-cyclohexylpropyl group, a 1-cyclohexylbutyl group, a 2-cyclohexylbutyl group, a 1-cyclohexylpentyl group, a 2-cyclohexylpentyl group, a 3-cyclohexylpentyl group, or one of deuterated derivative groups thereof.

In the organometallic compound according to an embodiment, the deuterated derivative group may include $—CD_3$, $—CD_2H$, $—CDH_2$, $—C(CD_3)_3$, $—C(CD_3)_2H$, $—C(CD_3)_2D$, $—C(CD_3)(H)_2$, $—C(CD_3)(H)(D)$, $—C(CD_3)(D)_2$, $—C(CD_3)_2(CH_3)$, $—C(CD_3)(CH_3)_2$, $—C(CD_3)_2(CD_2H)$, $—C(CD_3)(CD_2H)_2$, $—C(CD_3)_2(CDH_2)$, $—C(CD_3)(CDH_2)_2$, $—C(CD_3)(CD_2H)(CDH_2)$, a phenyl-$d_1$-group, a phenyl-$d_2$-group, a phenyl-$d_3$-group, a phenyl-$d_4$-group, and/or a phenyl-$d_5$-group.

The organometallic compound according to an embodiment may be represented by Formulae BD1 to BD105.

BD1

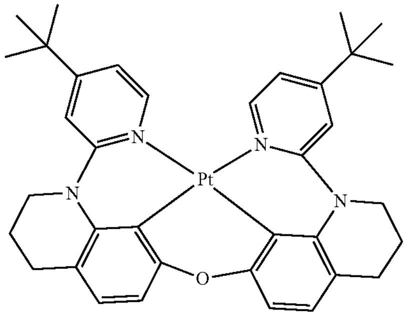

BD2

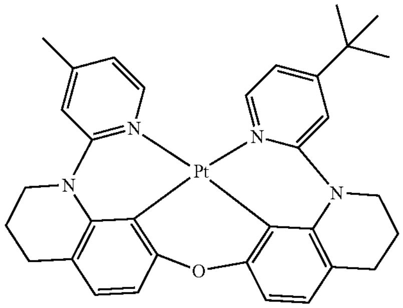

BD3

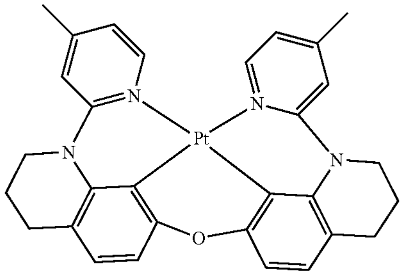

-continued

BD4

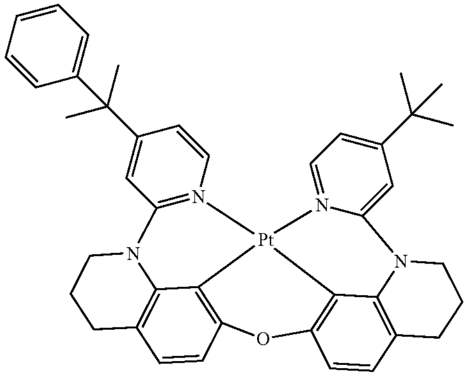

BD5

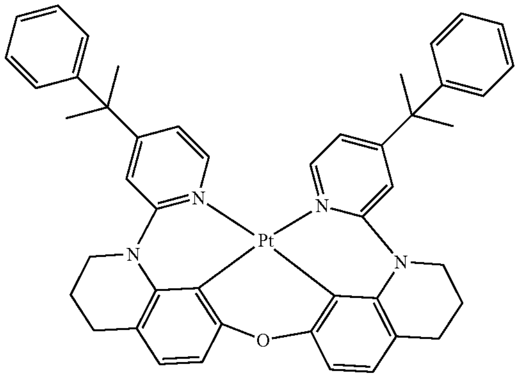

BD6

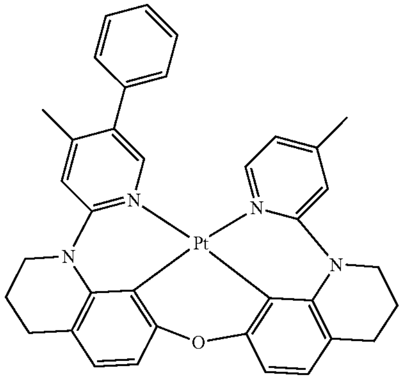

BD7

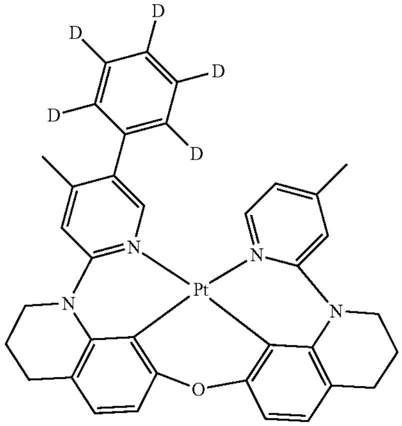

-continued
BD8
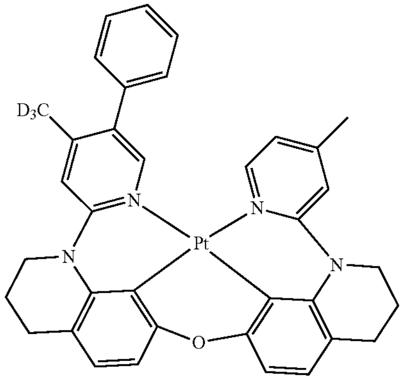
BD9
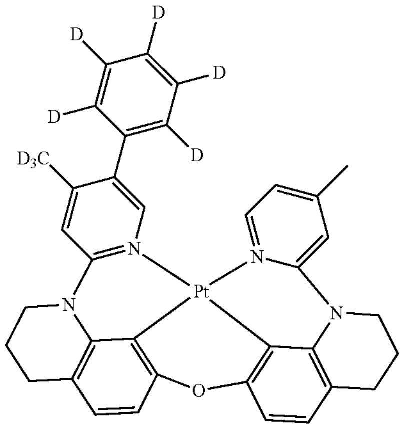
BD10
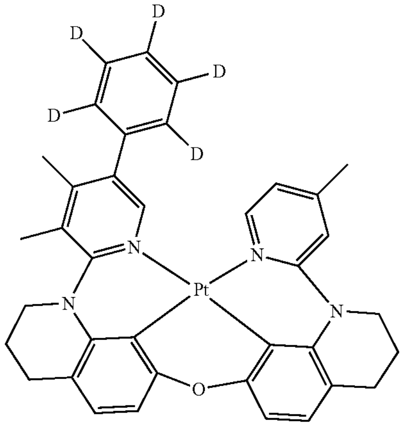
BD11
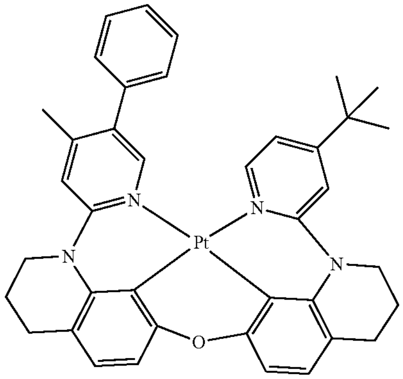
-continued
BD12
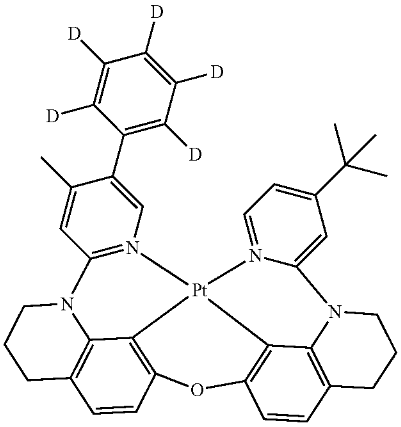
BD13
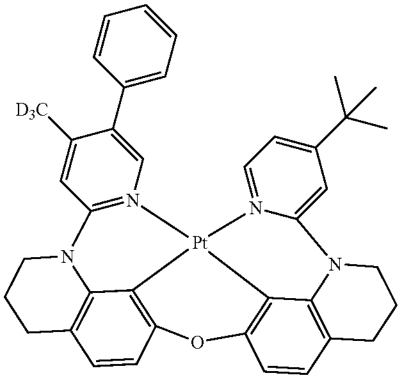
BD14
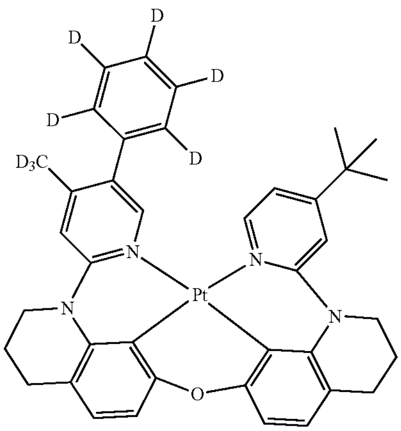

BD15
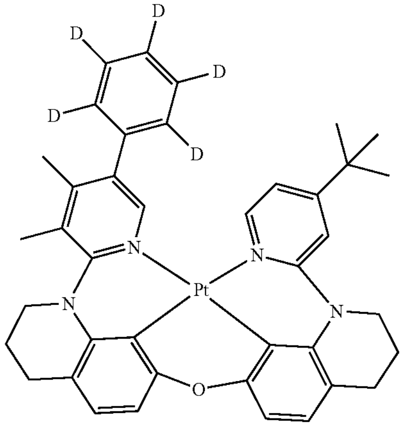
BD16
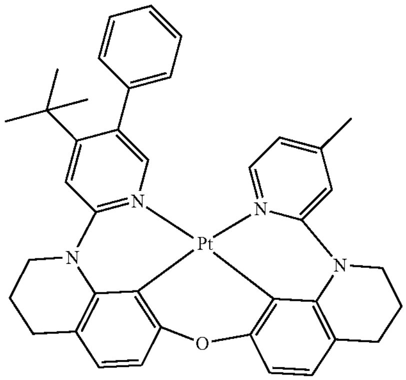
BD17
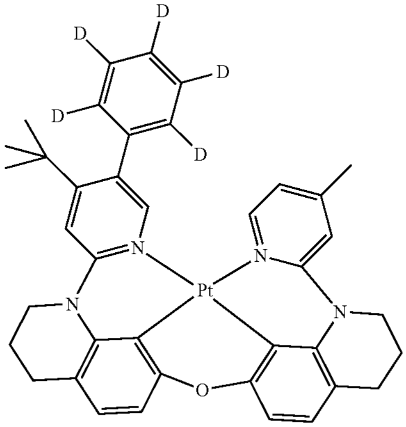
BD18
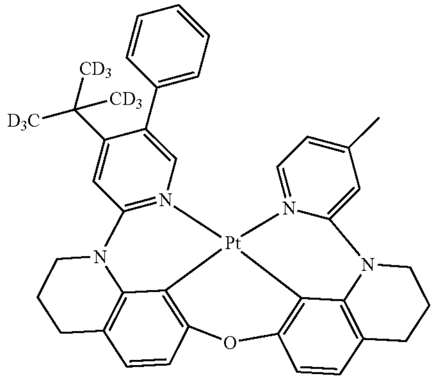
BD19
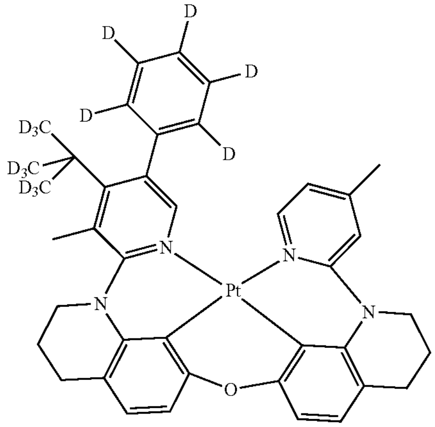
BD20
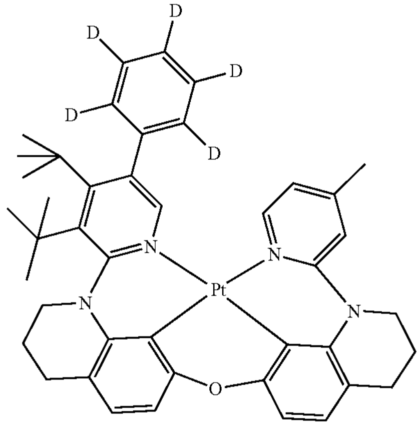
BD21
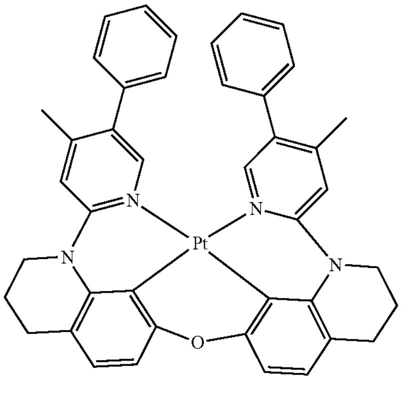

-continued
BD22
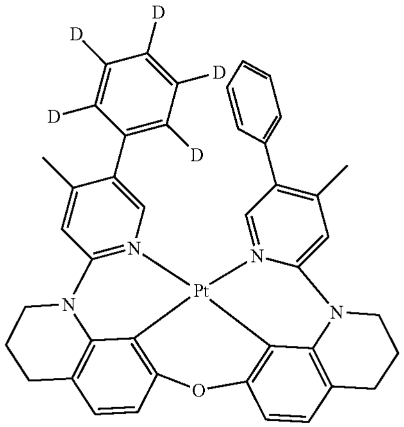
BD23
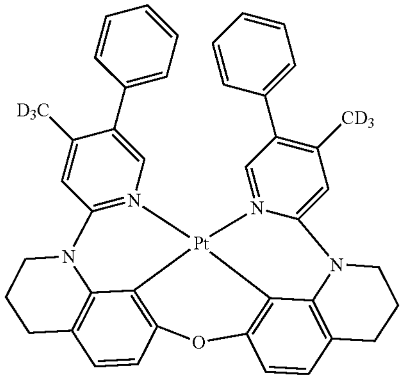
BD24
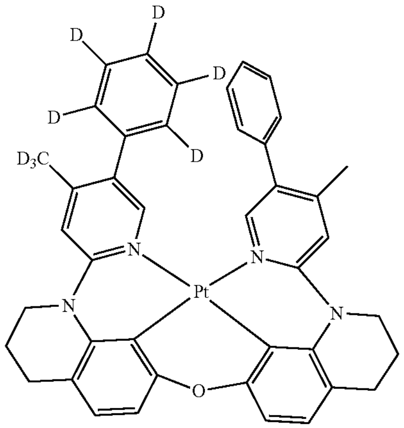
-continued
BD25
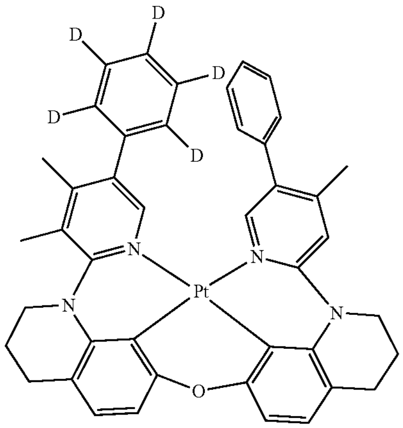
BD26
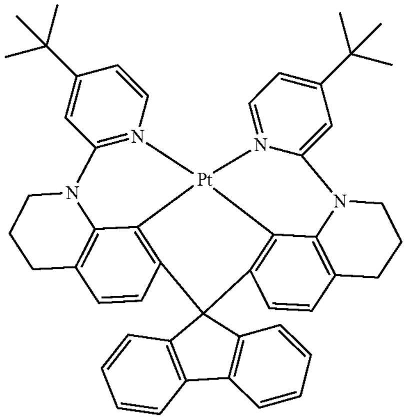
BD27
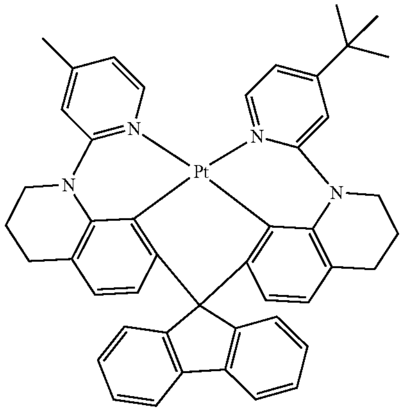
BD28
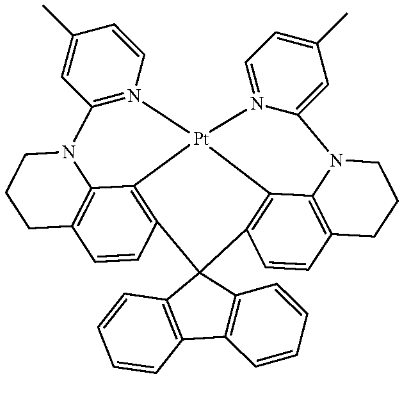

-continued
BD29
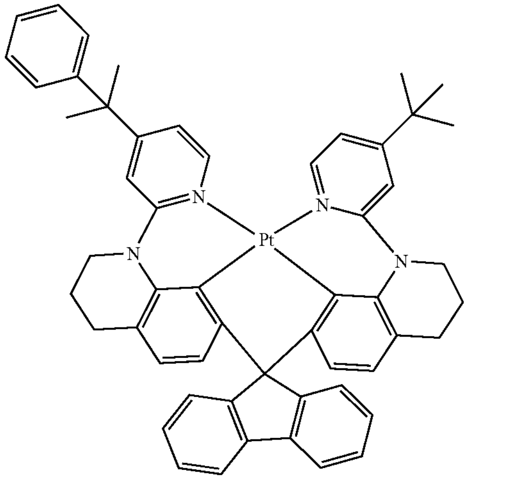
BD30
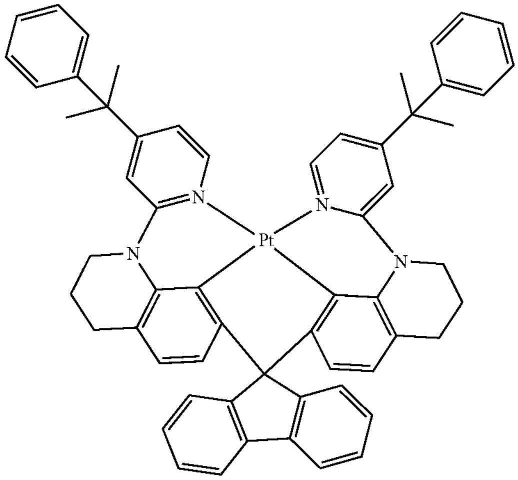
BD31
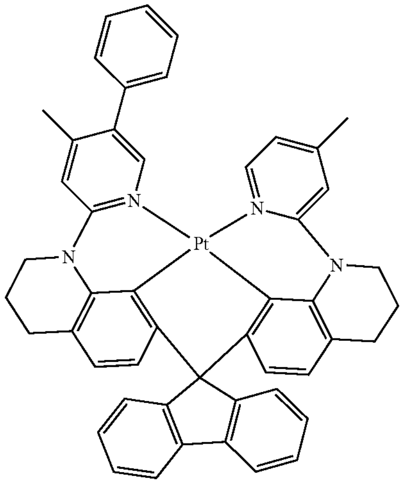
-continued
BD32
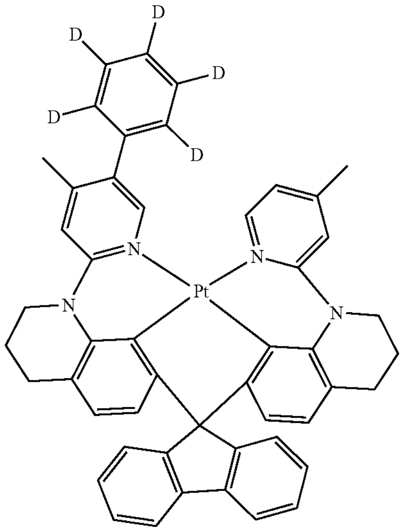
BD33
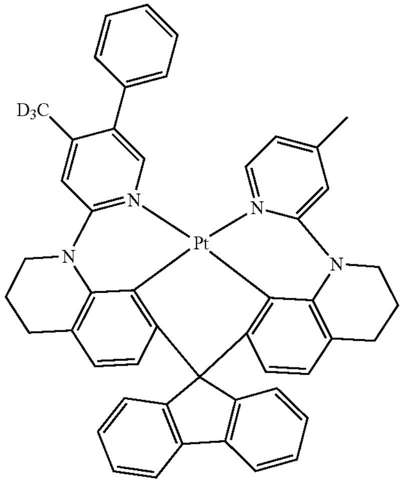
BD34
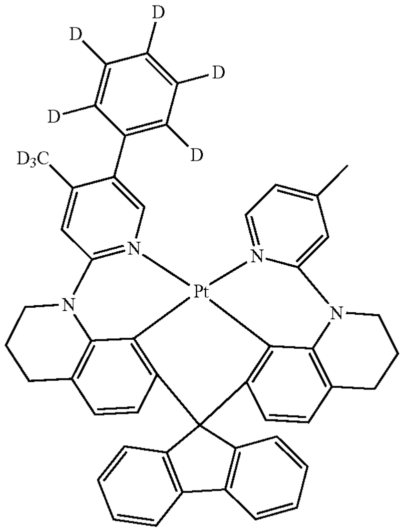

-continued
BD35
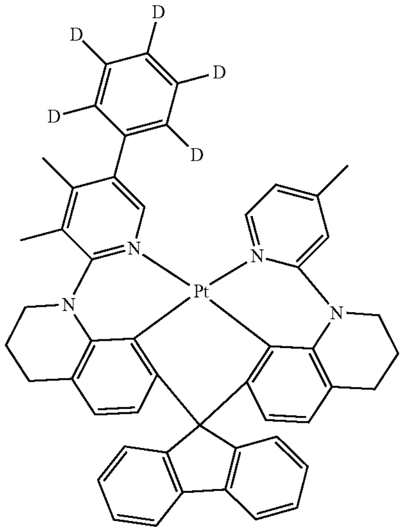
BD36
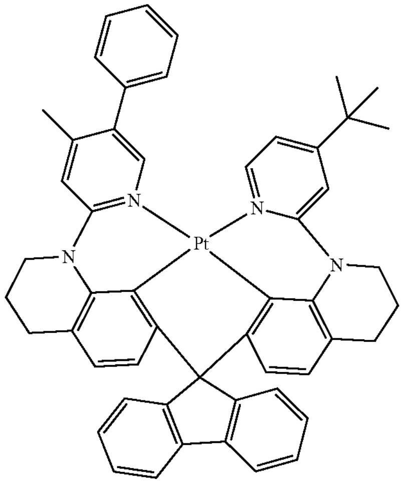
BD37
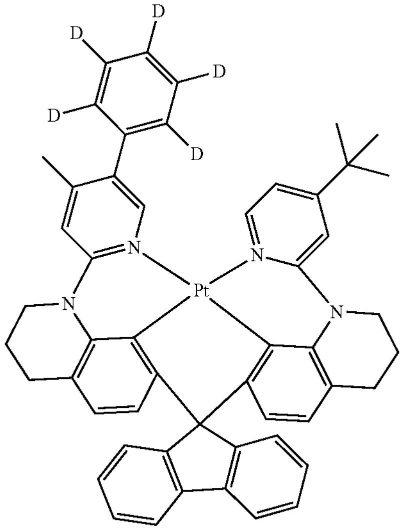
-continued
BD38
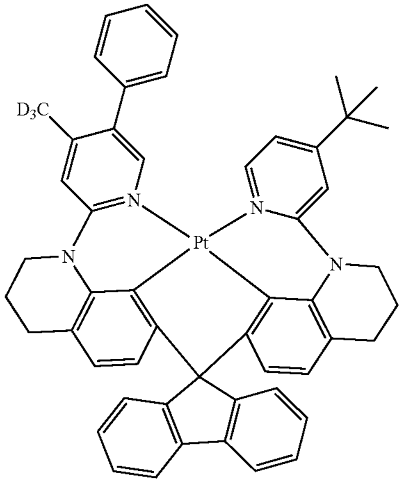
BD39
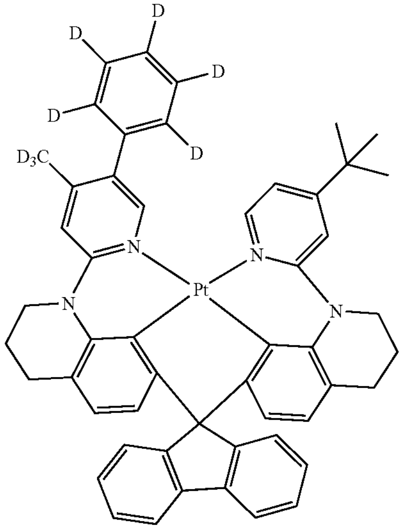
BD40
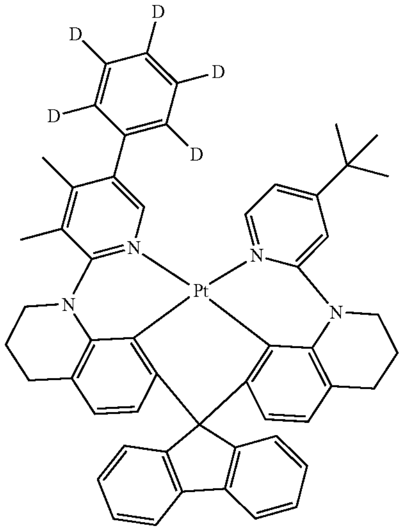

-continued
BD41
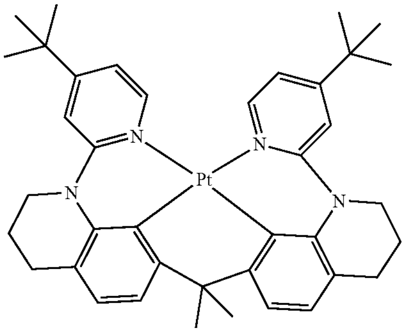
BD42
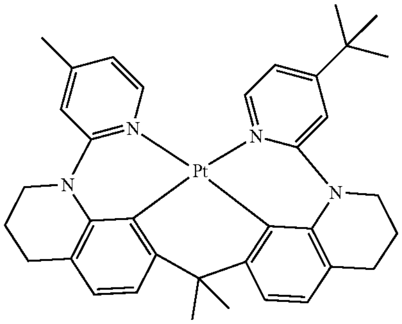
BD43
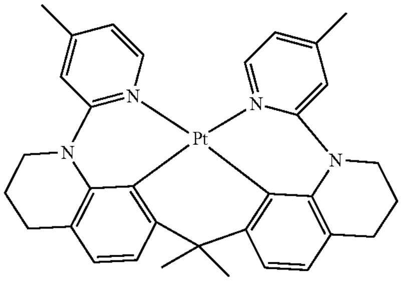
BD44
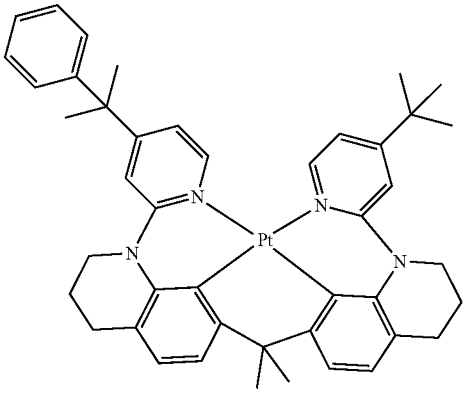
-continued
BD45
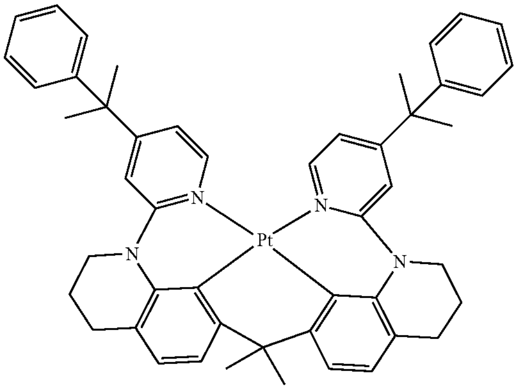
BD46
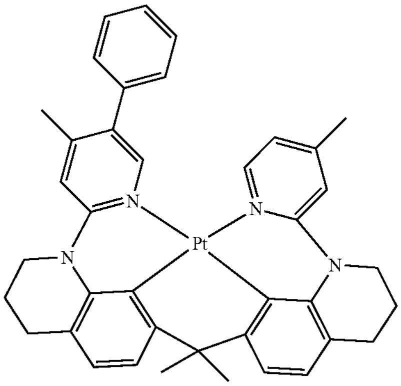
BD47
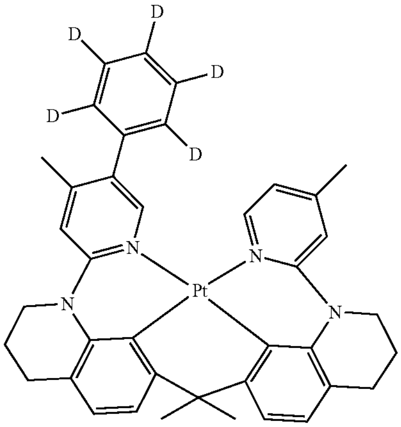
BD48
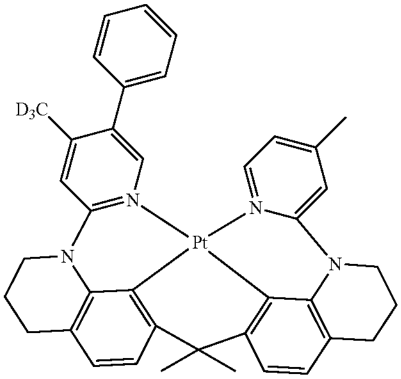

-continued
BD49
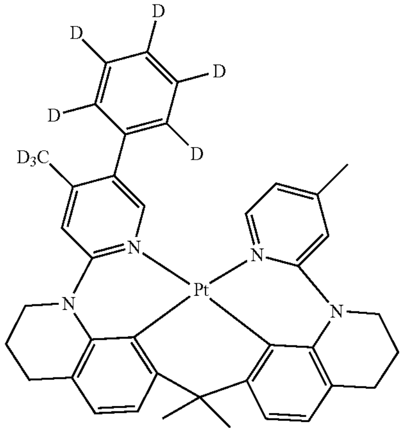
BD50
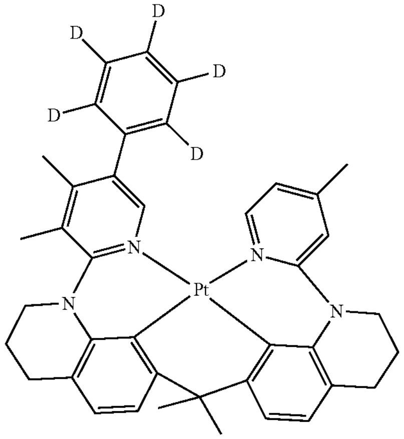
BD51
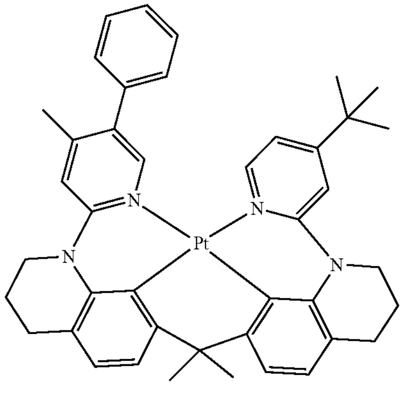
-continued
BD52
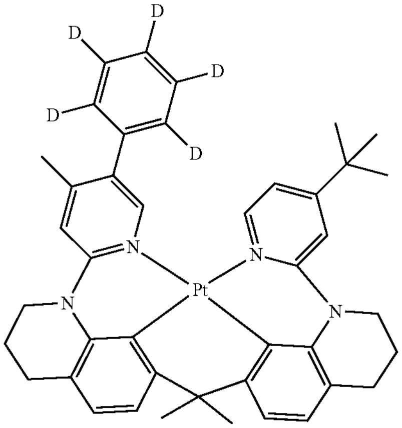
BD53
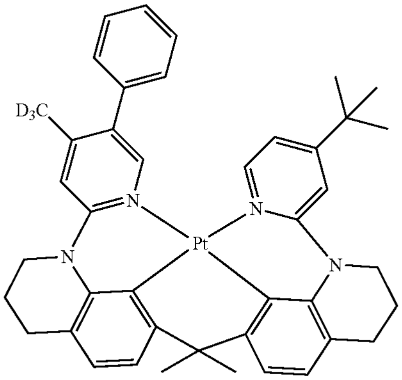
BD54
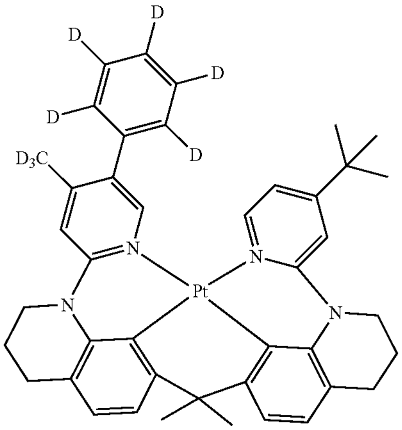

BD55
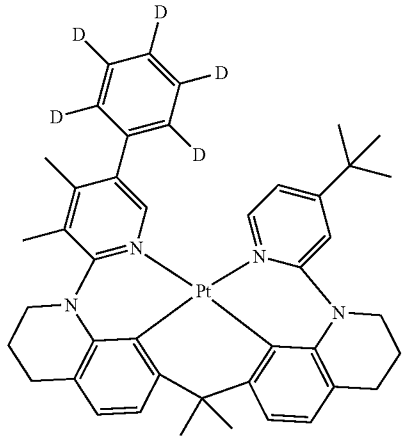
BD56
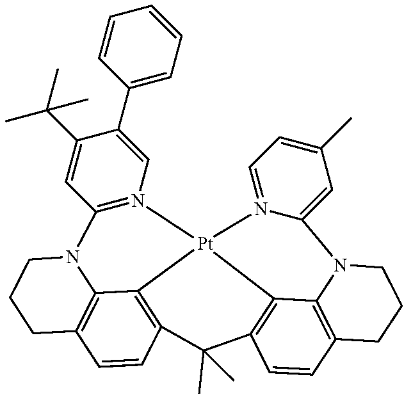
BD57
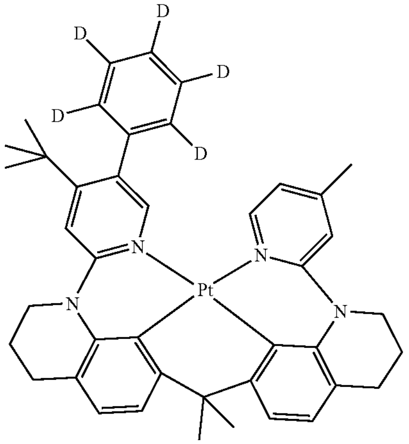
BD58
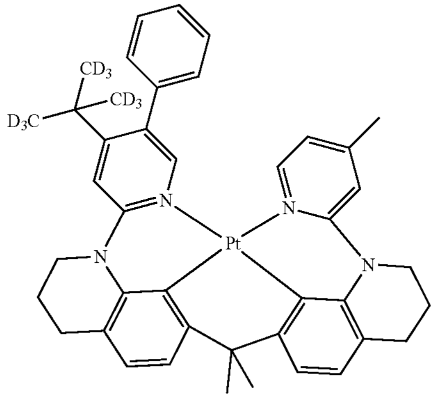
BD59
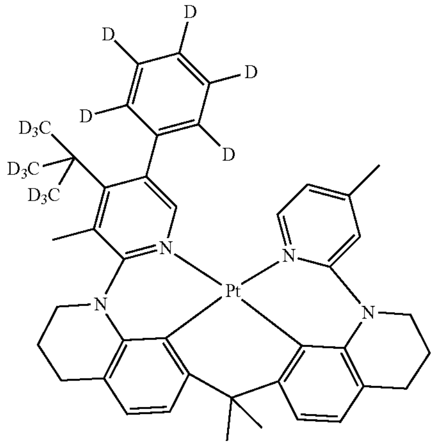
BD60
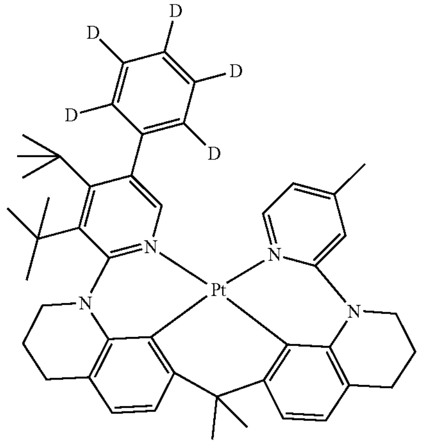

-continued
BD61
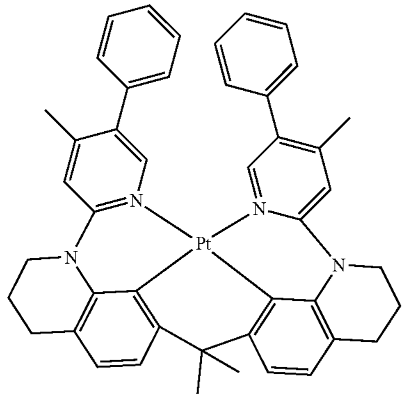
BD62
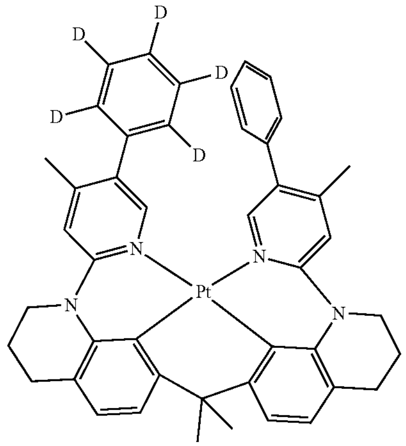
BD63
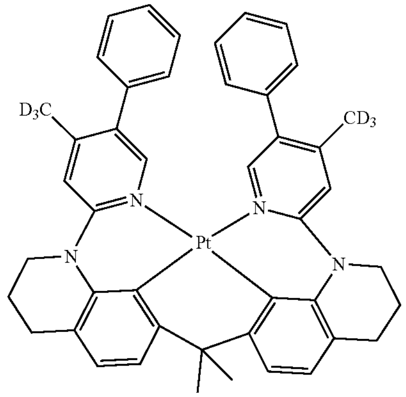
-continued
BD64
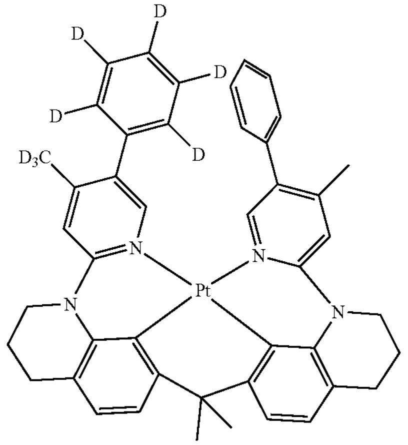
BD65
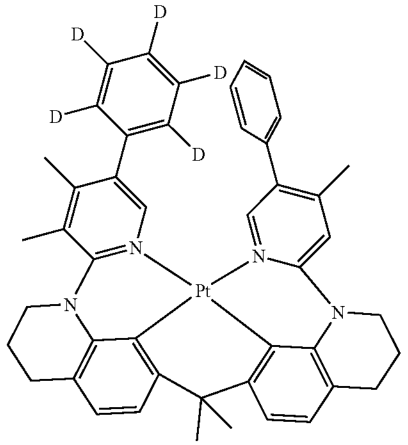
BD66
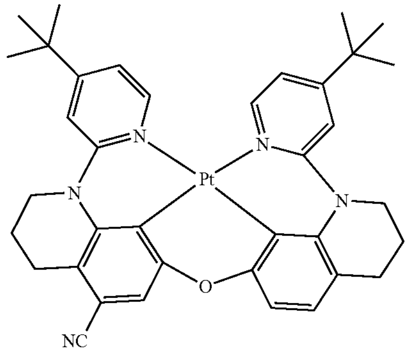
BD67
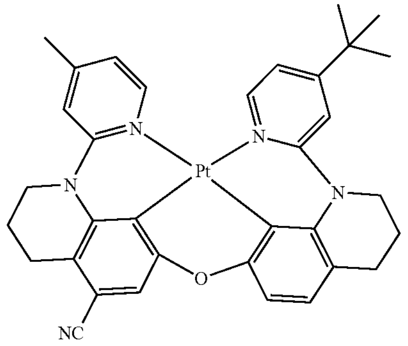

BD68
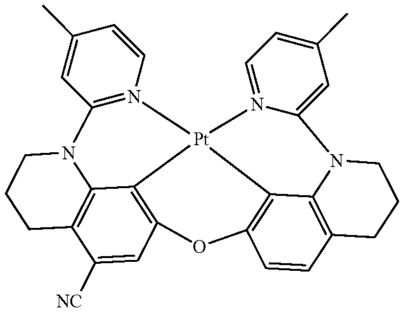
BD69
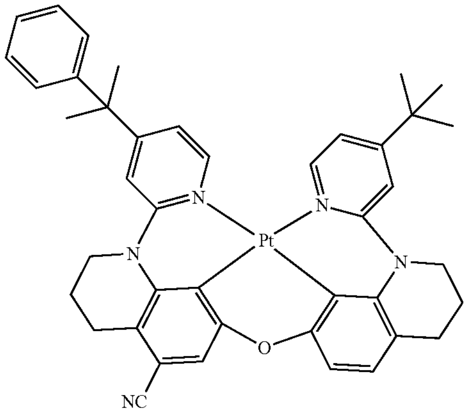
BD70
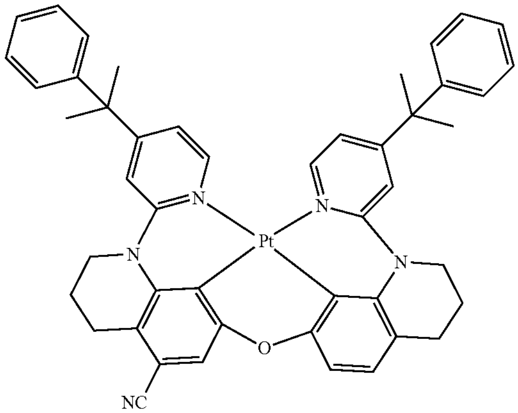
BD71
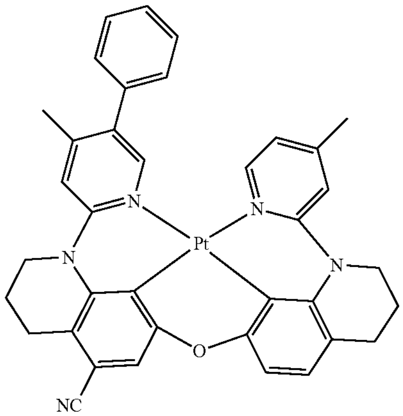
BD72
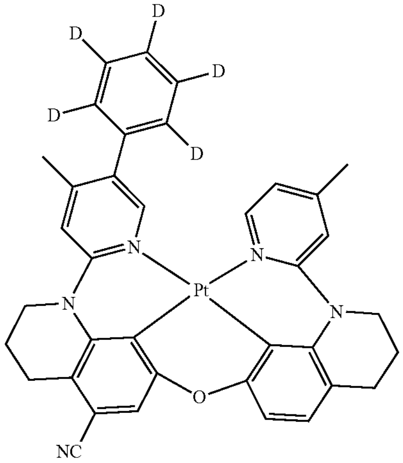
BD73
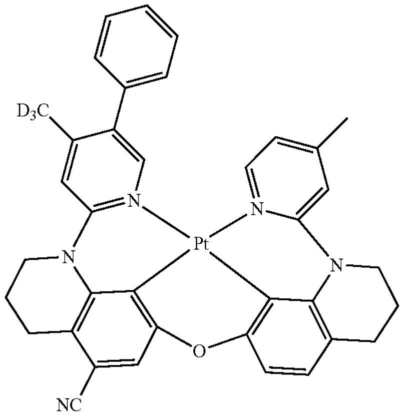
BD74
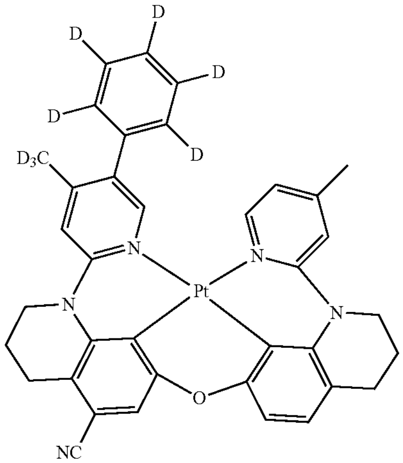

-continued
BD75
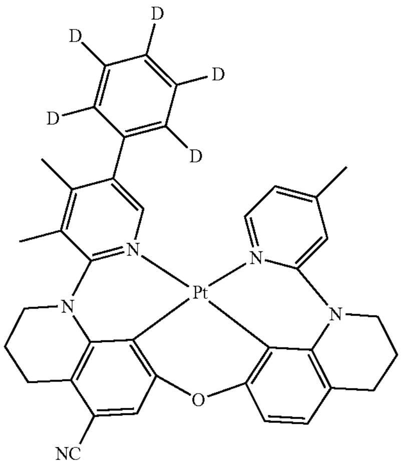
BD76
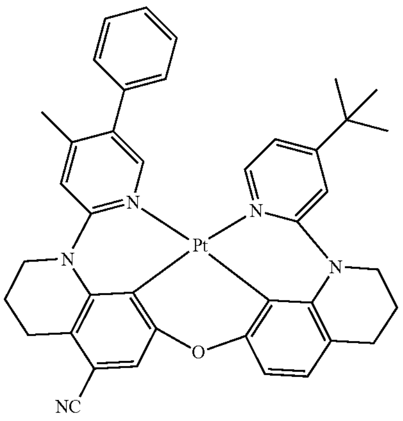
BD77
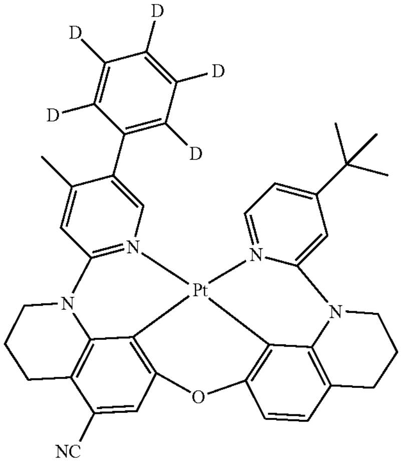
-continued
BD78
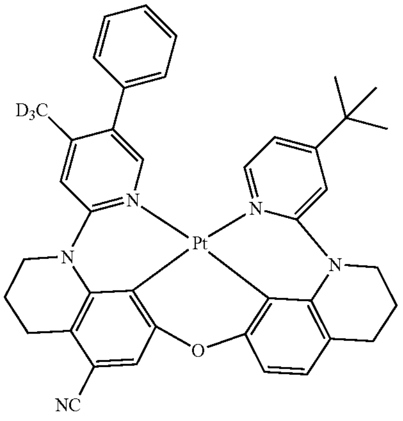
BD79
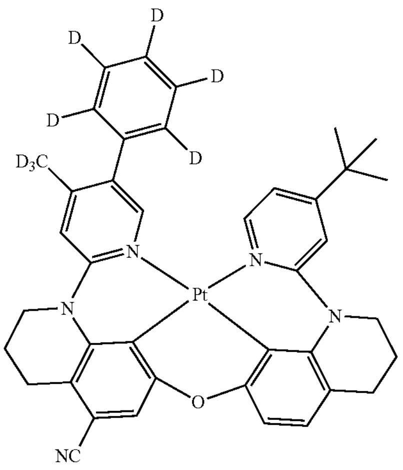
BD80
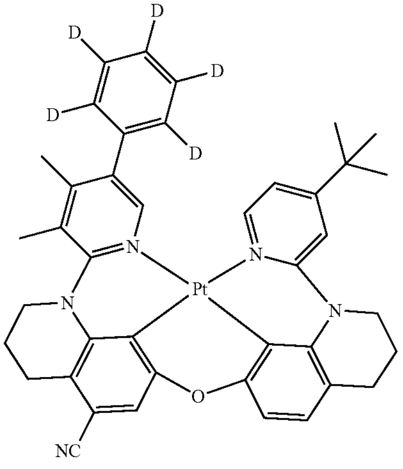

-continued
BD81
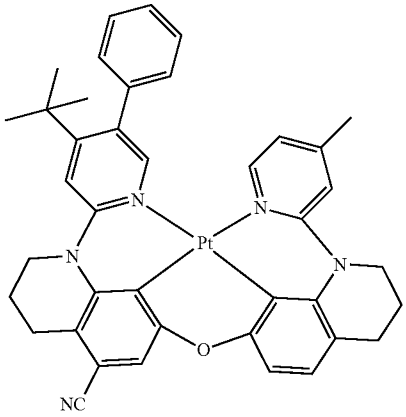
BD82
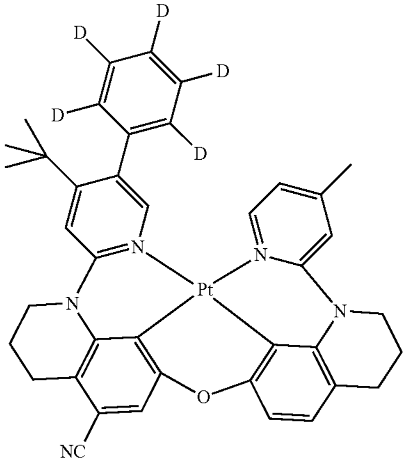
BD83
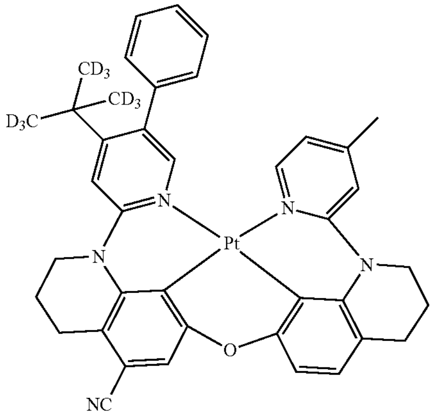
-continued
BD84
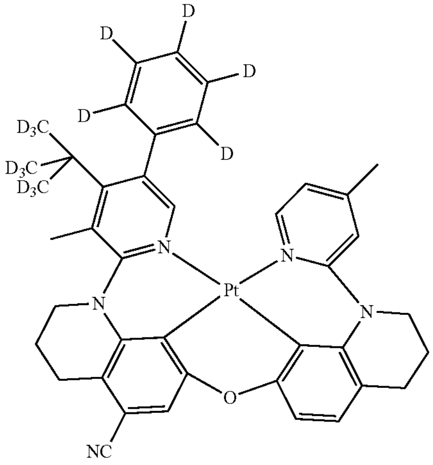
BD85
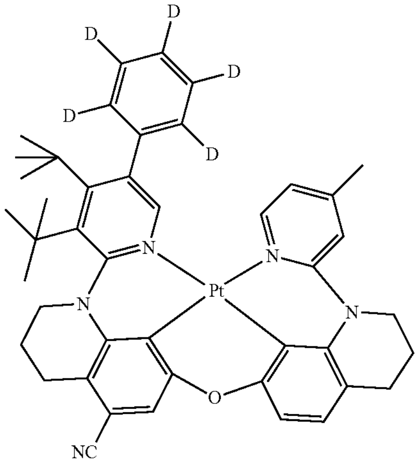
BD86
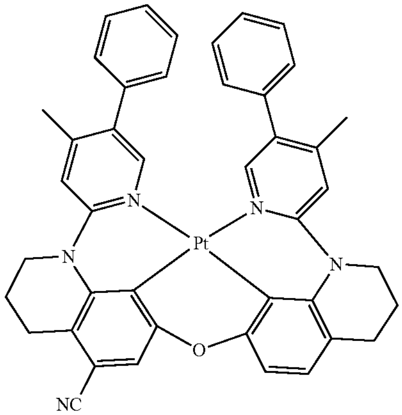

-continued
BD87
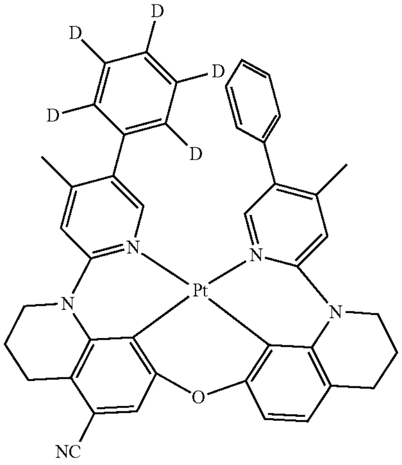
BD88
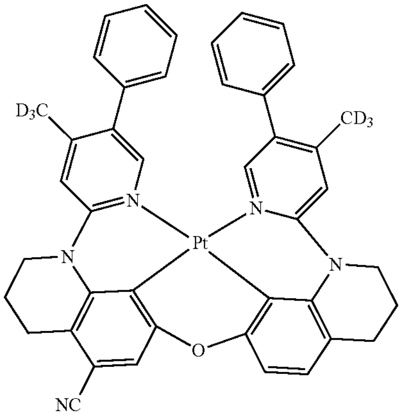
BD89
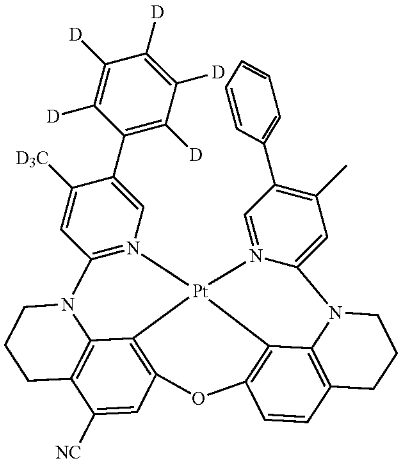
-continued
BD90
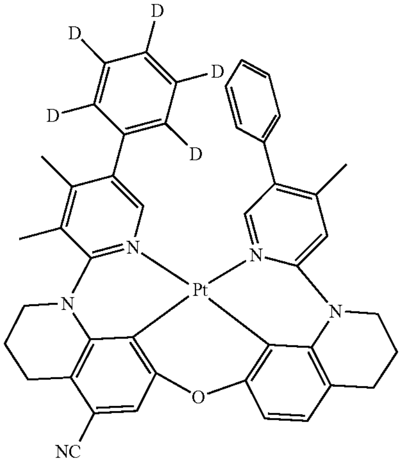
BD91
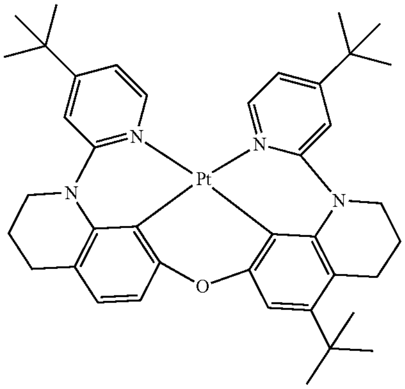
BD92
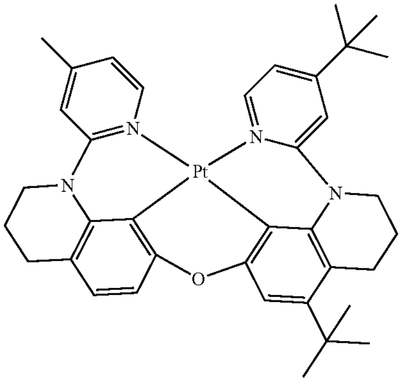
BD93
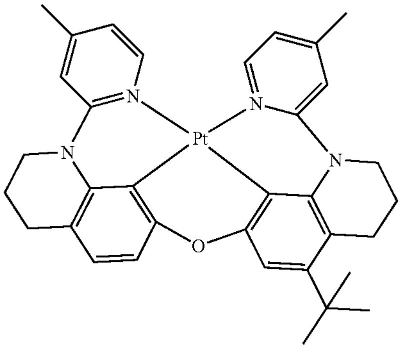

-continued
BD94
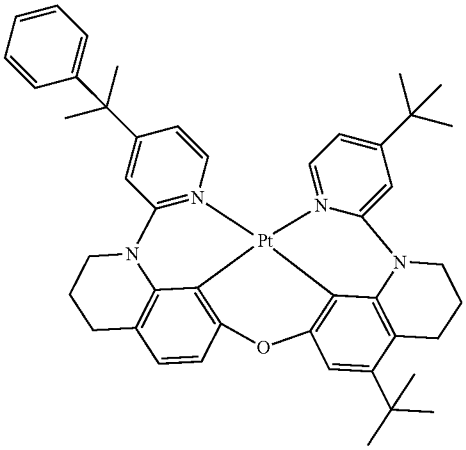
BD95
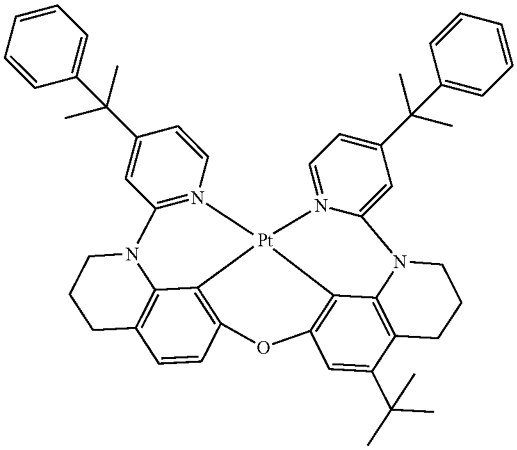
BD96
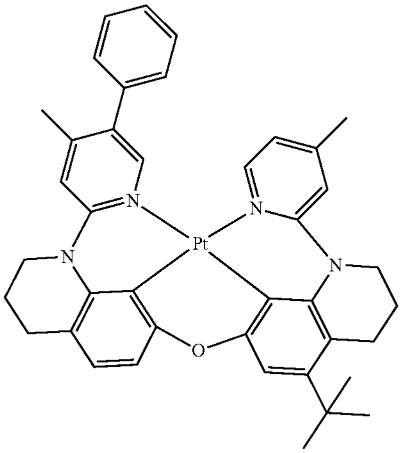
-continued
BD97
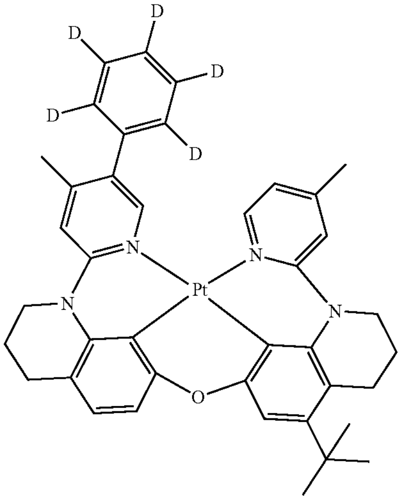
BD98
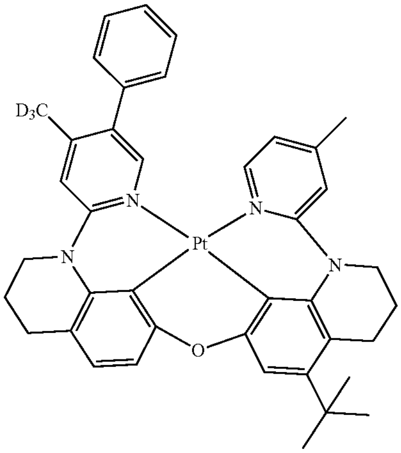
BD99
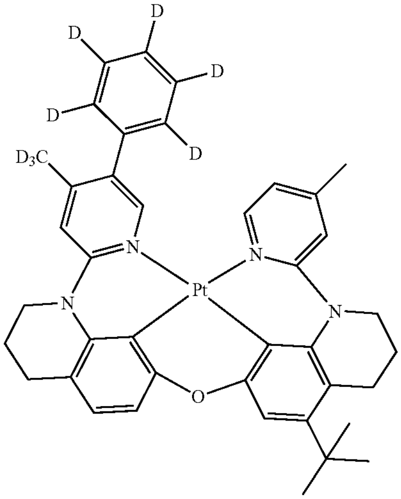

-continued

BD100

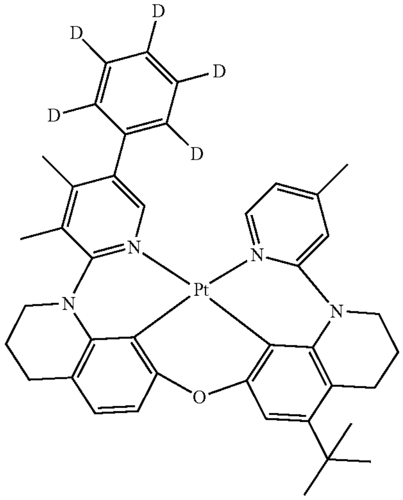

BD101

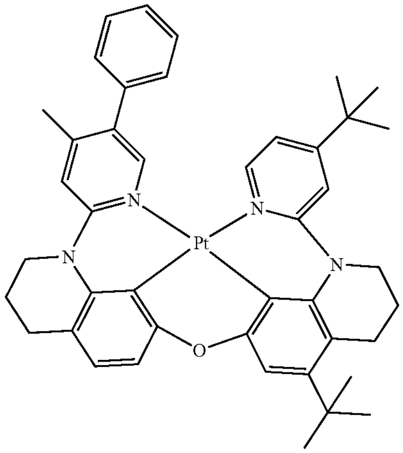

BD102

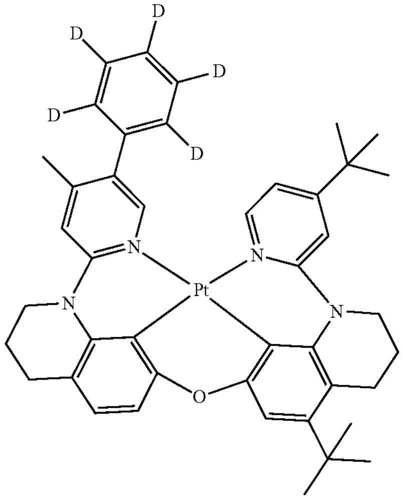

-continued

BD103

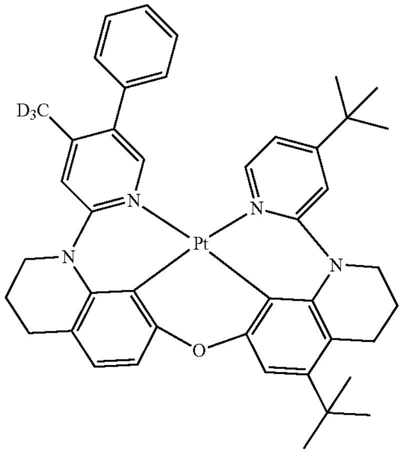

BD104

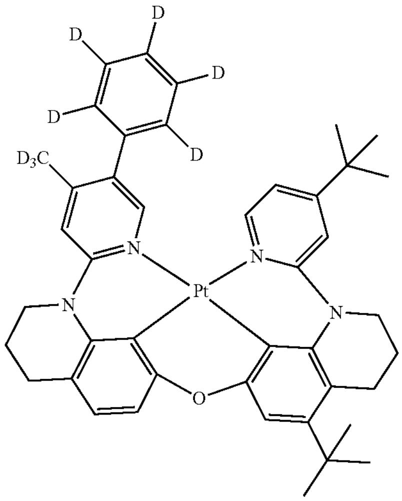

BD105

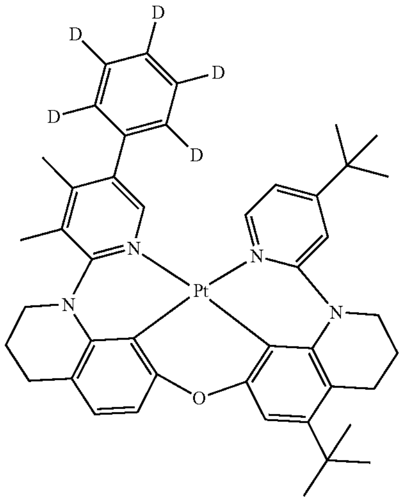

The organometallic compound represented by Formula 1 includes metal nuclei and a tetradentate ligand, and the tetradentate ligand includes at least one fused bicyclic compound. Also, the fused bicyclic compound may be a group in which one non-aromatic ring and one aromatic ring are condensed with each other.

The organometallic compound has a structure in which a ligand of a tetracoordinate organometallic compound is fixed with an additional linking group, and thus the formation of an exciplex with an organic compound is suppressed or reduced, and as a result, color purity and luminescence efficiency of the organometallic compound may be improved (increased).

Also, a highest occupied molecular orbital (HOMO) energy level of the organometallic compound may be determined by the fused bicyclic compound. Accordingly, by diversifying the fused bicyclic compound, energy levels of HOMO, lowest unoccupied molecular orbital (LUMO), $T_1$, $S_1$, and/or the like of the organometallic compound may be finely adjusted, and versatility may increase.

Furthermore, due to the non-aromatic ring included in the fused bicyclic compound, structural instability such as steric hindrance occurring between aromatic rings or steric hindrance between metal-ligand bonding sites and/or the like can be resolved (reduced). In an organometallic compound according to an embodiment, a metal nucleus may bond with a tetradentate ligand to form at least one 6-membered ring and up to three 6-membered rings.

Accordingly, the organometallic compound according to an embodiment may provide improved planarity, and may have an easier-to-laminate structure. Furthermore, the horizontal orientation and efficiency characteristics may be improved.

As a result, an electronic device, for example an organometallic compound, including the organometallic compound according to an embodiment may have a low driving voltage, a high efficiency, and a long lifespan.

Methods of synthesizing the organometallic compound represented by Formula 1 may be understood by those of ordinary skill in the art by referring to Synthesis Examples and Examples described herein.

At least one organometallic compound represented by Formula 1 may be utilized in a light-emitting device (for example, an organic light-emitting device). Thus, provided is a light-emitting device including: a first electrode; a second electrode facing the first electrode; an interlayer between the first electrode and the second electrode and including an emission layer; and the organometallic compound represented by Formula 1 as described in the present disclosure.

In an embodiment,
- the first electrode of the light-emitting device may be an anode,
- the second electrode of the light-emitting device may be a cathode,
- the interlayer may further include a hole transport region between the first electrode and the emission layer and an electron transport region between the emission layer and the second electrode,
- the hole transport region may include a hole injection layer, a hole transport layer, an emission auxiliary layer, an electron blocking layer, or one or more combinations thereof, and
- the electron transport region may include a buffer layer, a hole blocking layer, an electron control layer, an electron transport layer, an electron injection layer, or one or more combinations thereof.

In an embodiment, the organometallic compound may be included between the first electrode and the second electrode of the light-emitting device. Therefore, the organometallic compound may be included in the interlayer of the light-emitting device, for example, the emission layer of the interlayer.

In an embodiment, the emission layer in the interlayer of the light-emitting device may include a dopant and a host, and the host may include the organometallic compound. For example, the organometallic compound may act as a host. The emission layer may emit red light, green light, blue light, and/or white light. In an embodiment, the emission layer may emit blue light. The blue light may have a maximum emission wavelength of, for example, about 400 nm to about 490 nm.

In an embodiment, the emission layer in the interlayer of the light-emitting device may include a dopant and a host, the host may include the organometallic compound, and the dopant may emit blue light. In an embodiment, the dopant may include a transition metal and ligand(s) in the number of m, m may be an integer from 1 to 6, the ligand(s) in the number of m may be identical to or different from each other, at least one of the ligand(s) in the number of m may be bound to the transition metal via a carbon-transition metal bond, and the carbon-transition metal bond may be a coordinate bond. For example, at least one of the ligand(s) in the number of m may be a carbene ligand (e.g., $Ir(pmp)_3$ and/or the like). The transition metal may be, for example, iridium, platinum, osmium, palladium, rhodium, and/or gold. The emission layer and the dopant may be the same as described in the present disclosure.

$Ir(pmp)_3$

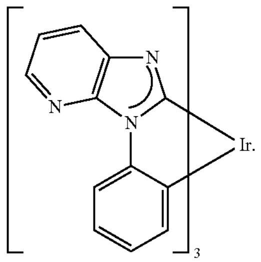

In an embodiment, the light-emitting device may include a capping layer located outside the first electrode or located outside the second electrode.

In an embodiment, the light-emitting device may further include at least one of a first capping layer outside the first electrode or a second capping layer outside the second electrode, and the at least one of the first capping layer or the second capping layer may include the organometallic compound represented by Formula 1. More details for the first capping layer and/or second capping layer may each independently be the same as described in the present disclosure.

In an embodiment, the light-emitting device may include:
- a first capping layer outside the first electrode and including the organometallic compound represented by Formula 1;
- a second capping layer outside the second electrode and including the organometallic compound represented by Formula 1; or
- the first capping layer and the second capping layer.

The wording "(interlayer and/or capping layer) includes an organometallic compound" as utilized herein may be to refer to that the (interlayer and/or capping layer) may include one kind of organometallic compound represented by Formula 1 or two or more different kinds of organometallic compounds, each represented by Formula 1".

In an embodiment, the interlayer and/or capping layer may include Compound 1 only as the organometallic compound. In this regard, Compound 1 may be present in the emission layer of the light-emitting device. In an embodiment, the interlayer may include, as the organometallic compound, Compound 1 and Compound 2. In this regard, Compound 1 and Compound 2 may be present in substantially the same layer (for example, all of Compound 1 and Compound 2 may be present in the emission layer), or may be present in different layers (for example, Compound 1 may be present in the emission layer, and Compound 2 may be present in the electron transport region).

The term "interlayer" as utilized herein refers to a single layer and/or all of a plurality of layers located between the first electrode and the second electrode of the light-emitting device.

According to one or more embodiments, provided is an electronic apparatus including the light-emitting device. The electronic apparatus may further include a thin-film transistor. In an embodiment, the electronic apparatus may further include a thin-film transistor including a source electrode and a drain electrode, wherein the first electrode of the light-emitting device may be electrically connected to the source electrode or the drain electrode. In an embodiment, the electronic apparatus may further include a color filter, a color conversion layer, a touch screen layer, a polarizing layer, or one or more combinations thereof. More details for the electronic apparatus are as described in the present disclosure.

Description of FIG. 1

FIG. 1 is a schematic cross-sectional view of a light-emitting device 10 according to an embodiment of the disclosure. The light-emitting device 10 includes a first electrode 110, an interlayer 130, and a second electrode 150.

Hereinafter, a structure of the light-emitting device 10 according to an embodiment and a method of manufacturing the light-emitting device 10 will be described in connection with FIG. 1.

First Electrode 110

In FIG. 1, a substrate may be additionally located under the first electrode 110 or above the second electrode 150. As the substrate, a glass substrate and/or a plastic substrate may be utilized. In an embodiment, the substrate may be a flexible substrate, and may include plastics with excellent or suitable heat resistance and durability, such as polyimide, polyethylene terephthalate (PET), polycarbonate, polyethylene napthalate, polyarylate (PAR), polyetherimide, or one or more combinations thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or one or more combinations thereof. In an embodiment, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or one or more combinations thereof may be utilized as a material for forming a first electrode.

The first electrode 110 may have a single-layered structure including (e.g., consisting of) a single layer or a multilayer structure including a plurality of layers. In an embodiment, the first electrode 110 may have a three-layered structure of ITO/Ag/ITO.

Interlayer 130

The interlayer 130 may be on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and/or the like, in addition to one or more suitable organic materials.

In an embodiment, the interlayer 130 may include, i) two or more emitting units sequentially stacked between the first electrode 110 and the second electrode 150, and ii) a charge generation layer between the two emitting units. When the interlayer 130 includes emitting units and a charge generation layer as described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or one or more combinations thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, the layers of each structure being stacked sequentially from the first electrode 110.

The hole transport region may include a compound represented by Formula 201, a compound represented by Formula 202, or a combination thereof:

Formula 201

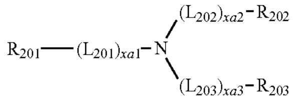

Formula 202

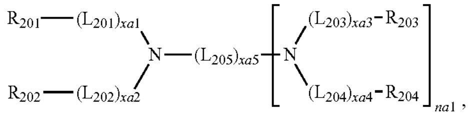

wherein, in Formulae 201 and 202, $L_{201}$ to $L_{204}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $L_{205}$ may be *—O—*', *—S—*', *—N($Q_{201}$)-*', a $C_1$-$C_{20}$ alkylene group that is unsubstituted or substituted with at least one $R_{10a}$, a $C_2$-$C_{20}$ alkenylene group that is unsubstituted or substituted with at least one $R_{10a}$, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $R_{201}$ and $R_{202}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$ to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$ to form a $C_8$-$C_{60}$ polycyclic group that is unsubstituted or substituted with at least one $R_{10a}$, and na1 may be an integer from 1 to 4.

In an embodiment, each of Formulae 201 and 202 may include at least one of groups represented by Formulae CY201 to CY217.

CY201

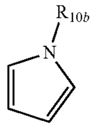

CY202

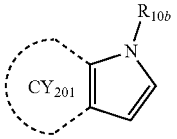

CY203

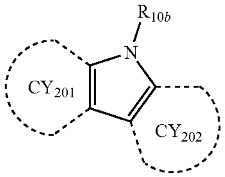

CY204

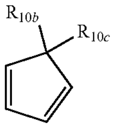

CY205

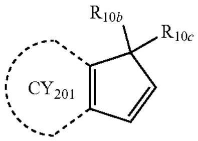

-continued

CY206

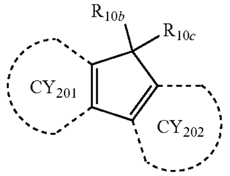

CY207

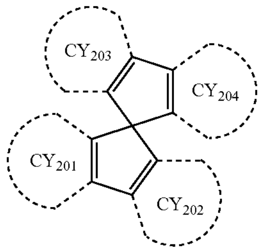

CY208

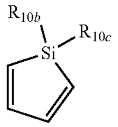

CY209

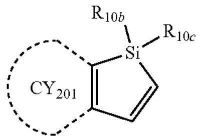

CY210

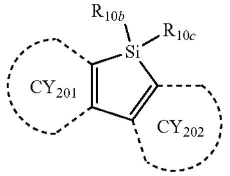

CY211

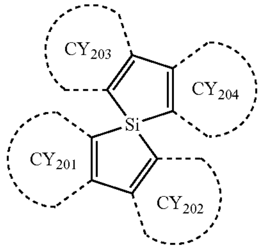

CY212

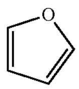

CY213

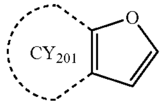

CY214

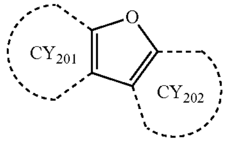

-continued

CY215

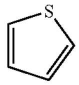

CY216

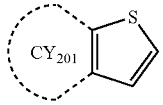

CY217

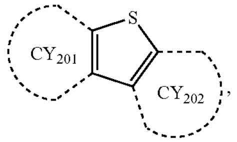

wherein in Formulae CY201 to CY217, $R_{10b}$ and $R_{10c}$ may each be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described above.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, each of Formulae 201 and 202 may include at least one of groups represented by Formulae CY201 to CY203.

In an embodiment, Formula 201 may include at least one of groups represented by Formulae CY201 to CY203 and at least one of groups represented by Formulae CY204 to CY217.

In an embodiment, xa1 in Formula 201 may be 1, $R_{201}$ may be a group represented by one of Formulae CY201 to CY203, xa2 may be 0, and $R_{202}$ may be a group represented by one of Formulae CY204 to CY207.

In an embodiment, each of Formulae 201 and 202 may not include (e.g., may exclude) groups represented by Formulae CY201 to CY203.

In an embodiment, each of Formulae 201 and 202 may not include (e.g., may exclude) groups represented by Formulae CY201 to CY203, and may include at least one of groups represented by Formulae CY204 to CY217.

In an embodiment, each of Formulae 201 and 202 may not include (e.g., may exclude) groups represented by Formulae CY201 to CY217.

In an embodiment, the hole transport region may include at least one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or one or more combinations thereof:

HT1

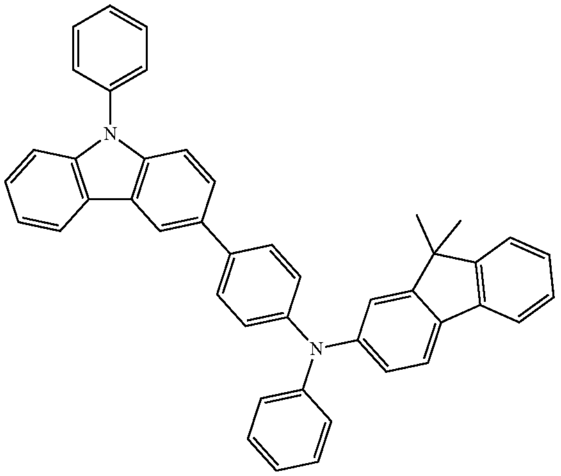

HT2

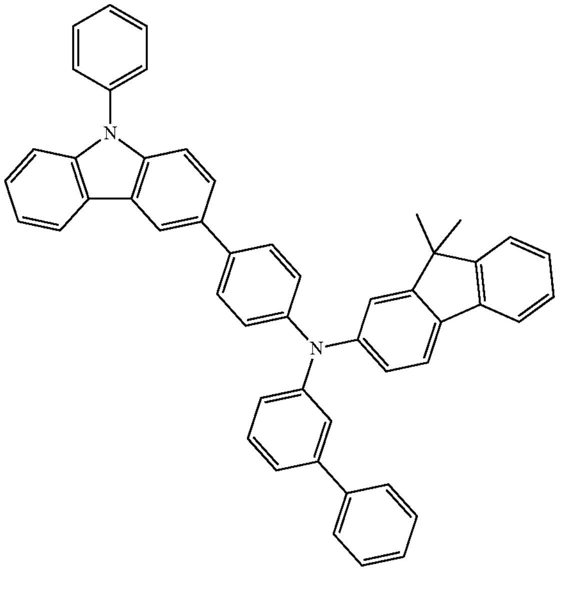

-continued
HT3
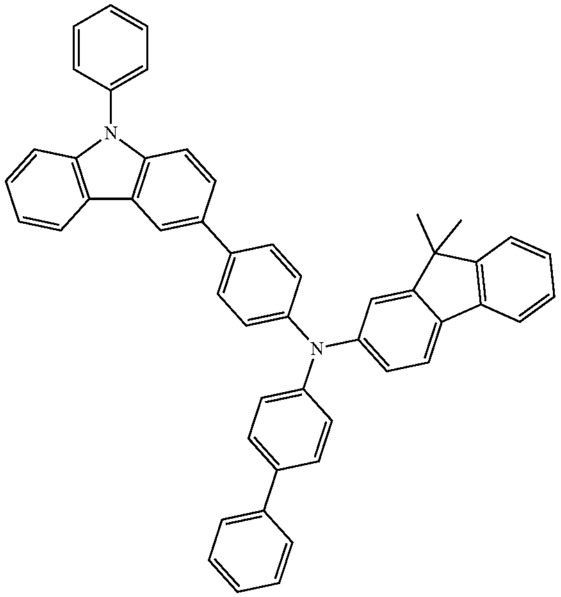
HT4
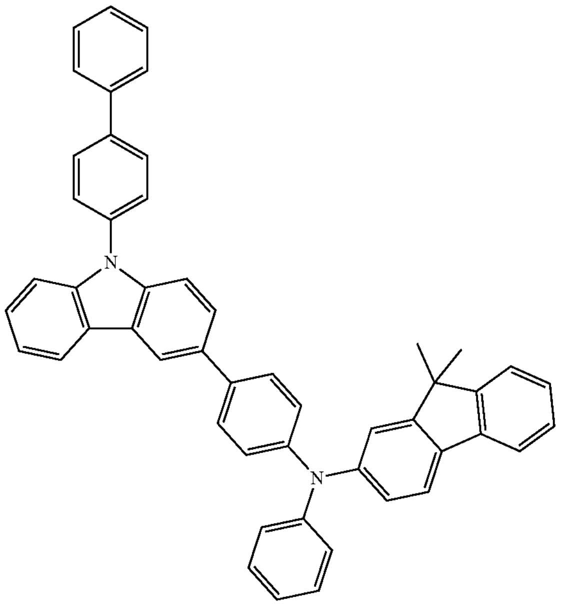
-continued
HT5
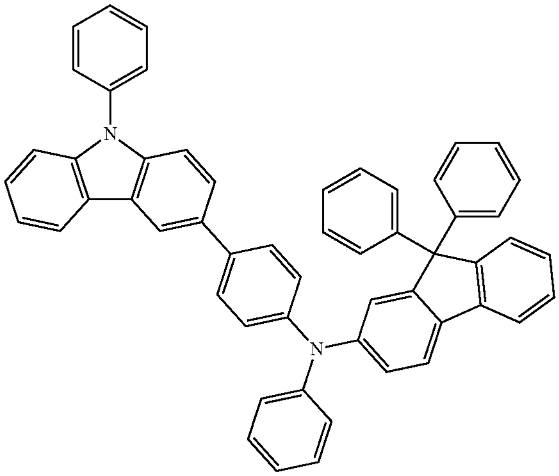
HT6
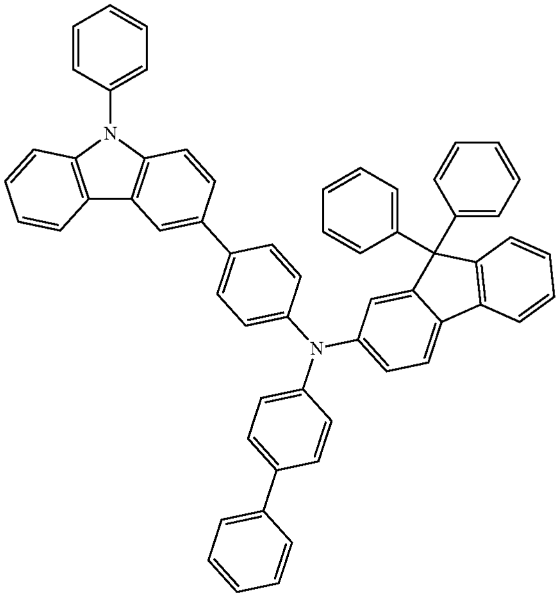

-continued
HT7
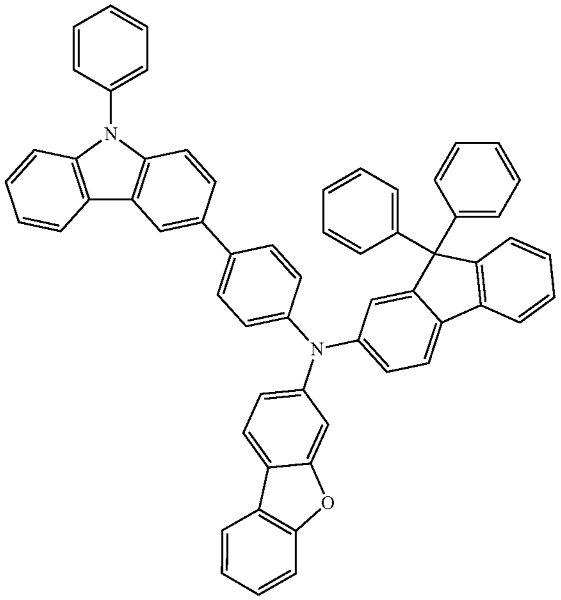
HT8
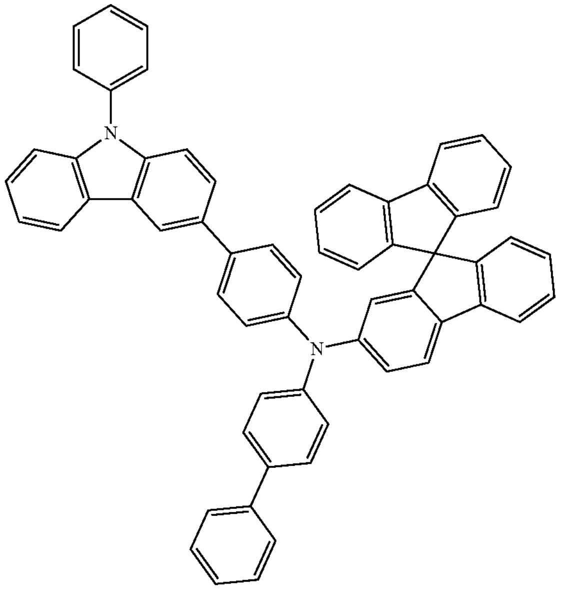
-continued
HT9
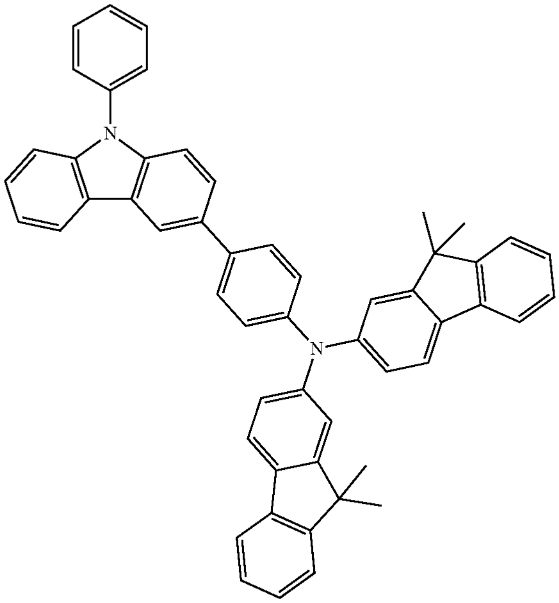
HT10
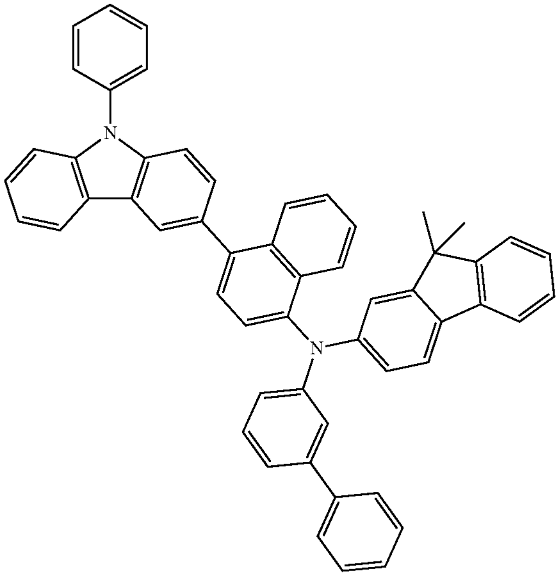

-continued
HT11
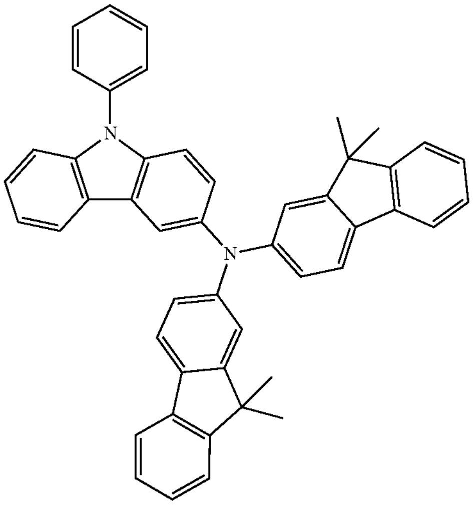
HT12
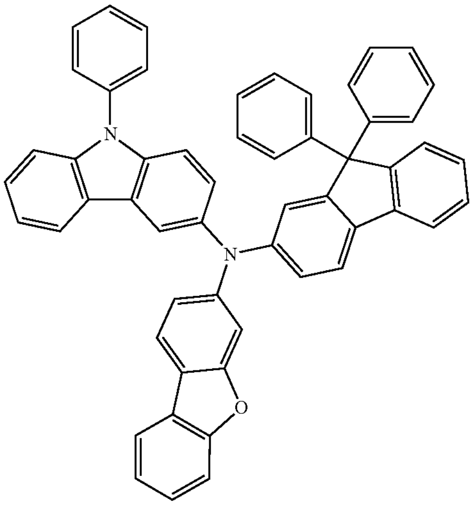
HT13
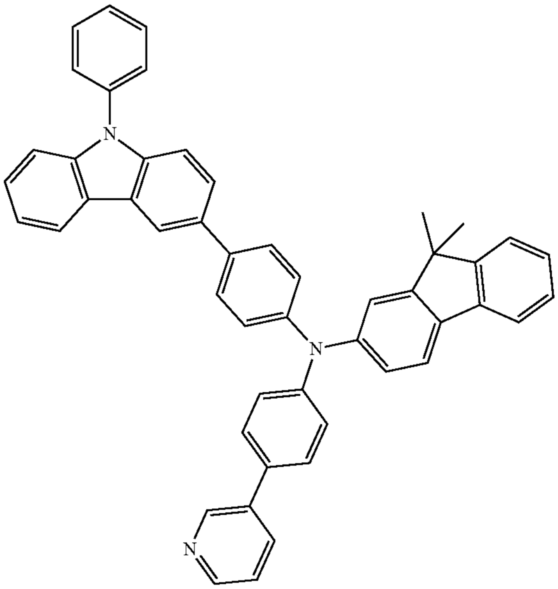
-continued
HT14
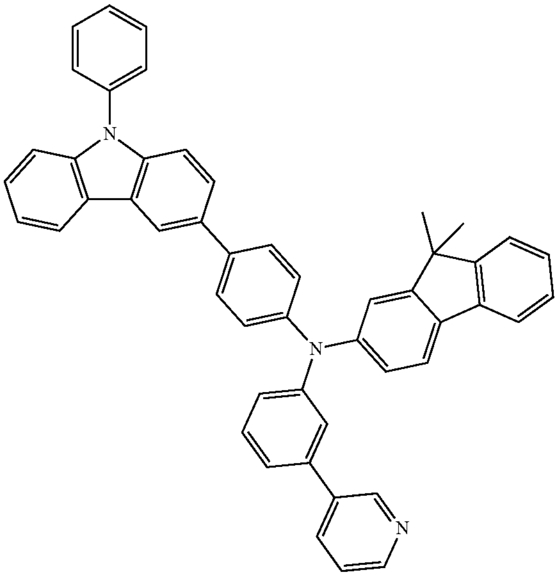
HT15
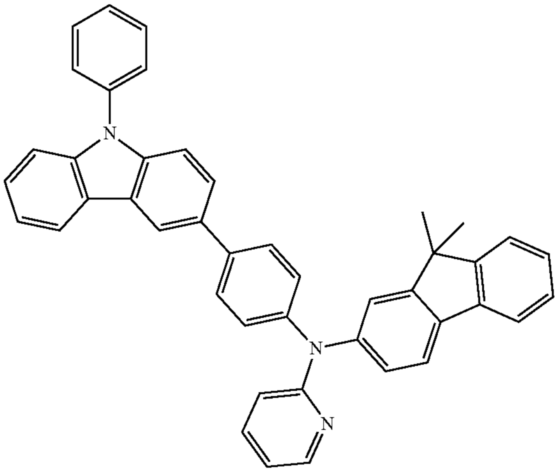
HT16
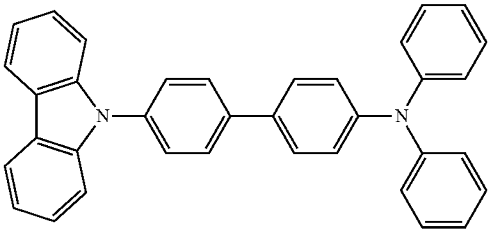

-continued
HT17
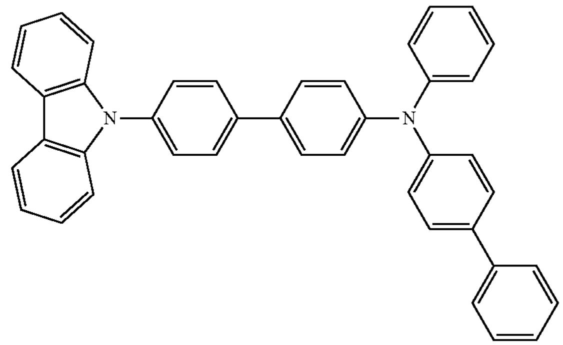
HT18
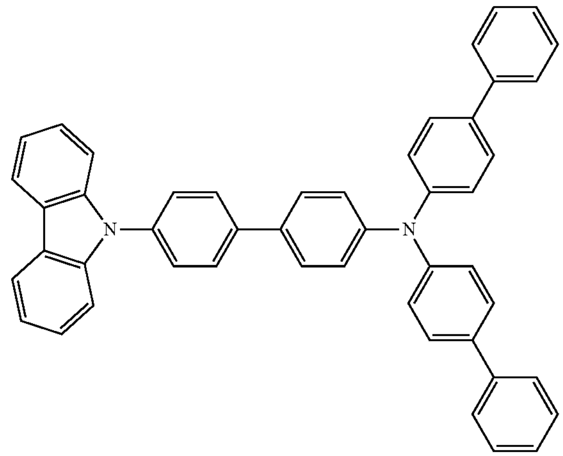
HT19
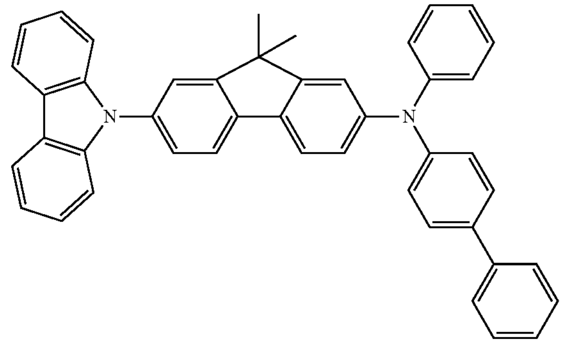
-continued
HT20
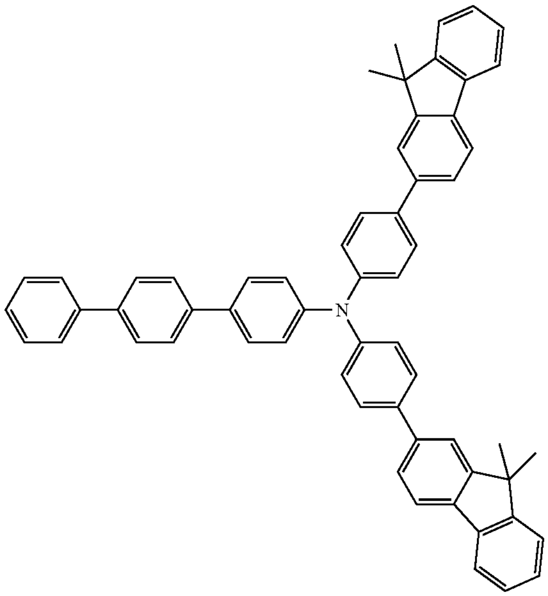
HT21
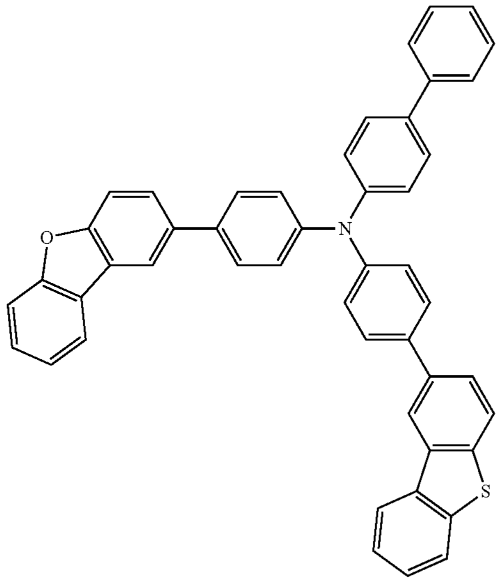
HT22
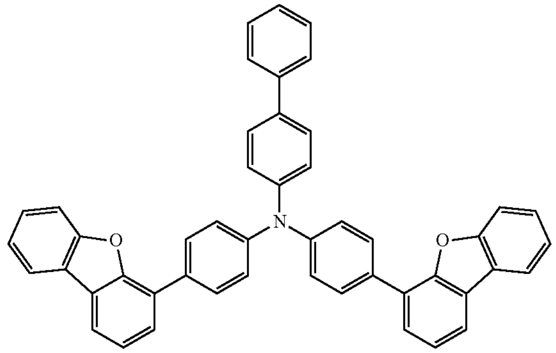

-continued
HT23
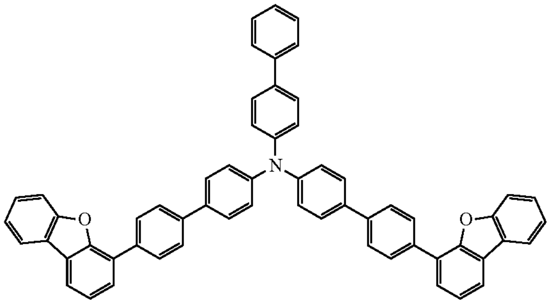
HT24
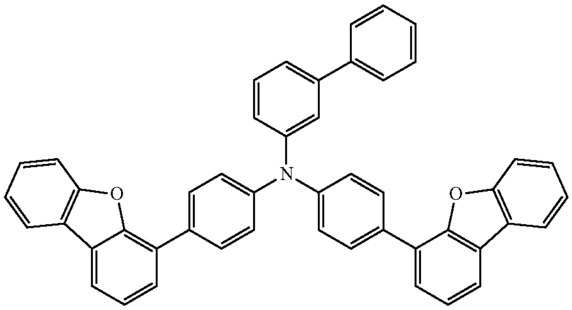
HT25
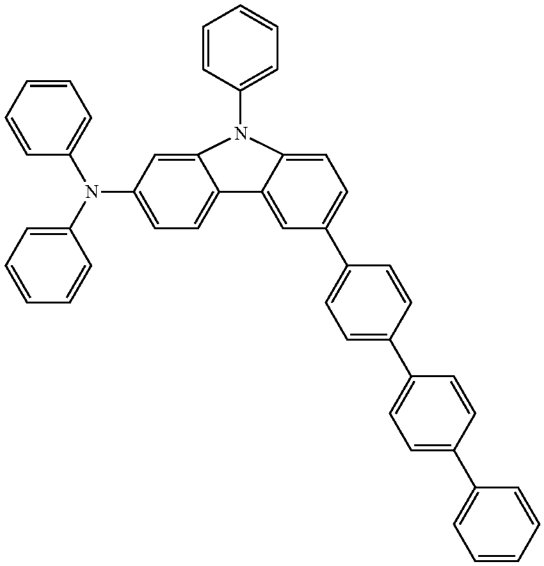
-continued
HT26
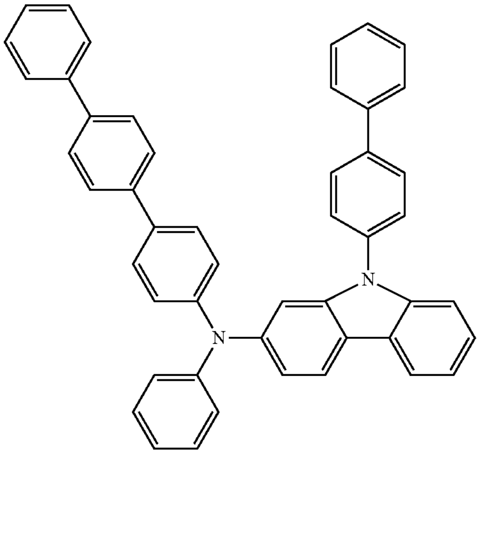
HT27
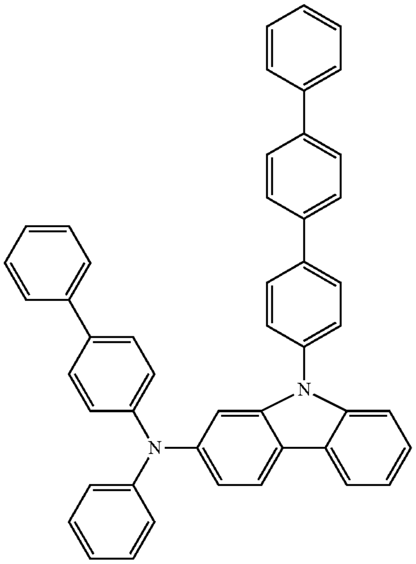
HT28
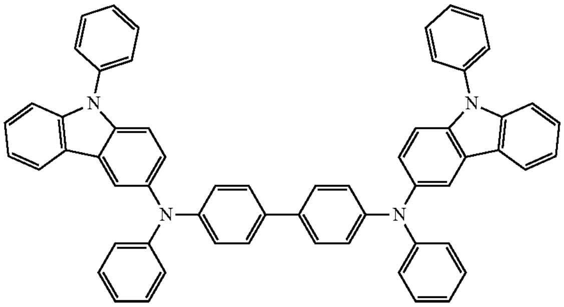

-continued
HT29
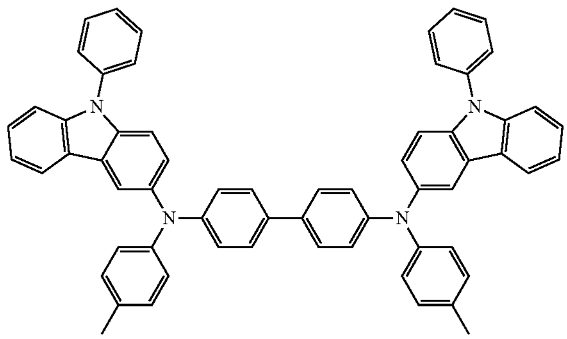
HT30
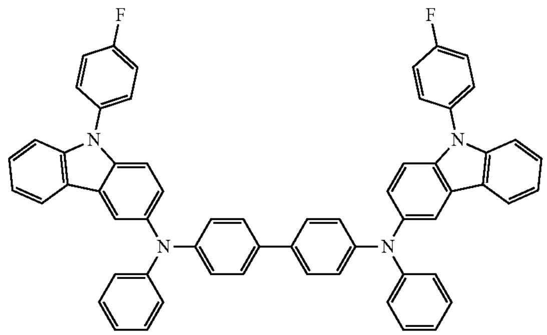
HT31
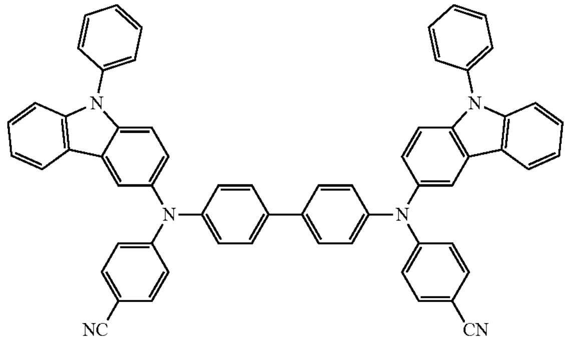
HT32
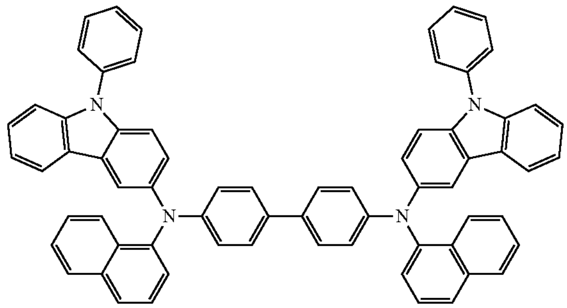
-continued
HT33
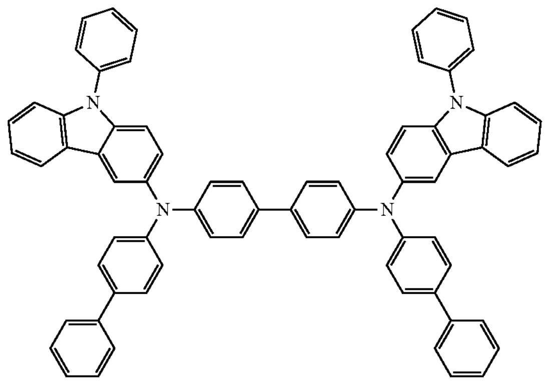
HT34
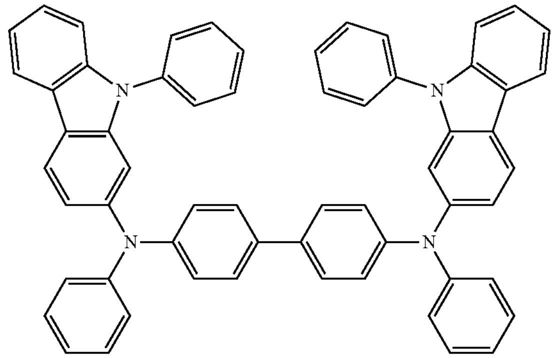
HT35
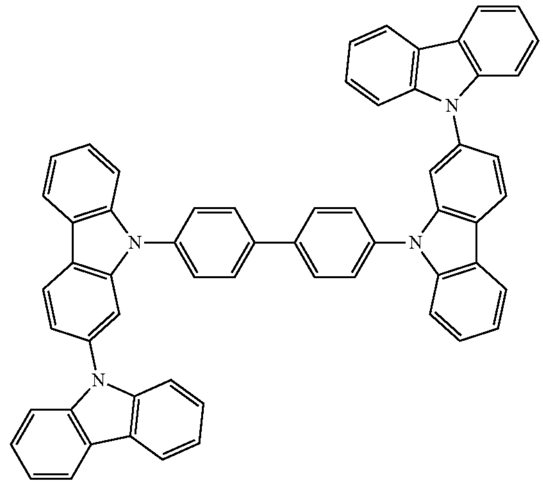

-continued
HT36
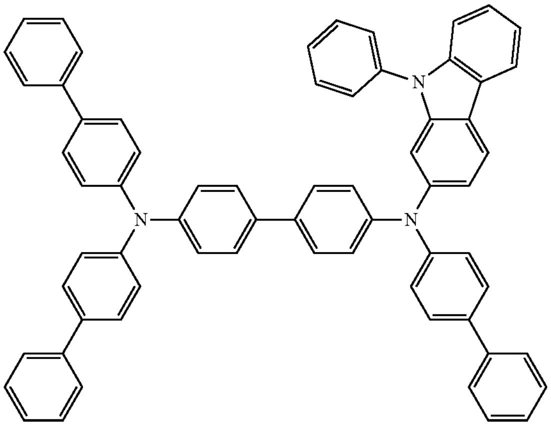
HT37
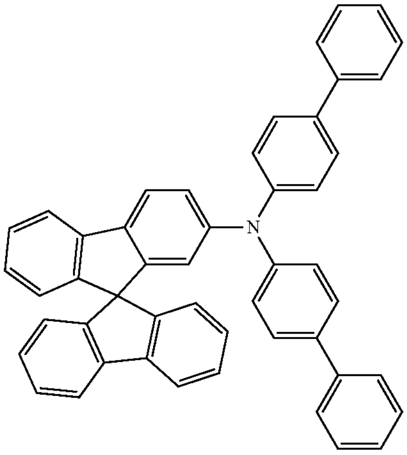
HT38
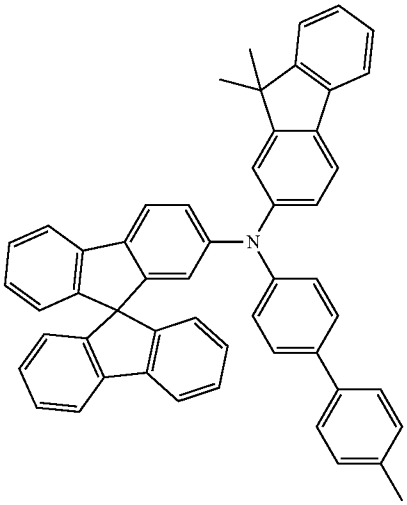
-continued
HT39
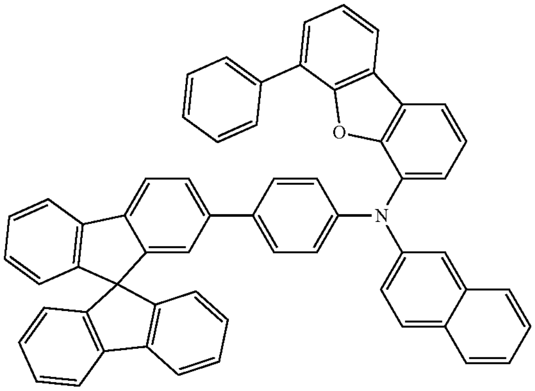
HT40
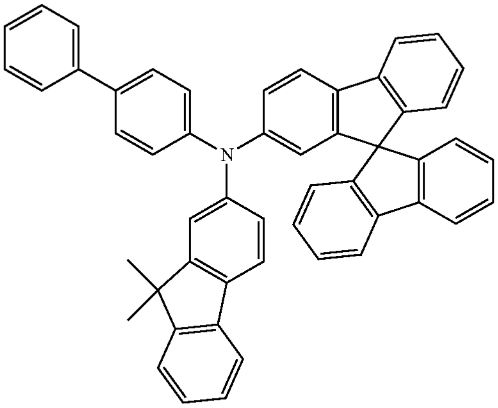
HT41
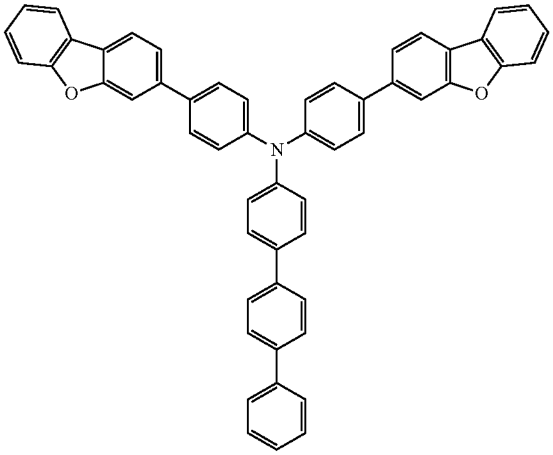
HT42
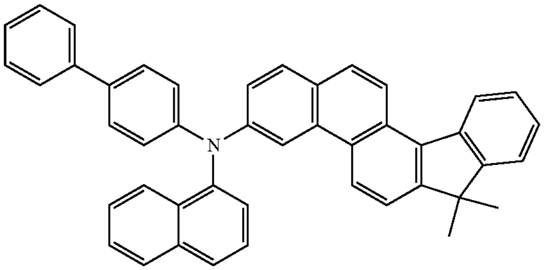

-continued
HT43
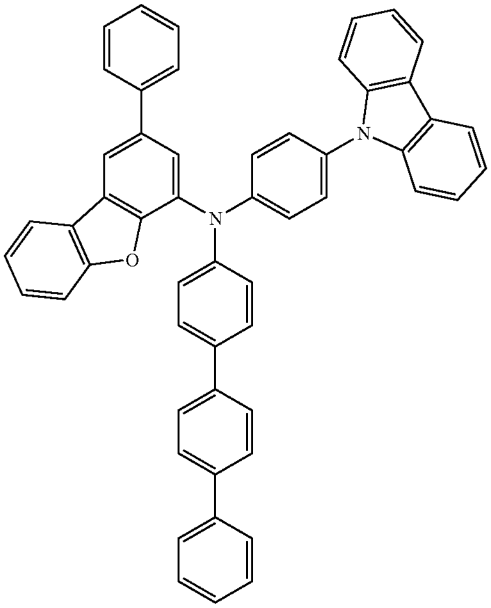
HT44
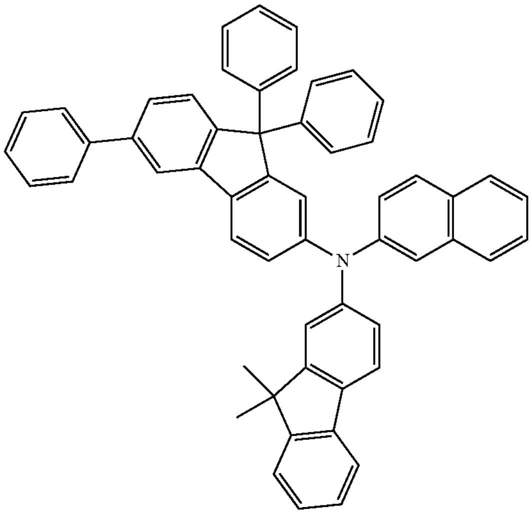
HT45
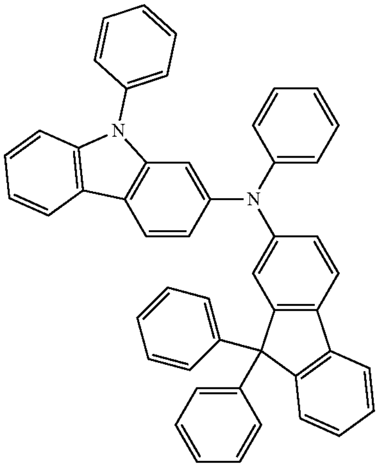
-continued
HT46
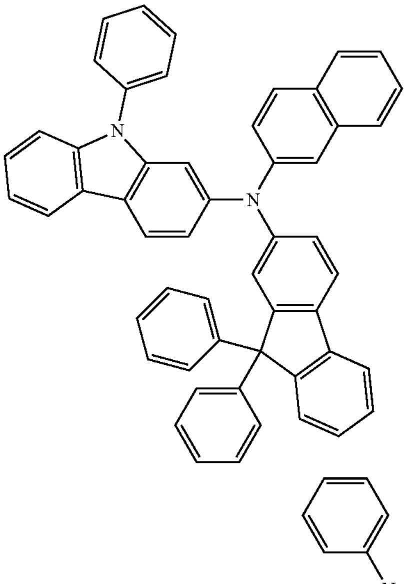
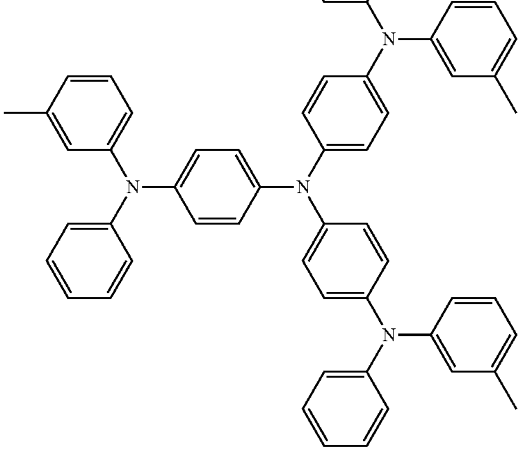
m-MTDATA
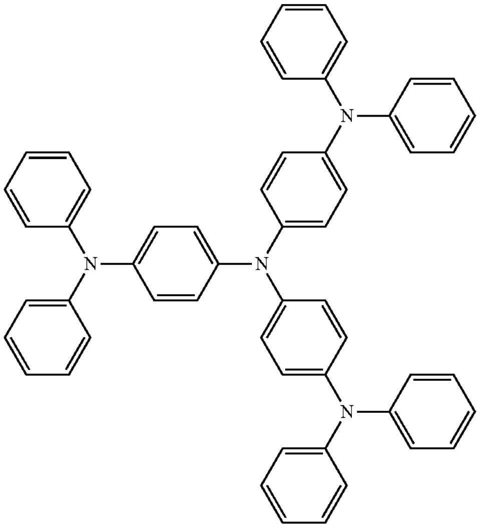
TDATA -continued

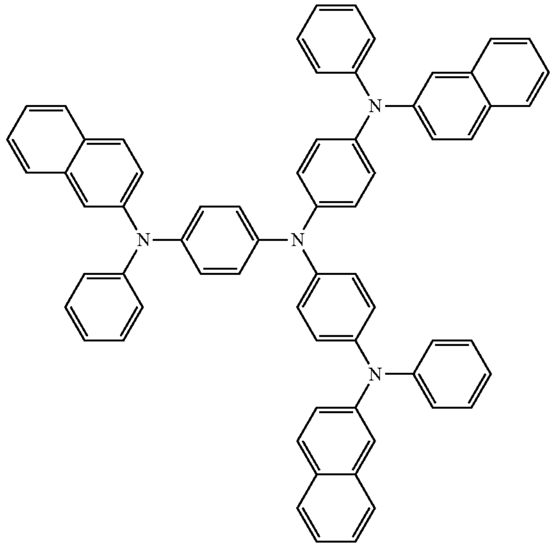

2-TNATA

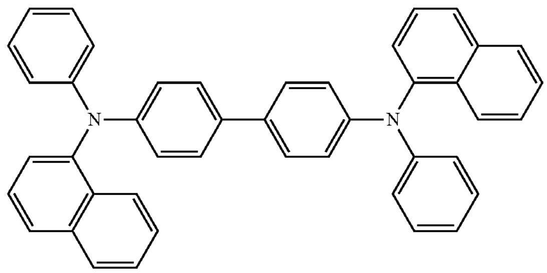

NPB

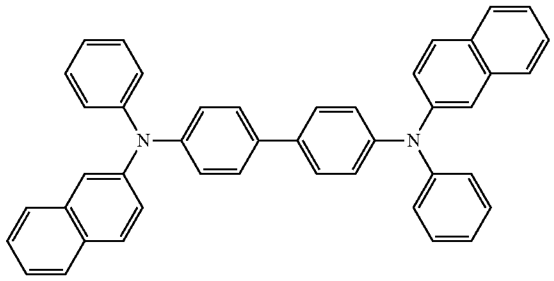

β-NPB

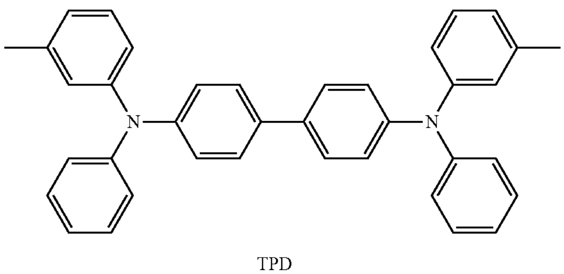

TPD

-continued

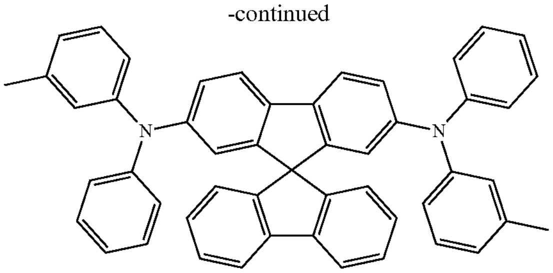

Spiro-TPD

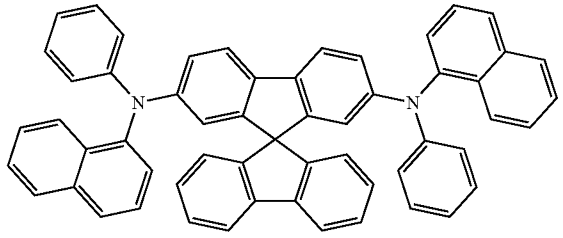

Spiro-NPB

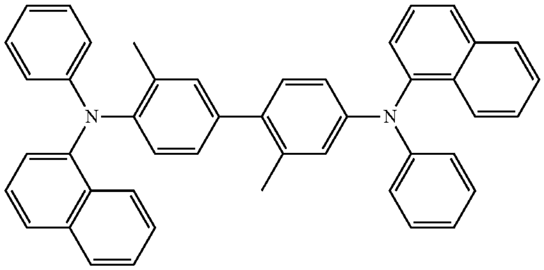

methylated-NPB

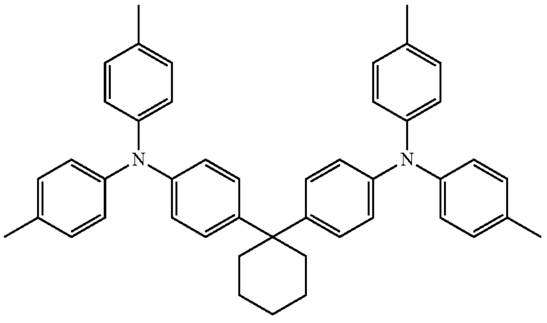

TAPC

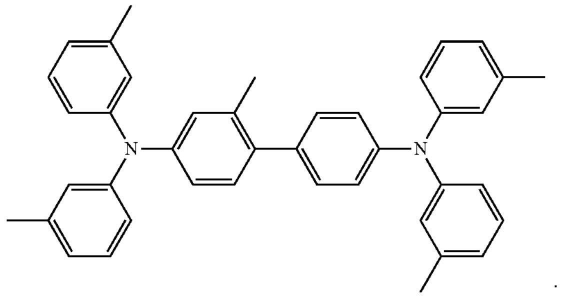

HMTPD

A thickness of the hole transport region may be in a range of about 50 Å to about 10,000 Å, for example, about 100 Å to about 4,000 Å. When the hole transport region includes a hole injection layer, a hole transport layer, or a combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory (suitable) hole-transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the leakage of electrons from an emission layer to a hole transport region. Materials that may be included in the hole transport region may also be included in the emission auxiliary layer and the electron blocking layer.

p-Dopant

The hole transport region may further include, in addition to these materials, a charge-generation material for the improvement of conductive properties. The charge-generation material may be substantially uniformly or non-uniformly dispersed in the hole transport region (for example, in the form of a single layer including (e.g., consisting of) a charge-generation material).

The charge-generation material may be, for example, a p-dopant.

In an embodiment, a LUMO energy level of the p-dopant may be about −3.5 eV or less.

In an embodiment, the p-dopant may include a quinone derivative, a cyano group-containing compound, a compound containing an element EL1 and an element EL2, or one or more combinations thereof.

Examples of the quinone derivative may include TCNQ, F4-TCNQ, and/or the like.

Examples of the cyano group-containing compound may include HAT-CN, a compound represented by Formula 221, and/or the like.

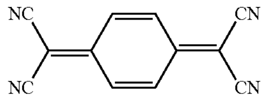

TCNQ

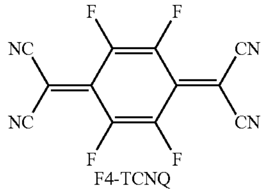

F4-TCNQ

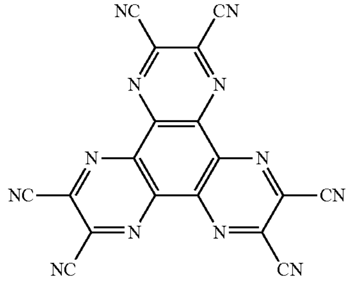

HAT-CN

-continued

Formula 221

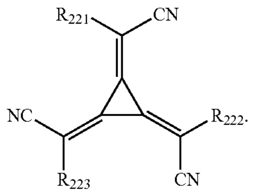

In Formula 221, $R_{221}$ to $R_{223}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or one or more combinations thereof.

In the compound containing the element EL1 and the element EL2, the element EL1 may be metal, metalloid, or a combination thereof, and the element EL2 may be non-metal, metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and/or a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and/or tellurium (Te).

Examples of the non-metal may include oxygen (O) and/or halogen (for example, F, Cl, Br, I, etc.).

In an embodiment, examples of the compound containing the element EL1 and the element EL2 may include metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, or one or more combinations thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and/or rhenium oxide (for example, $ReO_3$, etc.).

Examples of the metal halide may include alkali metal halide, alkaline earth metal halide, transition metal halide, post-transition metal halide, and/or lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and/or CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and/or $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $COCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and/or gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and/or tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and/or $SmI_3$.

Examples of the metalloid halide may include antimony halide (for example, $SbCl_5$, etc.).

Examples of the metal telluride may include alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and/or lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In an embodiment, the emission layer may have a stacked structure of two or more layers selected from a red emission layer, a green emission layer, and a blue emission layer, in which the two or more layers contact each other or are separated from each other. In an embodiment, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or a combination thereof.

An amount of the dopant in the emission layer may be from about 0.01 parts by weight to about 15 parts by weight based on 100 parts by weight of the host.

In an embodiment, the emission layer may include a quantum dot.

In an embodiment, the emission layer may include a delayed fluorescence material. The delayed fluorescence material may act as a host or a dopant in the emission layer.

A thickness of the emission layer may be in a range of about 100 Å to about 1,000 Å, for example, about 200 Å to about 600 Å. When the thickness of the emission layer is within the foregoing ranges, excellent or suitable light-emission characteristics may be obtained without a substantial increase in driving voltage.

Host

The host may include a compound represented by Formula 301:

$$[Ar_{301}]_{xb11}-[(L_{301})_{xb1}-R_{301}]_{xb21} \quad \text{Formula 301}$$

wherein, in Formula 301, $Ar_{301}$ and $L_{301}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), or —P(═O)($Q_{301}$)($Q_{302}$), xb21 may be an integer from 1 to 5, and $Q_{301}$ to $Q_{303}$ are respectively the same as described in connection with $Q_1$.

In an embodiment, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or a combination thereof:

Formula 301-1

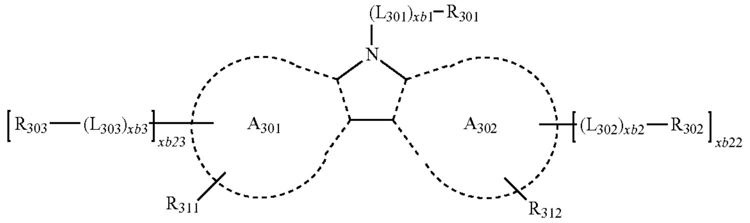

Formula 301-2

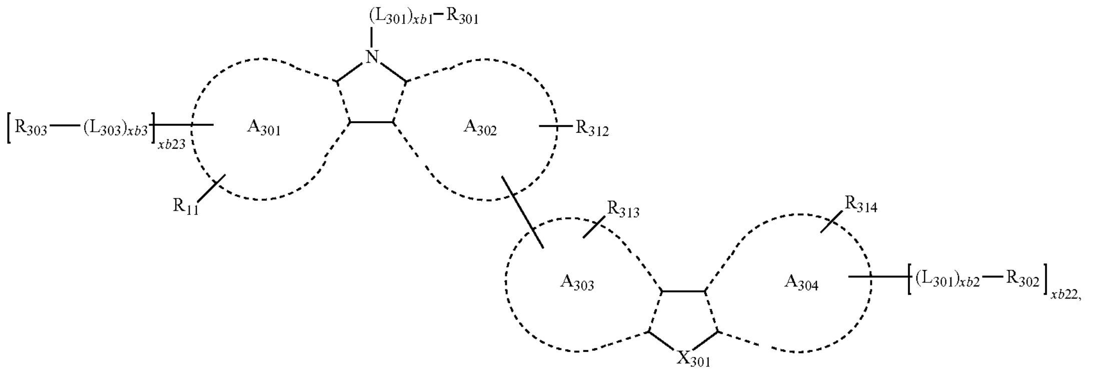

wherein, in Formulae 301-1 and 301-2, ring $A_{301}$ to ring $A_{304}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are respectively the same as described in the present disclosure, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ are respectively the same as described in connection with $R_{301}$.

In an embodiment, the host may include an alkali earth metal complex, a post-transition metal complex, or a combination thereof. In an embodiment, the host may include a Be complex (for example, Compound H55), an Mg complex, a Zn complex, or one or more combinations thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or one or more combinations thereof:

H1

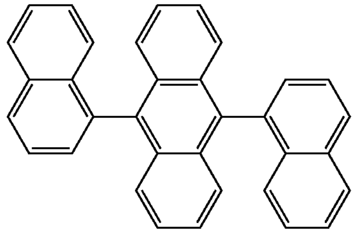

H2

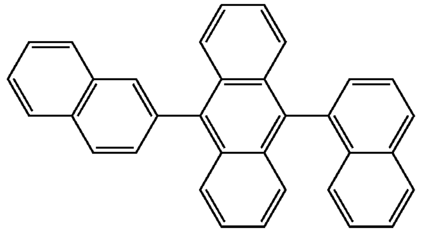

H3

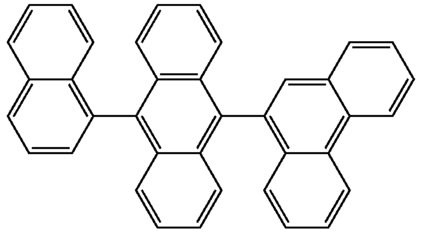

-continued
H4
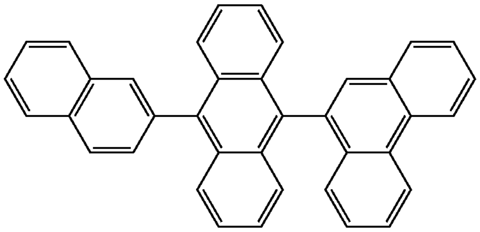
H5
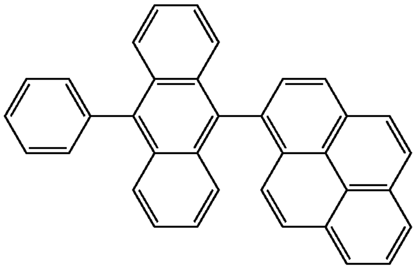
H6
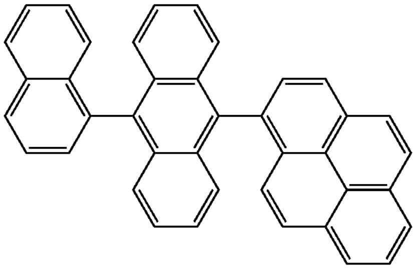
H7
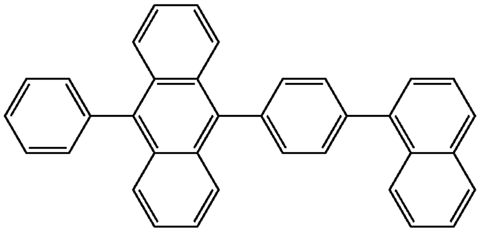
H8
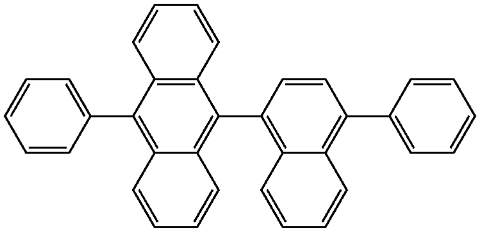
H9
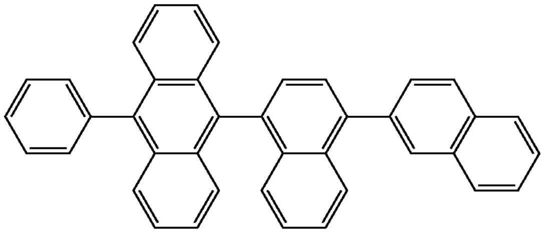
-continued
H10
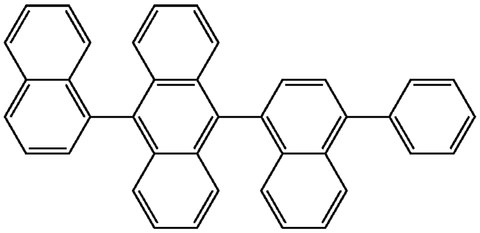
H11
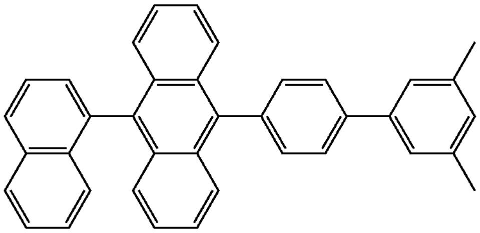
H12
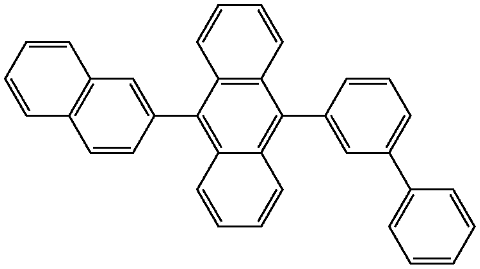
H13
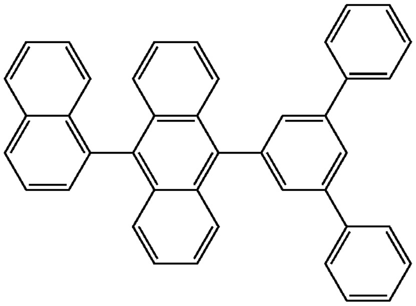
H14
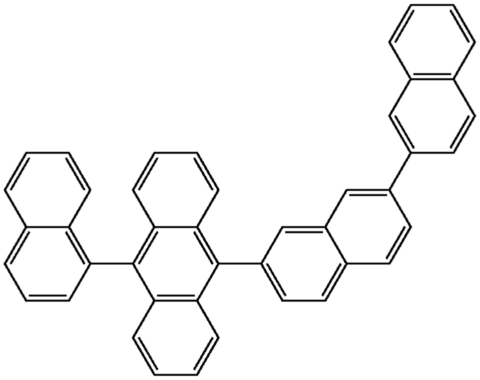

-continued
H15
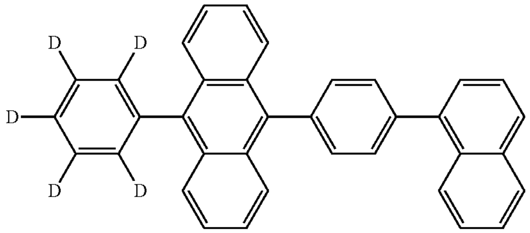
H16
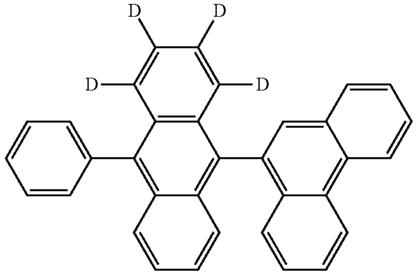
H17
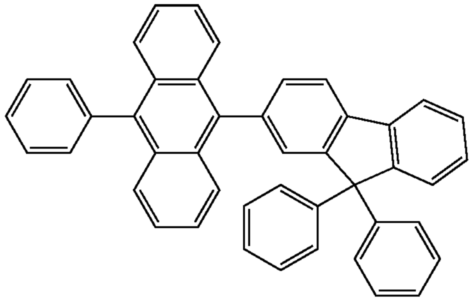
H18
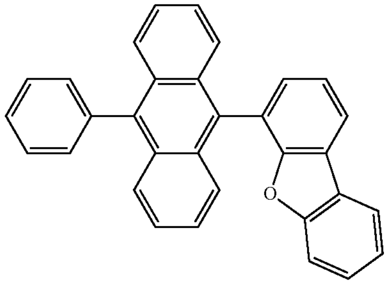
H19
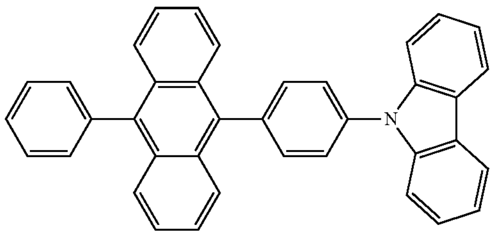
-continued
H20
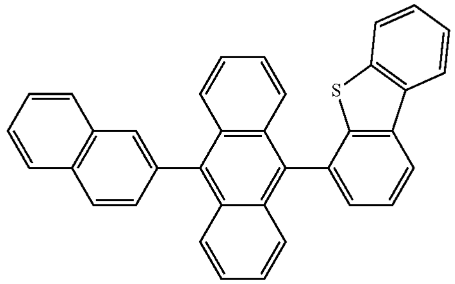
H21
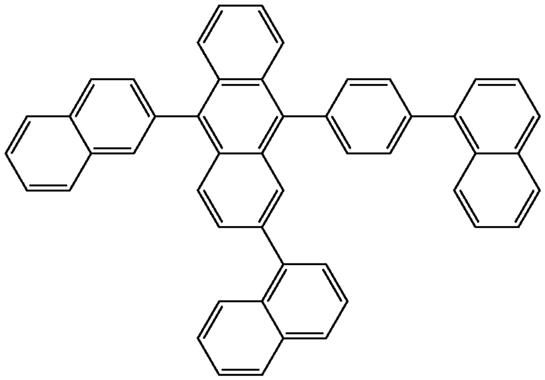
H22
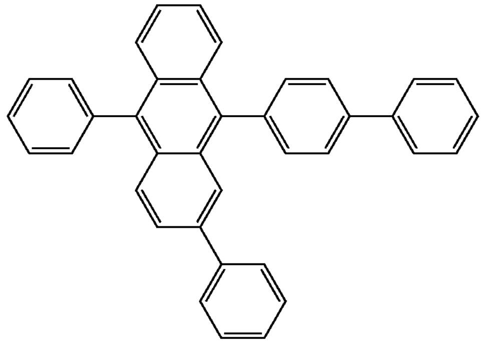
H23
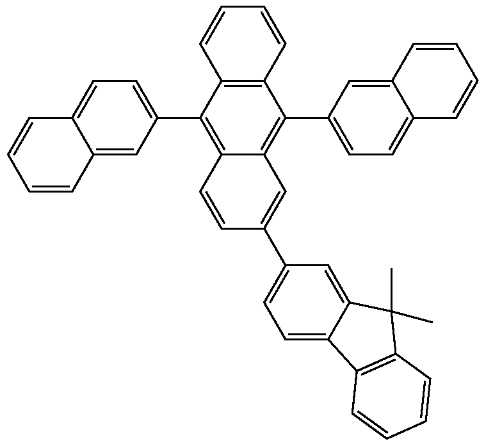

-continued
H24
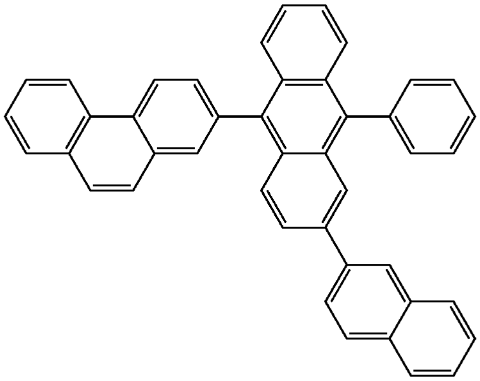
H25
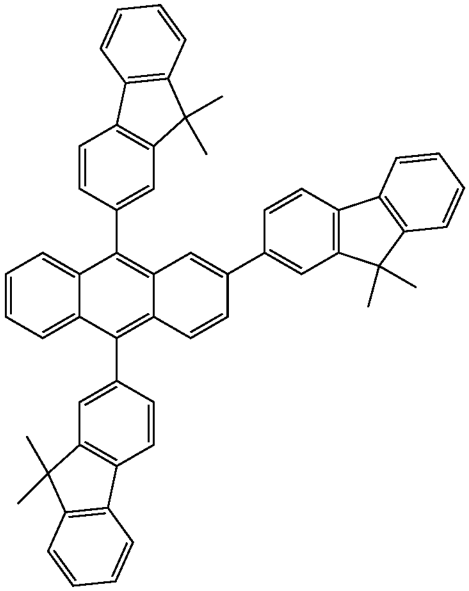
H26
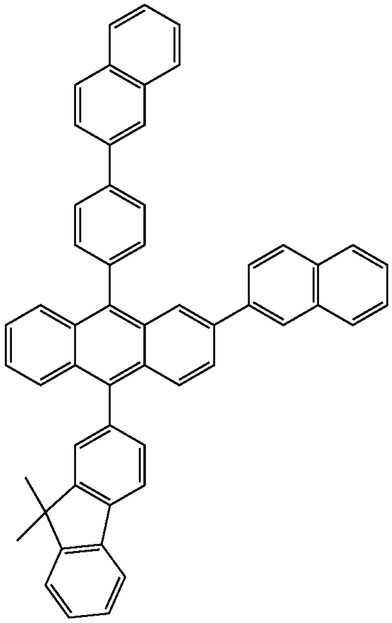
-continued
H27
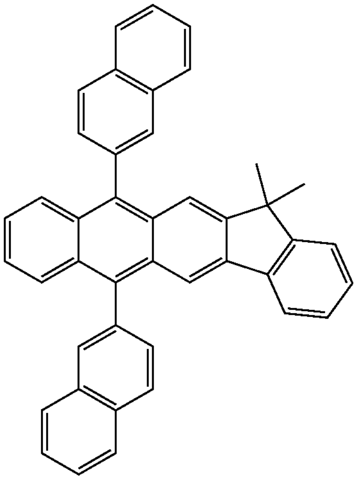
H28
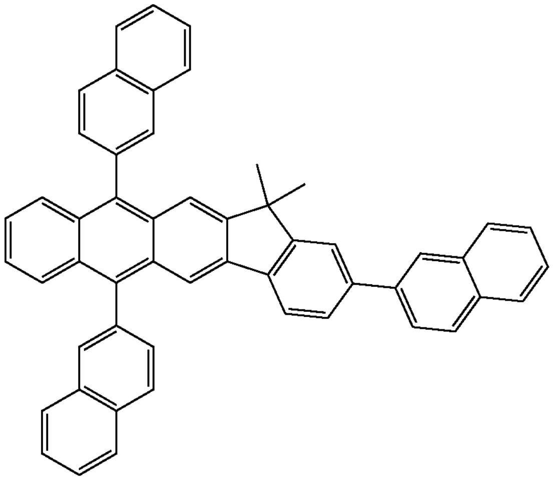
H29
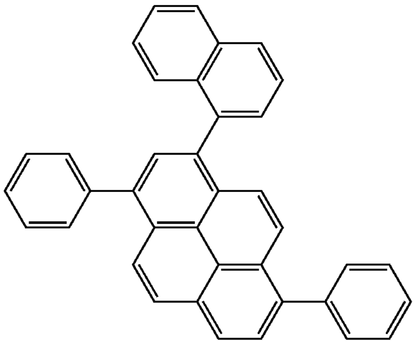

-continued
H30
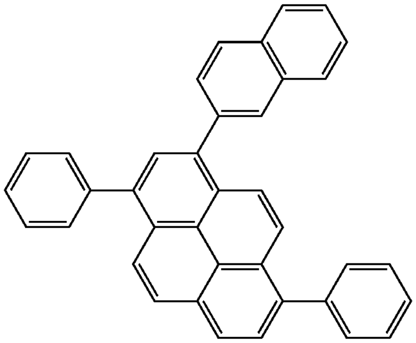
H31
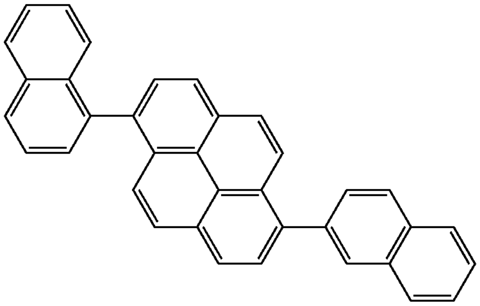
H32
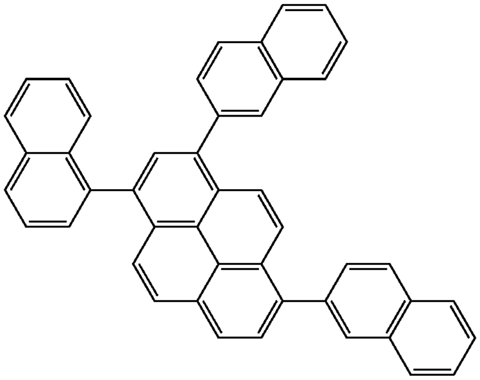
H33
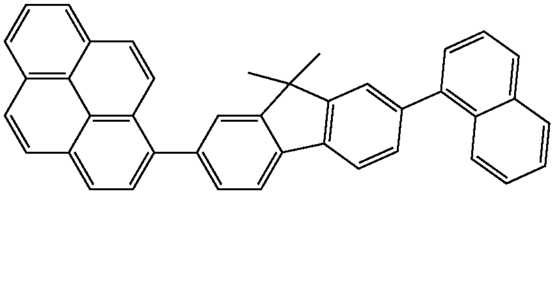
H34
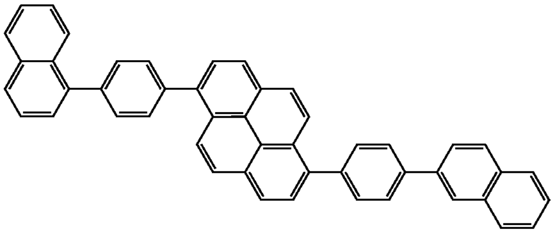
-continued
H35
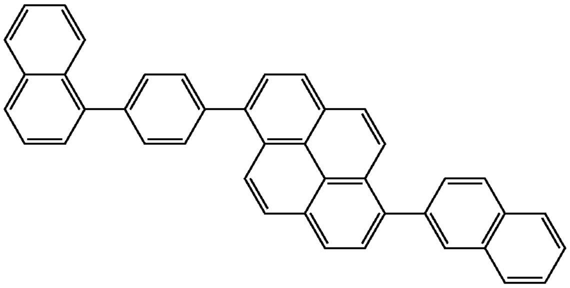
H36
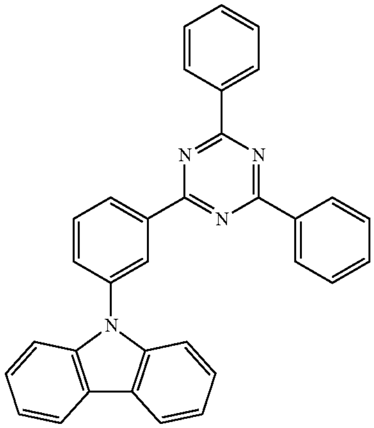
H37
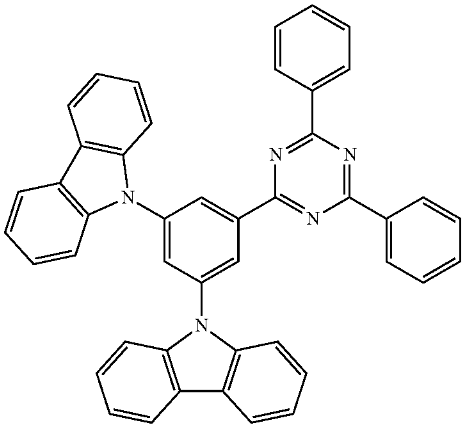
H38
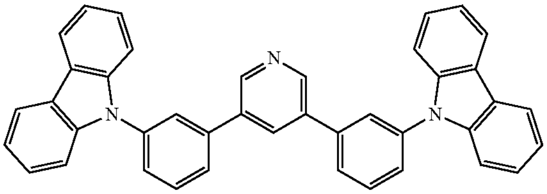

-continued
H39
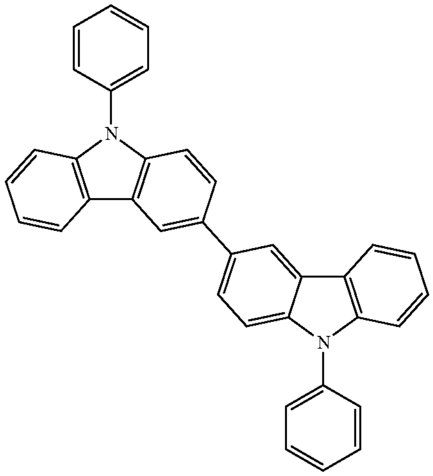
H40
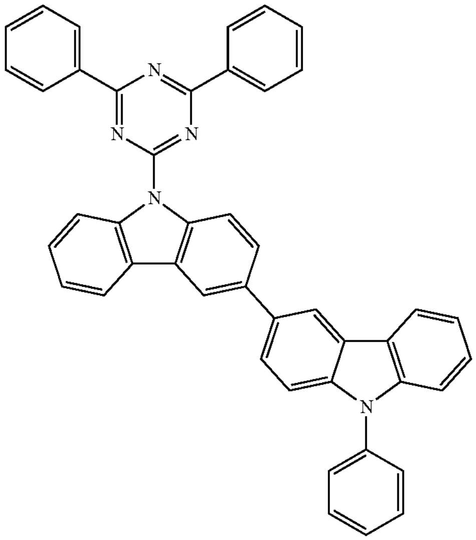
H41
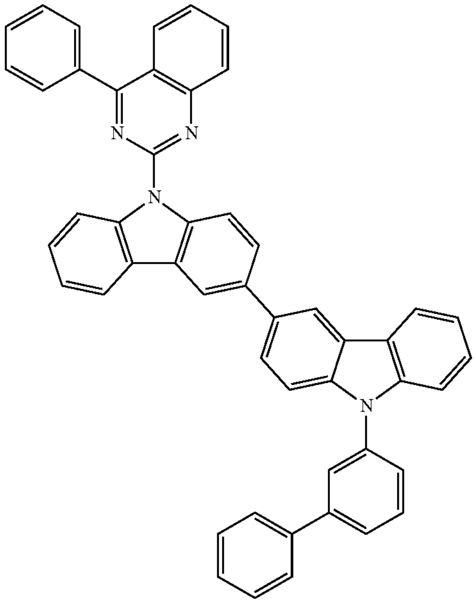
-continued
H42
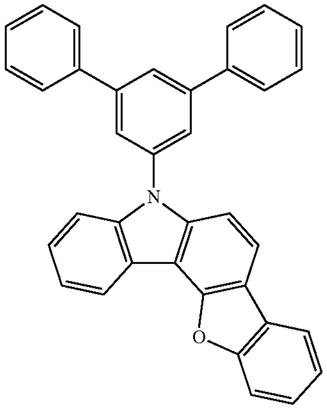
H43
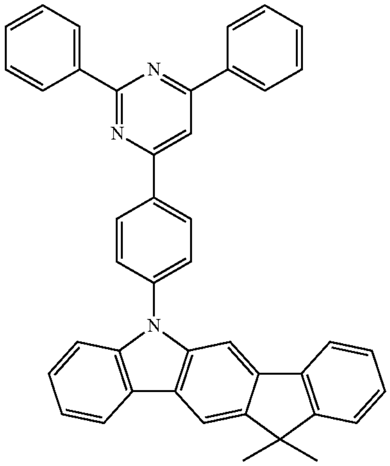
H44
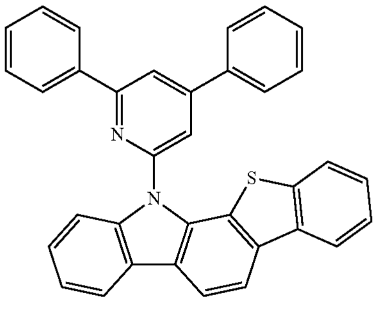

-continued
H45
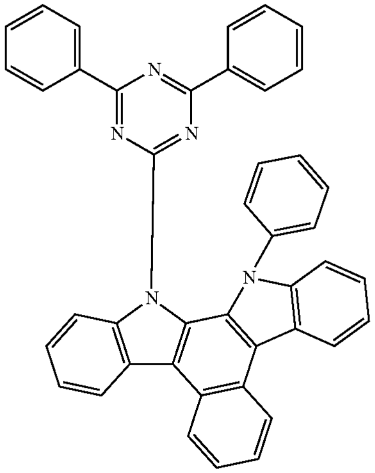
H46
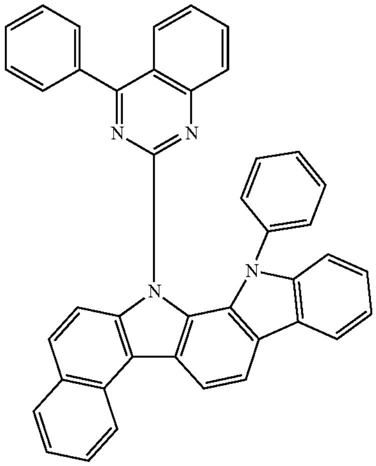
H47
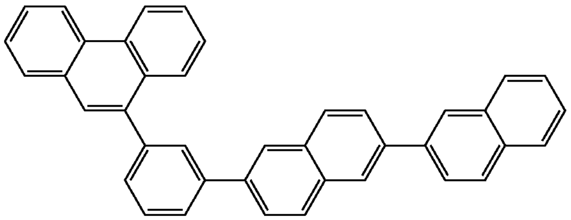
H48
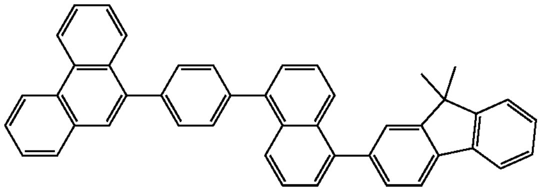
H49
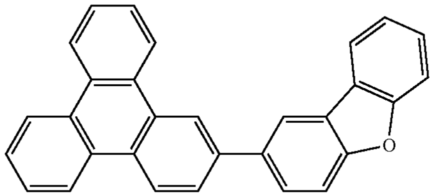
-continued
H50
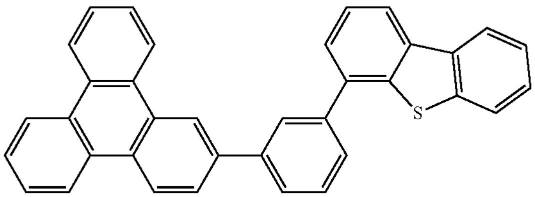
H51
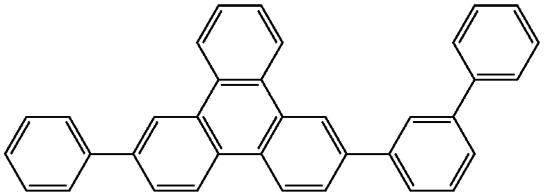
H52
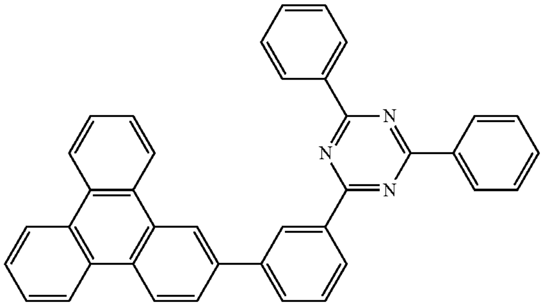
H53
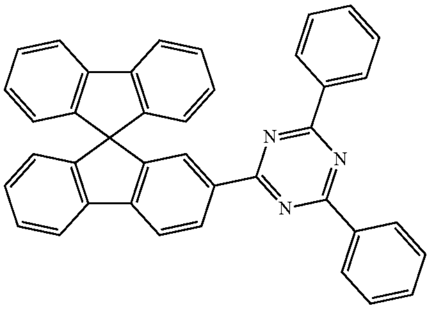
H54
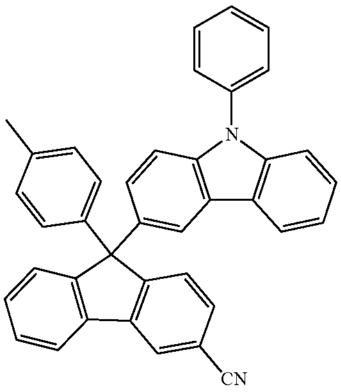

-continued
H55
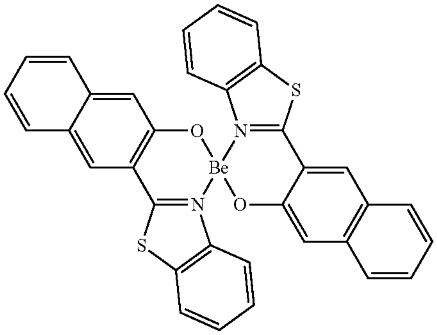
H56
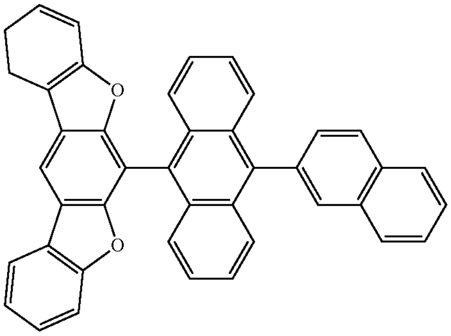
H57
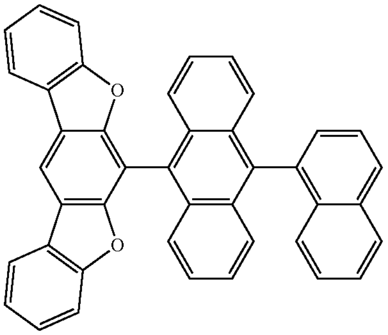
H58
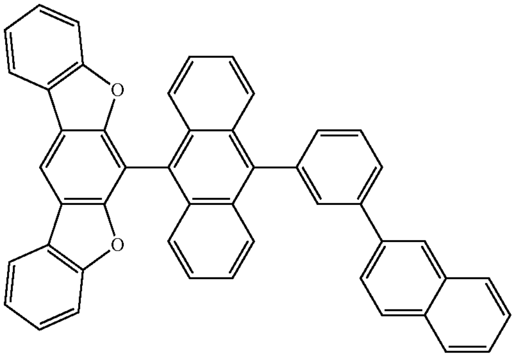
-continued
H59
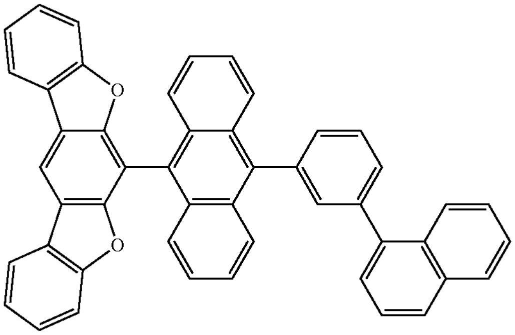
H60
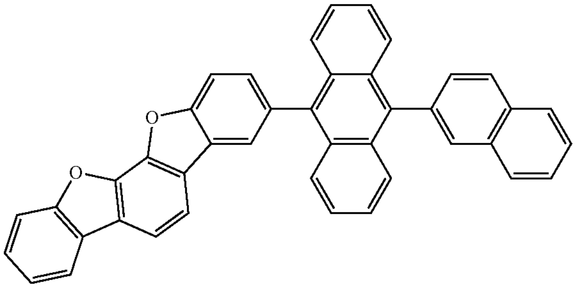
H61
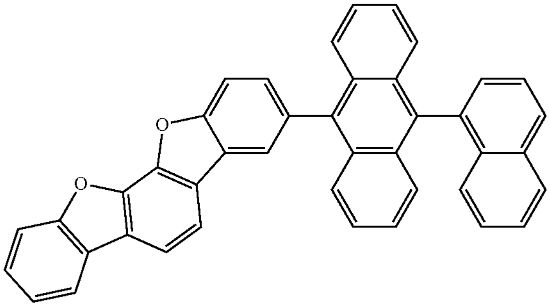
H62
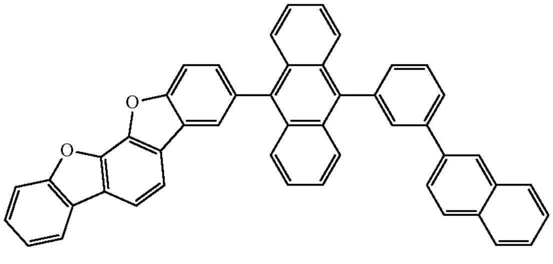
H63
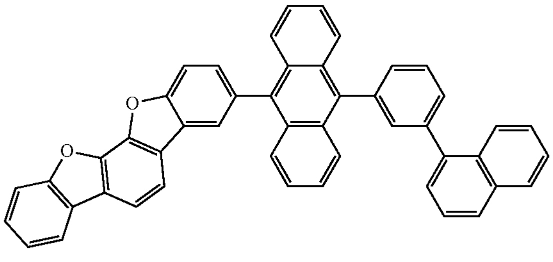

-continued
H64
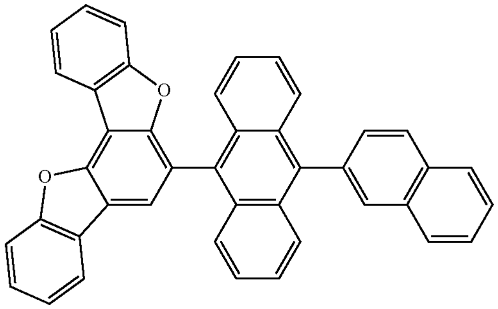
H65
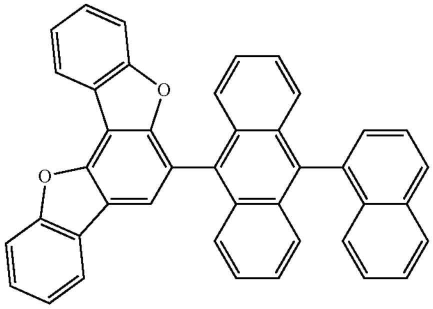
H66
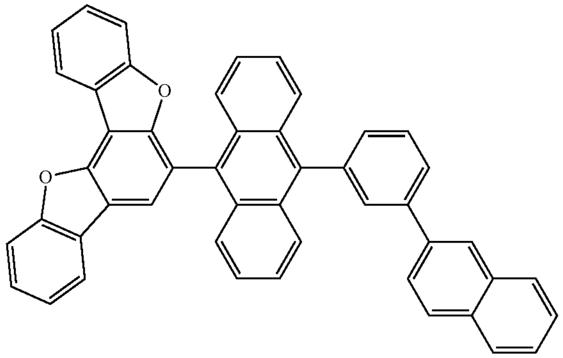
H67
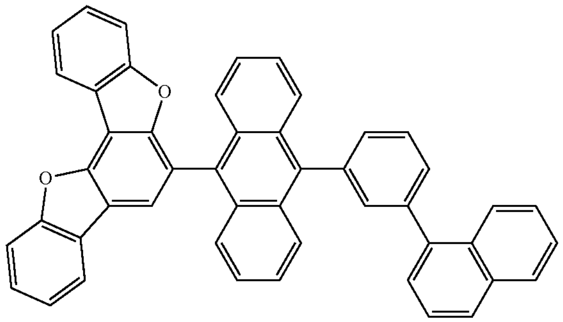
-continued
H68
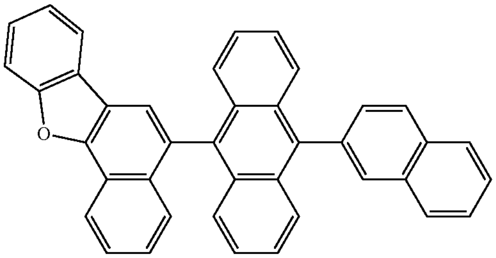
H69
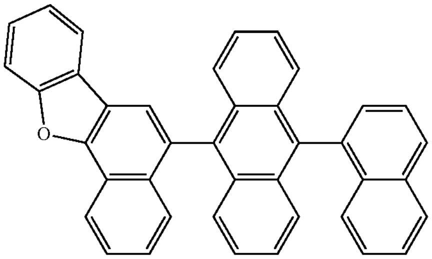
H70
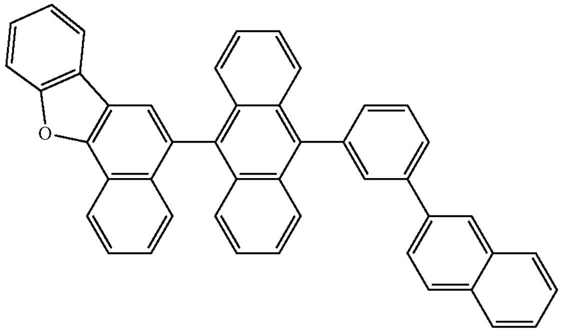
H71
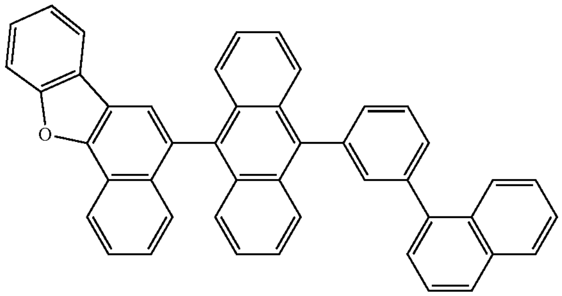
H72
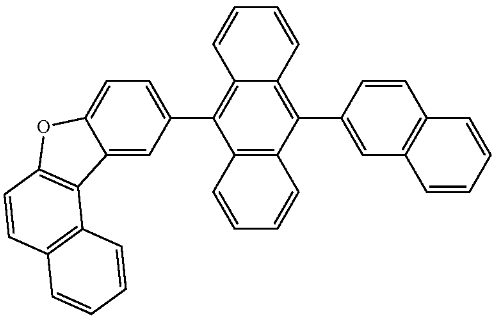

-continued
H73
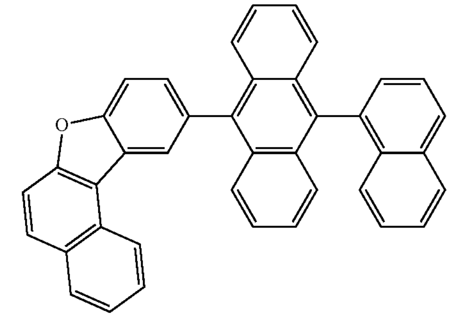
H74
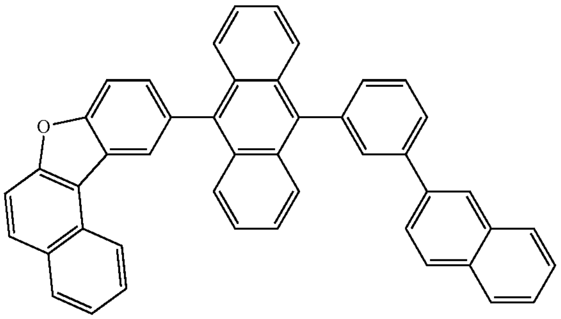
H75
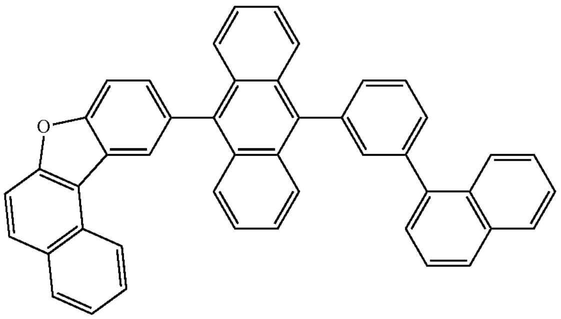
H76
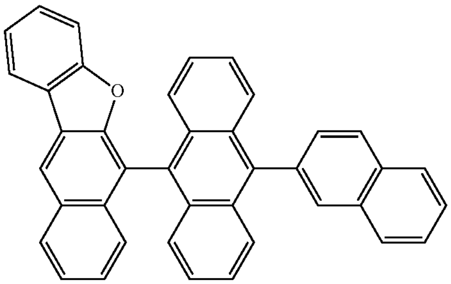
H77
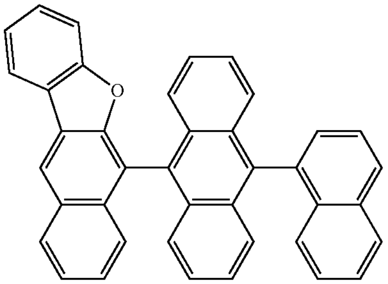
-continued
H78
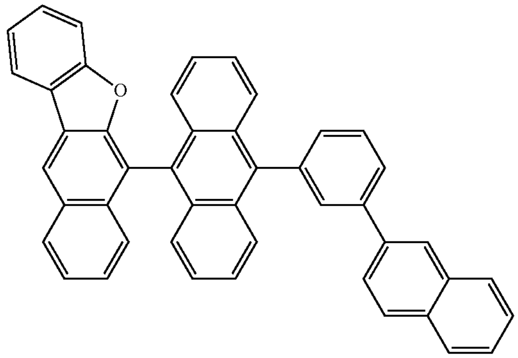
H79
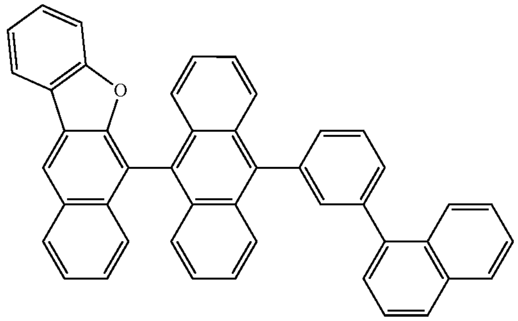
H80
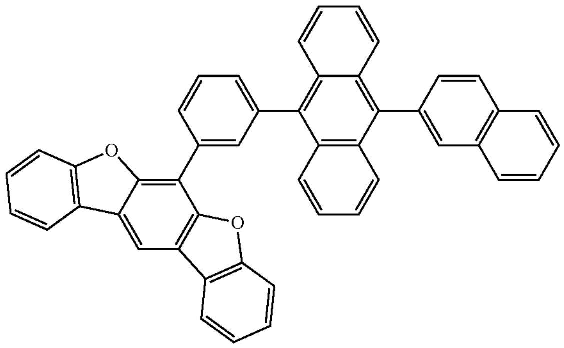
H81
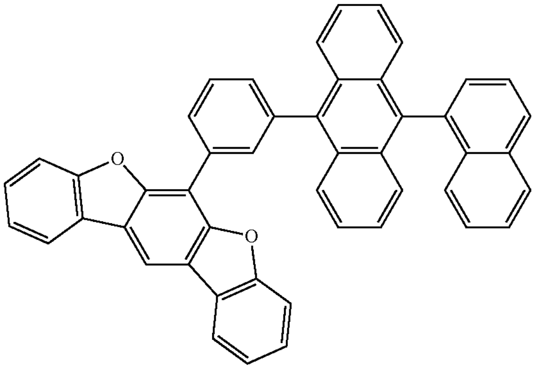

-continued
H82
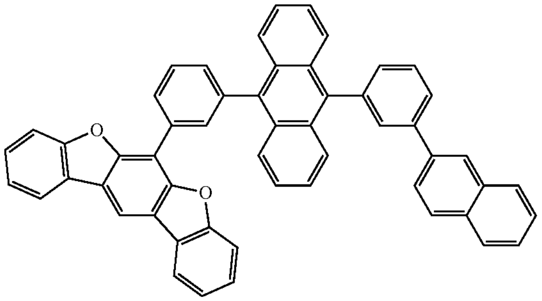
H83
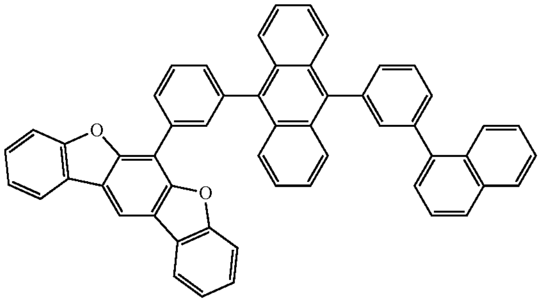
H84
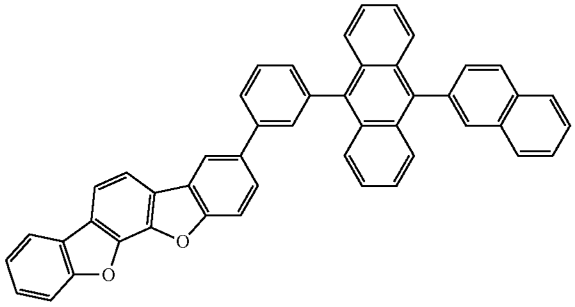
H85
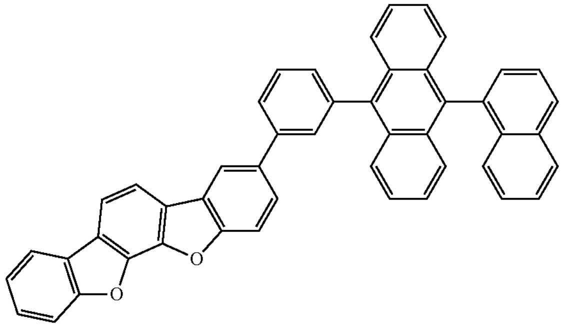
H86
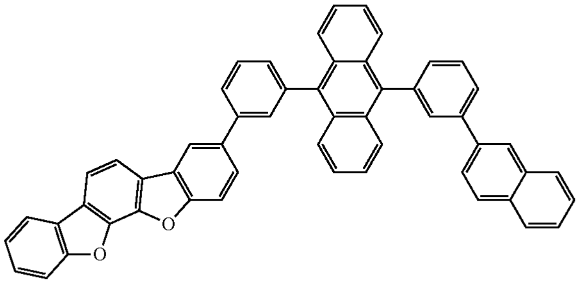
-continued
H87
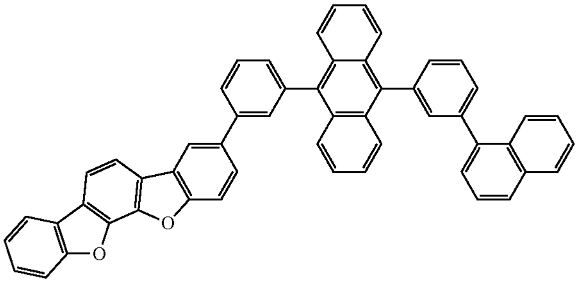
H88
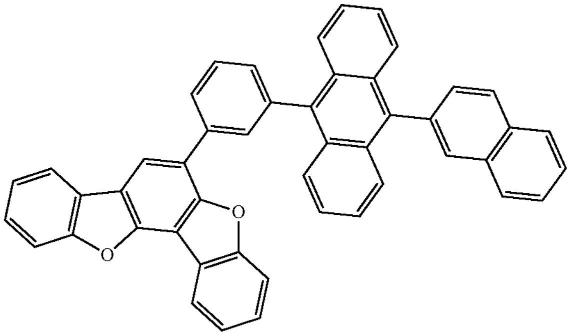
H89
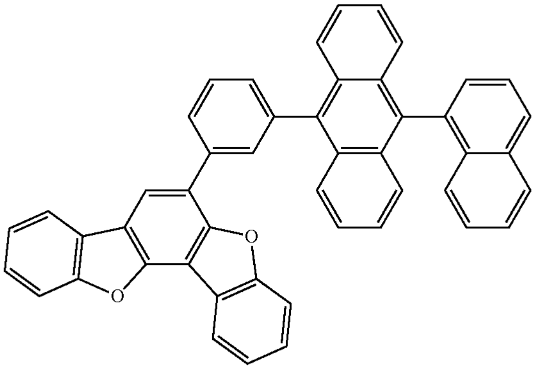
H90
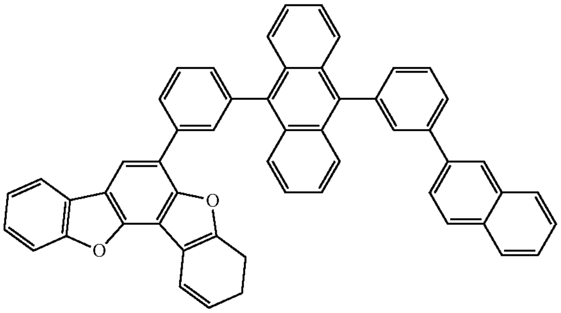

-continued
H91
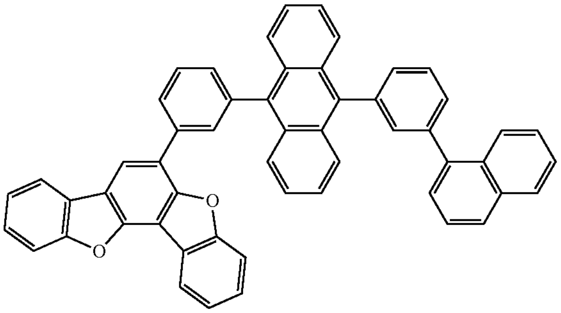
H92
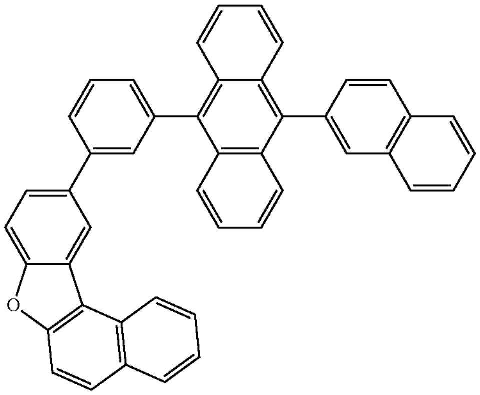
H93
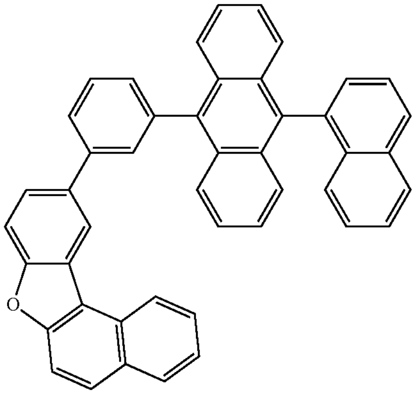
H94
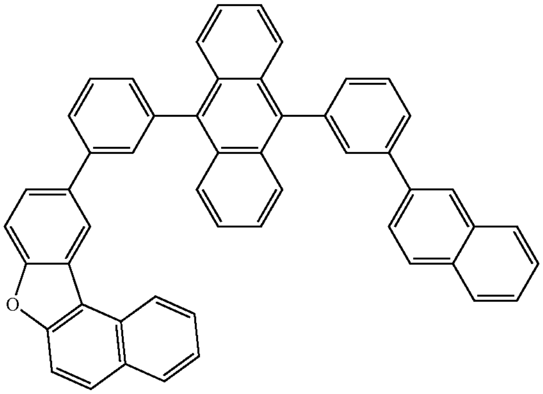
-continued
H95
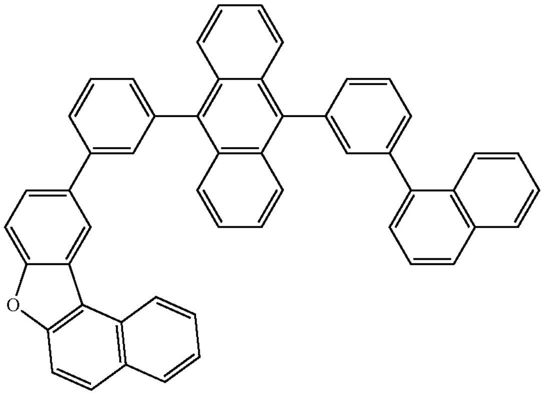
H96
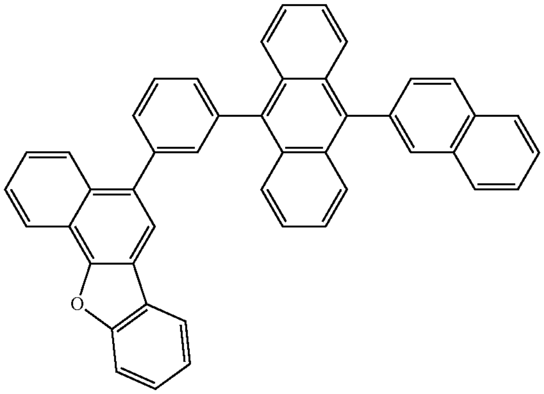
H97
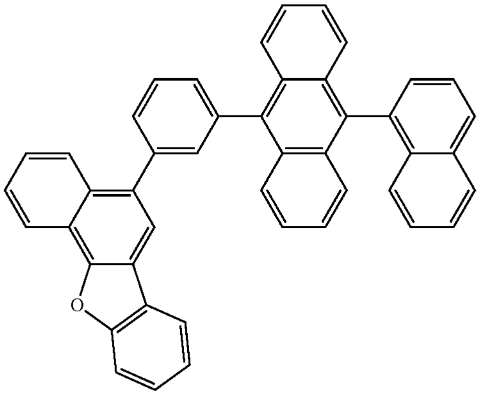
H98
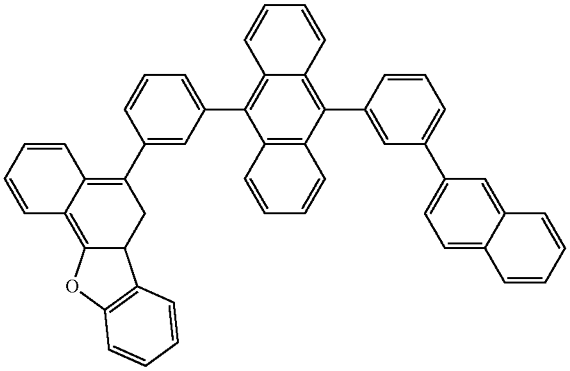

-continued
H99
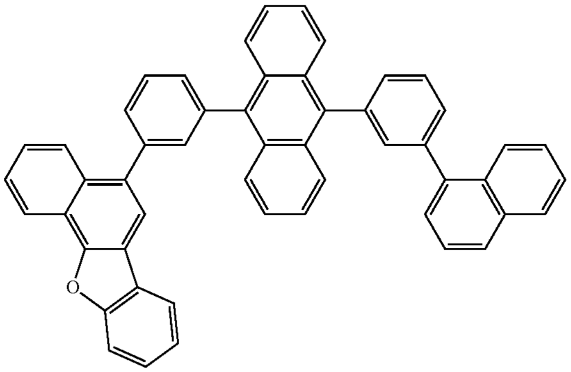
H100
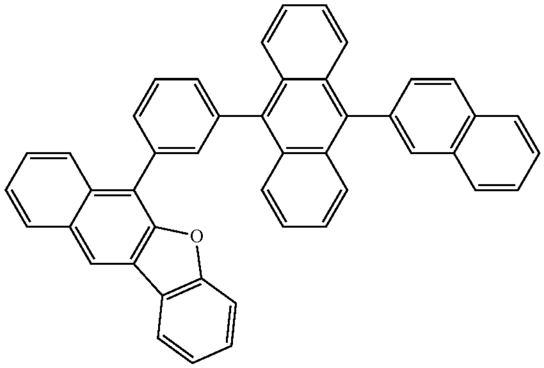
H101
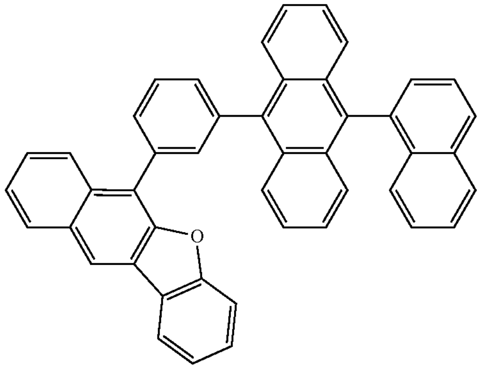
H102
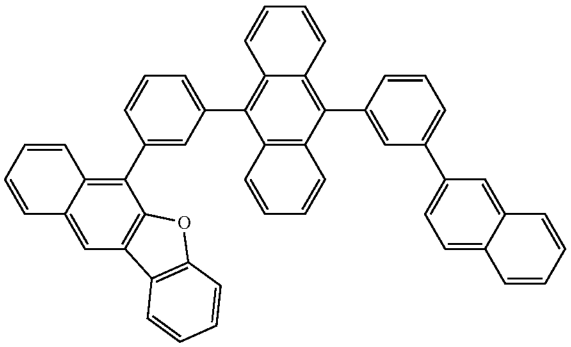
-continued
H103
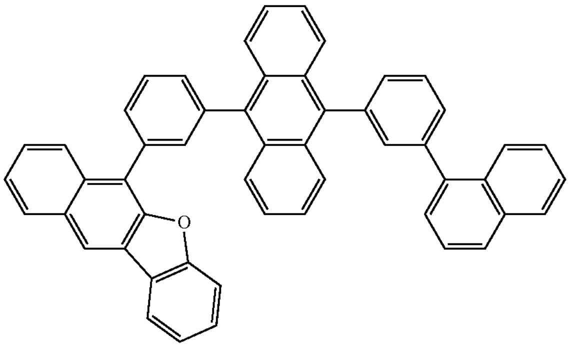
H104
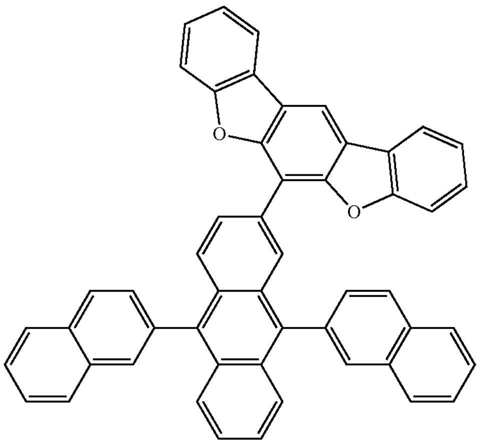
H105
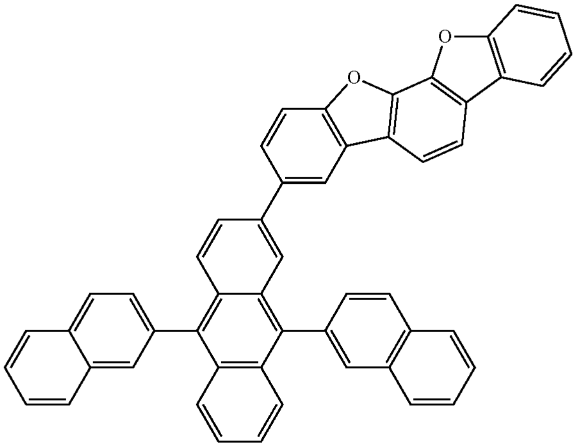

-continued
H106
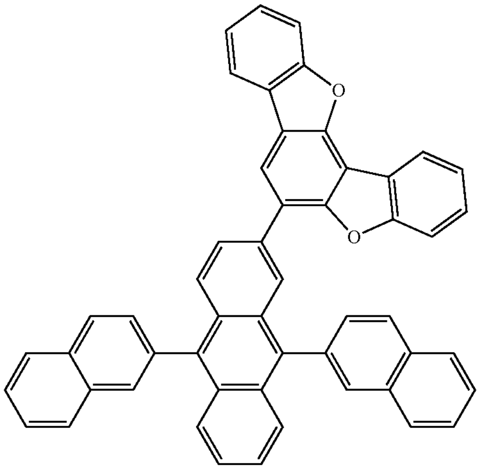
H107
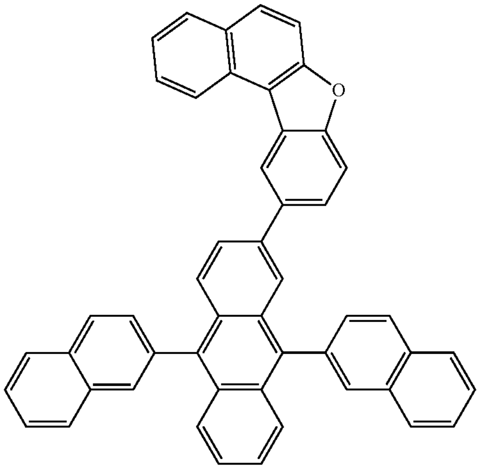
H108
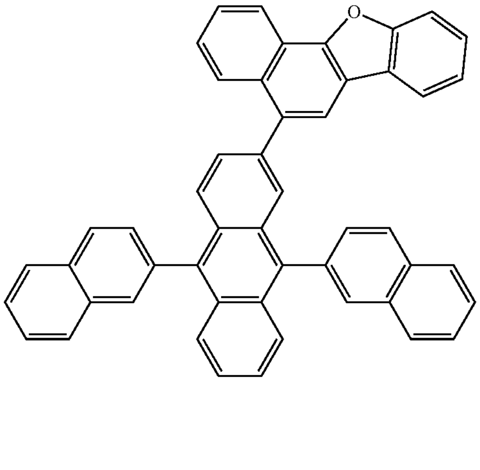
-continued
H109
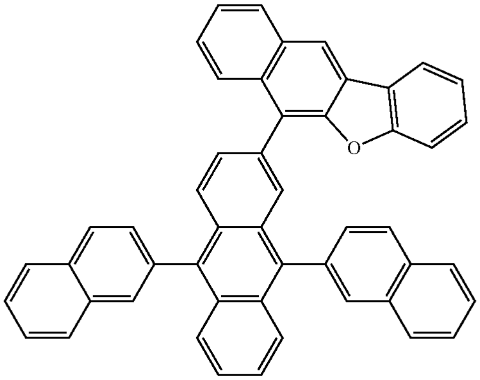
H110
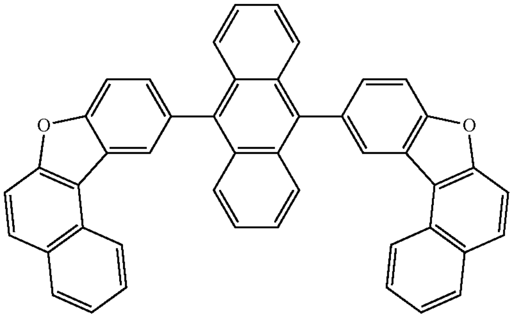
H111
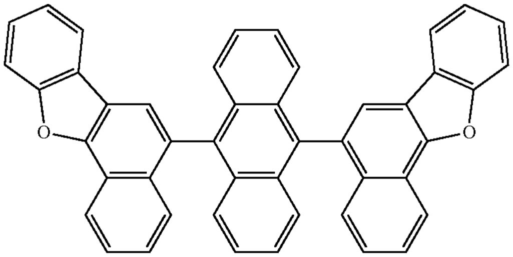
H112
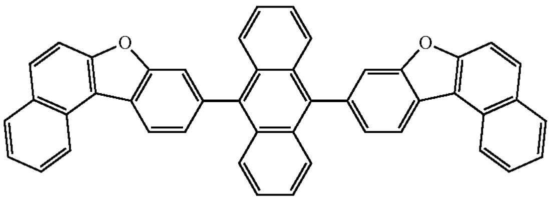
H113
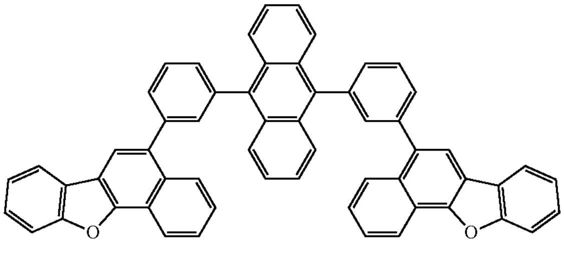

-continued
H114
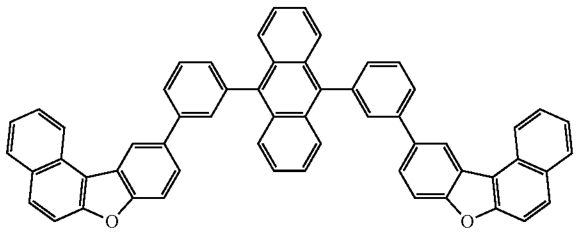
H115
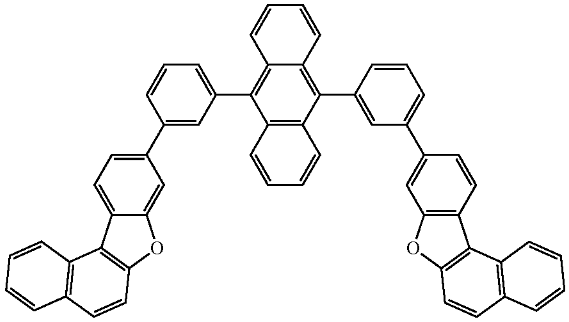
H116
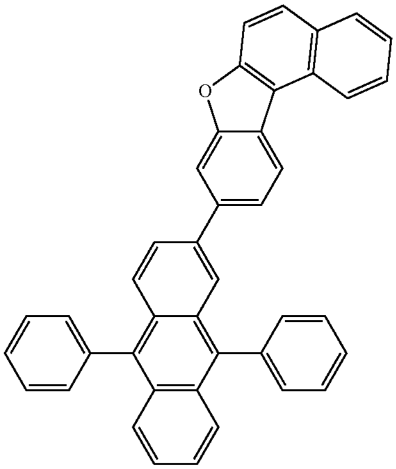
H117
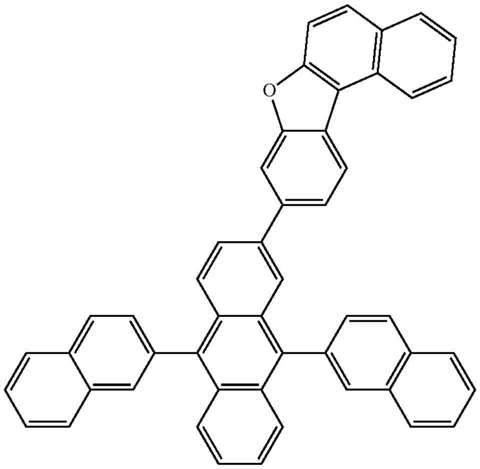
-continued
H118
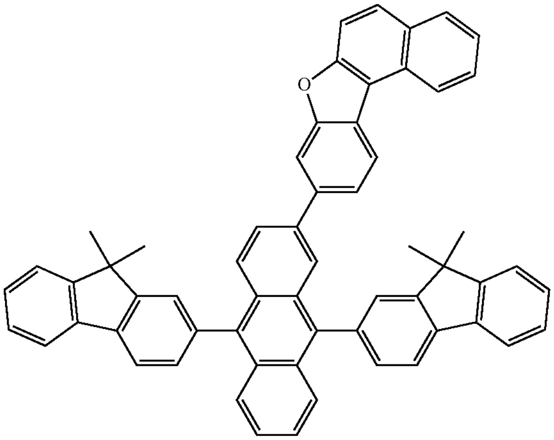
H119
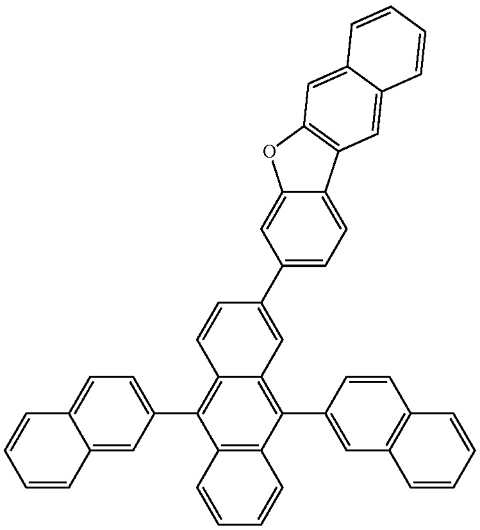
H120
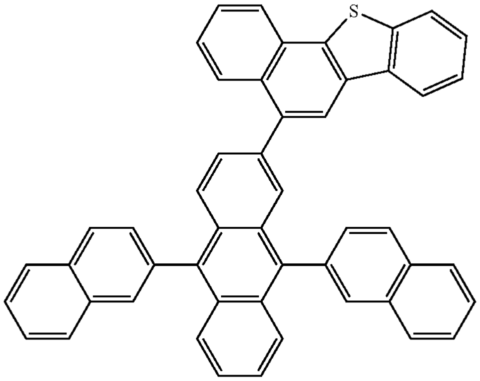

-continued

H121

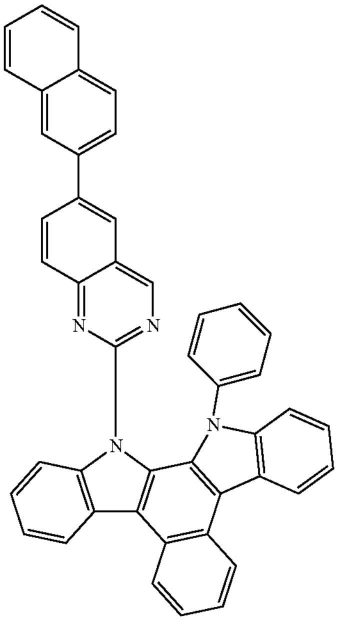

H122

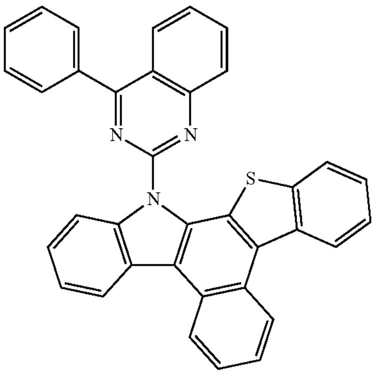

H123

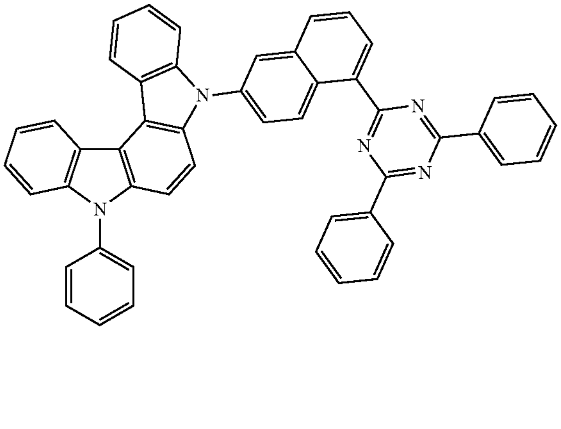

-continued

H124

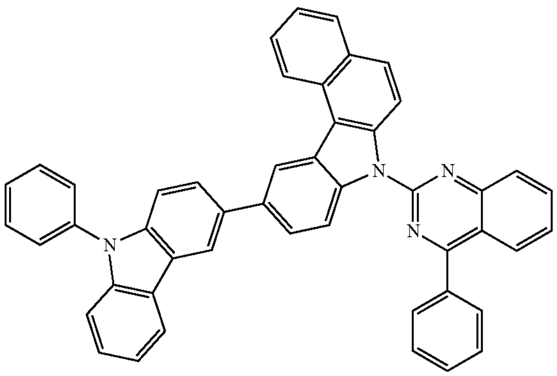

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or one or more combinations thereof.

The phosphorescent dopant may be electrically neutral.

In an embodiment, the phosphorescent dopant may include an organometallic compound represented by Formula 401:

Formula 401

$$M(L_{401})_{xc1}(L_{402})_{xc2}$$

Formula 402

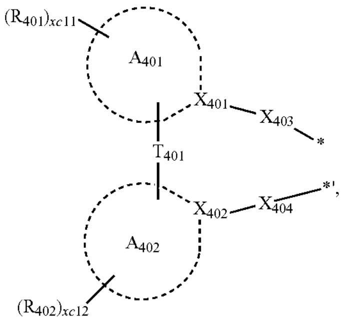

wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is two or more, two or more of $L_{401}$ (s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(═O)—*', *—N($Q_{411}$)-*', *—C($Q_{411}$)($Q_{412}$)-*', *—C($Q_{411}$)═C($Q_{412}$)-*', *—C($Q_{411}$)═*', or *═C($Q_{411}$)═*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are respectively the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group that is unsubstituted or substituted with at least one $R_{10a}$, a $C_1$-$C_{20}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ are respectively the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 402 is 2 or more, two ring $A_{401}$ in two or more of $L_{401}$ (s) may be optionally linked to each other via $T_{402}$, which is a linking group, and two ring $A_{402}$ may optionally be linked to each other via $T_{403}$, which is a linking group (see Compounds PD1 to PD4 and PD7). $T_{402}$ and $T_{403}$ are respectively the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(═O), an isonitrile group, —CN group, a phosphorus group (for example, a phosphine group, a phosphite group, etc.), or one or more combinations thereof.

The phosphorescent dopant may include, for example, at least one of compounds PD1 to PD39, or one or more combinations thereof:

PD1

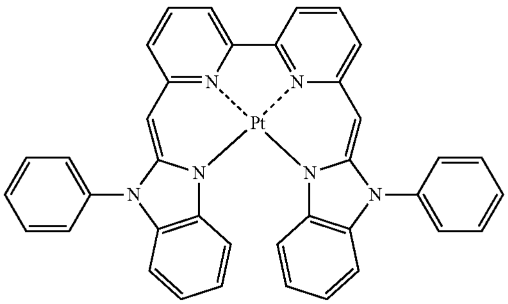

-continued

PD2

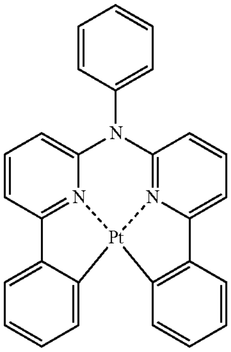

PD3

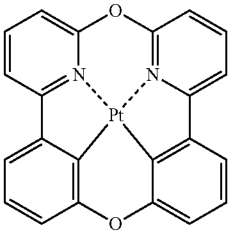

PD4

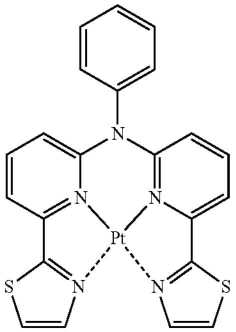

PD5

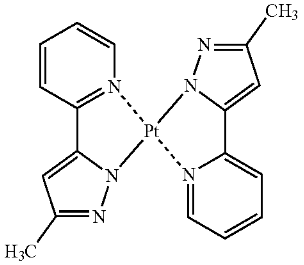

PD6

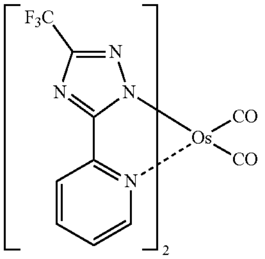

-continued
PD7
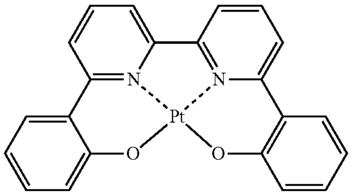
PD8
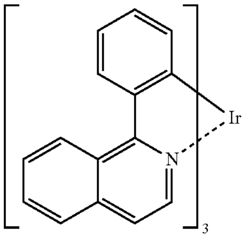
PD9
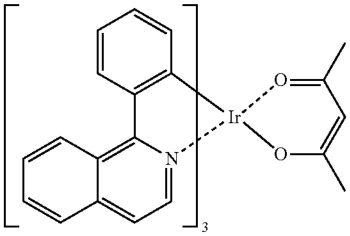
PD10
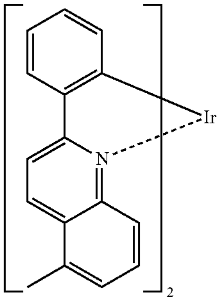
PD11
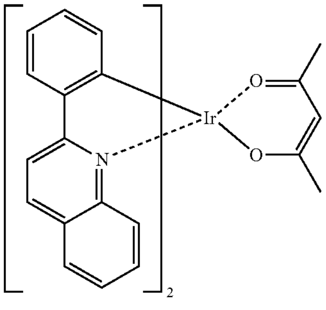
-continued
PD12
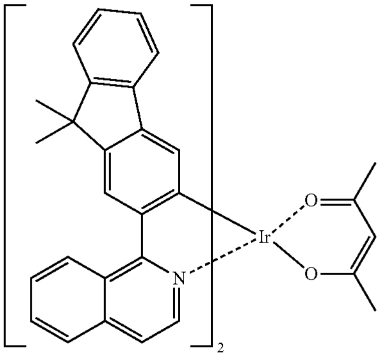
PD13
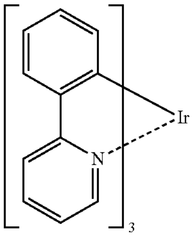
PD14
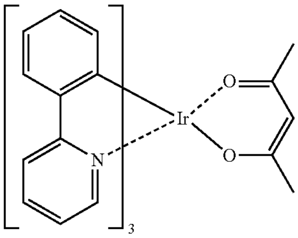
PD15
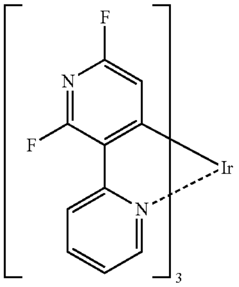
PD16
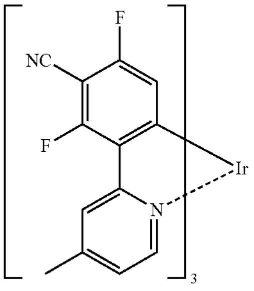

-continued
PD17
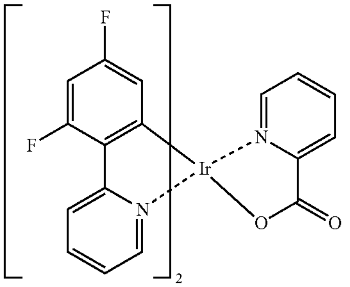
PD18
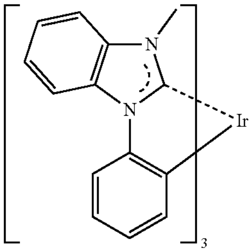
PD19
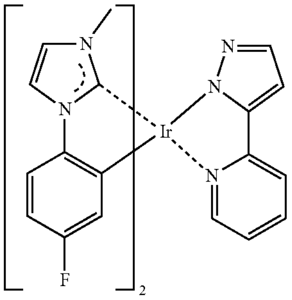
PD20
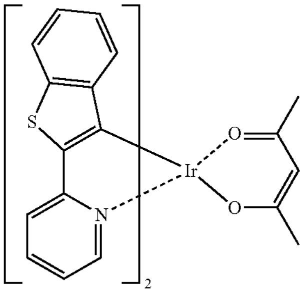
PD21
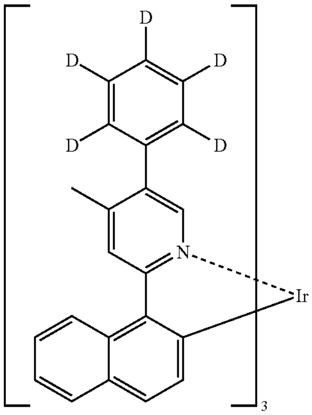
-continued
PD22
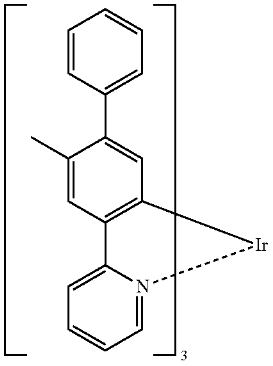
PD23
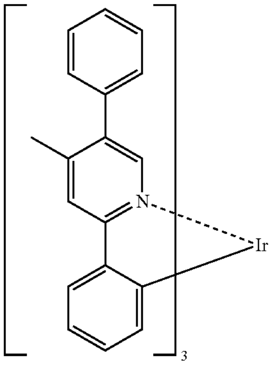
PD24
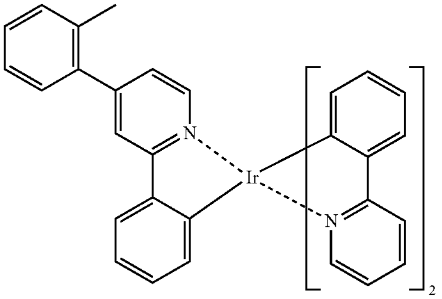
PD25
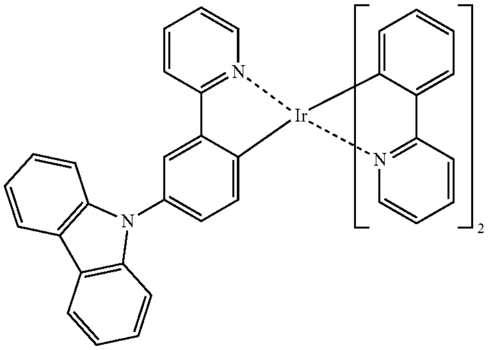

-continued
PD26
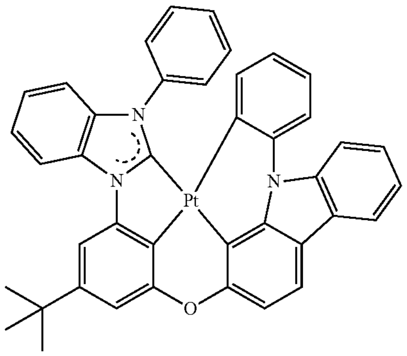
PD27
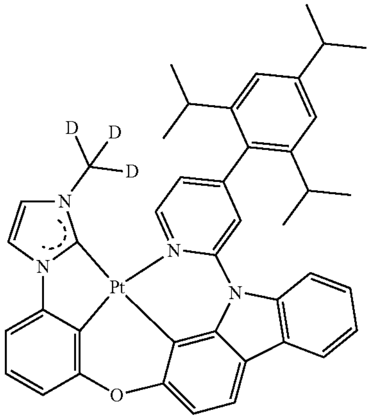
PD28
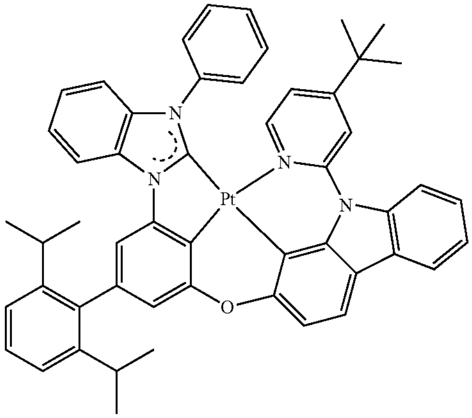
PD29
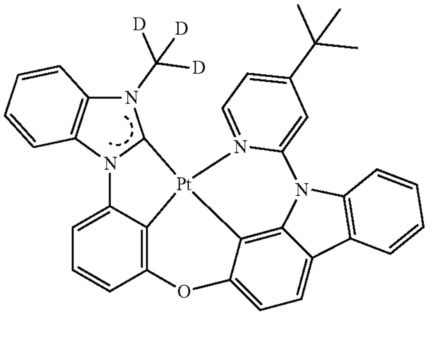
-continued
PD30
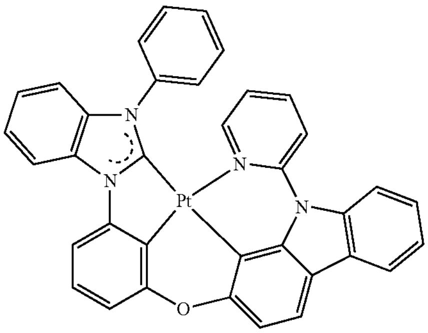
PD31
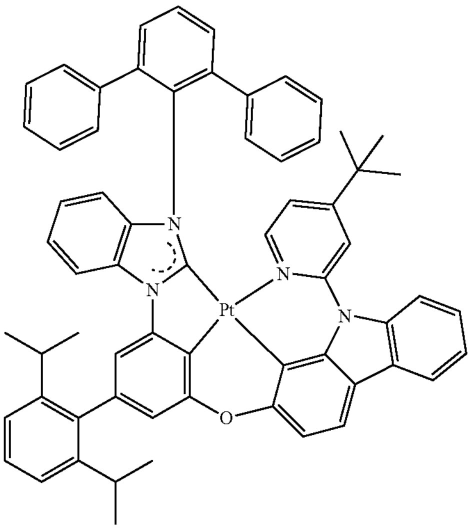
PD32
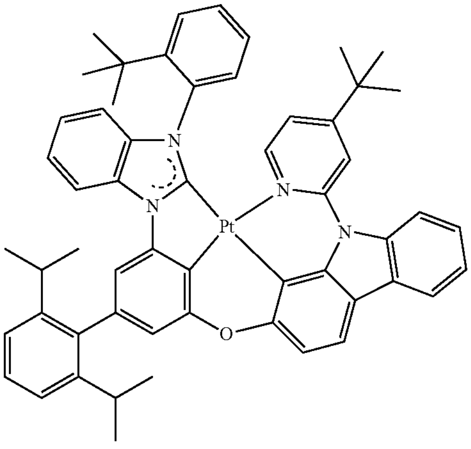

-continued
PD33
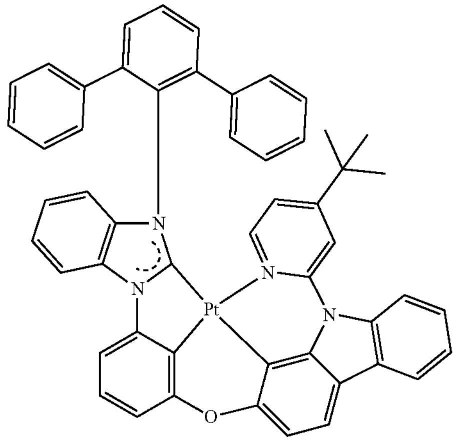
PD34
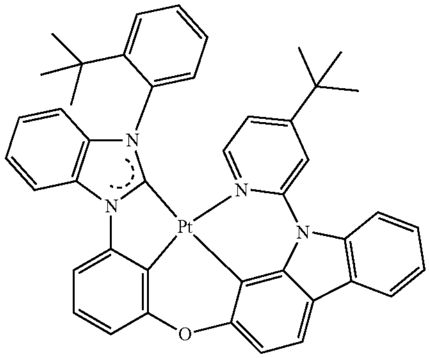
PD35
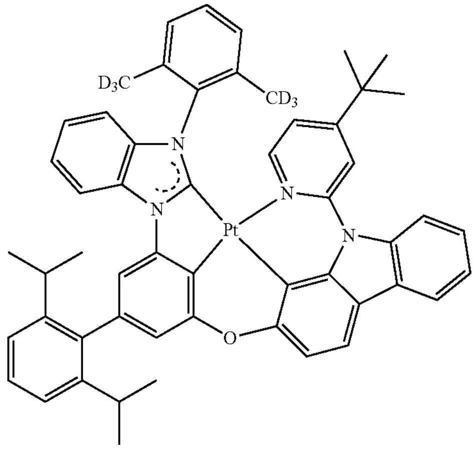
PD36
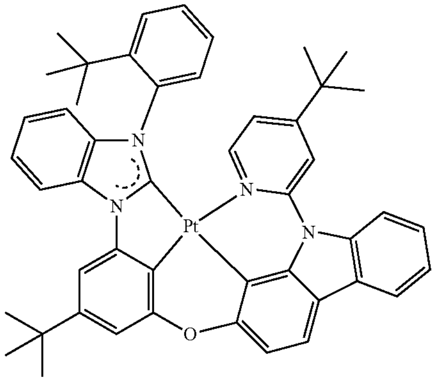
-continued
PD37
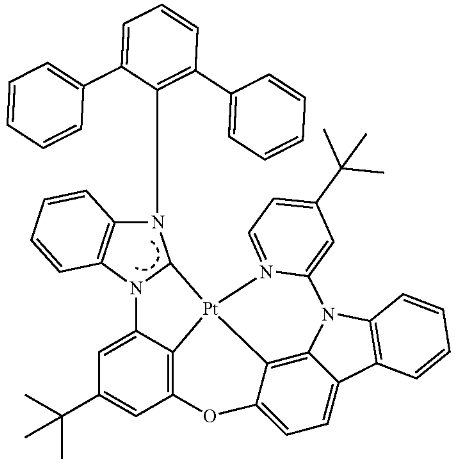
PD38
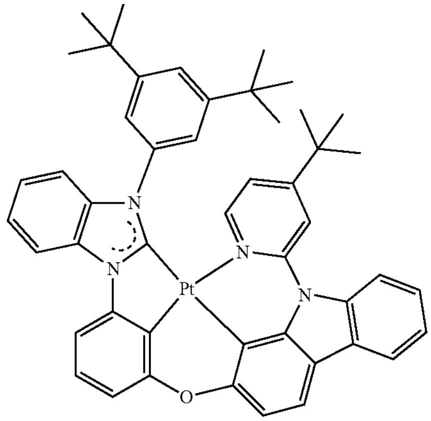
PD39
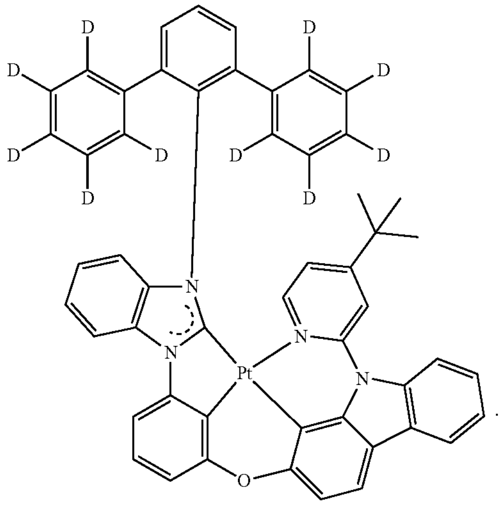
Fluorescent Dopant
The fluorescent dopant may include an amine group-containing compound, a styryl group-containing compound, or a combination thereof.
In an embodiment, the fluorescent dopant may include a compound represented by Formula 501:

Formula 501

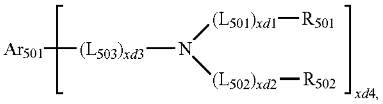

wherein, in Formula 501, $Ar_{501}$, $L_{501}$ to $L_{503}$, $R_{501}$, and $R_{502}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In an embodiment, xd4 in Formula 501 may be 2.

In an embodiment, the fluorescent dopant may include: at least one of Compounds FD1 to FD36; DPVBi; DPAVBi; or one or more combinations thereof:

FD1

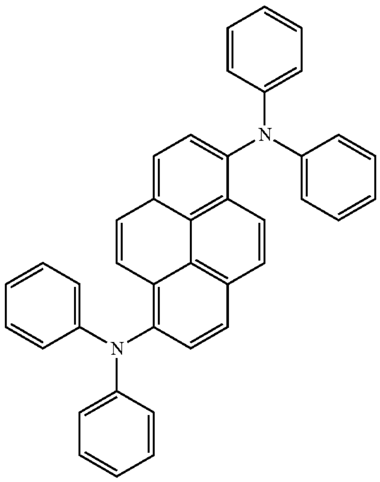

FD2

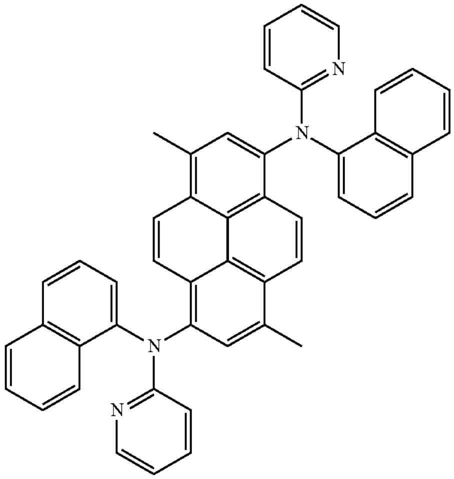

-continued

FD3

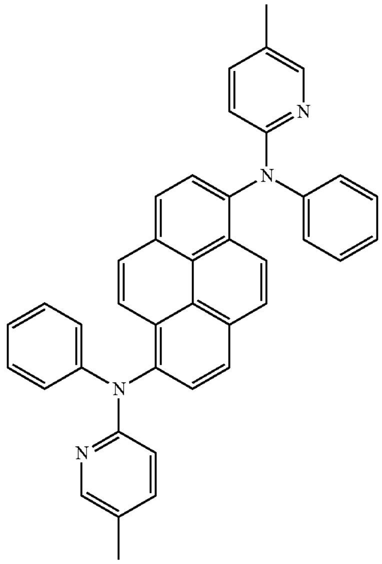

FD4

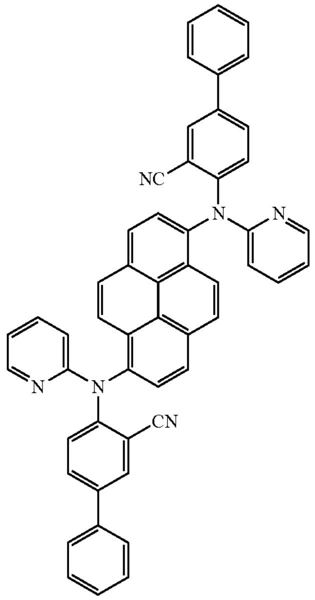

FD5

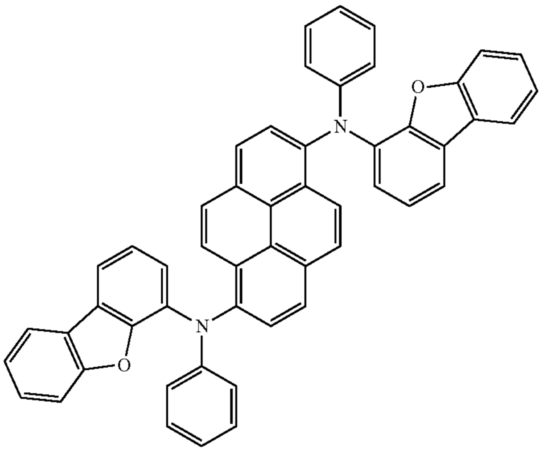

-continued
FD6
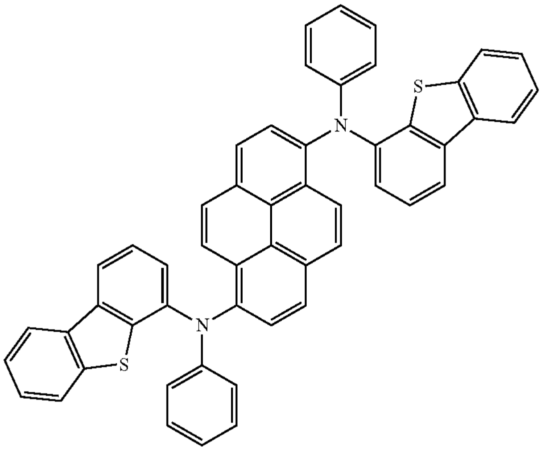
FD7
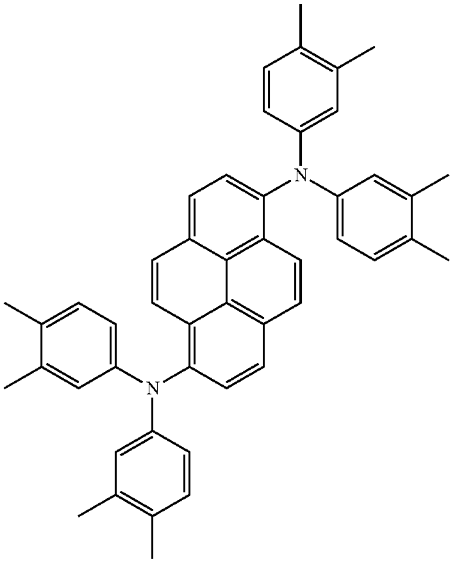
FD8
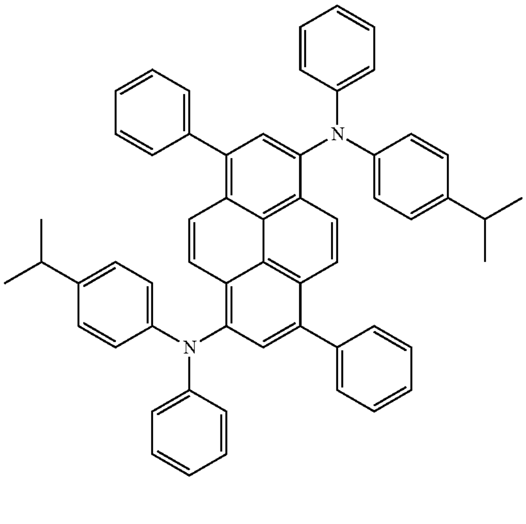
-continued
FD9
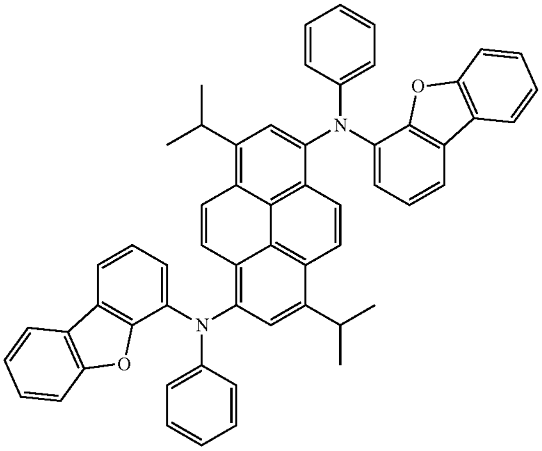
FD10
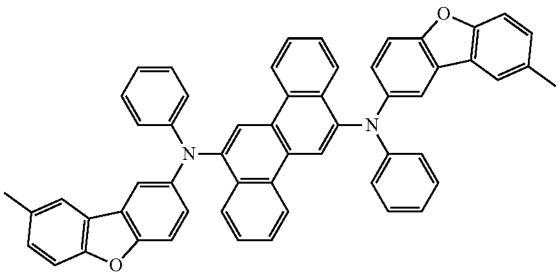
FD11
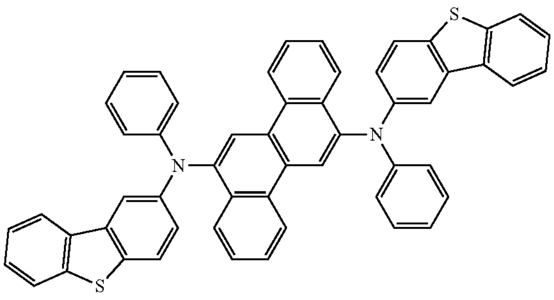
FD12
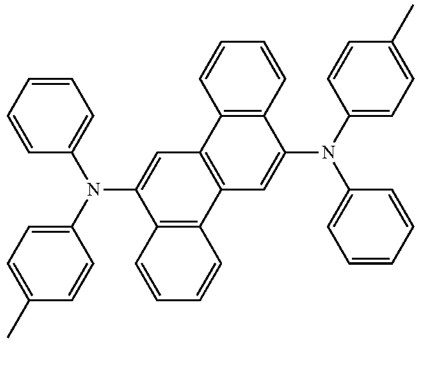

-continued
FD13
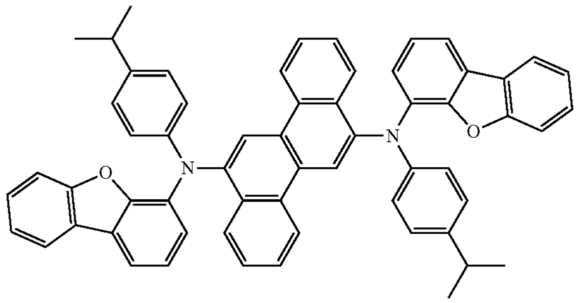
FD14
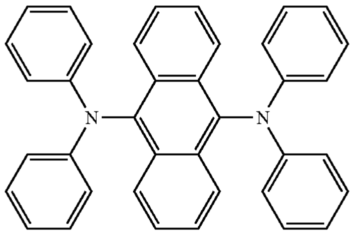
FD15
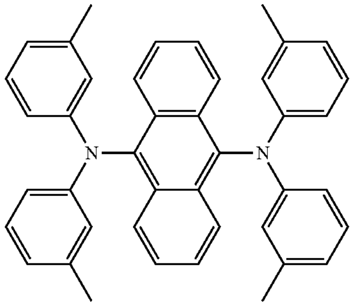
FD16
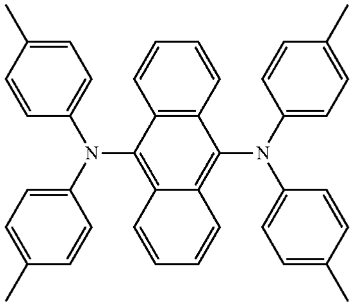
FD17
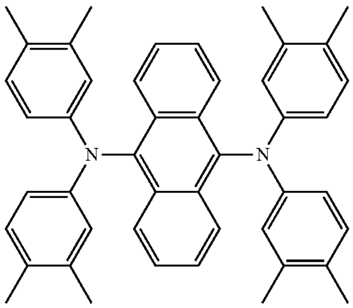
-continued
FD18
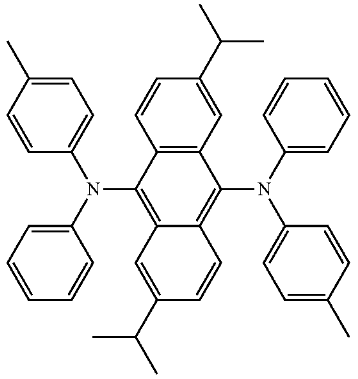
FD19
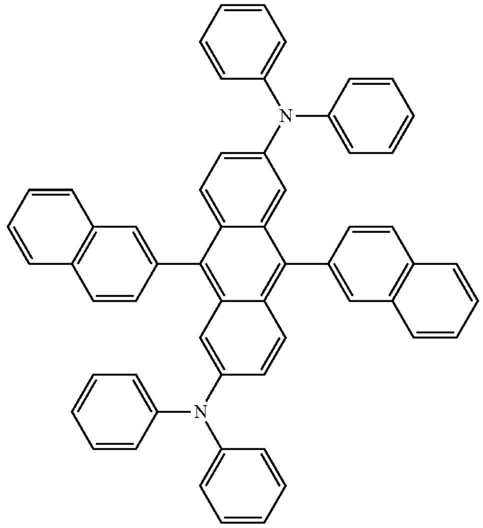
FD20
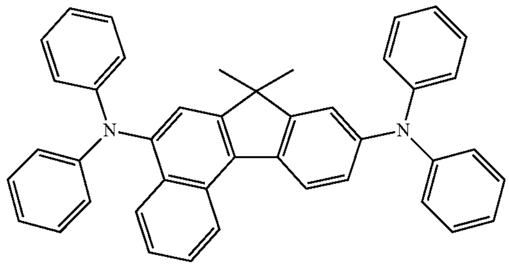
FD21
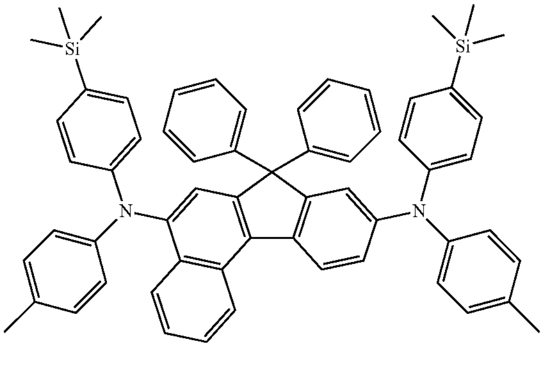

-continued
FD22
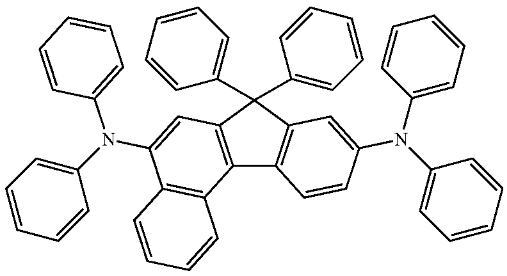
FD23
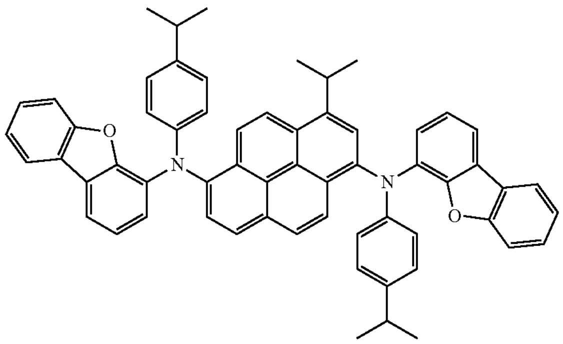
FD24
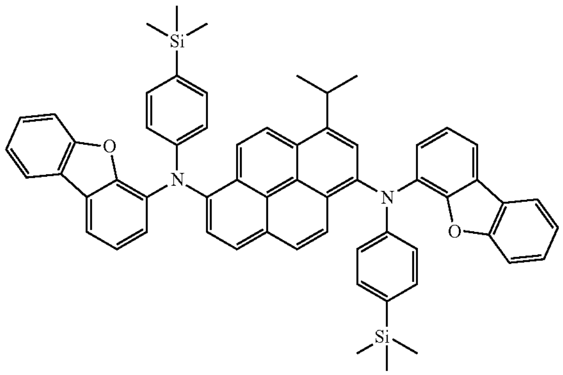
FD25
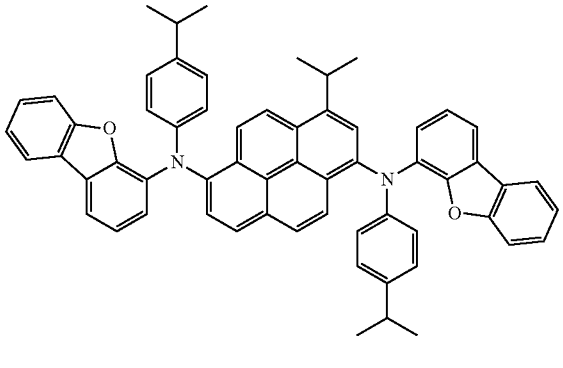
-continued
FD26
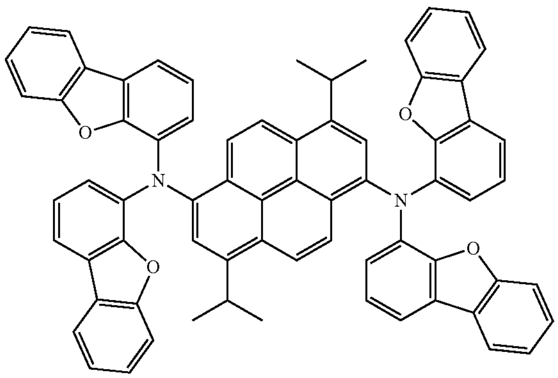
FD27
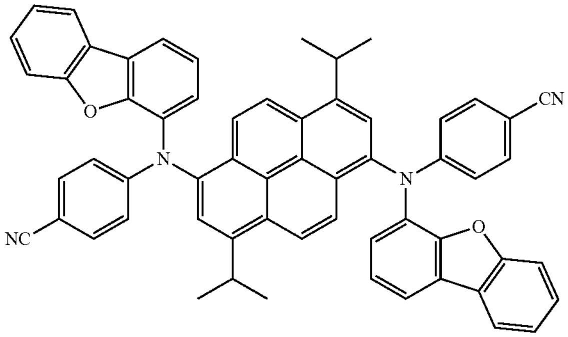
FD28
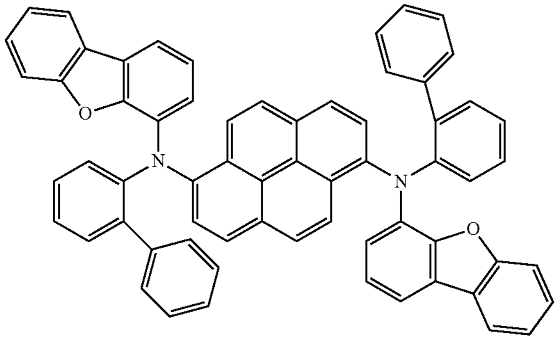
FD29
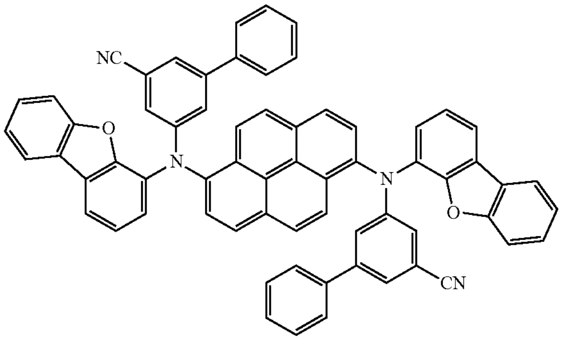

FD30
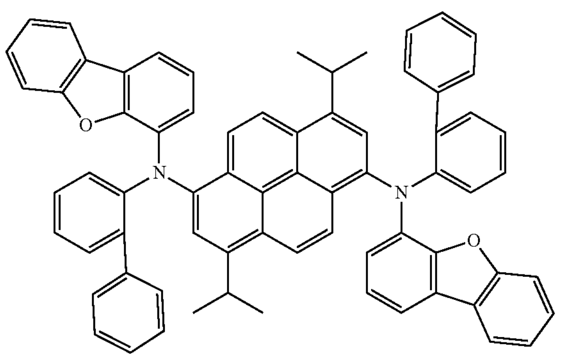
FD31
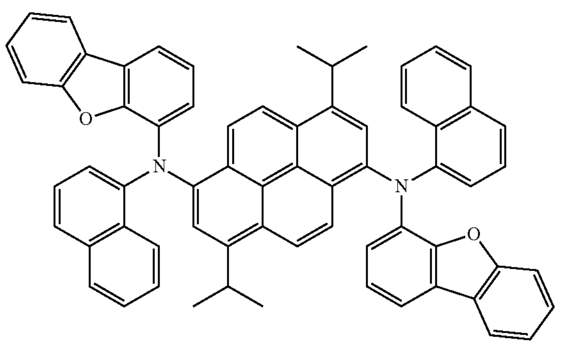
FD32
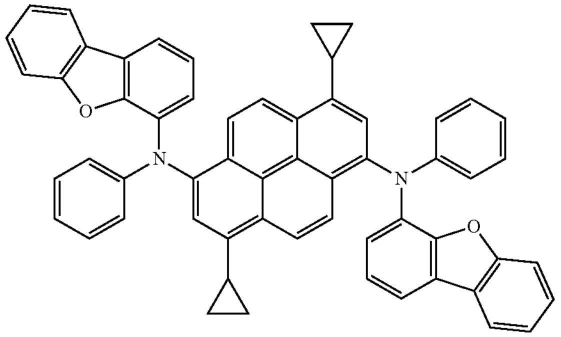
FD33
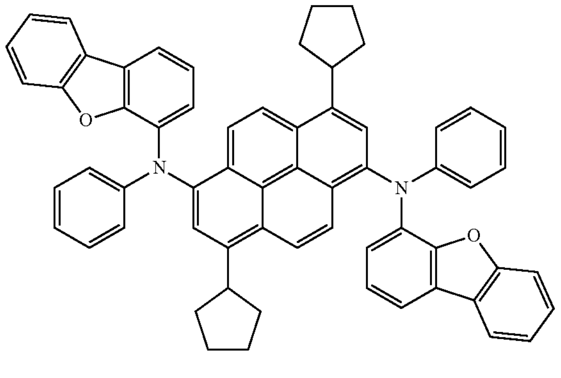
FD34
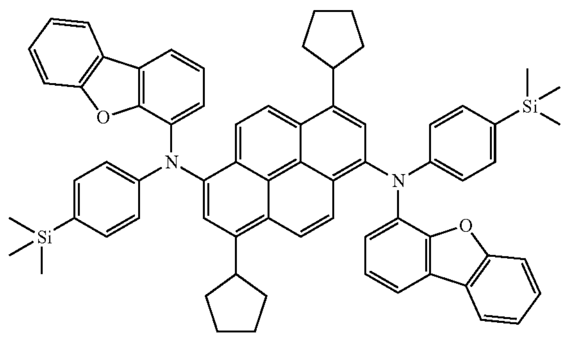
FD35
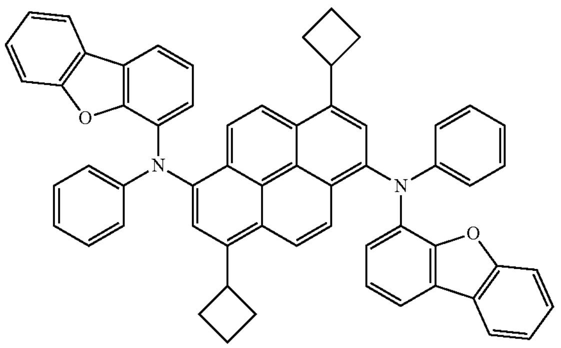
FD36
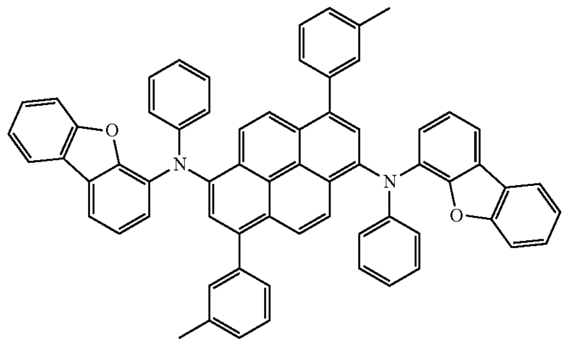
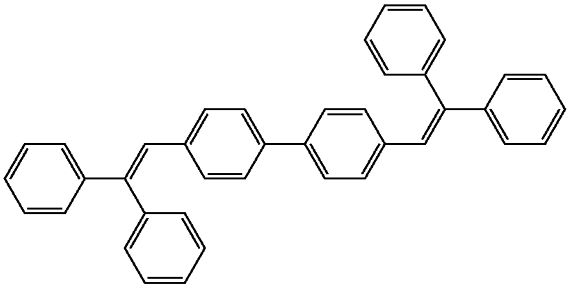
DPVBi
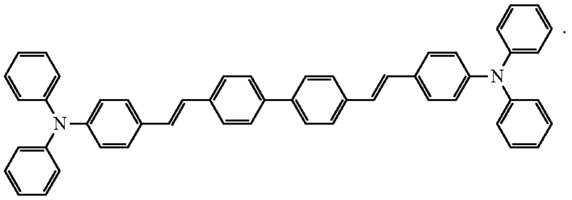
DPAVBi Delayed Fluorescence Material The emission layer may include a delayed fluorescence material.

In the present disclosure, the delayed fluorescence material may be selected from compounds capable of emitting delayed fluorescence based on a delayed fluorescence emission mechanism.

The delayed fluorescence material included in the emission layer may act as a host or a dopant depending on the type or kind of other materials included in the emission layer.

In an embodiment, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved (increased).

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Examples of the delayed fluorescence material may include at least one of the following Compounds DF1 to DF9:

DF1

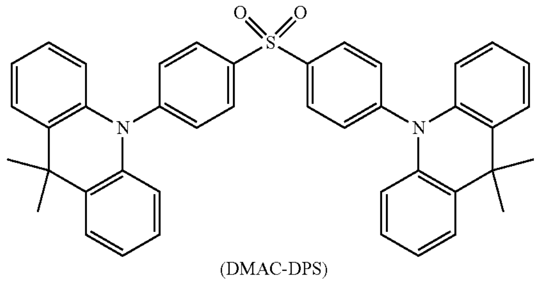

(DMAC-DPS)

DF2

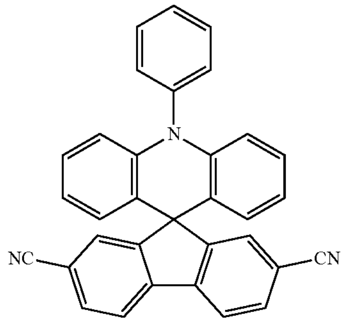

(ACRFLCN)

-continued

DF3

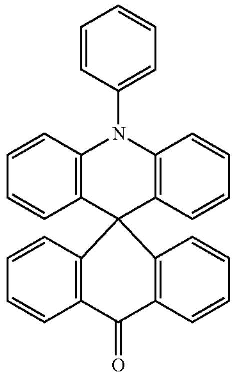

(ACRSA)

DF4

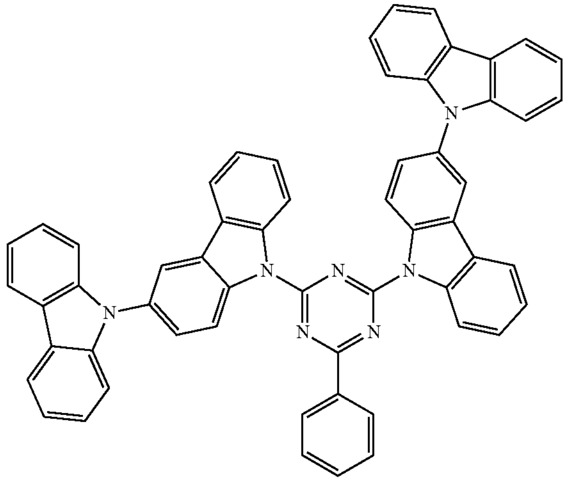

(CC2TA)

DF5

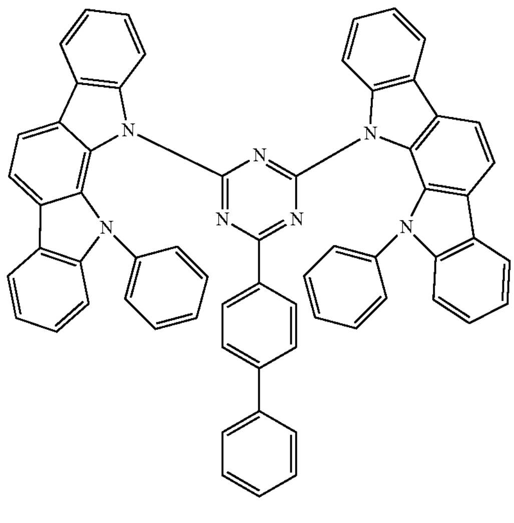

(PIC-TRZ)

-continued

DF6

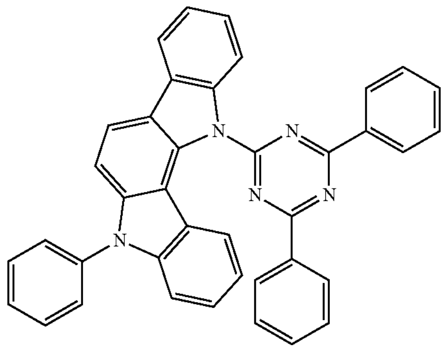

(PIC-TRZ2)

DF7

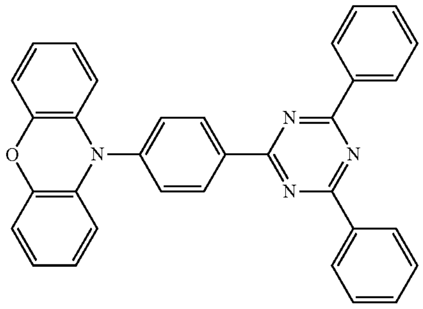

(PXZ-TRZ)

DF8

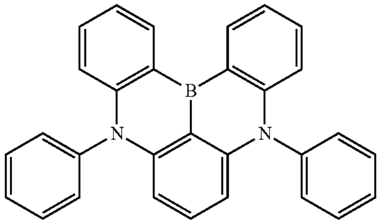

(DABNA-1)

DF9

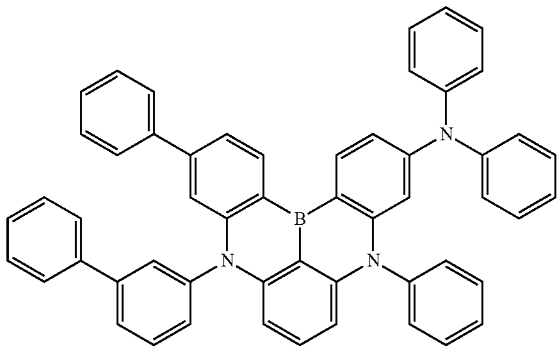

(DABNA-2)

Quantum Dot

The emission layer may include a quantum dot.

In the present disclosure, a quantum dot refers to a crystal of a semiconductor compound, and may include any suitable material capable of emitting light of one or more suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any suitable process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles may be controlled or selected through a process which is more easily performed than vapor deposition methods, such as metal organic chemical vapor deposition (MOCVD) or molecular beam epitaxy (MBE), and which requires lower costs.

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or one or more combinations thereof.

Examples of the Group II-VI semiconductor compound may include: a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or one or more combinations thereof.

Examples of the Group III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or one or more combinations thereof. In an embodiment, the Group III-V semiconductor compound may further include Group II elements. Examples of the Group III-V semiconductor compound further including Group II elements may include InZnP, InGaZnP, InAlZnP, and/or the like.

Examples of the Group III-VI semiconductor compound may include: a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; or one or more combinations thereof.

Examples of the Group I-III-VI semiconductor compound may include: a ternary compound, such as AgInS, $AgInS_2$, CuInS, $CuInS_2$, $CuGaO_2$, $AgGaO_2$, or $AgAlO_2$; or one or more combinations thereof.

Examples of the Group IV-VI semiconductor compound may include: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or one or more combinations thereof.

The Group IV element or compound may include: a single element compound, such as Si or Ge; a binary compound, such as SiC or SiGe; or one or more combinations thereof.

Each element included in a multi-element compound such as the binary compound, ternary compound and quaternary compound, may exist in a particle with a substantially uniform concentration or non-uniform concentration.

In an embodiment, the quantum dot may have a single structure or a dual core-shell structure. In the case of the quantum dot having a single structure, the concentration of each element included in the corresponding quantum dot is substantially uniform. In an embodiment, the material contained in the core and the material contained in the shell may be different from each other.

The shell of the quantum dot may act as a protective layer to prevent or reduce chemical degeneration of the core to maintain semiconductor characteristics and/or as a charging layer to impart electrophoretic characteristics to the quantum dot. The shell may be a single layer or a multi-layer. The element presented in the interface between the core and the shell of the quantum dot may have a concentration gradient that decreases toward the center of the quantum dot.

Examples of the shell of the quantum dot may be an oxide of metal, metalloid, or non-metal, a semiconductor compound, and one or more combinations thereof. Examples of the oxide of metal, metalloid, or non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or one or more combinations thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or one or more combinations thereof. In some embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or one or more combinations thereof.

A full width at half maximum (FWHM) of an emission wavelength spectrum of the quantum dot may be about 45 nm or less, for example, about 40 nm or less, for example, about 30 nm or less, and within these ranges, color purity or color reproducibility may be increased. In some embodiments, because the light emitted through the quantum dot is emitted in all directions, the wide viewing angle can be improved (increased).

In some embodiments, the quantum dot may be a substantially spherical particle, a pyramidal particle, a multi-arm particle, a cubic nanoparticle, a nanotube particle, a nanowire particle, a nanofiber particle, or a nanoplate particle.

Because the energy band gap can be adjusted by controlling the size of the quantum dot, light having one or more suitable wavelength bands can be obtained from the quantum dot emission layer. Therefore, by utilizing quantum dots of different sizes, a light-emitting device that emits light of one or more suitable wavelengths may be implemented. In an embodiment, the size of the quantum dot may be selected to emit red, green and/or blue light. In some embodiments, the size of the quantum dot may be configured to emit white light by combining light of one or more suitable colors.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or one or more combinations thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ and $L_{601}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group that is unsubstituted or substituted with at least one $R_{10a}$.

In an embodiment, when xe11 in Formula 601 is 2 or more, two or more of $Ar_{601}$(s) may be linked via a single bond.

In an embodiment, $Ar_{601}$ in Formula 601 may be a substituted or unsubstituted anthracene group.

In an embodiment, the electron transport region may include a compound represented by Formula 601-1:

Formula 601-1

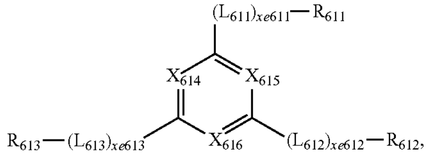

wherein, in Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ are respectively the same as those described in connection with $L_{601}$, xe611 to xe613 are respectively the same as those described in connection with xe1, $R_{611}$ to $R_{613}$ are respectively the same as those described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$.

In an embodiment, xe1 and xe611 to xe613 in Formulae 601 and 601-1 may each independently be 0, 1, or 2.

The electron transport region may include at least one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or one or more combinations thereof:

ET1

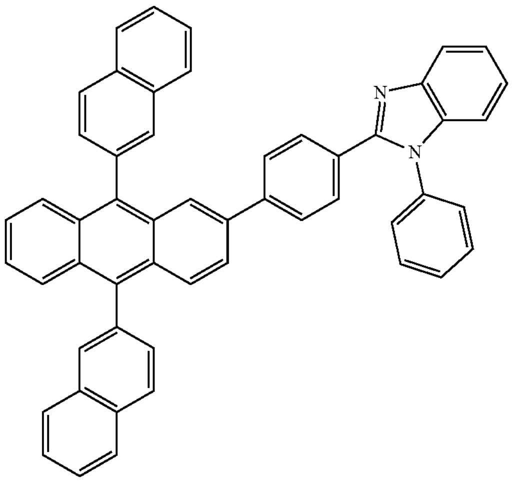

ET2

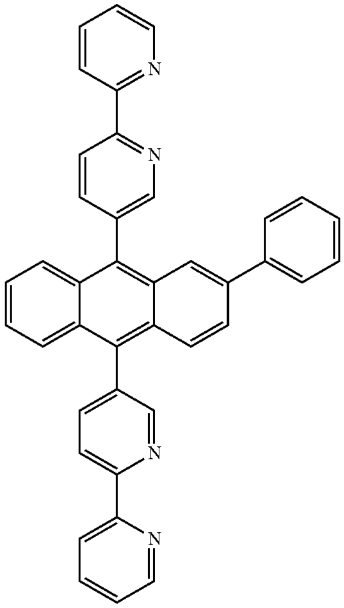

-continued

ET3

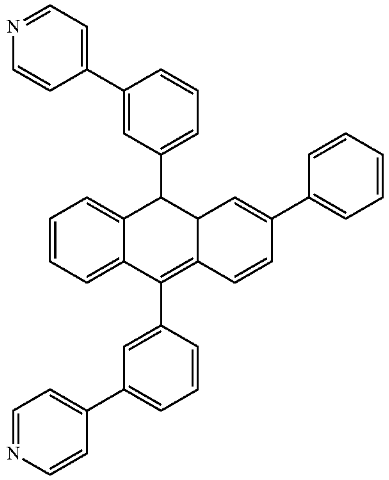

ET4

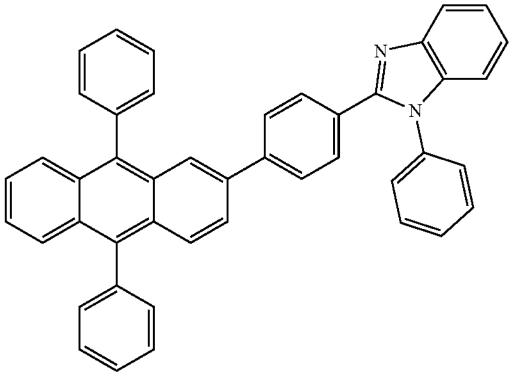

ET5

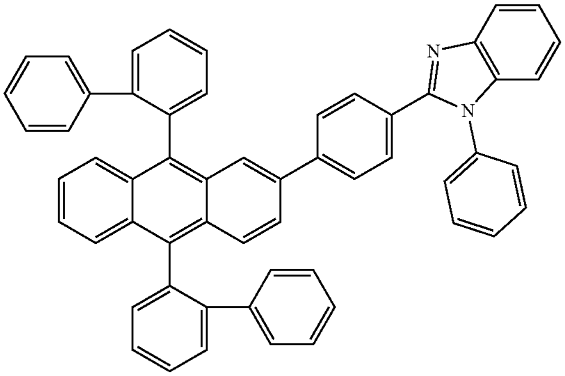

-continued
ET6
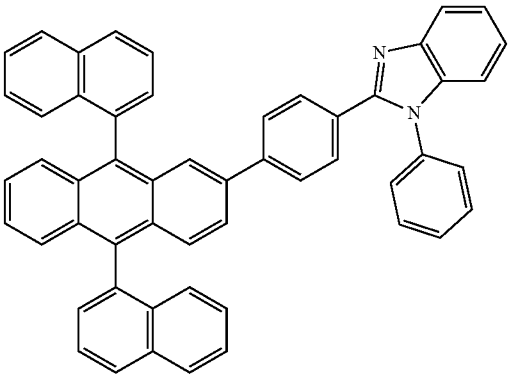
ET7
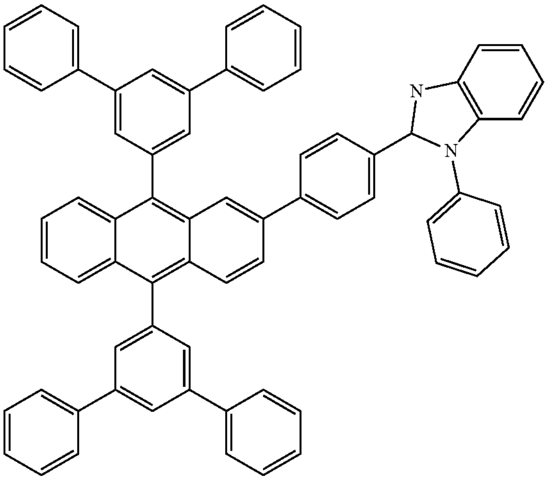
ET8
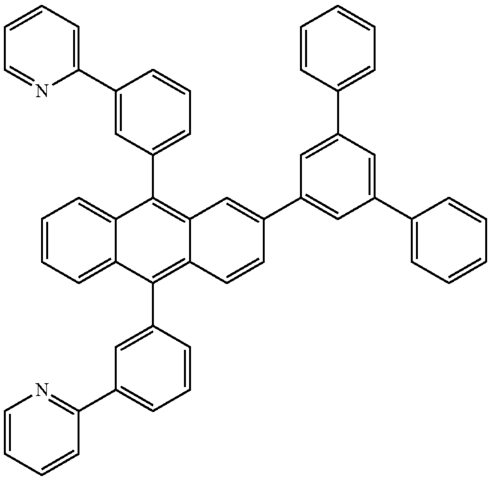
-continued
ET9
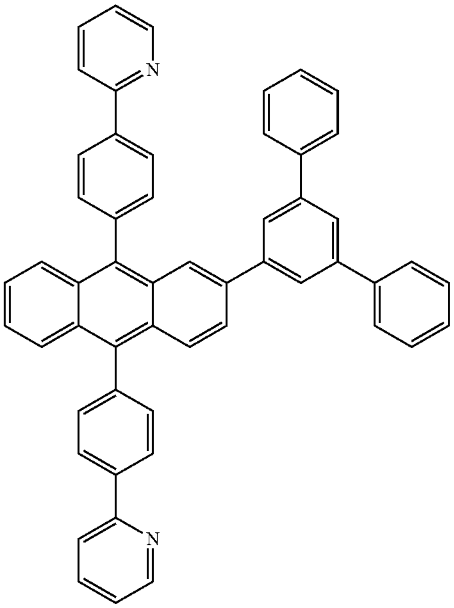
ET10
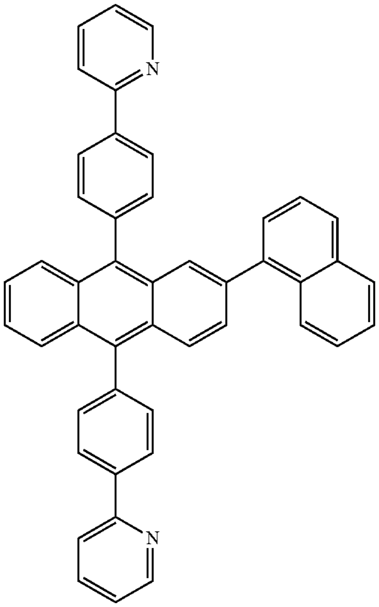

-continued
ET11
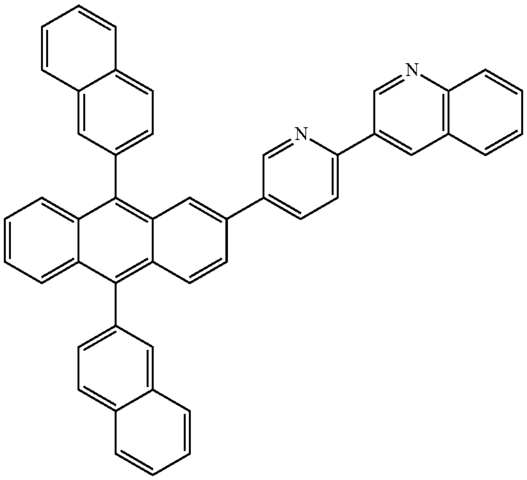
ET12
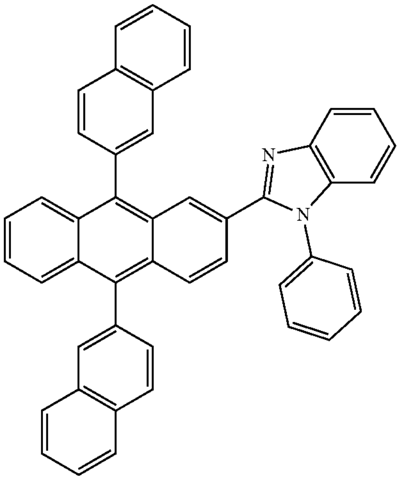
ET13
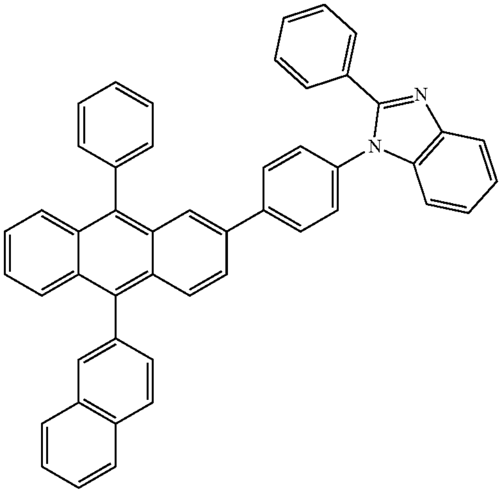
-continued
ET14
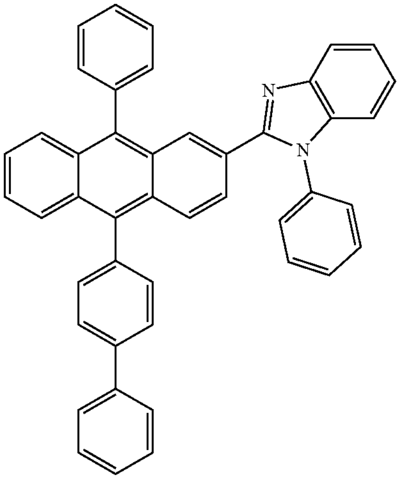
ET15
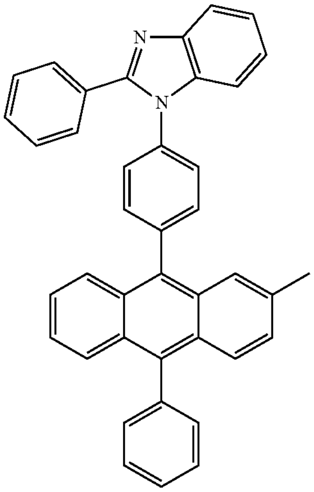
ET16
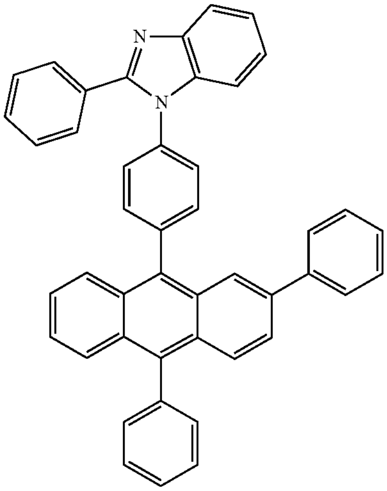

-continued
ET17
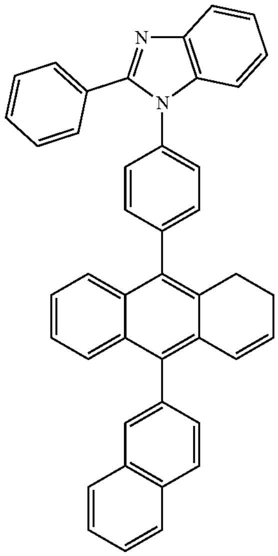
ET18
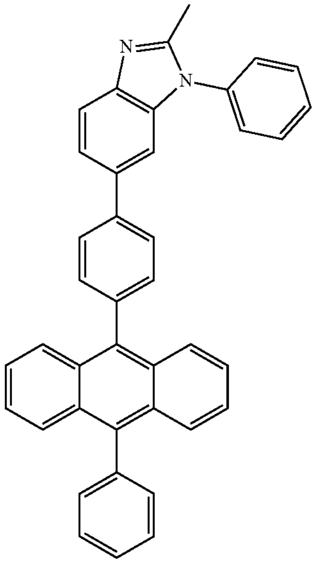
ET19
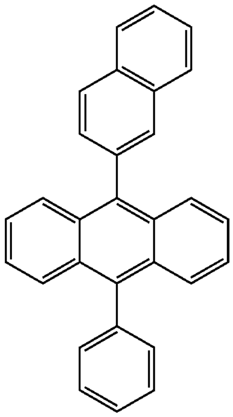
-continued
ET20
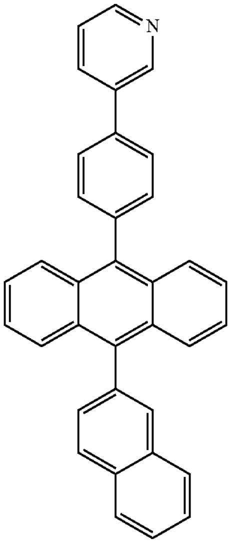
ET21
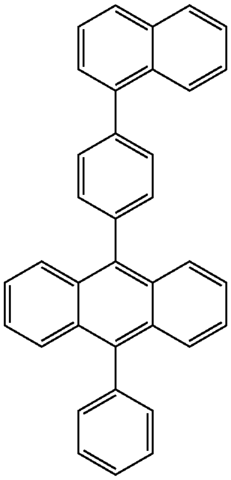
ET22
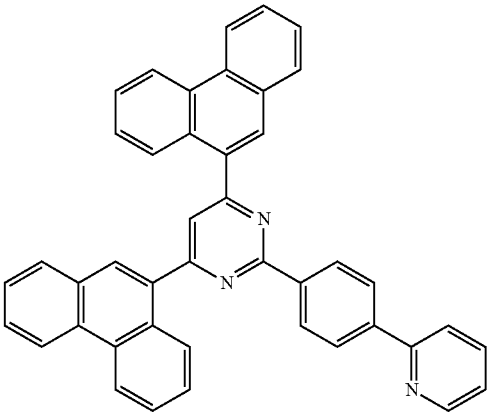

-continued
ET23
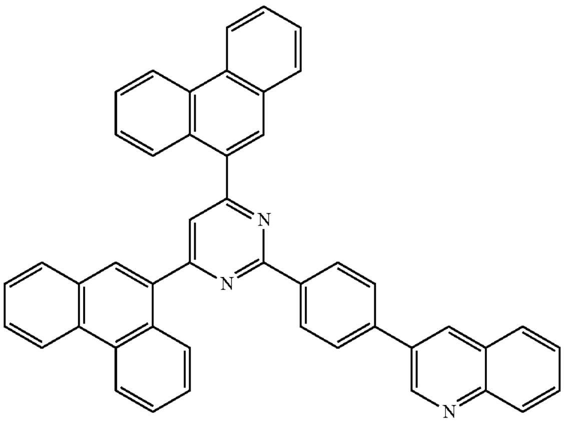
ET24
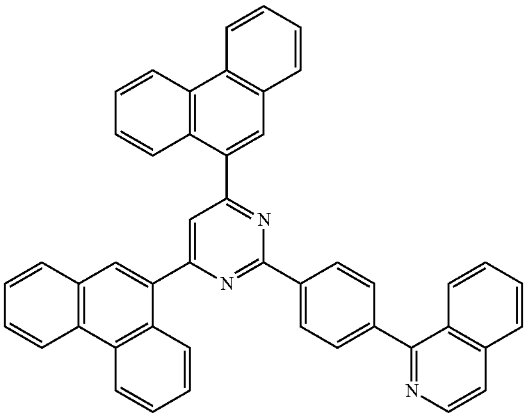
ET24
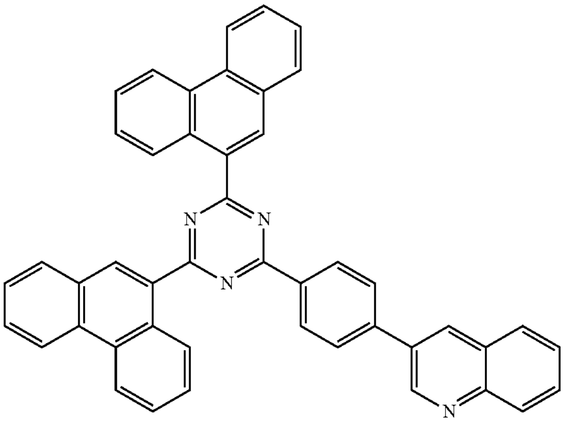
-continued
ET26
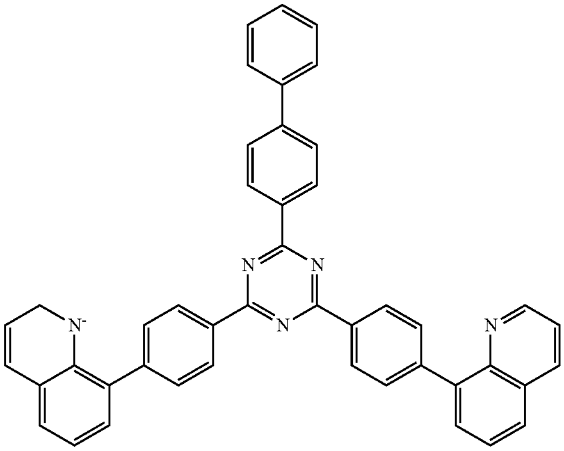
ET27
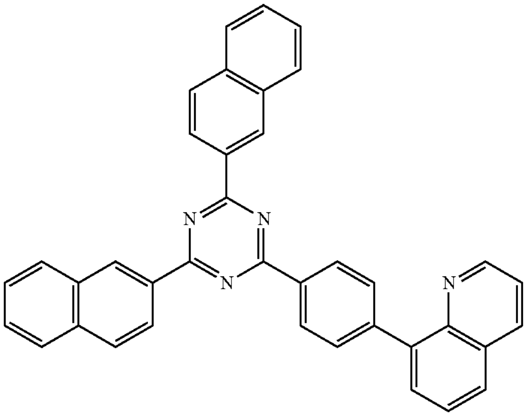
ET28
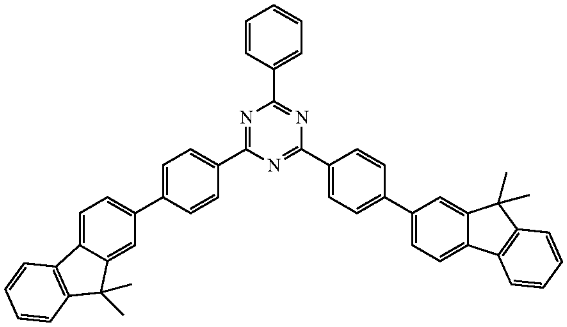

-continued
ET29
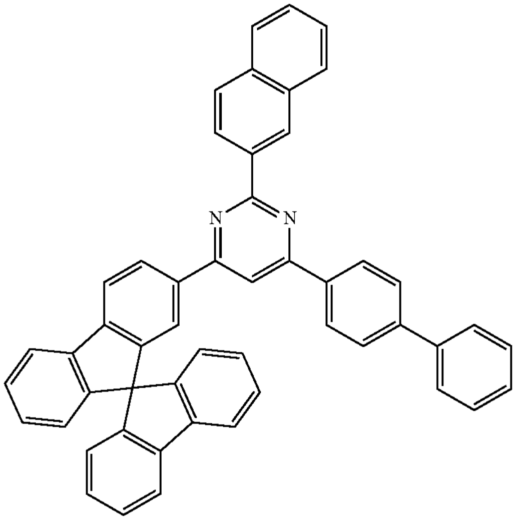
ET30
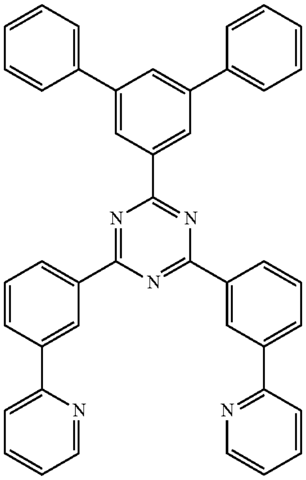
ET31
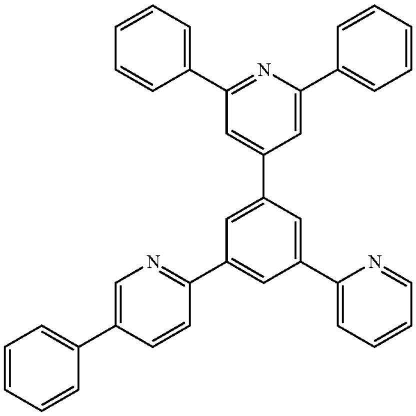
-continued
ET32
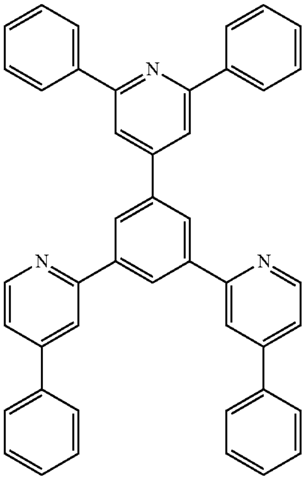
ET33
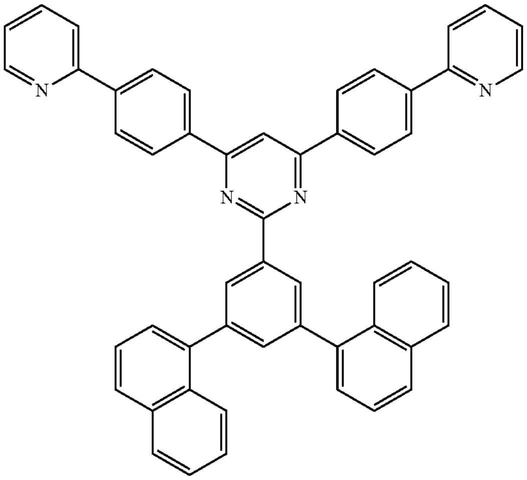
ET34
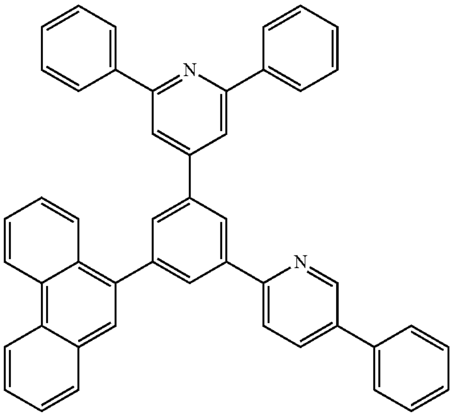

-continued
ET35
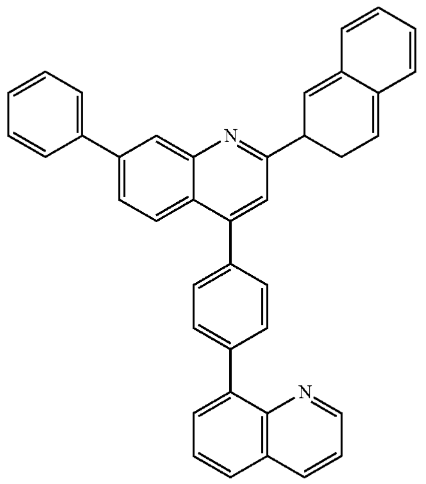
ET36
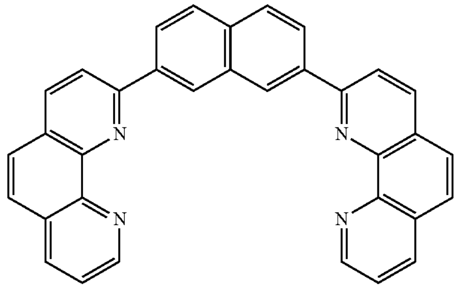
ET37
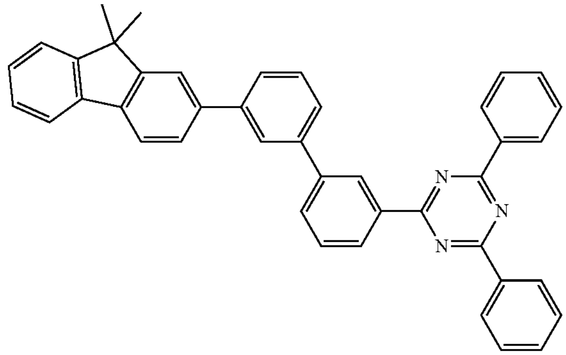
ET38
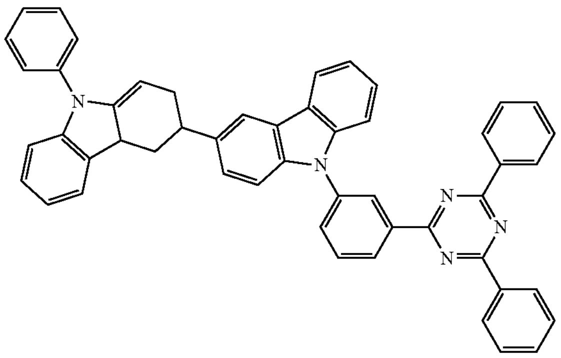
-continued
ET39
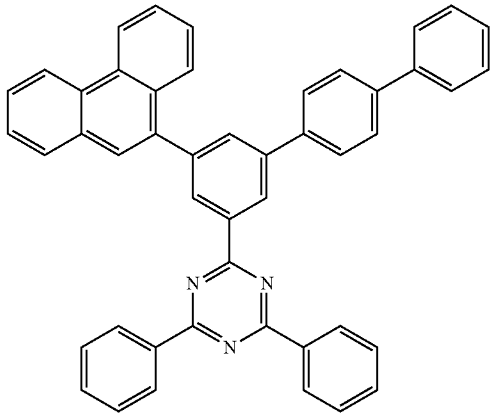
ET40
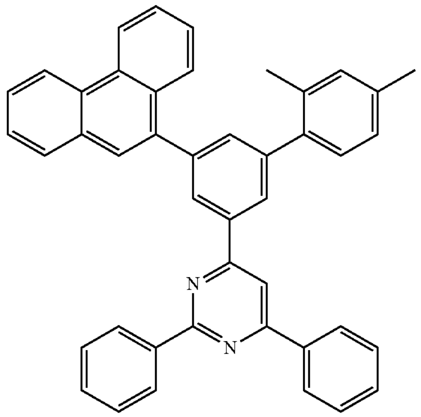
ET41
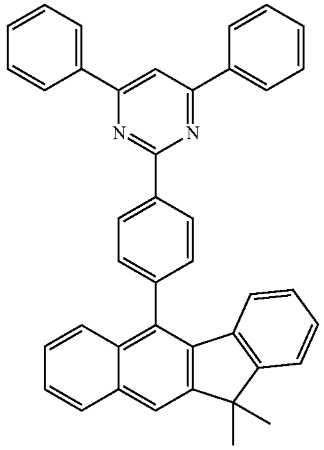

-continued

ET42

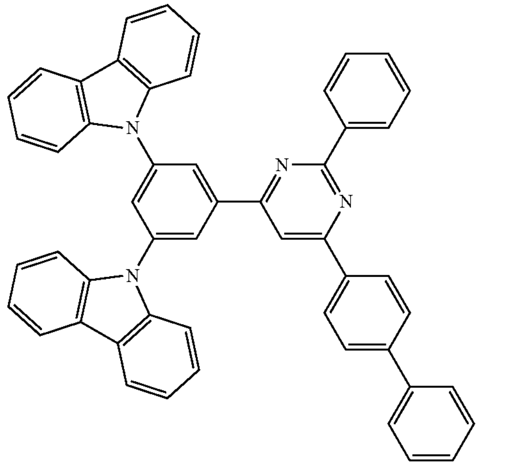

ET43

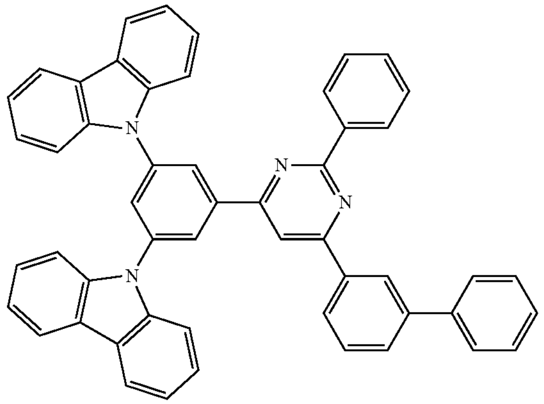

ET44

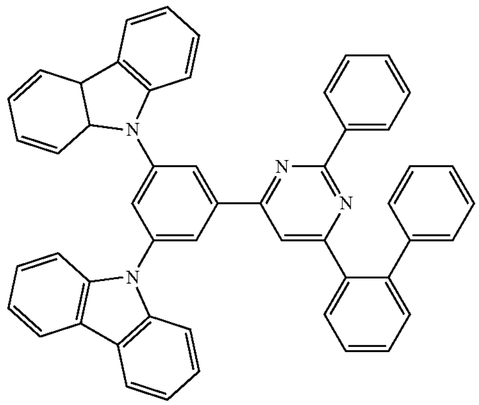

ET45

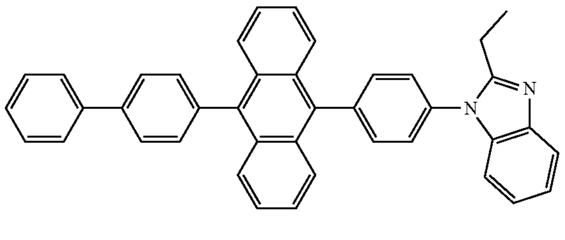

-continued

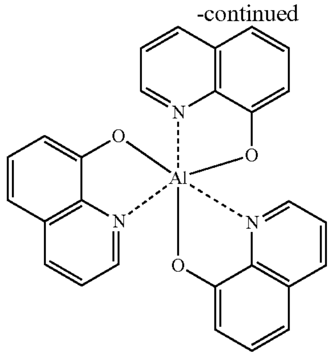

Alq3

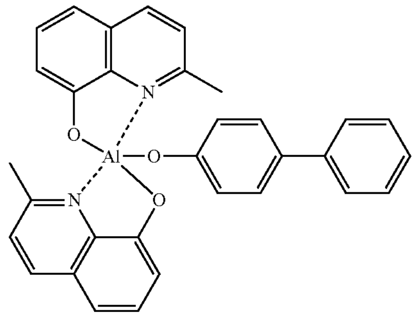

BAlq

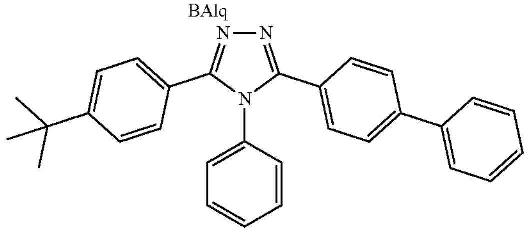

TAZ

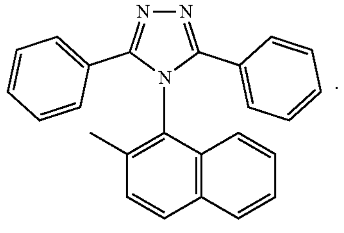

NTAZ

A thickness of the electron transport region may be from about 100 Å to about 5,000 Å, for example, about 160 Å to about 4,000 Å. When the electron transport region includes a buffer layer, a hole blocking layer, an electron control layer, an electron transport layer, or one or more combinations thereof, the thickness of the buffer layer, the hole blocking layer, or the electron control layer may each independently be from about 20 Å to about 1000 Å, for example, about 30 Å to about 300 Å, and the thickness of the electron transport layer may be from about 100 Å to about 1,000 Å, for example, about 150 Å to about 500 Å. When the thickness of the buffer layer, the hole blocking layer, the electron control layer, the electron transport layer, and/or the electron transport region are within these ranges, satisfactory (suitable) electron-transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or a combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or one or more combinations thereof.

In an embodiment, the metal-containing material may include a Li complex. The Li complex may include, for example, Compound ET-D1 (Liq) or ET-D2:

ET-D1

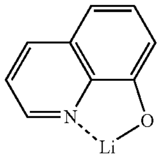

ET-D2

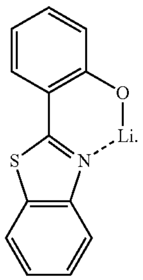

The electron transport region may include an electron injection layer that facilitates the injection of electrons from the second electrode 150. The electron injection layer may be in direct contact with the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or one or more combinations thereof.

The alkali metal may include Li, Na, K, Rb, Cs, or one or more combinations thereof. The alkaline earth metal may include Mg, Ca, Sr, Ba, or one or more combinations thereof. The rare earth metal may include Sc, Y, Ce, Tb, Yb, Gd, or one or more combinations thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or one or more combinations thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or one or more combinations thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or one or more combinations thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and/or $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or one or more combinations thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or one or more combinations thereof, as described above. In an embodiment, the electron injection layer may further include an organic material (for example, a compound represented by Formula 601).

In an embodiment, the electron injection layer may include (e.g., consist of) i) an alkali metal-containing compound (for example, an alkali metal halide); or ii) a) an alkali metal-containing compound (for example, an alkali metal halide) and b) an alkali metal, an alkaline earth metal, a rare earth metal, or one or more combinations thereof. In an embodiment, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or one or more combinations thereof may be substantially homogeneously or non-homogeneously dispersed in a matrix including (with) the organic material.

A thickness of the electron injection layer may be in a range of about 1 Å to about 100 Å, and, for example, about 3 Å to about 90 Å. When the thickness of the electron injection layer is within the range described above, satisfactory (suitable) electron injection characteristics may be obtained without a substantial increase in driving voltage.

Second Electrode 150

The second electrode 150 may be on the interlayer 130 having such a structure. The second electrode 150 may be a cathode, which is an electron injection electrode, and as the material for the second electrode 150, a metal, an alloy, an electrically conductive compound, or one or more combinations thereof, each having a low work function, may be utilized.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or one or more combinations thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be outside the first electrode 110, and/or a second capping layer may be outside the second electrode 150. In more detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer or light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one of the first capping layer or the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or one or more combinations thereof. The carbocyclic compound, the heterocyclic compound, and the amine group-containing compound may be optionally substituted with a substituent containing O, N, S, Se, Si, F, Cl, Br, I, or one or more combinations thereof. In an embodiment, at least one of the first capping layer or the second capping layer may each independently include an amine group-containing compound.

In an embodiment, at least one of the first capping layer or the second capping layer may each independently include a compound represented by Formula 201, a compound represented by Formula 202, or a combination thereof.

In an embodiment, at least one of the first capping layer or the second capping layer may each independently include at least one of Compounds HT28 to HT33, at least one of Compounds CP1 to CP6, β-NPB, or one or more combinations thereof:

CP1

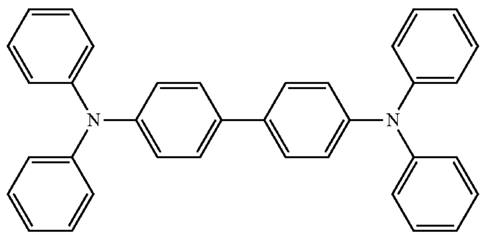

CP2

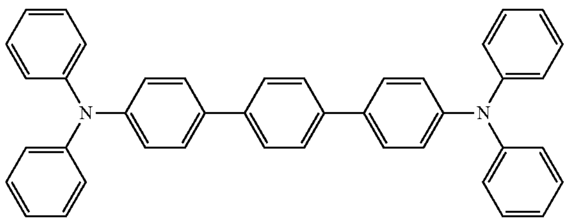

CP3

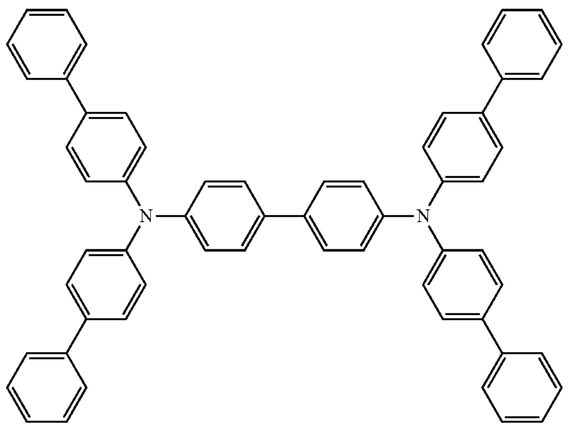

CP4

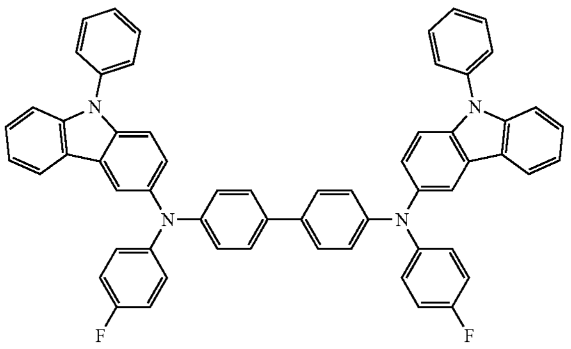

-continued

CP5

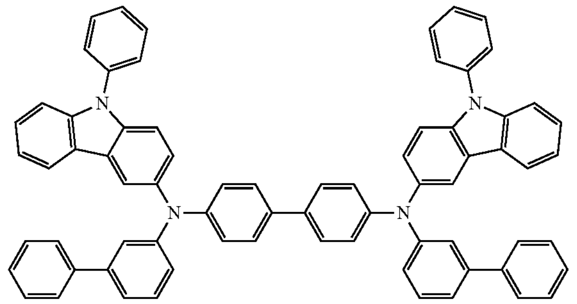

CP6

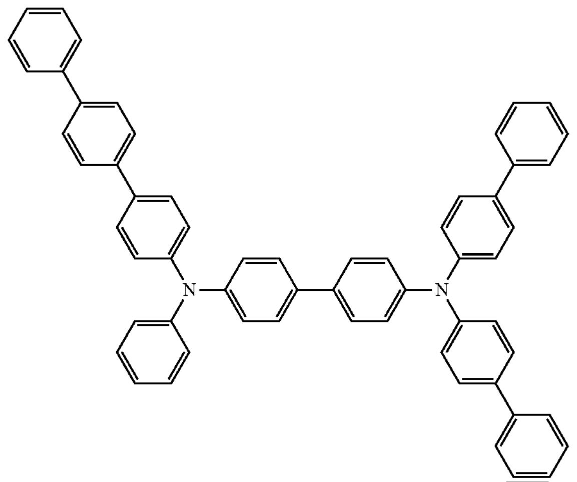

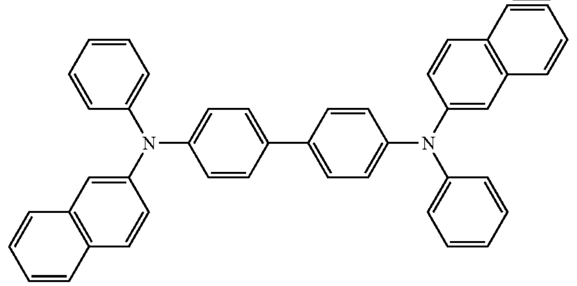

β-NPB

Film

The organometallic compound represented by Formula 1 may be included in one or more suitable films. According to an embodiment, a film including an organometallic compound represented by Formula 1 may be provided. The film may be, for example, an optical member (or a light control member) (for example, a color filter, a color conversion member, a capping layer, a light extraction efficiency enhancement layer, a selective light absorbing layer, a polarizing layer, a quantum dot-containing layer, and/or the like), a light-blocking member (for example, a light reflective layer, a light absorbing layer, and/or the like), and/or a protective member (for example, an insulating layer, a dielectric layer, and/or the like).

Electronic Apparatus

The light-emitting device may be included in one or more suitable electronic apparatuses. In an embodiment, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a quantum dot color conversion layer, or iii) a color filter and a quantum dot color conversion layer. The color filter and/or the quantum dot color conversion layer may be located in at least one traveling direction of light emitted from the light-emitting device. For example, the light emitted from the light-emitting device may be blue light or white light. The light-emitting device may be the same as described above. In an embodiment, the quantum dot color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the quantum dot color conversion layer may include a plurality of color conversion areas respectively corresponding to the subpixel areas.

A pixel-defining layer may be located or arranged among the subpixel areas to define each of the subpixel areas.

The color filter may further include a plurality of color filter areas and light-shielding patterns located among the color filter areas, and the quantum dot color conversion layer may include a plurality of color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In more detail, the first area may include a red quantum dot, the second area may include a green quantum dot, and the third area may not include (e.g., may exclude) a quantum dot. The quantum dot is substantially the same as described in the present disclosure. The first area, the second area, and/or the third area may each further include a scatterer.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. In more detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein one of the source electrode or the drain electrode may be electrically connected to a corresponding one of the first electrode or the second electrode of the light-emitting device.

The thin-film transistor may further include a gate electrode, a gate insulating film, etc.

The activation layer may include crystalline silicon, amorphous silicon, organic semiconductor, oxide semiconductor, and/or the like.

The electronic apparatus may further include a sealing portion for sealing the light-emitting device. The sealing portion and/or the quantum dot color conversion layer may be between the color filter and the light-emitting device. The sealing portion allows light from the light-emitting device to be extracted to the outside, while concurrently (e.g., simultaneously) preventing or reducing ambient air and moisture from penetrating into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the quantum dot color conversion layer, according to the use of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to one or more suitable displays, light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, one or more suitable measuring instruments, meters (for example, meters for a vehicle, an aircraft, and a vessel), projectors, and/or the like.

Figure 2:
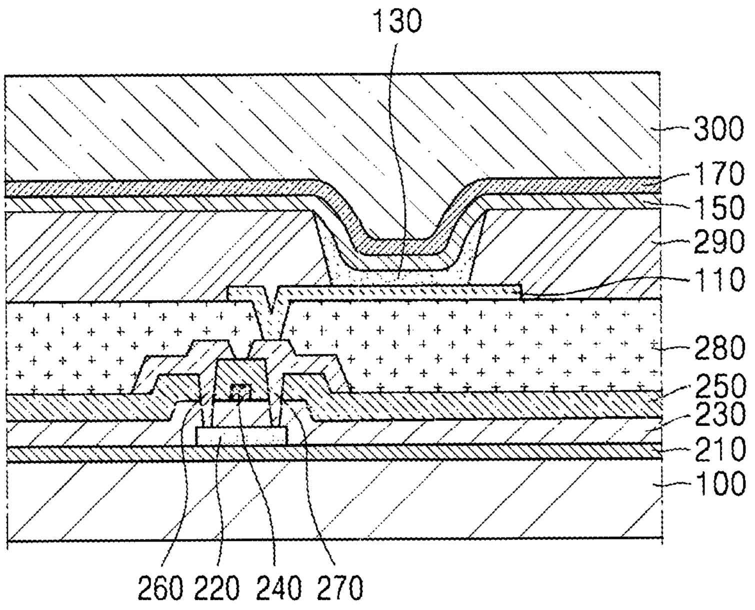
FIG. 2 is a cross-sectional view of a structure of an electronic apparatus according to an embodiment.
Figure 3:
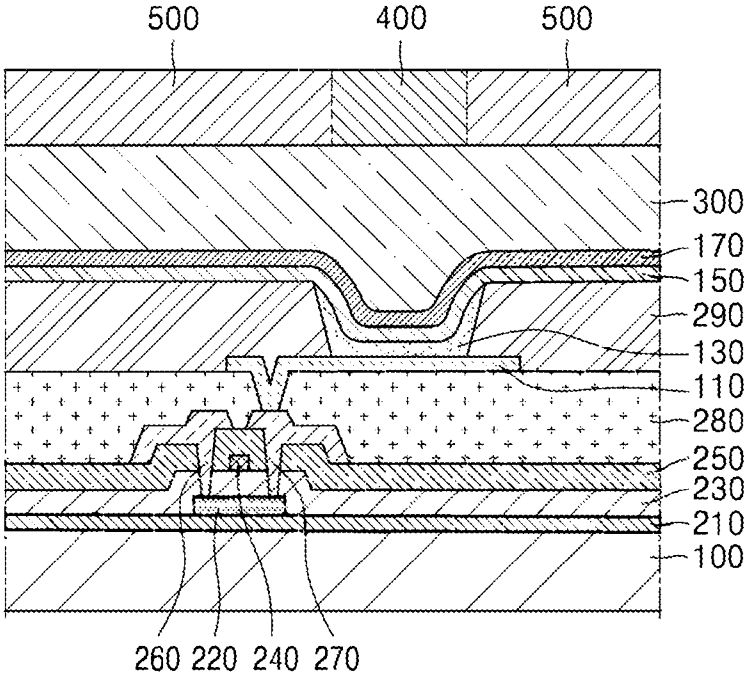
FIG. 3 is a cross-sectional view of a structure of an electronic apparatus according to another embodiment.

Description of FIGS. 2 and 3

FIG. 2 is a cross-sectional view of a light-emitting apparatus according to an embodiment of the disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent or reduce penetration of impurities through the substrate 100 and may provide a substantially flat surface on the substrate 100.

A TFT may be on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region and a channel region.

A gate insulating film 230 for insulating the activation layer 220 from the gate electrode 240 may be on the activation layer 220, and the gate electrode 240 may be on the gate insulating film 230.

An interlayer insulating film 250 may be on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be on the interlayer insulating film 250. The interlayer insulating film 250 and the gate insulating film 230 may be formed so as to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 may not completely cover the drain electrode 270 and exposes a portion of the drain electrode 270, and the first electrode 110 is connected to the exposed portion of the drain electrode 270.

A pixel-defining layer 290 containing an insulating material may be on the first electrode 110. The pixel-defining layer 290 exposes a region of the first electrode 110, and an interlayer 130 may be formed in the exposed region of the first electrode 110. The pixel-defining layer 290 may be a polyimide and/or polyacrylic organic film. At least some layers of the interlayer 130 may extend beyond the upper portion of the pixel-defining layer 290 to be located in the form of a common layer (i.e., may be provided as a common layer).

The second electrode 150 may be on the interlayer 130, and a capping layer 170 may be additionally formed on the second electrode 150. The capping layer 170 may be formed to cover the second electrode 150.

The encapsulation portion 300 may be on the capping layer 170. The encapsulation portion 300 may be on a light-emitting device to protect the light-emitting device from moisture or oxygen. The encapsulation portion 300 may include: an inorganic film including silicon nitride (SiNx), silicon oxide (SiOx), indium tin oxide, indium zinc oxide, or one or more combinations thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or one or more combinations thereof; or a combination of the inorganic film and the organic film.

FIG. 3 is a cross-sectional view of a light-emitting apparatus according to another embodiment of the disclosure.

The light-emitting apparatus of FIG. 3 is substantially the same as the light-emitting apparatus of FIG. 2, except that a light-shielding pattern 500 and a functional region 400 are additionally located on the encapsulation portion 300. The functional region 400 may be a combination of i) a color filter area, ii) a color conversion area, or iii) a combination of the color filter area and the color conversion area. In an embodiment, the light-emitting device included in the light-emitting apparatus of FIG. 3 may be a tandem light-emitting device.

Manufacture Method

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as utilized herein refers to a cyclic group including (e.g., consisting of) carbon only as a ring-forming atom and having three to sixty carbon atoms, and the term "$C_1$-$C_{60}$ heterocyclic group" as utilized herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group including (e.g., consisting of) one ring or a polycyclic group in which two or more rings are condensed with each other. In an embodiment, the $C_1$-$C_{60}$ heterocyclic group has 3 to 61 ring-forming atoms.

The "cyclic group" as utilized herein may include the $C_3$-$C_{60}$ carbocyclic group and the $C_1$-$C_{60}$ heterocyclic group.

The term "π electron-rich $C_3$-$C_{60}$ cyclic group" as utilized herein refers to a cyclic group that has three to sixty carbon atoms and does not include *—N═*' as a ring-forming moiety, and the term "π electron-deficient nitrogen-containing $C_1$-$C_{60}$ cyclic group" as utilized herein refers to a heterocyclic group that has one to sixty carbon atoms and includes *—N═*' as a ring-forming moiety.

In an embodiment, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), and the π electron-deficient nitrogen-containing $C_1$-$C_{60}$ cyclic group may be i) a group T4, ii) a condensed cyclic group in which two or more group T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as utilized herein refers to a group condensed to any cyclic group or a polyvalent group (for example, a divalent group, a trivalent group, a tetravalent group, etc.), depending on the structure of a formula in connection with which the terms are utilized. In an embodiment, "a benzene group" may be a benzo group, a phenyl group, a phenylene group, and/or the like, which may be understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as utilized herein refers to a linear or branched aliphatic hydrocarbon monovalent group that has one to sixty carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as utilized herein refers to a divalent group having the same structure as the $C_1$-$C_{60}$ alkyl group.

The term "$C_2$-$C_{60}$ alkenyl group" as utilized herein refers to a monovalent hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as utilized herein refers to a divalent group having the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as utilized herein refers to a divalent group having the same structure as the $C_2$-$C_{60}$ alkynyl group.

The term "$C_1$-$C_{60}$ alkoxy group" as utilized herein refers to a monovalent group represented by $-OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as utilized herein refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as utilized herein refers to a divalent group having the same structure as the $C_3$-$C_{10}$ cycloalkyl group.

The term "$C_1$-$C_{10}$ heterocycloalkyl group" as utilized herein refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as utilized herein refers to a divalent group having the same structure as the $C_1$-$C_{10}$ heterocycloalkyl group.

The term "$C_3$-$C_{10}$ cycloalkenyl group" utilized herein refers to a monovalent cyclic group that has three to ten carbon atoms and at least one carbon-carbon double bond in the ring thereof and non-aromaticity, and examples thereof include a cyclopentenyl group, a cyclohexenyl group, and a cycloheptenyl group. The term "$C_3$-$C_{10}$ cycloalkenylene group" as utilized herein refers to a divalent group having the same structure as the $C_3$-$C_{10}$ cycloalkenyl group.

The term "$C_1$-$C_{10}$ heterocycloalkenyl group" as utilized herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as utilized herein refers to a divalent group having the same structure as the $C_1$-$C_{10}$ heterocycloalkenyl group.

The term "$C_6$-$C_{60}$ aryl group" as utilized herein refers to a monovalent group having a carbocyclic aromatic system having six to sixty carbon atoms, and the term "$C_6$-$C_{60}$ arylene group" as utilized herein refers to a divalent group having a carbocyclic aromatic system having six to sixty carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, a fluorenyl group, a spiro-bifluorenyl group, and a benzofluorenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as utilized herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as utilized herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, an azafluorenyl group, a carbazolyl group, an azacarbazolyl group, an indeno carbazolyl group, an indolocarbazolyl group, a benzofurocarbazolyl group, a benzothienocarbazolyl group, a benzosilolocarbazolyl group, a benzoindolocarbazolyl group, and a benzocarbazolyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as utilized herein refers to a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group include an indenyl group, an indenophenanthrenyl group, and an indeno anthracenyl group. The term "divalent non-aromatic condensed polycyclic group" as utilized herein refers to a divalent group having the same structure as a monovalent non-aromatic condensed polycyclic group.

The term "monovalent non-aromatic condensed heteropolycyclic group" as utilized herein refers to a monovalent group having two or more rings condensed to each other, at least one heteroatom other than carbon atoms (for example, having 1 to 60 carbon atoms), as a ring-forming atom, and non-aromaticity in its molecular structure when considered as a whole. Examples of the monovalent non-aromatic condensed heteropolycyclic group include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a dibenzosilolyl group, a dibenzothiophenyl group, a dibenzofuranyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as utilized herein refers to a divalent group having the same structure as a monovalent non-aromatic condensed heteropolycyclic group.

The term "$C_6$-$C_{60}$ aryloxy group" as utilized herein indicates —$OA_{102}$ (wherein $A_{102}$ is the $C_6$-$C_{60}$ aryl group), and the term "$C_6$-$C_{60}$ arylthio group" as utilized herein indicates —$SA_{103}$ (wherein $A_{103}$ is the $C_6$-$C_{60}$ aryl group).

The term "$C_7$-$C_{60}$ aryl alkyl group" utilized herein refers to -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" utilized herein refers to -$A_{106}A_{107}$ (where $A_{106}$ may be a $C_1$-$C_{59}$ alkylene group, and $A_{107}$ may be a $C_1$-$C_{59}$ heteroaryl group).

$R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or one or more combinations thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or one or more combinations thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_{11}$ to $Q_{13}$, $Q_{21}$ to $Q_{23}$, and $Q_{31}$ to $Q_{33}$ utilized herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or one or more combinations thereof; a $C_7$-$C_{60}$ aryl alkyl group; or a $C_2$-$C_{60}$ heteroaryl alkyl group.

The term "hetero atom" as utilized herein refers to any atom other than a carbon atom. Examples of the heteroatom include O, S, N, P, Si, B, Ge, Se, or one or more combinations thereof.

The term "the third-row transition metal" utilized herein includes hafnium (Hf), tantalum (Ta), tungsten (W), rhenium (Re), osmium (Os), iridium (Ir), platinum (Pt), gold (Au), and/or the like.

"Ph" as utilized herein refers to a phenyl group, "Me" as utilized herein refers to a methyl group, "Et" as utilized herein refers to an ethyl group, "tert-Bu" or "$Bu^t$" as utilized herein refers to a tert-butyl group, and "OMe" as utilized herein refers to a methoxy group.

The term "biphenyl group" as utilized herein refers to "a phenyl group substituted with a phenyl group." For example, the "biphenyl group" is a substituted phenyl group having a $C_6$-$C_{60}$ aryl group as a substituent.

The term "terphenyl group" as utilized herein refers to "a phenyl group substituted with a biphenyl group". The "terphenyl group" is a substituted phenyl group having, as a substituent, a $C_6$-$C_{60}$ aryl group substituted with a $C_6$-$C_{60}$ aryl group.

* and *' as utilized herein, unless defined otherwise, each refer to a binding site to a neighboring atom in a corresponding formula or moiety.

Hereinafter, compounds according to embodiments and light-emitting devices according to embodiments will be described in more detail with reference to the following synthesis examples and examples. The wording "B was utilized instead of A" utilized in describing Synthesis Examples refers to that an identical molar equivalent of B was utilized in place of A.

EXAMPLES

The organometallic compound according to an embodiment may be synthesized, for example, as follows. However, synthesis methods of the organometallic compound according to an embodiment are not limited thereto.

Source of Reagent Utilized 7-methoxy-1,2,3,4-tetrahydroquinoline (BLD pharm), 7-bromo-1,2,3,4-tetrahydroquinoline (BLD pharm), 2-bromo-4-(tert-butyl)pyridine (JT Co., Ltd), SPhos (Sigma Aldrich), $Pd_2(dba)_3$ (HanChem Co., LTD.), Sodium tert-butoxide (Sigma Aldrich), 1M $BBr_3$ (Sigma Aldrich), NaOH (Samchun Chemical Co., Ltd.), magnesium sulfate (Daejung Chemicals & Metals Co., Ltd.), CuI (Sigma Aldrich), $K_2CO_3$ (Daejung Chemicals & Metals Co., Ltd.), L-Proline (Sigma Aldrich), Dichloro(1,2-dicyclooctadiene)platinum (TCI), Sodium acetate (Sigma Aldrich), (6-fluoro-4-methylpyridin-3-yl)boronic acid (BLD pharm), Bromobenzene-d5 (BLD Pharm), $Pd(PPh_3)_4$ (HanChem Co., LTD.), 1,2,3,4-tetrahydroquinoline-7-carbaldehyde (Azepine), 2-bromo-4-methylpyridine (Sigma Aldrich), 2-bromobiphenyl (Sigma Aldrich), LiCl (TCI), Ammonium Chloride (TCI), Potassium phosphate tribasic (Sigma Aldrich), hydrochloric acid (Samchun Chemical Co., Ltd.), acetic acid (Sigma Aldrich), Sodium hydroxide (Daejung Chemicals & Metals Co., Ltd.), Copper(I) cyanide (Sigma Aldrich), tert-Butylmagnesium bromide (abcr), 5-bromo-7-methoxy-1,2,3,4-tetrahydroquinoline (Sigma Aldrich), Toluene (Samchun Chemical Co., Ltd.), methylene chloride (Daejung Chemicals & Metals Co., Ltd.), DMSO (Samchun Chemical Co., Ltd.), 1,4-Dioxane (Sigma Aldrich), DMF (Daejung Chemicals & Metals Co., Ltd.), THF (Samchun Chemical Co., Ltd.), and/or Acetone (Samchun Chemical Co., Ltd.)

Synthesis Example 1. Synthesis of BD1

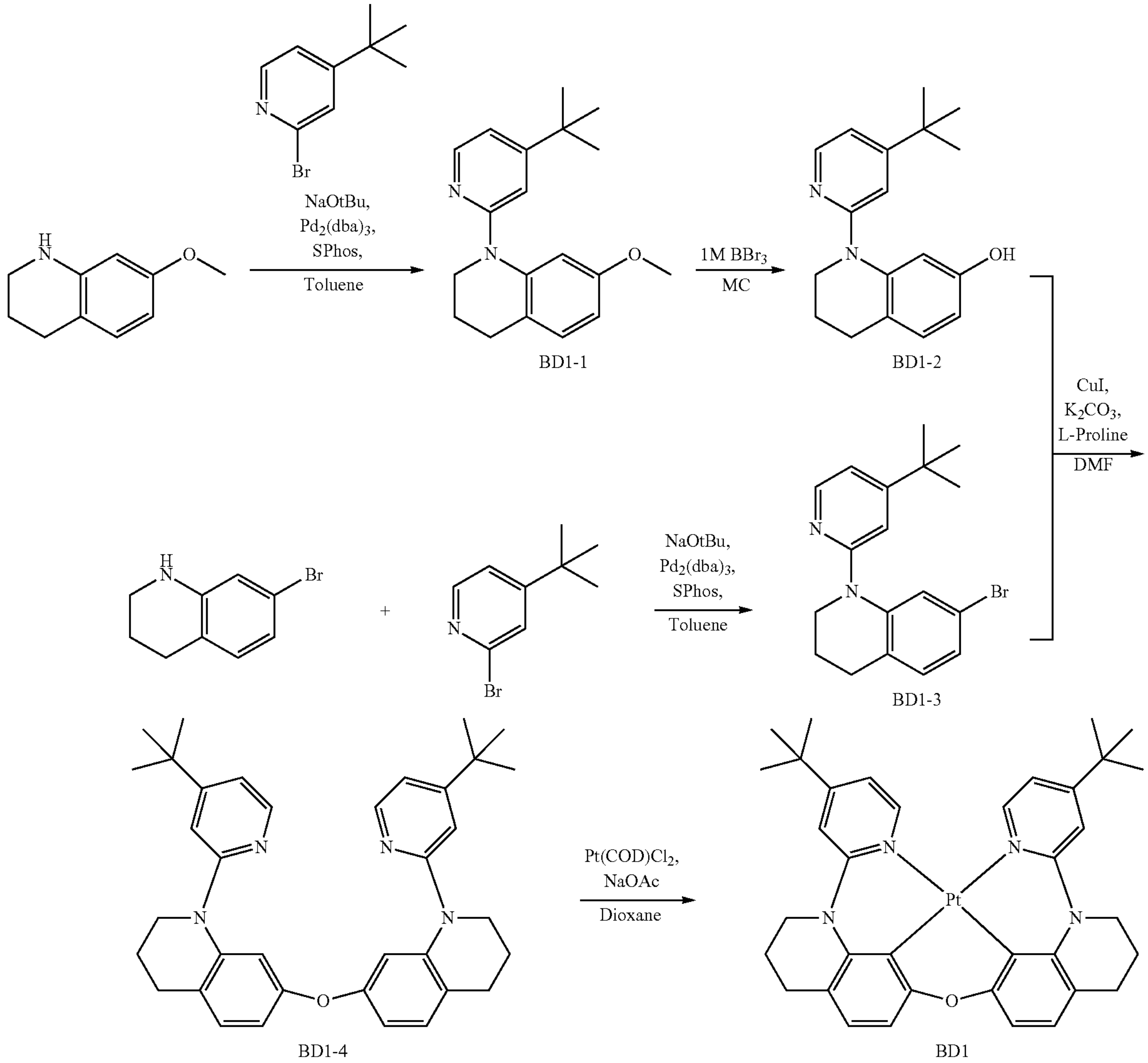

BD1-1

BD1-2

BD1-3

BD1-4

BD1

1) Synthesis of Intermediate BD1-1

7-methoxy-1,2,3,4-tetrahydroquinoline (1 eq), 2-bromo-4-(tert-butyl)pyridine (1.2 eq), SPhos (0.07 eq), $Pd_2(dba)_3$ (0.05 eq), and sodium tert-butoxide (2.0 eq) were suspended in a toluene solvent, and the temperature was raised to 100° C., followed by stirring for 12 hours. After completion of the reaction, the solvent was removed therefrom under reduced pressure, and an organic layer was extracted by utilizing methylene chloride and distilled water. The extracted organic layer was washed with a saturated aqueous sodium chloride solution and dried by utilizing magnesium sulfate. A residue obtained by removing the solvent therefrom was separated by column chromatography to obtain Intermediate BD1-1 at a yield of 80%.

2) Synthesis of Intermediate BD1-2

Intermediate BD1-1 (1.0 eq) was dissolved in methylene chloride, and 1M $BBr_3$ (1.2 eq) was added dropwise thereto at 0° C. After stirring the resultant at room temperature for an hour, the mixture was neutralized with a NaOH aqueous solution, and an organic layer was extracted by utilizing methylene chloride and distilled water. The extracted organic layer was dried by utilizing magnesium sulfate. A residue obtained by removing the solvent therefrom was separated by column chromatography to obtain Intermediate BD1-2 at a yield of 64%.

3) Synthesis of Intermediate BD1-3

7-bromo-1,2,3,4-tetrahydroquinoline (1 eq), 2-bromo-4-(tert-butyl)pyridine (1.2 eq), SPhos (0.07 eq), $Pd_2(dba)_3$ (0.05 eq), and sodium tert-butoxide (2.0 eq) were suspended in a toluene solvent, and the temperature was raised to 100° C., followed by stirring for 12 hours. After completion of the reaction, the solvent was removed therefrom under reduced pressure, and an organic layer was extracted by utilizing methylene chloride and distilled water. The extracted organic layer was washed with a saturated aqueous sodium chloride solution and dried by utilizing magnesium sulfate. A residue obtained by removing the solvent therefrom was separated by column chromatography to obtain Intermediate BD1-3 at a yield of 55%.

4) Synthesis of Intermediate BD1-4

Intermediate BD1-2 (1.0 eq), Intermediate BD1-3 (1.2 eq), CuI (0.01 eq), $K_2CO_3$ (2.0 eq), and L-Proline (0.02 eq) were dissolved in DMSO (0.1M), followed by stirring at 130° C. for 24 hours. The reaction mixture was cooled at room temperature, and an extraction process was performed thereon three times by utilizing dichloromethane and water, to thereby obtain an organic layer. The obtained organic layer was dried by utilizing magnesium sulfate and concentrated, and column chromatography was utilized to obtain Intermediate BD1-4 at a yield of 66%.

5) Synthesis of Compound BD1

Intermediate BD1-4 (1.0 eq), dichloro(1,2-dicyclooctadiene)platinum ($Pt(COD)Cl_2$) (1.1 eq), and sodium acetate (2.0 eq) were dissolved in dioxane (0.1 M), followed by stirring at 120° C. for 72 hours. The reaction mixture was cooled at room temperature, and an extraction process was performed thereon three times by utilizing dichloromethane and water, to thereby obtain an organic layer. The obtained organic layer was dried utilizing magnesium sulfate and concentrated, and column chromatography was utilized to synthesize Compound BD1 (yield: 24%).

Synthesis Example 2. Synthesis of BD12

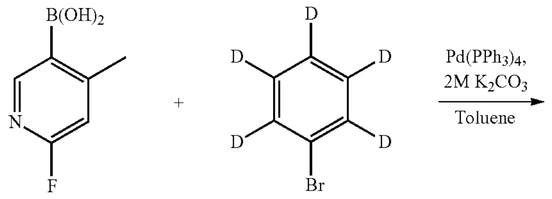

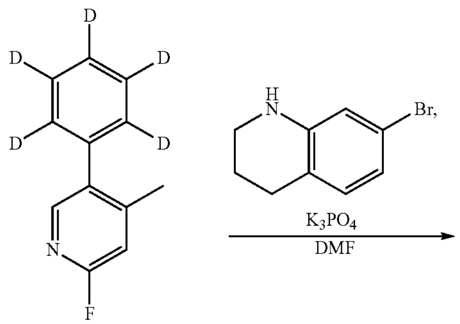

BD12-1

-continued

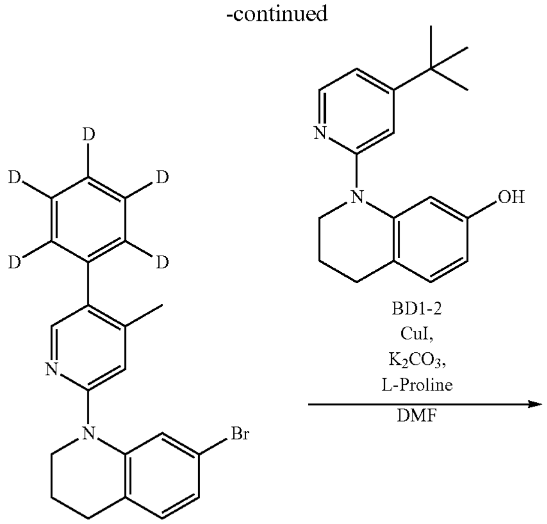

BD12-2

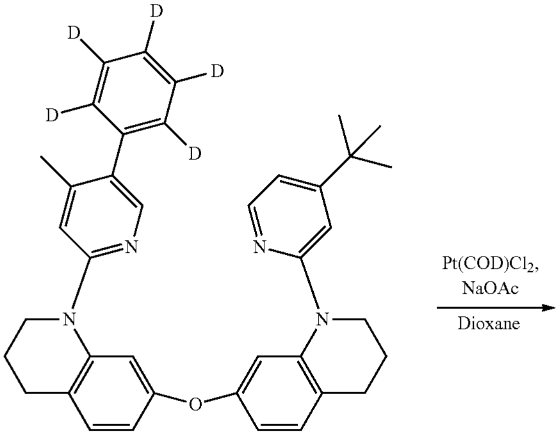

BD12-3

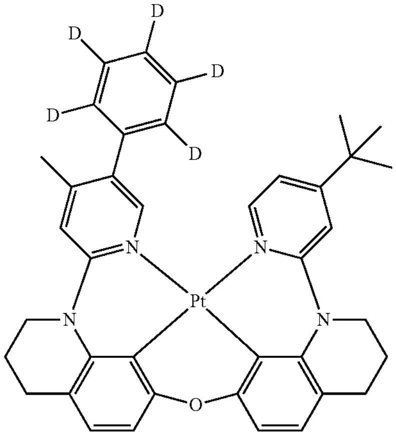

BD12

1) Synthesis of Intermediate BD12-1

(6-fluoro-4-methylpyridin-3-yl)boronic acid (1.2 eq), bromobenzene-d5 (1 eq), Pd(PPh3)4 (0.05 eq), and 2M $K_2CO_3$ (3 eq) were dissolved in toluene, followed by stirring at 110° C. for 12 hours. After completion of the reaction, the solvent was removed therefrom under reduced pressure, and an organic layer was extracted by utilizing methylene chloride and distilled water. The extracted organic layer was dried by utilizing magnesium sulfate. A residue obtained by removing the solvent therefrom was separated by column chromatography to obtain Intermediate BD12-1 at a yield of 88%.

2) Synthesis of Intermediate BD12-2

Intermediate BD12-1 (1 eq), 6-bromo-1,2,3,4-tetrahydroquinoline (1.1 eq), and $K_3PO_4$ (3 eq) were dissolved in DMF, followed by stirring at 160° C. for 10 hours. After completion of the reaction, the solvent was removed therefrom under reduced pressure, and an organic layer was extracted by utilizing methylene chloride and distilled water. The extracted organic layer was dried by utilizing magnesium sulfate. A residue obtained by removing the solvent therefrom was separated by column chromatography to obtain Intermediate BD12-2 at a yield of 78%.

3) Synthesis of Intermediate BD12-3

Intermediate BD12-3 was obtained in substantially the same manner as utilized to obtain Intermediate BD1-4 of Synthesis Example 1, except that Intermediate BD12-2 was utilized instead of Intermediate BD1-3.

4) Synthesis of Compound BD12

Intermediate BD12-3 (1.0 eq), dichloro (1,2-dicyclooctadiene)platinum ($Pt(COD)Cl_2$) (1.1 eq), and sodium acetate (2.0 eq) were dissolved in dioxane (0.1 M), followed by stirring at 120° C. for 72 hours. The reaction mixture was cooled at room temperature, and an extraction process was performed thereon three times by utilizing dichloromethane and water, to thereby obtain an organic layer. The obtained organic layer was dried utilizing magnesium sulfate and concentrated, and column chromatography was utilized to synthesize Compound BD12 (yield: 20%).

Synthesis Example 3. Synthesis of BD28

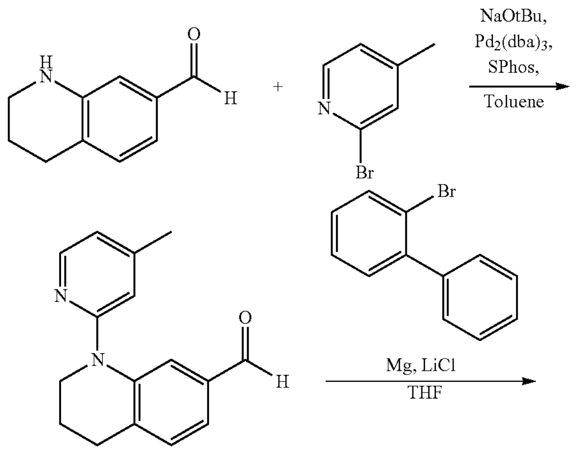

BD28-1

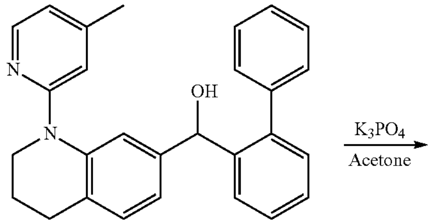

BD28-2

-continued

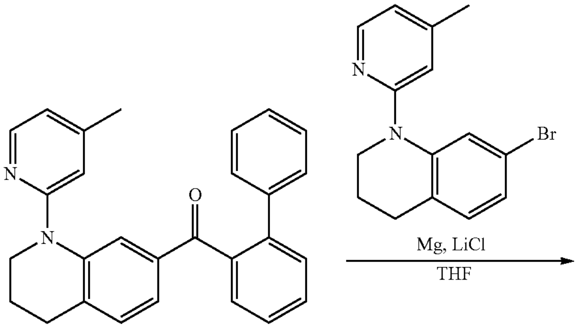

BD28-3

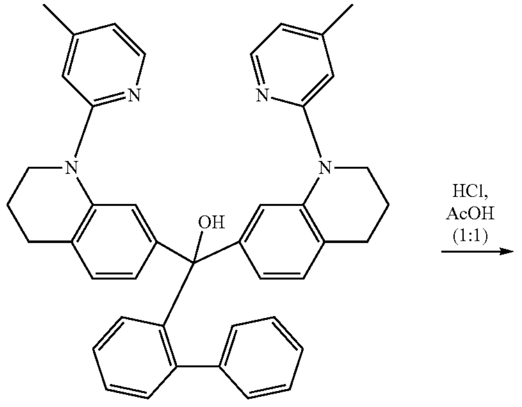

BD28-4

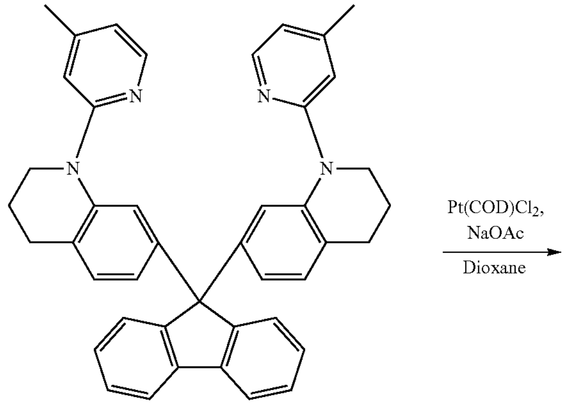

BD28-5

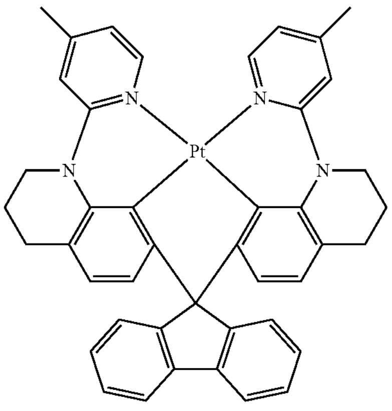

BD28

1) Synthesis of Intermediate BD28-1

1,2,3,4-tetrahydroquinoline-7-carbaldehyde (1 eq), 2-bromo-4-methylpyridine (1.2 eq), SPhos (0.07 eq), $Pd_2(dba)_3$ (0.05 eq), and sodium tert-butoxide (2.0 eq) were suspended in a toluene solvent, and temperature was raised to 100° C., followed by stirring for 12 hours. After completion of the reaction, the solvent was removed therefrom under reduced pressure, and an organic layer was extracted by utilizing methylene chloride and distilled water. The extracted organic layer was washed with a saturated aqueous sodium chloride solution and dried by utilizing magnesium sulfate. A residue obtained by removing the solvent therefrom was separated by column chromatography to obtain Intermediate BD28-1 at a yield of 60%.

2) Synthesis of Intermediate BD28-2

Magnesium (1 eq) and 2-bromobiphenyl (1 eq) were added to THF and stirred for 30 minutes at 80° C., dried LiCl (1 eq) was added thereto, and then, the mixture was stirred for 10 minutes. Intermediate BD28-1 was dissolved in THF and then slowly added dropwise thereto, followed by stirring for 15 hours. After completion of the reaction, an organic layer was extracted by utilizing an aqueous ammonium chloride solution and ethylacetate. The extracted organic layer was dried by utilizing magnesium sulfate, and a residue obtained by removing the solvent therefrom was separated by utilizing column chromatography to obtain Intermediate BD28-2 at a yield of 58%.

3) Synthesis of Intermediate BD28-3

Intermediate BD28-2 was dissolved in acetone, and potassium phosphate tribasic (2 eq) was added thereto, followed by stirring at 60° C. for 12 hours. After completion of the reaction, an organic layer was extracted by utilizing ethylacetate, the extracted organic layer was dried by utilizing magnesium sulfate, and a residue obtained by removing the solvent therefrom was separated by utilizing column chromatography to obtain Intermediate BD28-3 at a yield of 80%.

4) Synthesis of Intermediate BD28-4

Intermediate BD28-4 was obtained in substantially the same manner as utilized to obtain Intermediate BD28-2 of Synthesis Example 3, except that Intermediate 7-bromo-1-(4-methylpyridin-2-yl)-1,2,3,4-tetrahydroquinoline was utilized instead of 2-bromobiphenyl.

5) Synthesis of Intermediate BD28-5

Intermediate BD28-4 was dissolved in hydrochloric acid and acetic acid (a volume ratio of 1:1), followed by stirring at 60° C. for 12 hours. After completion of the reaction, the mixture was neutralized with an aqueous sodium hydroxide solution, and an organic layer was extracted by utilizing methylene chloride and distilled water. The extracted organic layer was washed with a saturated aqueous sodium chloride solution and dried by utilizing magnesium sulfate. A residue obtained by removing the solvent therefrom was separated by column chromatography to obtain Intermediate BD28-5 at a yield of 70%.

6) Synthesis of Compound BD28

Intermediate BD28-5 (1.0 eq), dichloro(1,2-dicyclooctadiene)platinum ($Pt(COD)Cl_2$) (1.1 eq), and sodium acetate (2.0 eq) were dissolved in dioxane (0.1 M), followed by stirring at 120° C. for 72 hours. The reaction mixture was cooled at room temperature, and an extraction process was performed thereon three times by utilizing dichloromethane and water, to thereby obtain an organic layer. The obtained organic layer was dried utilizing magnesium sulfate and concentrated, and column chromatography was utilized to synthesize Compound BD28 (yield: 27%).

Synthesis Example 4. Synthesis of BD66

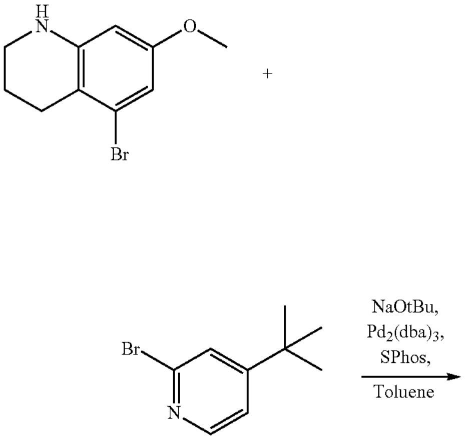

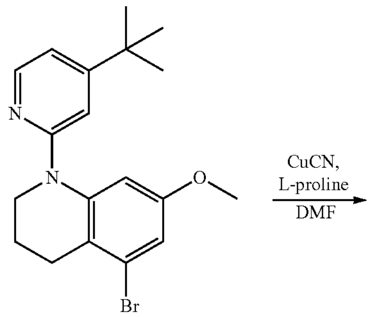

BD66-1

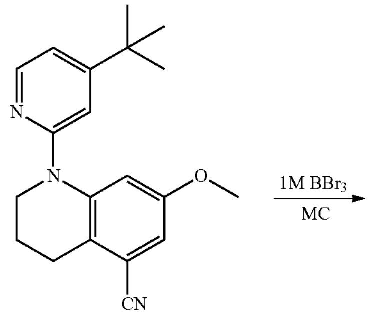

BD66-2

-continued

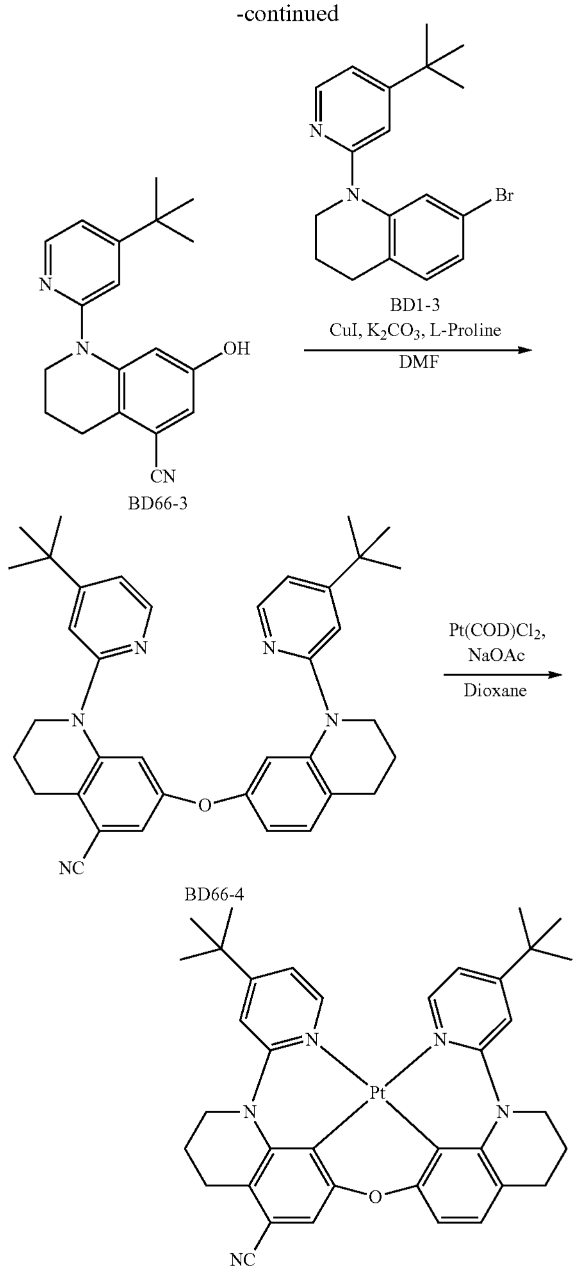

BD66-3

BD66-4

BD66

1) Synthesis of Intermediate BD66-1

5-bromo-7-methoxy-1,2,3,4-tetrahydroquinoline (1 eq), 2-bromo-4-(tert-butyl) pyridine (1.2 eq), SPhos (0.07 eq), $Pd_2(dba)_3$ (0.05 eq), and sodium tert-butoxide (2.0 eq) were suspended in a toluene solvent, and the temperature was raised to 100° C., followed by stirring for 12 hours. After completion of the reaction, the solvent was removed therefrom under reduced pressure, and an organic layer was extracted by utilizing methylene chloride and distilled water. The extracted organic layer was washed with a saturated aqueous sodium chloride solution and dried by utilizing magnesium sulfate. A residue obtained by removing the solvent therefrom was separated by column chromatography to obtain Intermediate BD66-1 at a yield of 74%.

2) Synthesis of Intermediate BD66-2

Intermediate BD66-1 (1 eq), Copper(I) cyanide (2 eq), and L-proline (1 eq) were added to DMF, followed by stirring at 160° C. for 24 hours. After completion of the reaction, the solvent was removed therefrom under reduced pressure, and an organic layer was extracted by utilizing ethylacetate and distilled water. The extracted organic layer was washed with a saturated aqueous sodium chloride solution and dried by utilizing magnesium sulfate. A residue obtained by removing the solvent therefrom was separated by column chromatography to obtain Intermediate BD66-2 at a yield of 80%.

3) Synthesis of Intermediate BD66-3

Intermediate BD66-3 was obtained in substantially the same manner as utilized to obtain Intermediate BD1-2 of Synthesis Example 1, except that Intermediate BD66-2 was utilized instead of Intermediate BD1-1.

4) Synthesis of Intermediate BD66-4

Intermediate BD66-4 was obtained in substantially the same manner as utilized to obtain Intermediate BD1-4 of Synthesis Example 1, except that Intermediate BD66-3 was utilized instead of Intermediate BD1-2.

5) Synthesis of Compound BD66

Intermediate BD66-4 (1.0 eq), dichloro(1,2-dicycloocta-diene)platinum (Pt(COD)Cl2) (1.1 eq), and sodium acetate (2.0 eq) were dissolved in dioxane (0.1 M), followed by stirring at 120° C. for 72 hours. The reaction mixture was cooled at room temperature, and an extraction process was performed thereon three times by utilizing dichloromethane and water, to thereby obtain an organic layer. The obtained organic layer was dried utilizing magnesium sulfate and concentrated, and column chromatography was utilized to synthesize Compound BD66 (yield: 19%).

Synthesis Example 5. Synthesis of BD91

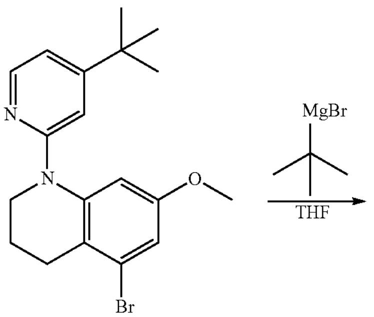

[BD66-1]

-continued

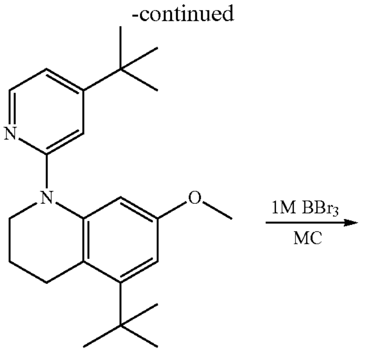

BD91-1

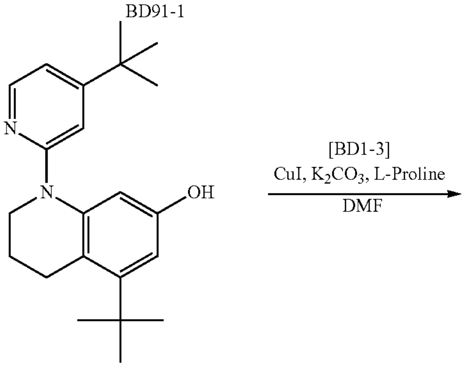

BD91-2

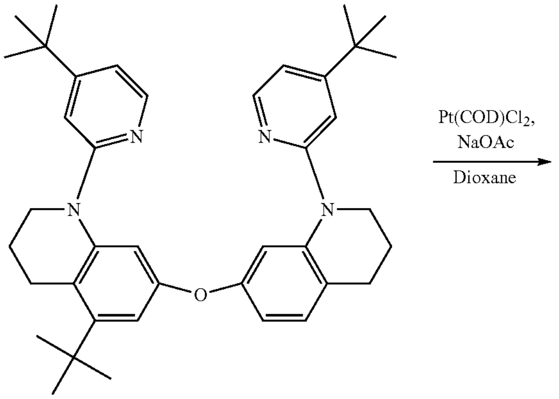

BD91-3

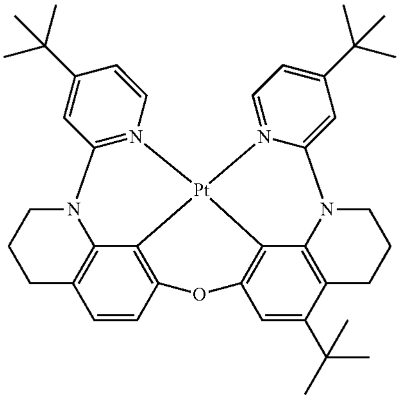

BD91

1) Synthesis of Intermediate BD91-1

Intermediate 66-1 (1 eq) was dissolved in THF, and tert-butylmagnesium bromide (1M in THF, 1.3 eq) was slowly added dropwise thereto, followed by stirring at room temperature for 24 hours. After completion of the reaction, the solvent was removed therefrom under reduced pressure, and an organic layer was extracted by utilizing ethylacetate and distilled water. The extracted organic layer was washed with a saturated aqueous sodium chloride solution and dried by utilizing magnesium sulfate. A residue obtained by removing the solvent therefrom was separated by column chromatography to obtain Intermediate BD91-1 at a yield of 67%.

2) Synthesis of Intermediate BD91-2

Intermediate BD91-2 was obtained in substantially the same manner as utilized to obtain Intermediate BD1-2 of Synthesis Example 1, except that Intermediate BD91-1 was utilized instead of Intermediate BD1-1.

3) Synthesis of Intermediate BD91-3

Intermediate BD91-3 was obtained in substantially the same manner as utilized to obtain Intermediate BD1-4 of Synthesis Example 1, except that Intermediate BD91-2 was utilized instead of Intermediate BD1-2.

4) Synthesis of Compound BD91

Intermediate BD91-3 (1.0 eq), dichloro (1,2-dicycloocta-diene)platinum ($Pt(COD)Cl_2$) (1.1 eq), and sodium acetate (2.0 eq) were dissolved in dioxane (0.1 M), followed by stirring at 120° C. for 72 hours. The reaction mixture was cooled at room temperature, and an extraction process was performed thereon three times by utilizing dichloromethane and water, to thereby obtain an organic layer. The obtained organic layer was dried utilizing magnesium sulfate and concentrated, and column chromatography was utilized to synthesize Compound BD91 (yield: 30%).

TABLE 1

| | | MS/FAB | |
|---|---|---|---|
| Compound | H NMR (δ) | Calc | found |
| BD1 | 8.12 (d, 2H), 7.12 (d, 2H), 6.67-6.65 (m, 4H), 6.52 (s, 2H), 3.04 (t, 4H), 2.79 (t, 4H), 1.96 (m, 4H), 1.32 (s, 18H) | 739.83 | 739.28 |
| BD12 | 8.46 (s, 1H), 8.12 (d, 1H), 7.12 (d, 2H), 6.71-6.66 (m, 4H), 6.52 (s, 1H), 3.04 (t, 4H), 2.79 (t, 4H), 2.68 (s, 3H), 1.96 (m, 4H), 1.30 (s, 9H) | 778.87 | 778.30 |
| BD28 | 8.10 (d, 2H), 7.90 (d, 2H), 7.55 (d, 2H), 7.38 (t, 2H), 7.28 (t, 2H), 7.15 (d, 2H), 6.84 (d, 2H), 6.67 (d, 2H), 6.52 (s, 2H), 3.00 (t, 4H), 2.77 (t, 4H), 2.22 (s, 6H), 1.90 (m, 4H), | 803.87 | 803.26 |
| BD66 | 8.16 (d, 2H), 7.42 (s, 1H), 7.12 (d, 1H), 6.68-6.60 (m, 3H), 6.52 (s, 2H), 3.04 (t, 4H), 2.74-2.70 (m, 4H), 1.99 (m, 4H), 1.32 (s, 18H) | 764.84 | 764.28 |
| BD91 | 8.22 (d, 2H), 7.12 (d, 1H), 7.02-6.88 (m, 4H), 6.50 (s, 2H), 3.00 (t, 4H), 2.80-2.71 (m, 4H), 1.94 (m, 4H), 1.35 (s, 9H), 1.32 (s, 9H) | 795.94 | 795.35 |
| Comparative Compound 1 | 8.90 (d, 2H), 8.19 (d, 2H), 8.12-8.02 (m, 4H), 7.92 (d, 2H), 7.52 (m, 2H), 7.45-7.37 (m, 4H), 7.18 (d, 2H), 1.34 (s, 18H). | 807.86 | 807.25 |
| Comparative Compound 2 | 8.56 (d, 2H), 7.88-7.82 (m, 4H), 7.40-7.38 (m, 4H), 7.10 (d, 2H), 6.95 (t, 2H) | 517.45 | 517.08 |

Evaluation Example 1

LUMO and HOMO values of compounds of Synthesis Examples were measured utilizing methods described in Table 2, and by utilizing the DFT method of the Gaussian 09 program (with the structure optimization at the level of B3LYP, 6-311 G(d,p)), $T_1$ (triplet energy), and $^3$MLCT values of Compounds of Synthesis Examples were calculated. The results are shown in Table 3.

TABLE 2

| | |
|---|---|
| HOMO energy level evaluation method | By utilizing cyclic voltammetry (CV) (electrolyte: 0.1M $BU_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and then, from the oxidation onset of the graph, the HOMO energy level of each compound was calculated. |
| LUMO energy level evaluation method | By utilizing cyclic voltammetry (CV) (electrolyte: 0.1M $BU_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and then, from the reduction onset of the graph, the LUMO energy level of each compound was calculated. |

TABLE 3

| Compound No. | HOMO (eV) | LUMO (eV) | $T_1$ (eV) | $^3$MLCT (%) |
|---|---|---|---|---|
| BD1 | −5.25 | −1.94 | 2.93 | 21.0 |
| BD12 | −5.24 | −2.01 | 2.90 | 19.8 |
| BD28 | −5.26 | −1.96 | 2.93 | 15.4 |
| BD66 | −5.40 | −2.09 | 2.91 | 16.7 |
| BD91 | −5.30 | −1.96 | 2.92 | 15.9 |
| Comparative Compound 1 | −5.12 | −1.90 | 2.91 | 10.2 |
| Comparative Compound 2 | −5.20 | −1.98 | 2.80 | 8.8 |

Structural formulae of Comparative Compounds 1 and 2 of Table 3 are as follows.

Comparative Compound 1

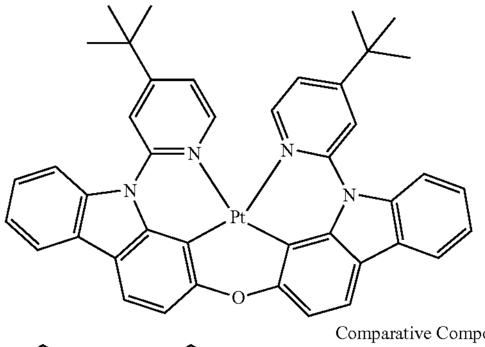

Comparative Compound 2

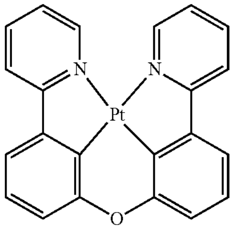

Example 1

As an anode, a glass substrate with ITO of 15 Ω/cm$^2$ and 1,200 Å deposited thereon was cut to a size of 50 mm×50 mm×0.7 mm, sonicated with isopropyl alcohol and pure water each for 5 minutes, and then cleaned by irradiation of ultraviolet rays and exposure of ozone thereto for 30 minutes. The resultant glass substrate was loaded onto a vacuum deposition apparatus.

2-TNATA was vacuum-deposited on the ITO substrate to form a hole injection layer having a thickness of 600 Å, and then, NPB was vacuum-deposited on the hole injection layer to form a hole transport layer having a thickness of 300 Å.

A second compound (HTH29), a third compound (ETH2), and BD1 of Synthesis Example 1 were co-deposited on the hole transport layer at a weight ratio of 65:35:10 to form an emission layer having a third compound of 300 Å.

ETH2 was deposited on the emission layer to form a hole blocking layer having a thickness of 50 Å. Next, $Alq_3$ was deposited on the hole blocking layer to form an electron transport layer having a thickness of 300 Å, and LiF, which is a halogenated alkali metal, was deposited on the electron transport layer to form an electron injection layer having a thickness of 10 Å, and Al was vacuum-deposited thereon to form a cathode electrode having a thickness of 3,000 Å, to form a LiF/Al electrode, thereby completing the manufacture of a light-emitting device.

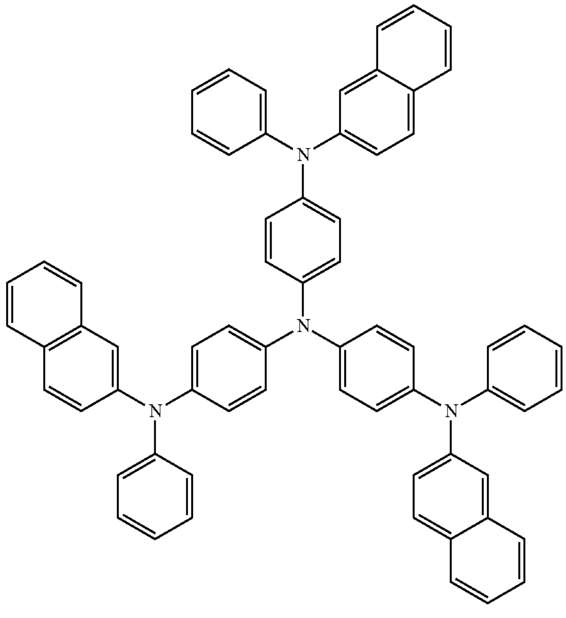

2-TNATA

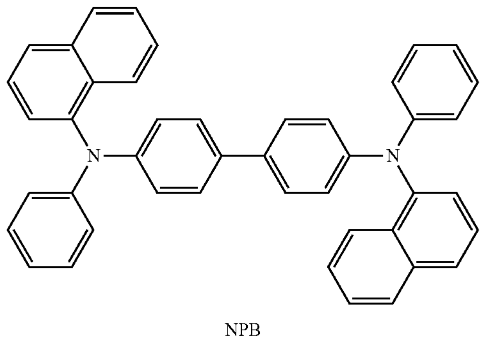

NPB

-continued

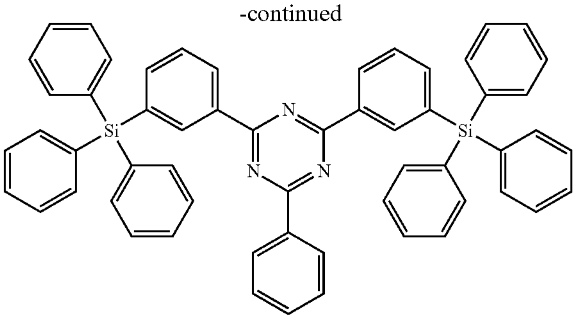

ETH2

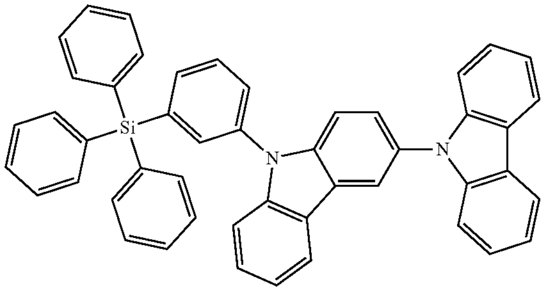

HTH29

Example 2

Example 2 was carried out in substantially the same manner as in Example 1, except that Compound BD12 was utilized instead of Compound BD1.

Example 3

Example 3 was carried out in substantially the same manner as in Example 1, except that Compound BD28 was utilized instead of Compound BD1.

Example 4

Example 4 was carried out in substantially the same manner as in Example 1, except that Compound BD66 was utilized instead of Compound BD1.

Example 5

Example 5 was carried out in substantially the same manner as in Example 1, except that Compound BD91 was utilized instead of Compound BD1.

Comparative Example 1

Comparative Example 1 was carried out in substantially the same manner as in Example 1, except that Comparative Compound 1 was utilized instead of Compound BD1. A structural formula of Comparative Compound 1 is as follows.

Structural Formula of Comparative Compound 1

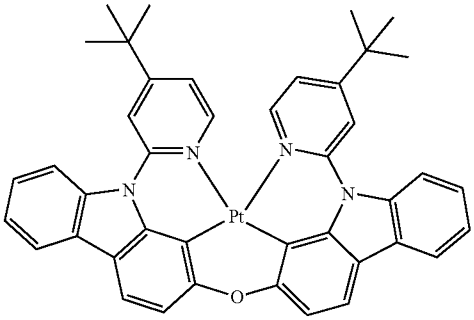

Comparative Example 2

Comparative Example 2 was carried out in substantially the same manner as in Example 1, except that Comparative Compound 2 was utilized instead of Compound BD1. A structural formula of Comparative Compound 2 is as follows.

Structural Formula of Comparative Compound 2

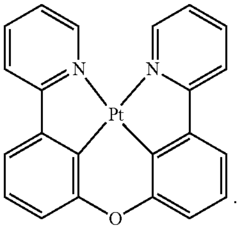

A voltage was supplied so that the light-emitting devices manufactured according to Examples 1 to 5 and Comparative Examples 1 and 2 emitted light having a luminance of 1,000 cd/m$^2$. The luminance (cd/m$^2$), driving voltage (V), luminescence efficiency (cd/A), maximum emission wavelength (nm), and device lifespan (hr @ 1,000 cd/m$^2$) were each measured by utilizing the Keithley MU 236 and the luminance meter PR650, and results thereof are shown in Table 4.

TABLE 4

| | Dopant | Luminance (cd/m$^2$) | Driving voltage (V) | Luminescence efficiency (cd/A) | Maxium emission wavelength (nm) | Device lifespan ($T_{90}$, hr @ 1,000 cd/m$^2$) |
|---|---|---|---|---|---|---|
| Example 1 | BD1 | 1000 | 4.0 | 25.0 | 460 | 59 |
| Example 2 | BD12 | 1000 | 4.2 | 27.3 | 459 | 57 |
| Example 3 | BD28 | 1000 | 4.3 | 24.1 | 461 | 67 |
| Example 4 | BD66 | 1000 | 4.2 | 25.4 | 461 | 61 |
| Example 5 | BD91 | 1000 | 4.3 | 26.8 | 462 | 80 |
| Comparative Example 1 | Comparative Compound 1 | 1000 | 5.2 | 20.1 | 470 | 30 |

TABLE 4-continued

| | Dopant | Luminance ($cd/m^2$) | Driving voltage (V) | Luminescence efficiency (cd/A) | Maxium emission wavelength (nm) | Device lifespan ($T_{90}$, hr @ 1,000 $cd/m^2$) |
|---|---|---|---|---|---|---|
| Comparative Example 2 | Comparative Compound 2 | 1000 | 5.0 | 18.0 | 471 | 15 |

From Table 4, it may be confirmed that the light-emitting device including the organometallic compound according to each Example had excellent or suitable driving voltage (V), excellent or suitable luminescence efficiency (cd/A), and excellent or suitable device lifespan ($T_{90}$), as compared to the light-emitting devices including dopants of Comparative Examples 1 and 2.

A light-emitting device having high efficiency and a long lifespan and a high-quality electronic apparatus including the same may be manufactured by utilizing the organometallic compound.

The use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

The light emitting device, electronic apparatus or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope of the present disclosure as defined by the following claims and equivalents thereof.

What is claimed is:

1. A light-emitting device comprising:

a first electrode;

a second electrode facing the first electrode; and an interlayer between the first electrode and the second electrode and comprising an emission layer, wherein the emission layer comprises an organometallic compound represented by Formula 1:

Formula 1

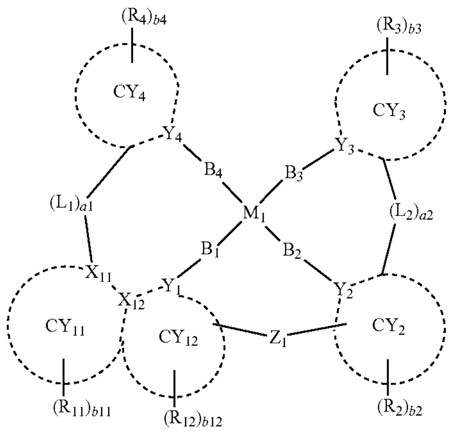

wherein, in Formula 1, $M_1$ is platinum (Pt), palladium (Pd), copper (Cu), silver (Ag), gold (Au), rhodium (Rh), iridium (Ir), ruthenium (Ru), or osmium (Os), rings $CY_{11}$, $CY_{12}$, $CY_2$, $CY_3$, and $CY_4$ are each independently a $C_5$-$C_{60}$ carbocyclic group or a $C_1$-$C_{60}$ heterocyclic group, ring $CY_{11}$ is non-aromatic, ring $CY_{12}$ is aromatic, $Y_1$, $Y_2$, $Y_3$, $Y_4$, $X_{11}$, and $X_{12}$ are each independently selected from among a carbon atom (C) and a nitrogen atom (N), $Y_1$ and $X_{12}$ are directly linked to each other via a chemical bond, $X_{11}$ and $X_{12}$ are directly linked to each other via a chemical bond, $X_{12}$ is a bridgehead atom, $B_1$ to $B_4$ are each independently a single bond, an oxygen atom (O), a sulfur atom (S), $N(R_{11a})$, or $C(R_{11a})(R_{12a})$, $Z_1$ is a single bond, an oxygen atom (O), a sulfur atom (S), $B(R_{13})$, $N(R_{13})$, $P(R_{13})$, $C(R_{13})(R_{14})$, $Si(R_{13})(R_{14})$, or $P(R_{13})(R_{14})$, $R_{13}$ and $R_{14}$ are optionally linked to each other to form a $C_5$-$C_{60}$ carbocyclic group that is unsubstituted or substituted with $R_{10a}$ or a $C_1$-$C_{60}$ heterocyclic group that is unsubstituted or substituted with $R_{10a}$, $L_1$ and $L_2$ are each independently *—O—*', *—S—*', *—$C(R_{15})(R_{16})$—*', *—$C(R_{15})$=*', *=$C(R_{15})$—*', *—$C(R_{15})$=$C(R_{16})$—*', *—C(=O)—*', *—C(=S)—*', *—C≡C—*', *—$B(R_{15})$—*', *—$N(R_{15})$—*', *—$P(R_{15})$—*', *—$Si(R_{15})(R_{16})$—*', *—$P(R_{15})(R_{16})$—*', or *—$Ge(R_{15})(R_{16})$—*', a1 and a2 are each independently an integer from 0 to 3, when a1 is 0, a group represented by *-$(L_1)_{a1}$-*' is a single bond, when a2 is 0, a group represented by *-$(L_2)_{a2}$-*' is a single bond, $R_{11}$, $R_{12}$, $R_2$, $R_3$, $R_4$, $R_{11a}$, $R_{12a}$, $R_{13}$, $R_{14}$, $R_{15}$, $R_{16}$, and $R_{10a}$ are each independently:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —C(=O)($Q_{11}$), —$S(=O)_2(Q_{11})$, —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —C(=O)($Q_{21}$), —$S(=O)_2(Q_{21})$, —P(=O)($Q_{21}$)($Q_{22}$), or any combination thereof; or —$Si(Q_{31})(Q_{32})(Q_{33})$, —$N(Q_{31})(Q_{32})$, —$B(Q_{31})(Q_{32})$, —C(=O)($Q_{31}$), —$S(=O)_2(Q_{31})$, or —P(=O)($Q_{31}$)($Q_{32}$), $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, b11, b12, b2, b3, and b4 are each independently an integer from 0 to 8, and

* and *' each indicates a binding site to a neighboring atom.

2. The light-emitting device of claim 1, wherein the emission layer further comprises a second compound, a third compound, a fourth compound, or any combination thereof, the second compound comprises at least one π electron-rich $C_3$-$C_{60}$ cyclic group, the third compound comprises at least one π electron-deficient nitrogen-containing $C_1$-$C_{60}$ cyclic group, the fourth compound emits delayed fluorescence, and the second compound, the third compound, and the fourth compound are different from one another.

3. The light-emitting device of claim 2, wherein the second compound and the third compound are to form an exciplex.

4. The light-emitting device of claim 1, wherein the percentage of the metal-to-ligand charge-transfer triplet state ($^3$MLCT) of the organometallic compound is greater than or equal to 15%.

5. The light-emitting device of claim 1, wherein the emission layer is configured to emit blue light.

6. The light-emitting device of claim 1, wherein the first electrode is an anode, the second electrode is a cathode, the interlayer further comprises a hole transport region between the first electrode and the emission layer and an electron transport region between the emission layer and the second electrode, the hole transport region comprises a hole injection layer, a hole transport layer, an emission auxiliary layer, an electron blocking layer, or any combination thereof, and the electron transport region comprises a hole blocking layer, an electron transport layer, an electron injection layer, or any combination thereof.

7. An electronic apparatus comprising the light-emitting device according to claim 1.

8. The electronic apparatus of claim 7, further comprising a thin-film transistor, wherein the thin-film transistor comprises a source electrode and a drain electrode, and the first electrode of the light-emitting device is electrically connected to the source electrode or the drain electrode of the thin-film transistor.

9. The electronic apparatus of claim 7, further comprising a color filter, a quantum dot color conversion layer, a touch screen layer, a polarizing layer, or any combination thereof.

10. An organometallic compound represented by Formula 1:

Formula 1

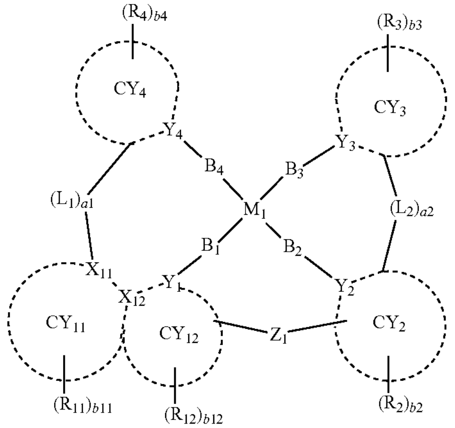

wherein, in Formula 1, $M_1$ is platinum (Pt), palladium (Pd), copper (Cu), silver (Ag), gold (Au), rhodium (Rh), iridium (Ir), ruthenium (Ru), or osmium (Os), rings $CY_{11}$, $CY_{12}$, $CY_2$, $CY_3$, and $CY_4$ are each independently a $C_5$-$C_{60}$ carbocyclic group or a $C_1$-$C_{60}$ heterocyclic group, ring $CY_{11}$ is non-aromatic, ring $CY_{12}$ is aromatic, $Y_1$, $Y_2$, $Y_3$, $Y_4$, $X_{11}$, and $X_{12}$ are each independently selected from among a carbon atom (C) and a nitrogen atom (N), $Y_1$ and $X_{12}$ are directly linked to each other via a chemical bond, $X_{11}$ and $X_{12}$ are directly linked to each other via a chemical bond, $X_{12}$ is a bridgehead atom, $B_1$ to $B_4$ are each independently a single bond, an oxygen atom (O), a sulfur atom (S), $N(R_{11a})$, or $C(R_{11a})(R_{12a})$, $Z_1$ is a single bond, an oxygen atom (O), a sulfur atom (S), $B(R_{13})$, $N(R_{13})$, $P(R_{13})$, $C(R_{13})(R_{14})$, $Si(R_{13})(R_{14})$, or $P(R_{13})(R_{14})$, $R_{13}$ and $R_{14}$ are optionally linked to each other to form a $C_5$-$C_{60}$ carbocyclic group that is unsubstituted or substituted with $R_{10a}$ or a $C_1$-$C_{60}$ heterocyclic group that is unsubstituted or substituted with $R_{10a}$, $L_1$ and $L_2$ are each independently *—O—*', *—S—*', *—$C(R_{15})(R_{16})$—*', *—$C(R_{15})$=*', *=$C(R_{15})$—*', *—$C(R_{15})$=$C(R_{16})$—*', *—C(=O)—*', *—C(=S)—*', *—C≡C—*', *—$B(R_{15})$—*', *—$N(R_{15})$—*', $P(R_{15})$—*', *—$Si(R_{15})(R_{16})$—*', *—$P(R_{15})(R_{16})$—*', or *—$Ge(R_{15})(R_{16})$—*', a1 and a2 are each independently an integer from 0 to 3, when a1 is 0, a group represented by *-$(L_1)_{a1}$-*' is a single bond, when a2 is 0, a group represented by *-$(L_2)_{a2}$-*' is a single bond, $R_{11}$, $R_{12}$, $R_2$, $R_3$, $R_4$, $R_{11a}$, $R_{12a}$, $R_{13}$, $R_{14}$, $R_{15}$, $R_{16}$, and $R_{10a}$ are each independently:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, b11, b12, b2, b3, and b4 are each independently an integer from 0 to 8, and

* and *' each indicates a binding site to a neighboring atom.

11. The organometallic compound of claim 10, wherein ring $CY_3$ and ring $CY_4$ are the same group.

12. The organometallic compound of claim 10, wherein rings $CY_3$ and $CY_4$ are each independently a benzene group, a pyridine group, a pyridazine group, a pyrimidine group, a pyrazine group, a triazine group, a cyclopentadiene group, a pyrrole group, a pyrazole group, an imidazole group, or a triazole group.

13. The organometallic compound of claim 10, wherein ring $CY_{11}$ is a cyclopentane group, a cyclopentene group, a cyclopentadiene group, a cyclohexane group, a cyclohexene group, a cyclohexadiene group, a cycloheptane group, a cycloheptene group, a cycloheptadiene group, a cycloheptatriene group, an azepane group, a pyrrolidine group, an imidazolidine group, a dihydropyrrole group, a dihydroimidazole group, a piperidine group, a tetrahydropyridine group, a dihydropyridine group, a hexahydropyrimidine group, a dihydropyrimidine group, a piperazine group, a tetrahydropyrazine group, a dihydropyrazine group, a tetrahydroazepine group, or a dihydroazepine group, and ring $CY_{12}$ is a benzene group, a pyrrole group, a pyridine group, a pyridazine group, a pyrimidine group, a pyrazine group, an azepine group, a diazepine group, an oxepine group, a dioxazepine group, a thiepine group, or a thiazepine group.

14. The organometallic compound of claim 10, wherein, in Formula 1, a moiety represented by

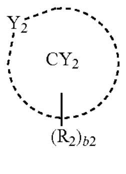

is a group represented by Formula 1-1:

Formula 1-1

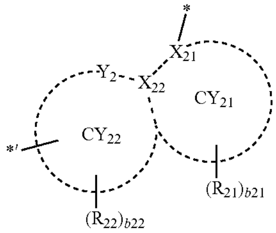

wherein, in Formula 1-1, rings $CY_{21}$ and $CY_{22}$ are each independently a $C_5$-$C_{60}$ carbocyclic group or a $C_1$-$C_{60}$ heterocyclic group, ring $CY_{21}$ is non-aromatic, ring $CY_{22}$ is aromatic, $X_{21}$ and $X_{22}$ are each independently selected from among a carbon atom (C) and a nitrogen atom (N), $Y_2$ and $X_{22}$ are directly linked to each other via a chemical bond, $X_{21}$ and $X_{22}$ are directly linked to each other via a chemical bond, $X_{22}$ is a bridgehead atom,

* indicates a binding site to $L_2$,

*' indicates a binding site to $Z_1$, $R_{21}$ and $R_{22}$ are respectively the same as described in connection with $R_2$ in claim 10, and b21 and b22 are respectively the same as described in connection with b2 in claim 10.

15. The organometallic compound of claim 14, wherein ring $CY_{11}$ and ring $CY_{21}$ are the same group.

16. The organometallic compound of claim 14, wherein ring $CY_{12}$ and ring $CY_{22}$ are the same group.

17. The organometallic compound of claim 14, wherein ring $CY_{21}$ is a cyclopentane group, a cyclopentene group, a cyclopentadiene group, a cyclohexane group, a cyclohexene group, a cyclohexadiene group, a cycloheptane group, a cycloheptene group, a cycloheptadiene group, a cycloheptatriene group, an azepane group, a pyrrolidine group, an imidazolidine group, a dihydropyrrole group, a dihydroimidazole group, a piperidine group, a tetrahydropyridine group, a dihydropyridine group, a hexahydropyrimidine group, a dihydropyrimidine group, a piperazine group, a tetrahydropyrazine group, a dihydropyrazine group, a tetrahydroazepine group, or a dihydroazepine group, and ring $CY_{22}$ is a benzene group, a pyrrole group, a pyridine group, a pyridazine group, a pyrimidine group, a pyrazine group, an azepine group, a diazepine group, an oxepine group, a dioxazepine group, a thiepine group, or a thiazepine group.

18. The organometallic compound of claim 14, wherein a moiety represented by

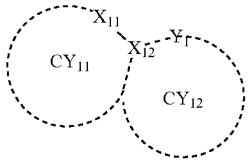

in Formula 1 or a moiety represented by

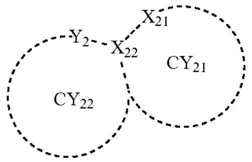

in Formula 1-1 are each independently one of the groups represented by Formulae 1-1-1 to 1-1-12:

1-1-1

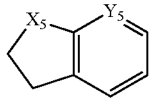

1-1-2

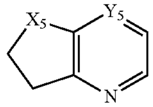

1-1-3

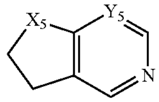

1-1-4

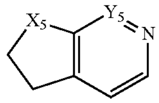

1-1-5

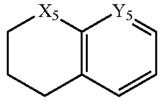

1-1-6

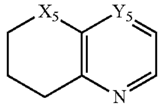

1-1-7

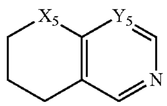

1-1-8

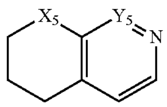

1-1-9

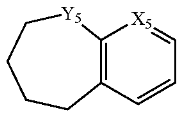

1-1-10

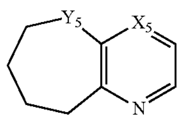

-continued 1-1-11

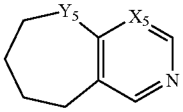

1-1-12

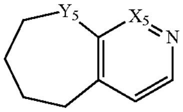

wherein, in Formulae 1-1-1 to 1-1-12, $X_5$ is $X_{11}$ or $X_{21}$, when $X_5$ is $X_{11}$, $Y_5$ is $Y_1$, and when $X_5$ is $X_{21}$, $Y_5$ is $Y_2$.

19. The organometallic compound of claim 10, wherein two of $Y_1$ to $Y_4$ are each a nitrogen atom (N) and satisfy one of conditions of 1) to 4):

1) $Y_1$ and $Y_2$ are each a nitrogen atom (N)

2) $Y_3$ and $Y_4$ are each a nitrogen atom (N)

3) $Y_1$ and $Y_3$ are each a nitrogen atom (N)

4) $Y_2$ and $Y_4$ are each a nitrogen atom (N).

20. The organometallic compound of claim 10, wherein the organometallic compound is represented by one of Formulae BD1 to BD105:

BD1

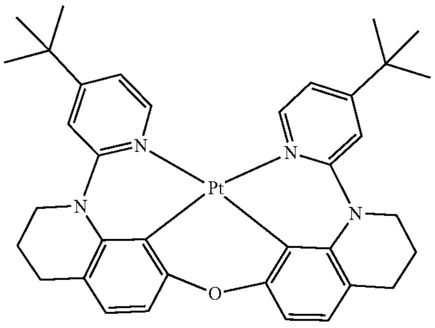

BD2

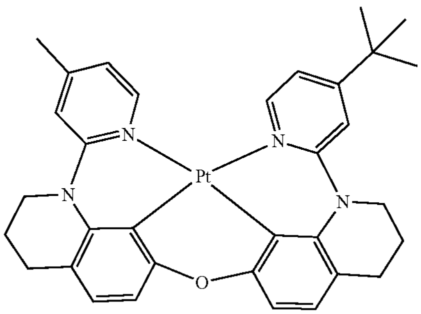

BD3

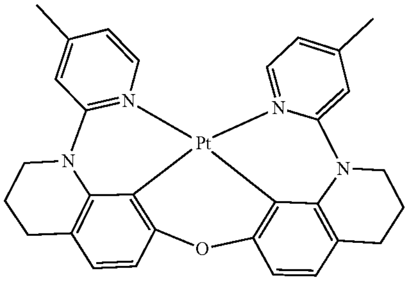

-continued

BD4

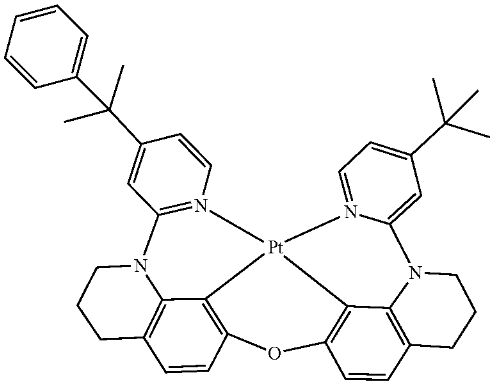

BD5

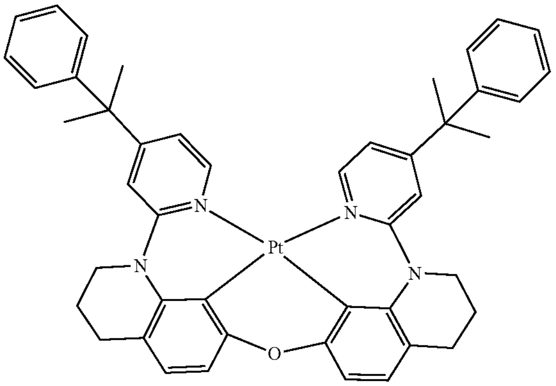

BD6

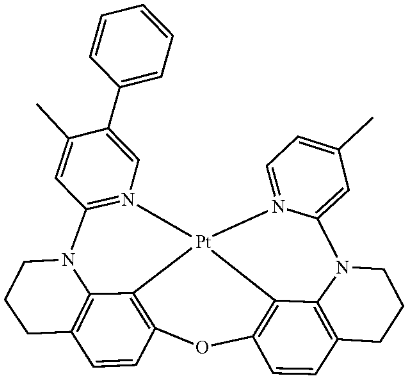

BD7

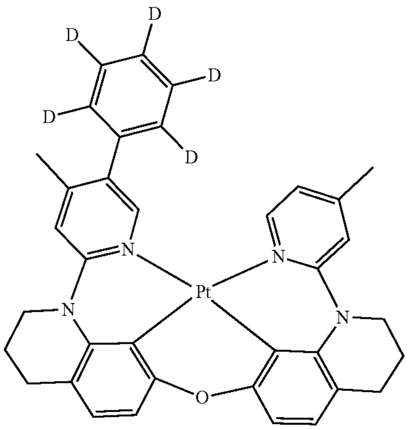

-continued
BD8
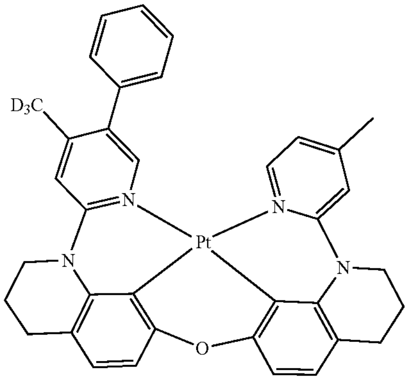
BD9
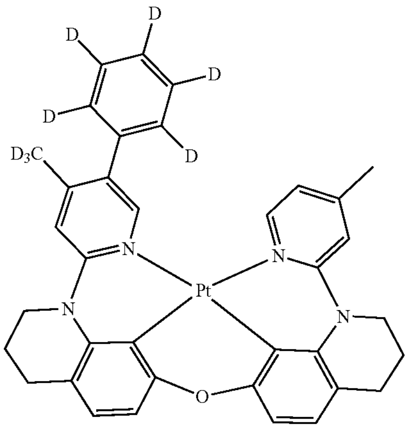
BD10
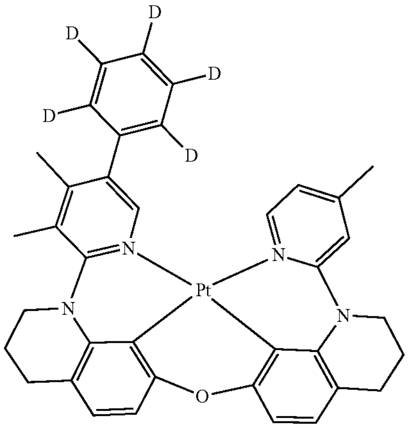
BD11
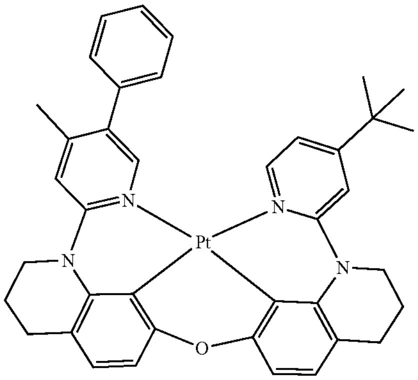
-continued
BD12
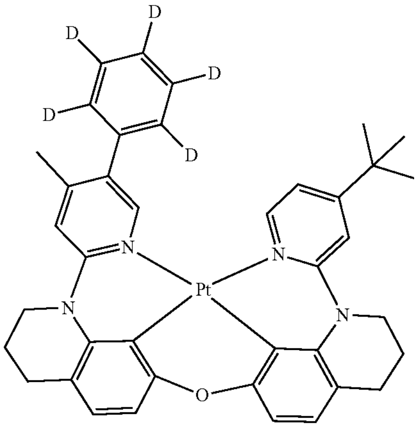
BD13
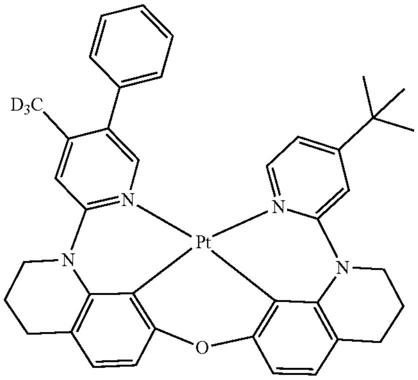
BD14
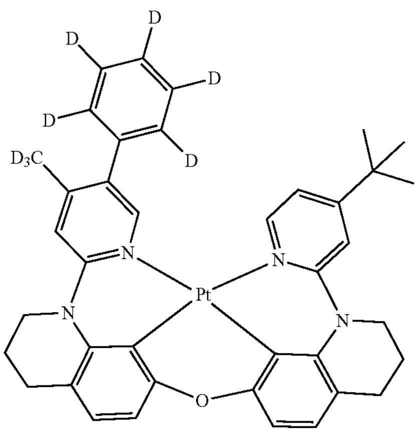

-continued
BD15
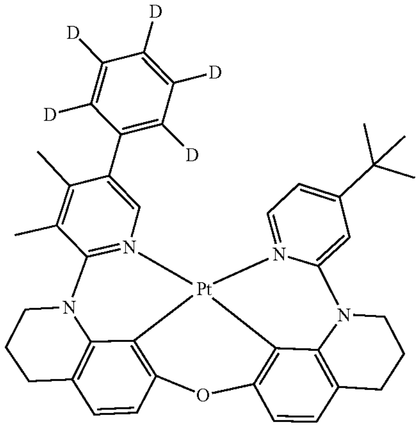
BD16
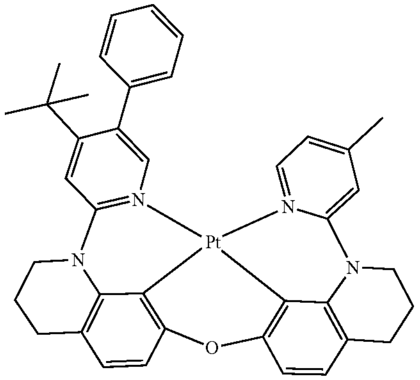
BD17
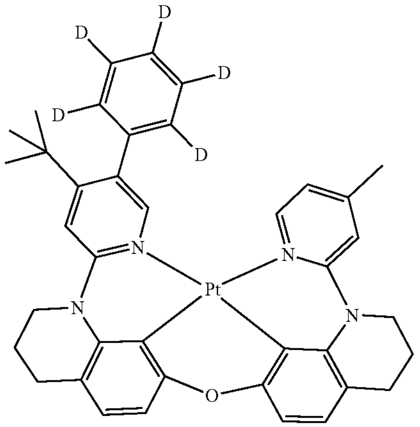
BD18
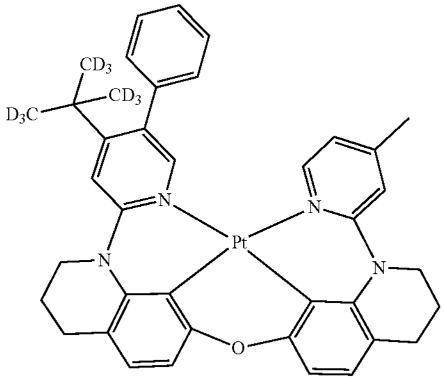
-continued
BD19
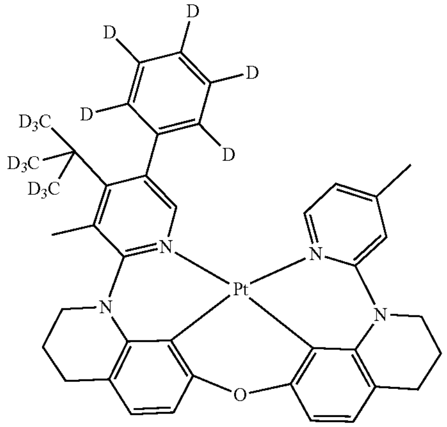
BD20
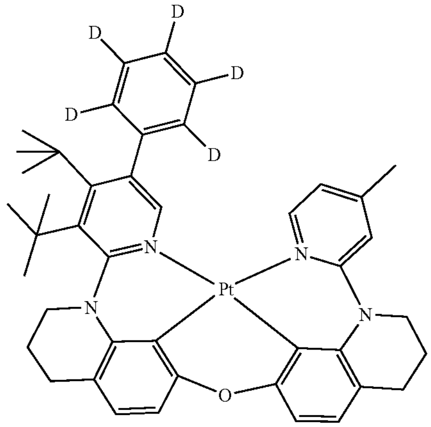
BD21
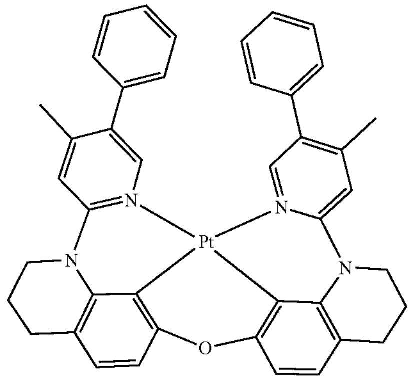

-continued
BD22
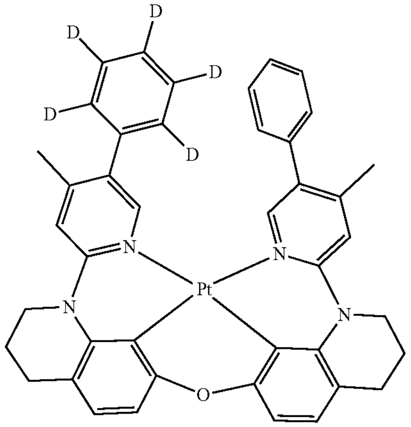
BD23
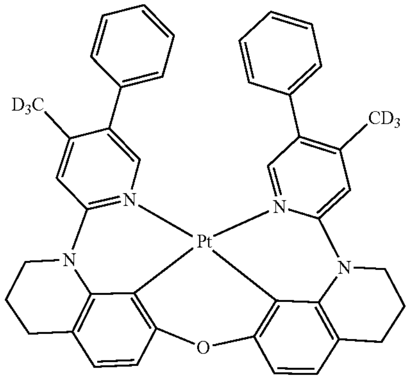
BD24
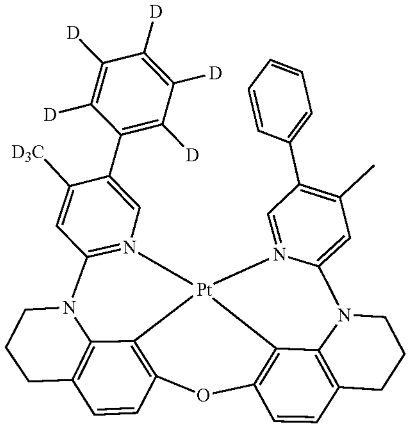
-continued
BD25
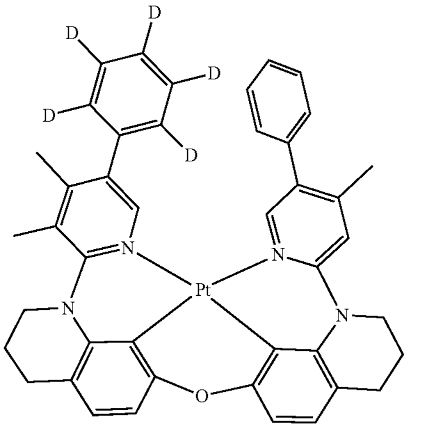
BD26
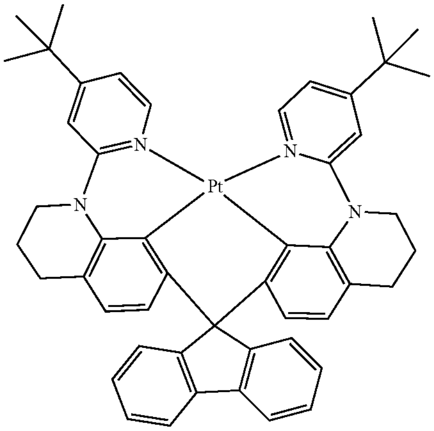
BD27
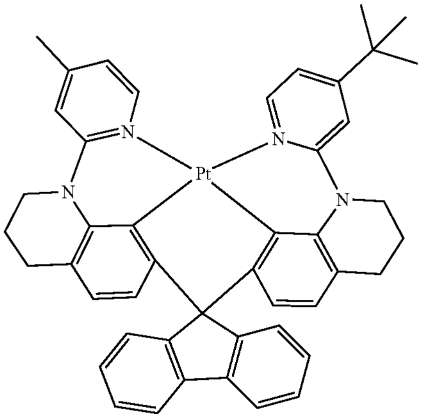

232
-continued
BD28
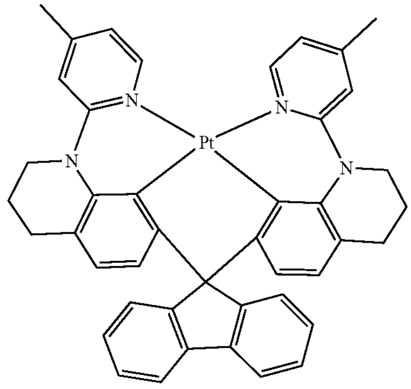
BD29
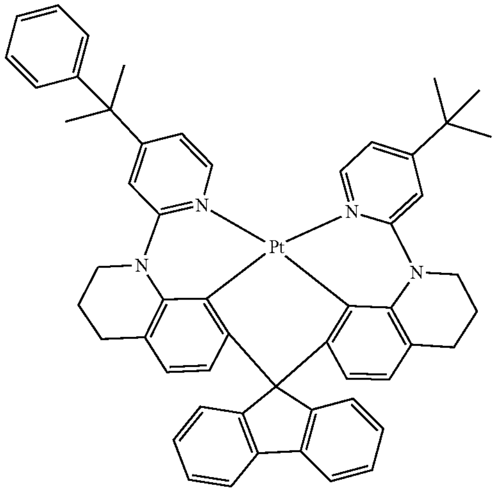
H30
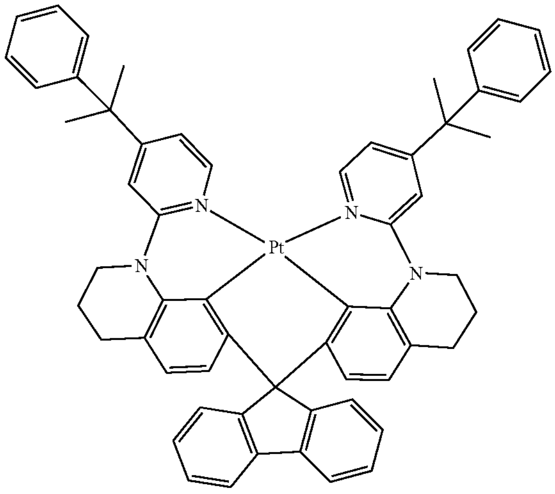
H31
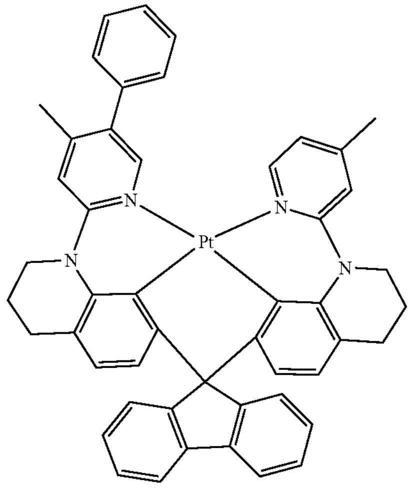
H32
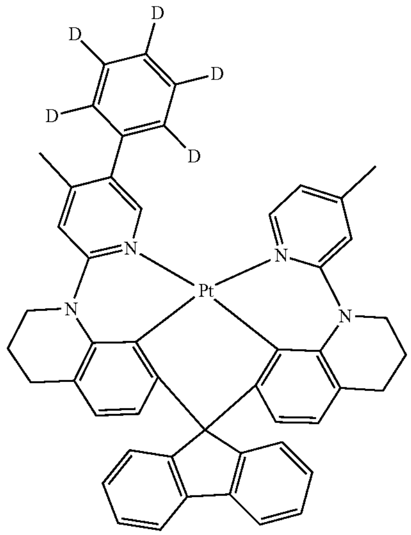
H33
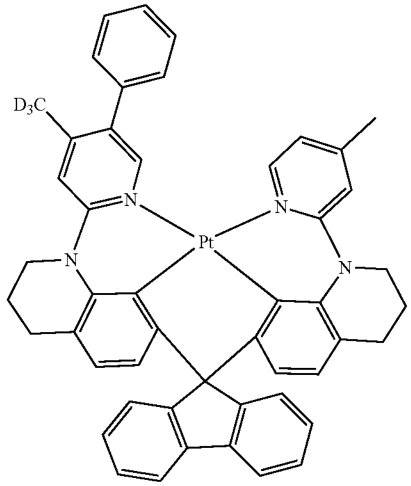

-continued
BD34
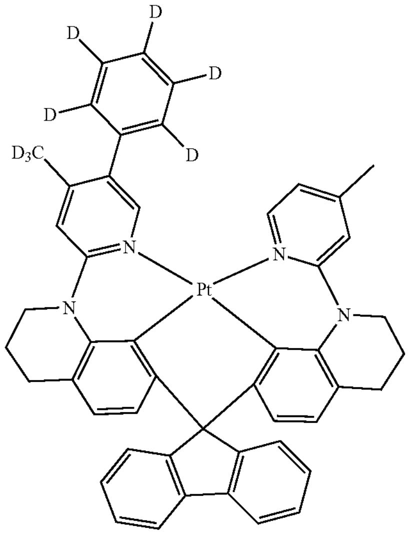
BD35
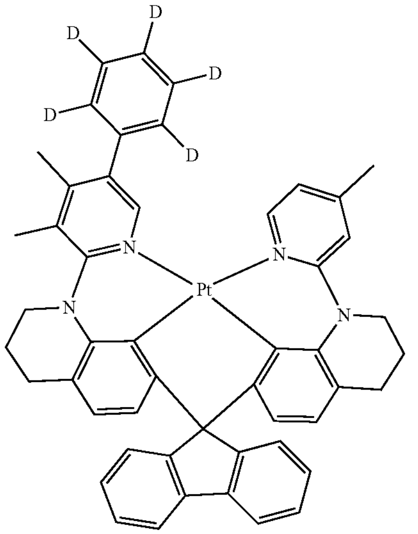
BD36
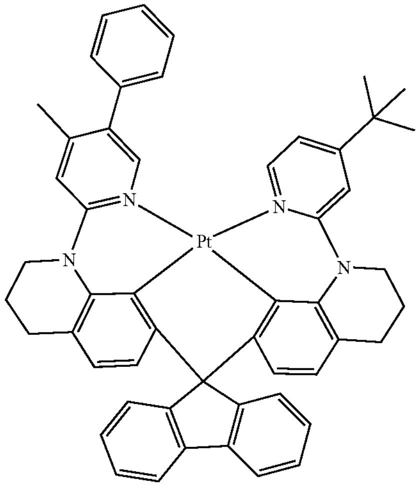
-continued
BD37
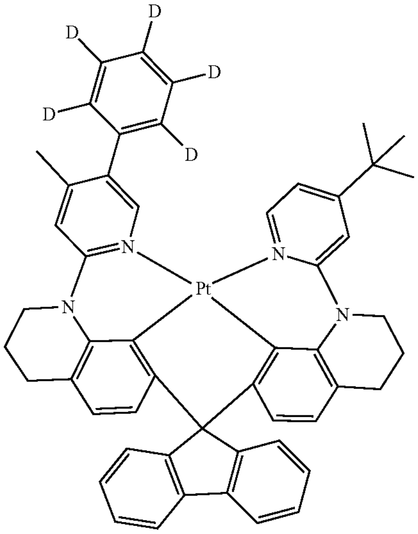
BD38
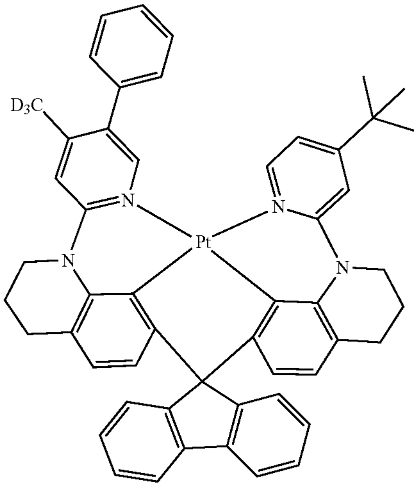
BD39
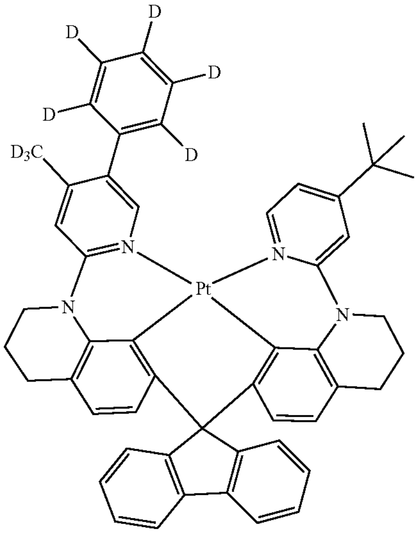

BD40
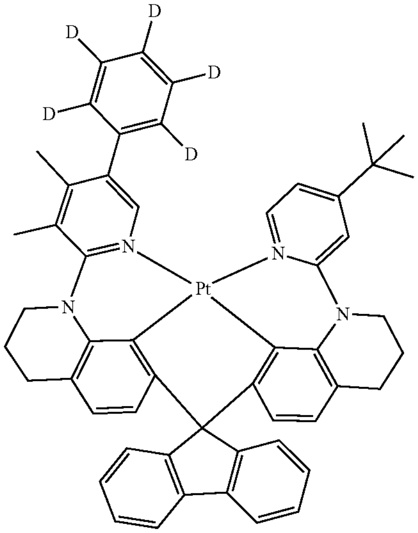
BD41
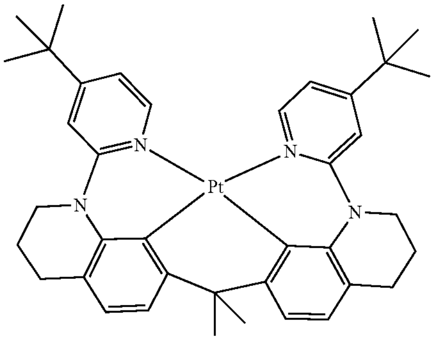
BD42
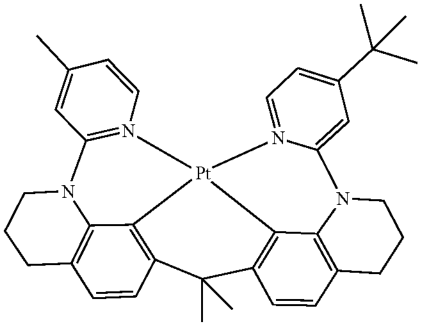
BD43
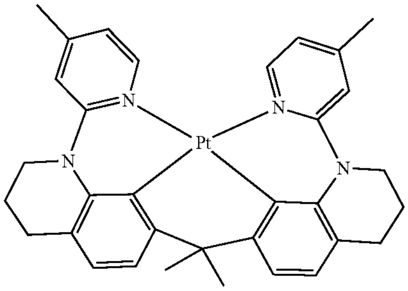
BD44
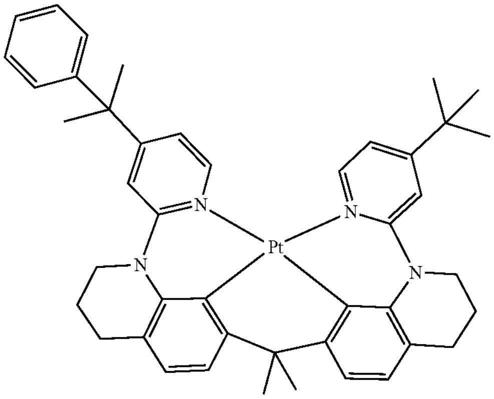
BD45
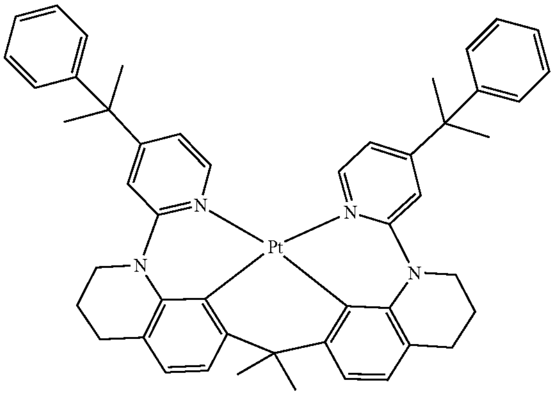
BD46
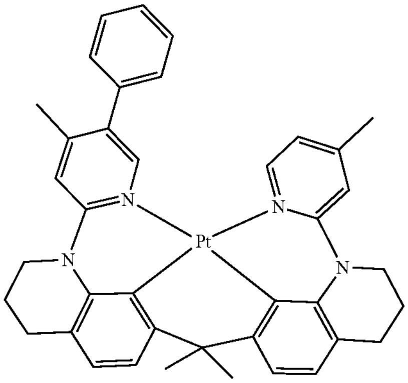
BD47
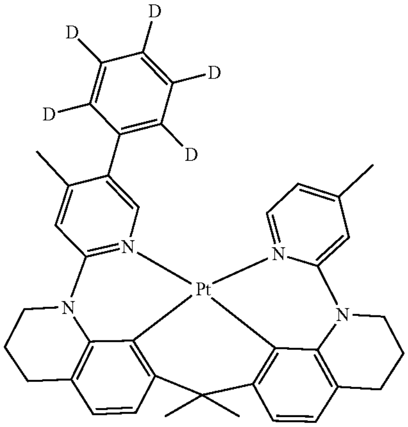

-continued
BD48
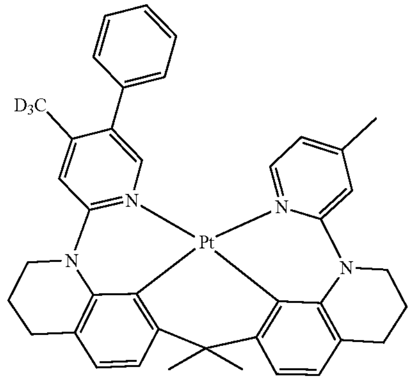
BD49
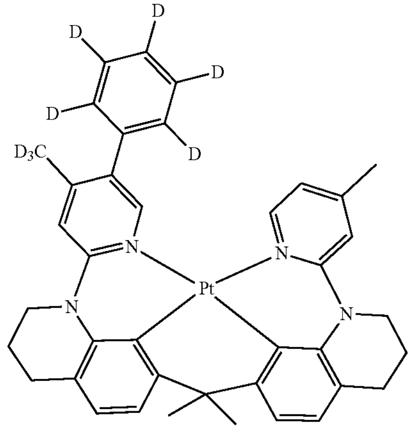
BD50
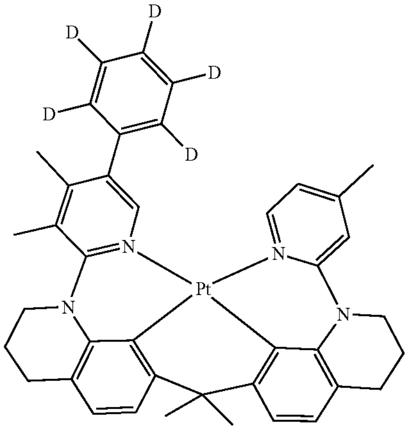
BD51
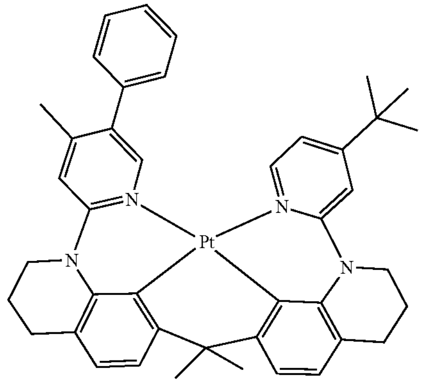
-continued
BD52
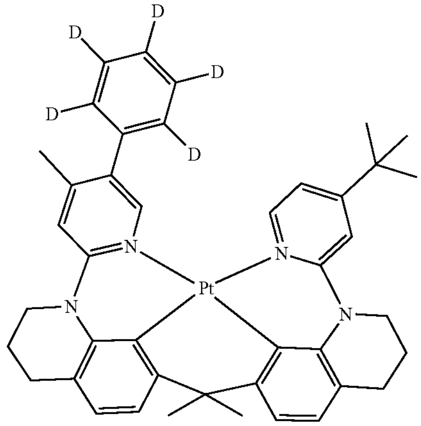
BD53
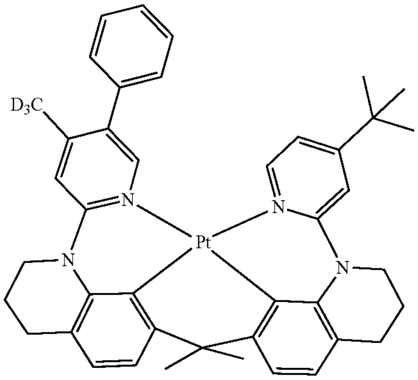
BD54
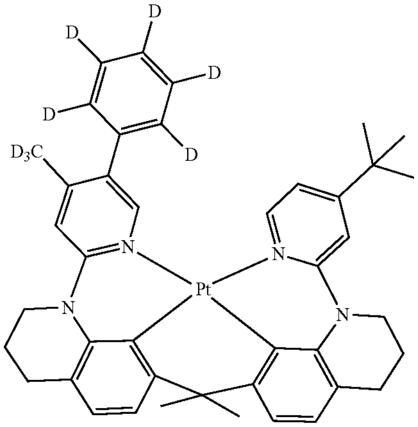

-continued
BD55
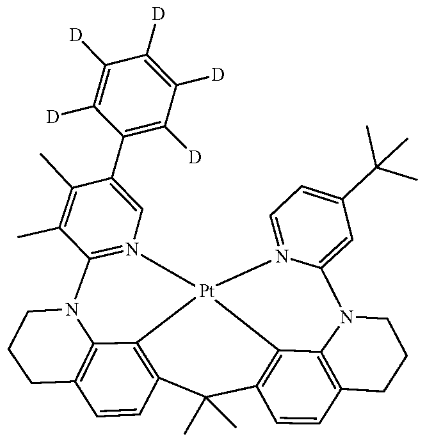
BD56
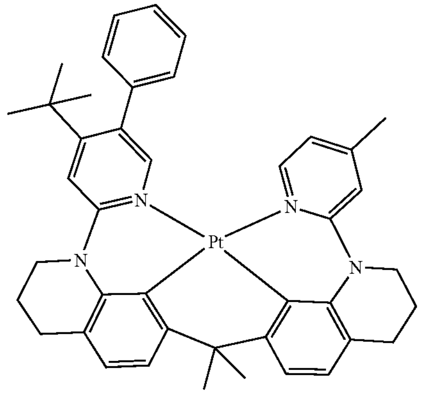
BD57
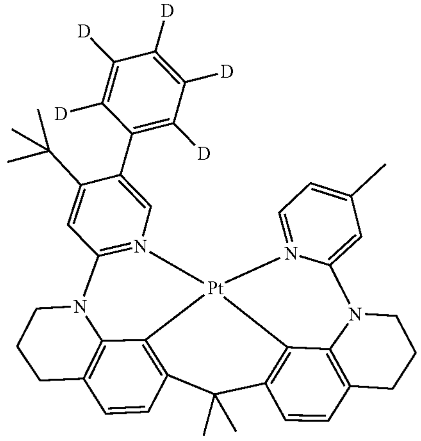
-continued
BD58
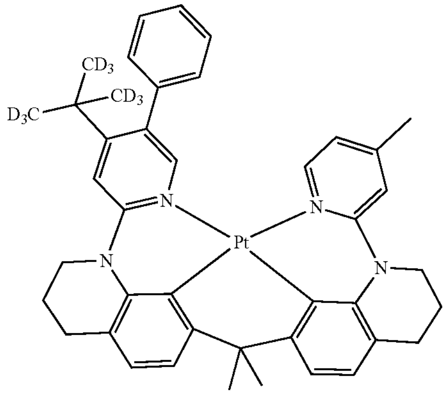
BD59
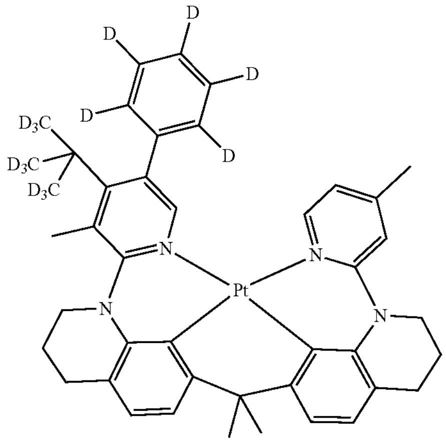
BD60
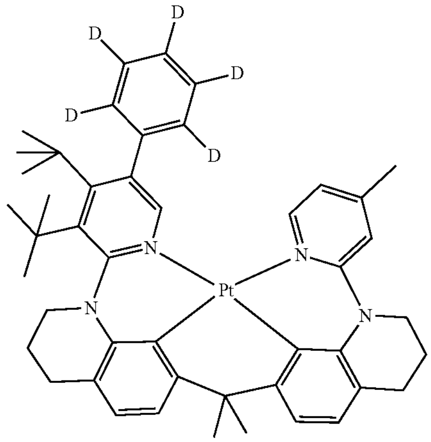

BD61
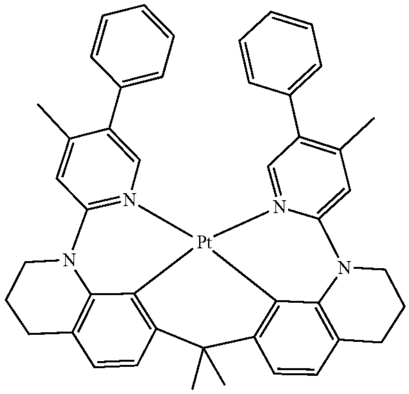
BD62
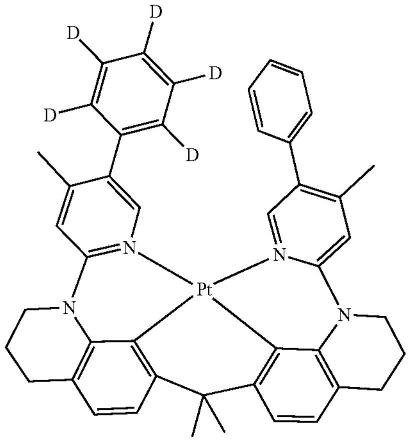
BD63
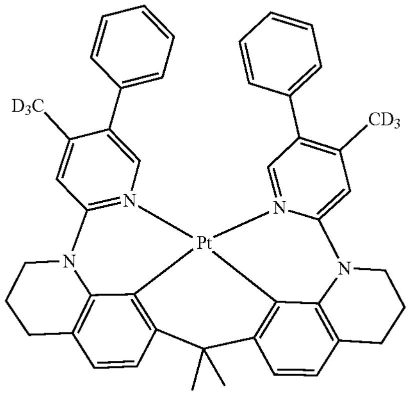
BD64
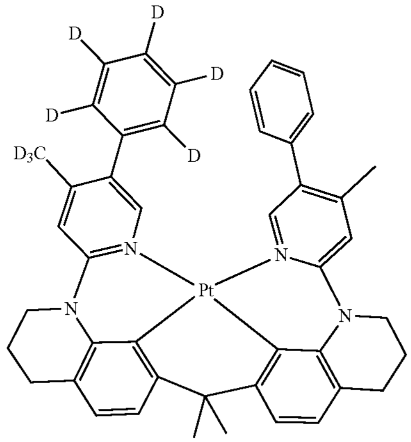
BD65
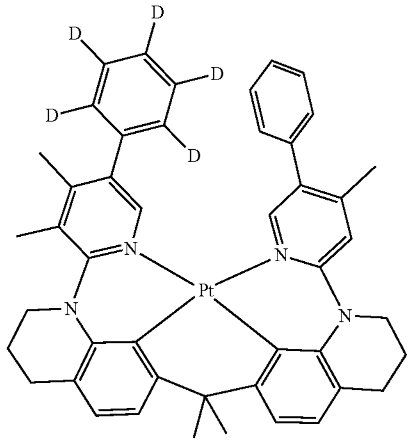
BD66
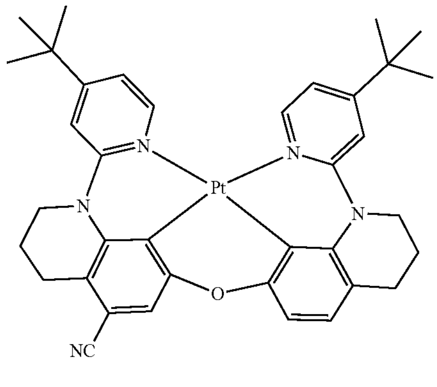
BD67
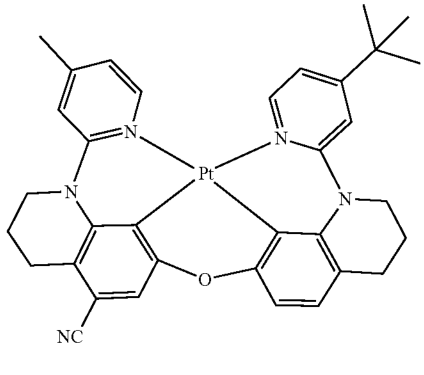

-continued
BD68
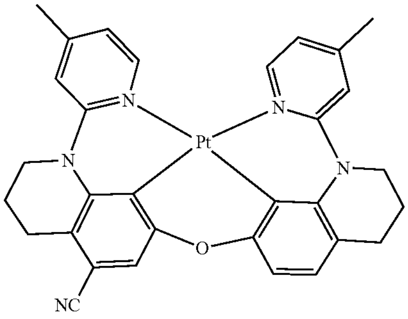
BD69
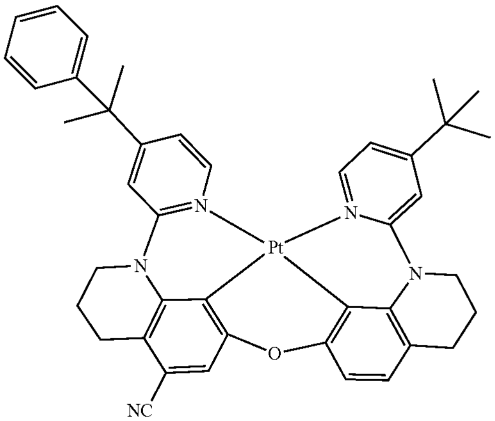
BD70
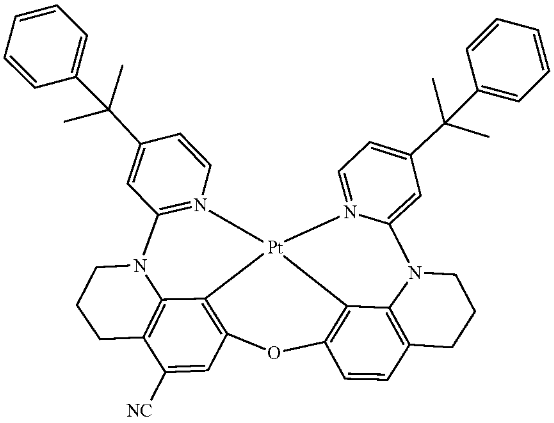
BD71
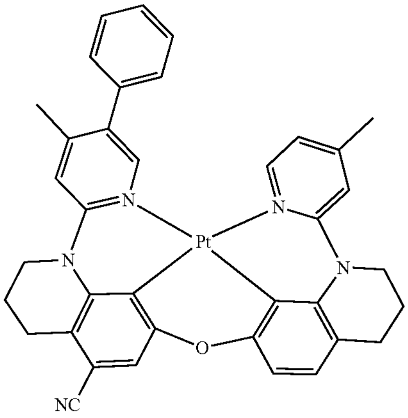
-continued
BD72
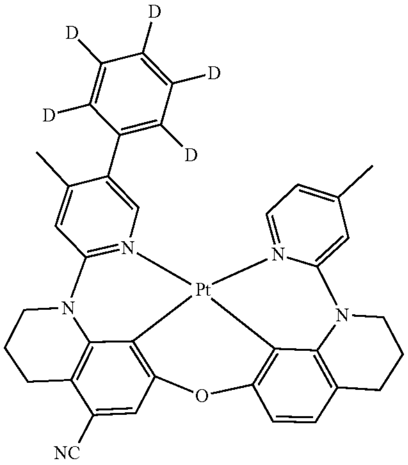
BD73
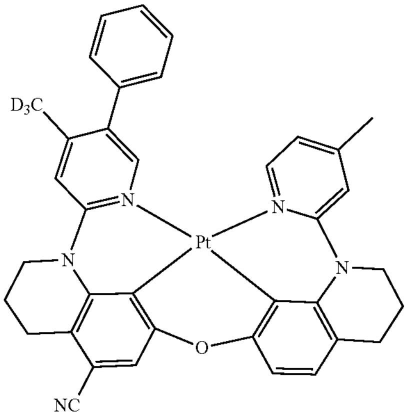
BD74
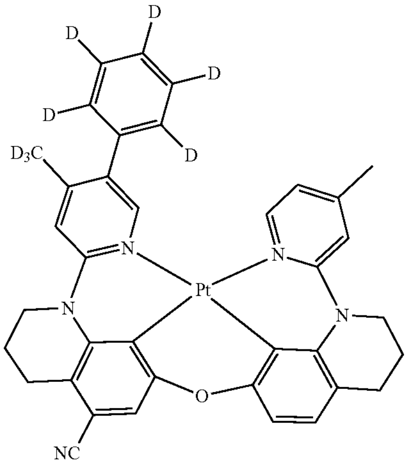

-continued
BD75
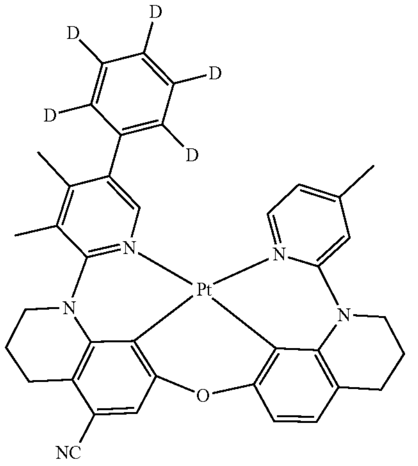
BD76
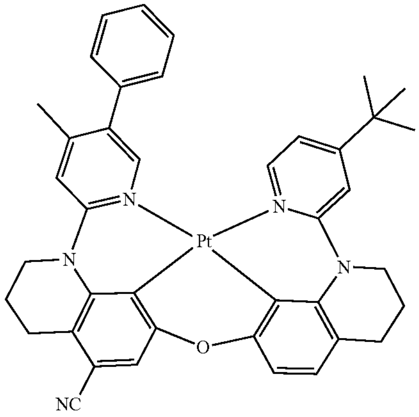
BD77
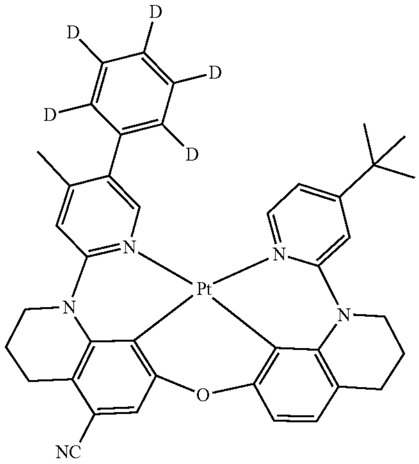
-continued
BD78
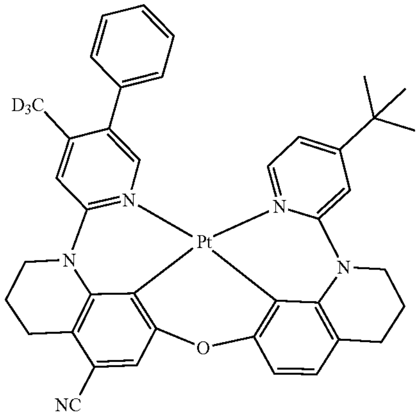
BD79
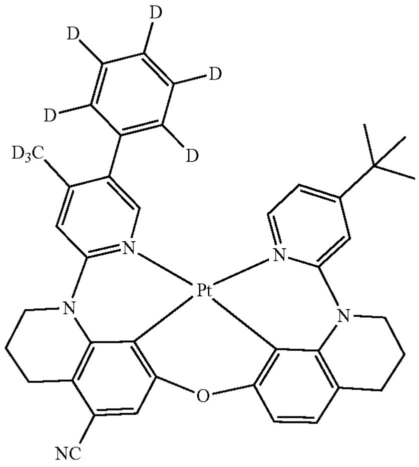
BD80
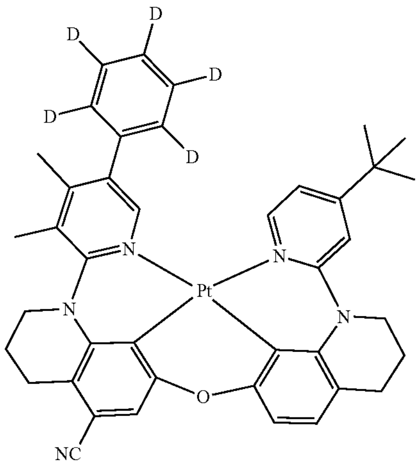

-continued
BD81
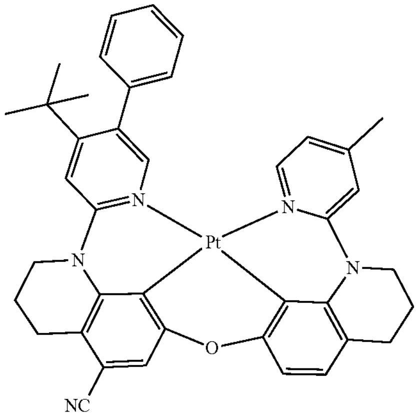
BD82
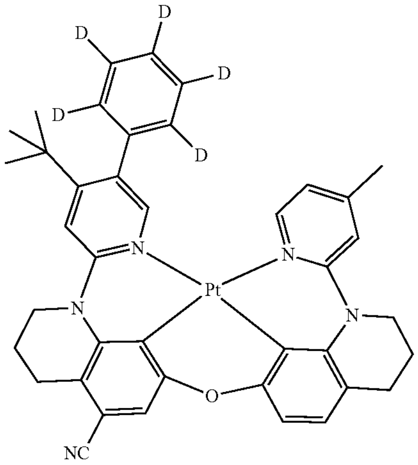
BD83
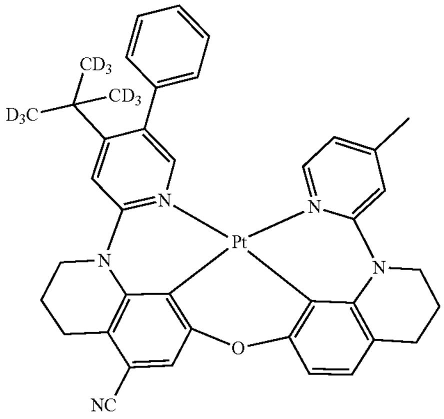
-continued
BD84
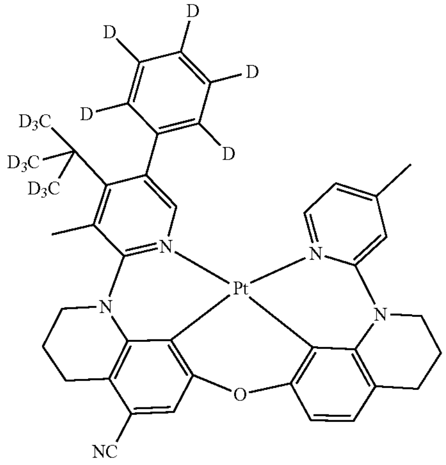
BD85
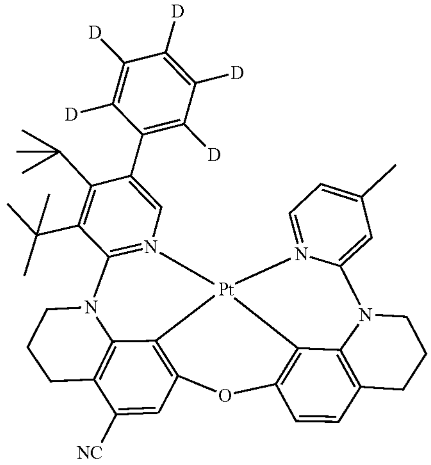
BD86
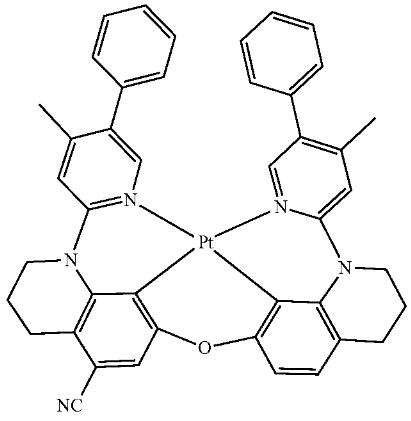

-continued
BD87
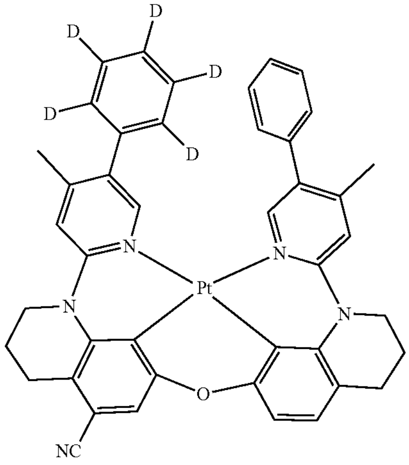
BD88
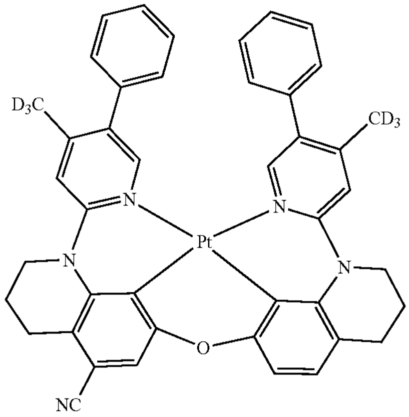
BD89
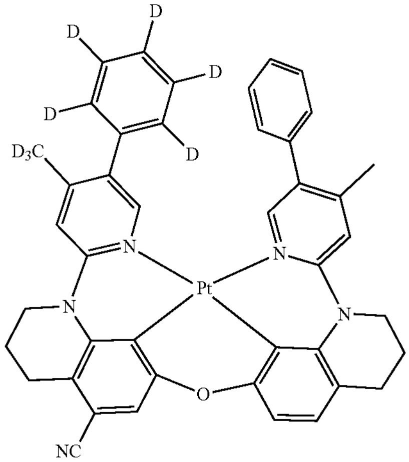
-continued
BD90
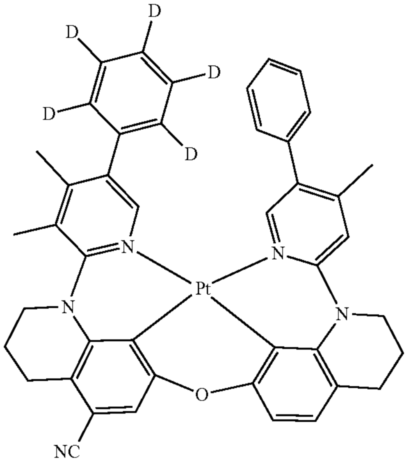
BD91
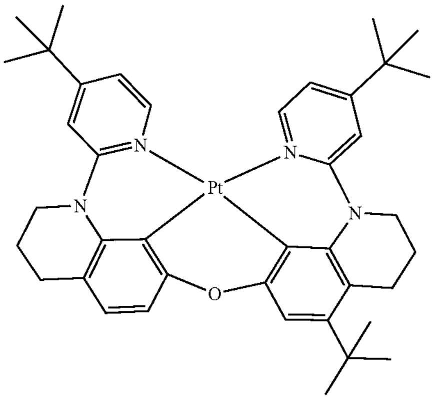
BD92
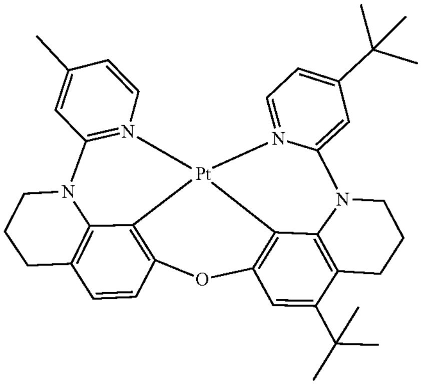
BD93
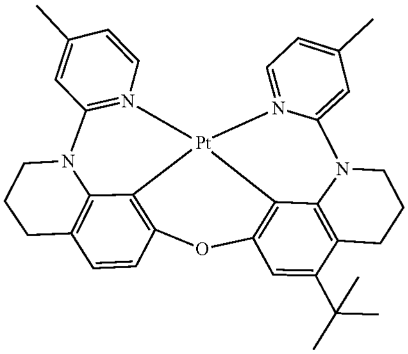

-continued
BD94
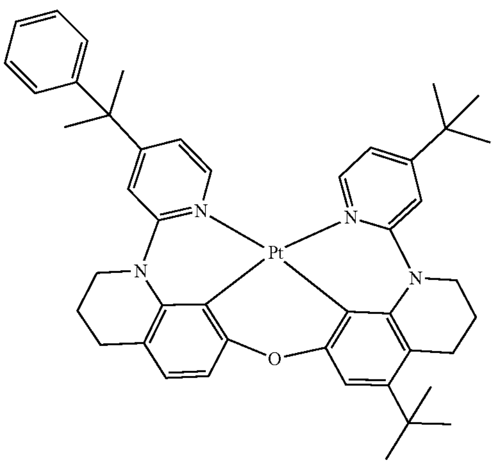
BD95
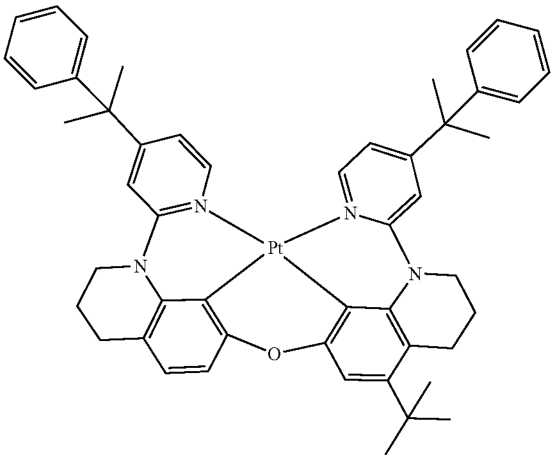
BD96
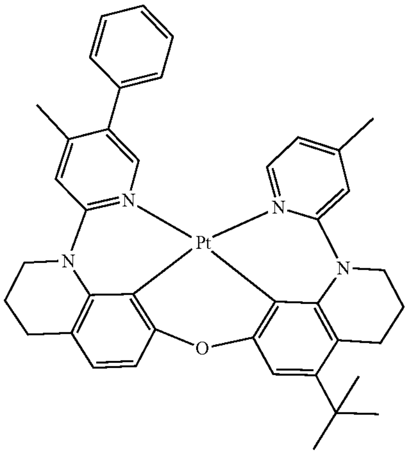
-continued
BD97
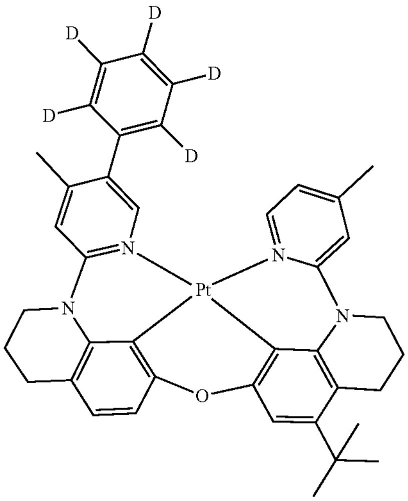
BD98
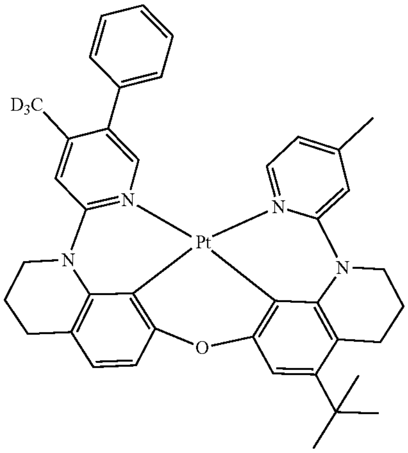
BD99
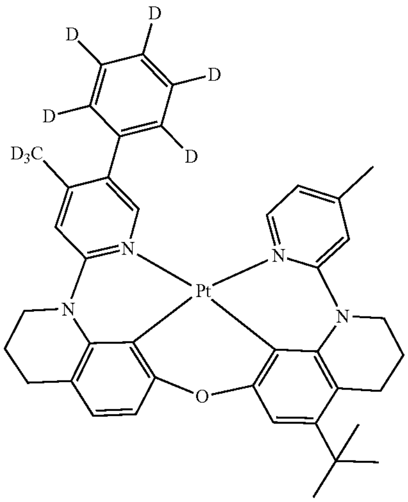

-continued
BD100
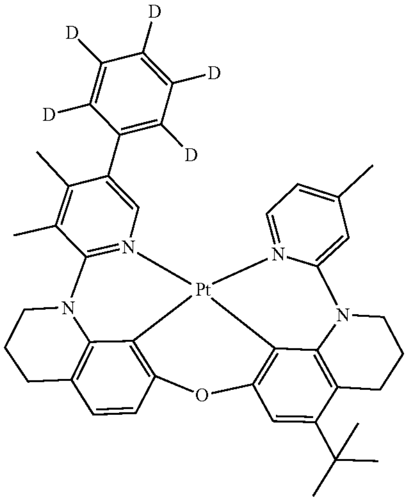
BD101
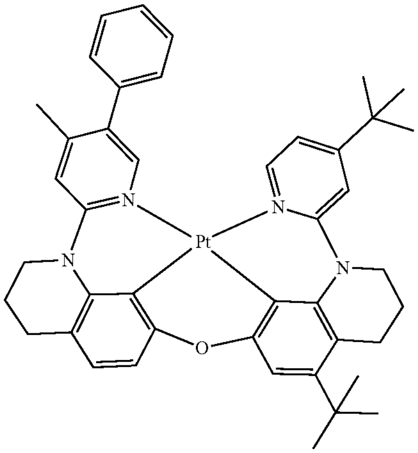
BD102
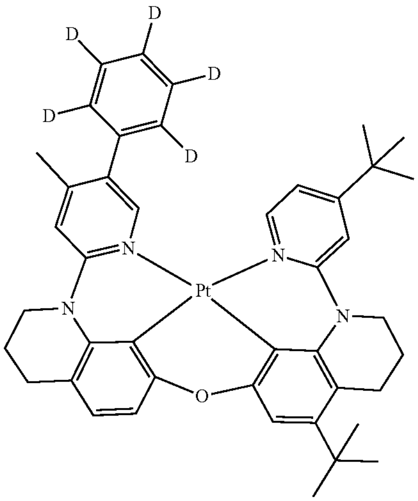
-continued
BD103
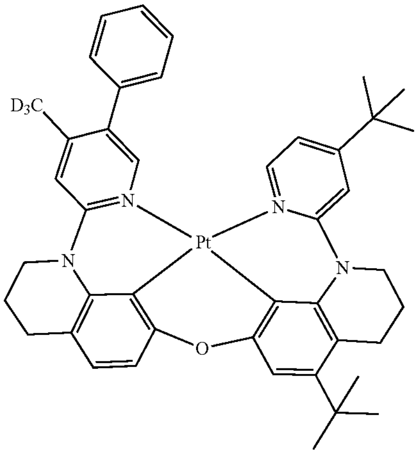
BD104
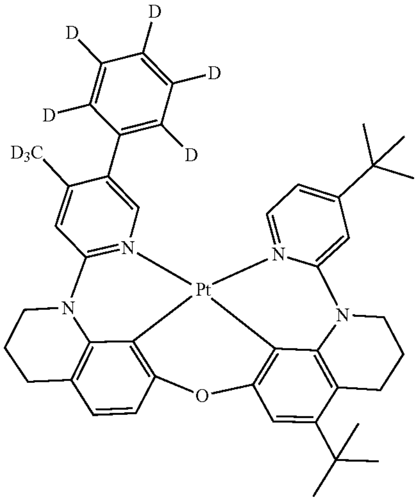
BD105
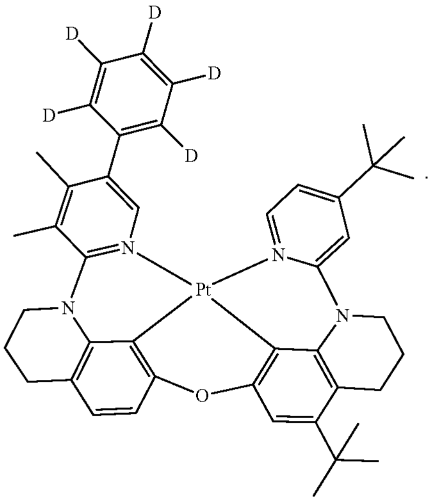
* * * * *